(12) United States Patent
Inoue et al.

(10) Patent No.: US 11,447,421 B2
(45) Date of Patent: Sep. 20, 2022

(54) GARNET COMPOUND, OXIDE SINTERED COMPACT, OXIDE SEMICONDUCTOR THIN FILM, THIN FILM TRANSISTOR, ELECTRONIC DEVICE AND IMAGE SENSOR

(71) Applicant: IDEMITSU KOSAN CO., LTD., Tokyo (JP)

(72) Inventors: Kazuyoshi Inoue, Sodegaura (JP); Masatoshi Shibata, Sodegaura (JP); Emi Kawashima, Sodegaura (JP); Yuki Tsuruma, Sodegaura (JP); Shigekazu Tomai, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 35 days.

(21) Appl. No.: 16/499,143

(22) PCT Filed: Mar. 29, 2018

(86) PCT No.: PCT/JP2018/013243
§ 371 (c)(1),
(2) Date: Sep. 27, 2019

(87) PCT Pub. No.: WO2018/181716
PCT Pub. Date: Oct. 4, 2018

(65) Prior Publication Data
US 2020/0140337 A1     May 7, 2020

(30) Foreign Application Priority Data
Mar. 30, 2017 (JP) .............................. JP2017-068069
Oct. 26, 2017 (JP) .............................. JP2017-207594
(Continued)

(51) Int. Cl.
    *C04B 35/01*     (2006.01)
    *C23C 14/34*     (2006.01)
    (Continued)

(52) U.S. Cl.
    CPC .............. *C04B 35/01* (2013.01); *C23C 14/34* (2013.01); *H01L 27/14612* (2013.01);
    (Continued)

(58) Field of Classification Search
    CPC ...................................................... C04B 35/01
    See application file for complete search history.

(56) References Cited

U.S. PATENT DOCUMENTS 8,647,537 B2 *    2/2014    Utsuno ................. H01L 29/242
                                                                                                                                     252/518.1
2011/0108836 A1    5/2011    Koyama et al.
(Continued)

FOREIGN PATENT DOCUMENTS

CN        101514100 A     8/2009
CN        101921589 A    12/2010
(Continued)

OTHER PUBLICATIONS

International Preliminary Report on Patentability dated Oct. 1, 2019 for corresponding Application No. PCT/JP2018/013243.
(Continued)

*Primary Examiner* — William D Young
(74) *Attorney, Agent, or Firm* — Foley & Lardner LLP

(57) ABSTRACT

A sintered oxide contains In element, Y element, and Ga element at respective atomic ratios as defined in formulae (1) to (3) below, $$0.80 \leq \text{In}/(\text{In}+\text{Y}+\text{Ga}) \leq 0.96 \quad (1),$$

$$0.02 \leq \text{Y}/(\text{In}+\text{Y}+\text{Ga}) \leq 0.10 \quad (2), \text{ and}$$

$$0.02 \leq \text{Ga}/(\text{In}+\text{Y}+\text{Ga}) \leq 0.10 \quad (3), \text{ and}$$

(Continued)

Al element at an atomic ratio as defined in a formula (4) below, $$0.005 \leq Al/(In+Y+Ga+Al) \leq 0.07 \quad (4),$$

where In, Y, Ga, and Al in the formulae represent the number of atoms of the In element, Y element, Ga element, and Al element in the sintered oxide, respectively.

12 Claims, 31 Drawing Sheets

(30) Foreign Application Priority Data

Dec. 12, 2017 (JP) .............................. JP2017-237754
Feb. 1, 2018 (JP) .............................. JP2018-016727

(51) Int. Cl.
  *H01L 27/146* (2006.01)
  *H01L 29/786* (2006.01)

(52) U.S. Cl.
  CPC ................ *H01L 29/78693* (2013.01); *C04B 2235/3225* (2013.01); *C04B 2235/3286* (2013.01)

(56) References Cited

U.S. PATENT DOCUMENTS

| | | | |
|---|---|---|---|
| 2011/0180763 | A1 | 7/2011 | Utsuno et al. |
| 2012/0093712 | A1* | 4/2012 | Yano ............. C23C 14/086 423/594.14 |
| 2013/0119380 | A1 | 5/2013 | Koyama et al. |
| 2014/0167033 | A1 | 6/2014 | Utsuno et al. |
| 2015/0048366 | A1 | 2/2015 | Koyama et al. |
| 2016/0233252 | A1 | 8/2016 | Koyama et al. |
| 2016/0343554 | A1* | 11/2016 | Tomai ............. H01J 37/3426 |

FOREIGN PATENT DOCUMENTS

| | | |
|---|---|---|
| CN | 102159517 A | 8/2011 |
| CN | 102598269 A | 7/2012 |
| CN | 105873881 A | 8/2016 |
| JP | 2006-165527 A | 6/2006 |
| JP | 2006-165528 A | 6/2006 |
| JP | 2006-165529 A | 6/2006 |
| JP | 2008-041796 A | 2/2008 |
| JP | 2010-045263 A | 2/2010 |
| JP | 2011-119711 A | 6/2011 |
| JP | 2014-214359 A | 11/2014 |
| JP | 2017-135410 A | 8/2017 |
| JP | 2017-178740 A | 10/2017 |
| TW | 201014812 A | 4/2010 |
| WO | WO-2010/032422 A1 | 3/2010 |
| WO | WO-2011/061936 A1 | 5/2011 |
| WO | WO-2015/098060 A1 | 7/2015 |
| WO | WO-2017/017966 A1 | 2/2017 |

OTHER PUBLICATIONS

Written Opinion and International Search Report dated Jul. 3, 2018 for corresponding Application No. PCT/JP2018/013243.
Hlásek et al., "Influence of gallium on infrared luminescence in $Er^{3+}$ doped $Yb_3Al_5\text{-}13_yGa_yO_{12}$ films grown by the liquid phase epitaxy", Journal of Luminescence, 2015, vol. 164, pp. 90-93 (4 pages).
International Search Report issued in International Application No. PCT/JP2018/013243 dated Jul. 3, 2018 (13 pages).
Office Action dated Oct. 19, 2021 issued in a corresponding Japanese Patent Application No. 2019-510128, (3 pages).
Office Action dated Aug. 27, 2021 issued in a corresponding Chinese Patent Application No. 201880020911.7, (21 pages).
Office Action dated Nov. 25, 2021 issued in a corresponding Taiwanese Patent Application No. 107111193, (8 pages).

* cited by examiner

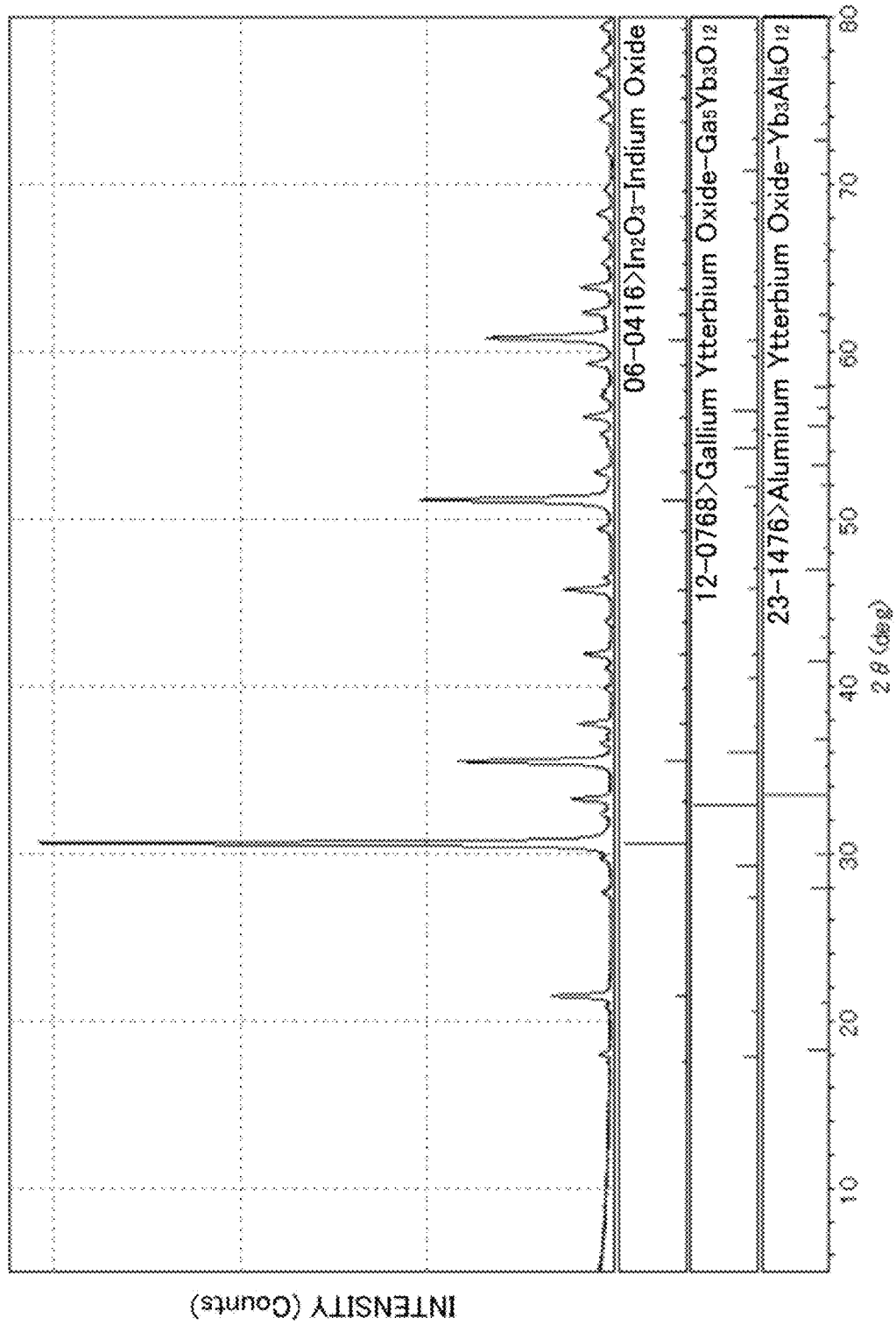

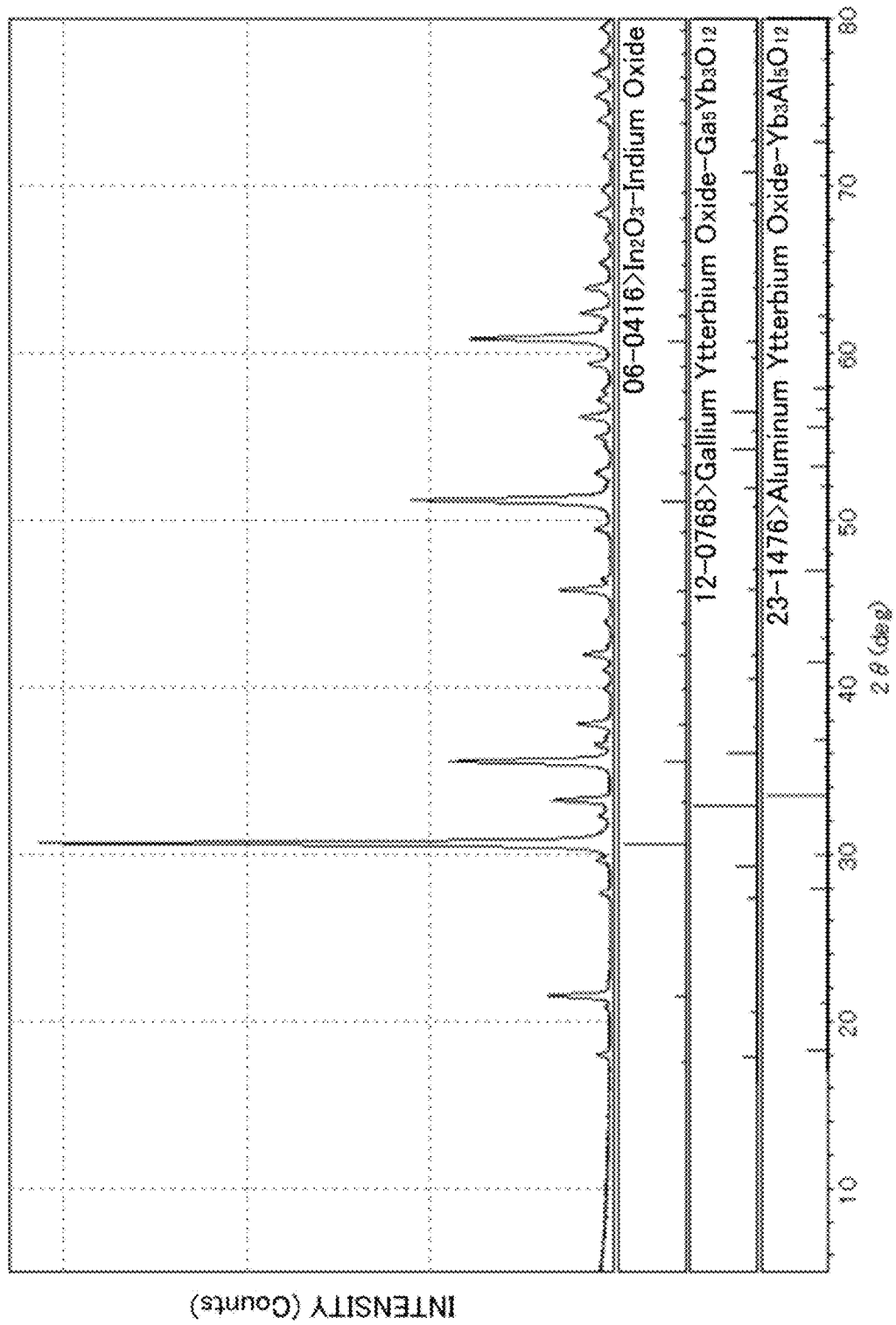

GARNET COMPOUND, OXIDE SINTERED COMPACT, OXIDE SEMICONDUCTOR THIN FILM, THIN FILM TRANSISTOR, ELECTRONIC DEVICE AND IMAGE SENSOR

RELATED APPLICATIONS

The present application claims priority under 37 U.S.C. § 371 to International Patent Application No. PCT/JP2018/013243, filed Mar. 29, 2018, which claims priority to and the benefit of Japanese Patent Application Nos. 2017-068069, filed on Mar. 30, 2017, 2017-207594, filed on Oct. 26, 2017, 2017-237754, filed on Dec. 12, 2017, 2018-016727, filed on Feb. 1, 2018. The contents of these applications are hereby incorporated by reference in their entireties.

TECHNICAL FIELD

The present invention relates to a garnet compound, a sintered oxide, an oxide semiconductor thin-film, a thin film transistor, an electronic device and an image sensor.

BACKGROUND ART

Amorphous oxide semiconductor usable for a thin-film transistor has higher carrier mobility than general-purpose amorphous silicon (a-Si) and a large optical band gap, and can form a film at a low temperature. Accordingly, the use of the amorphous oxide semiconductor is expected in the field of next-generation display devices requiring high-resolution and high-speed large-size image display, and a resin substrate with low heat resistance.

The oxide semiconductor (film) is suitably formed through a sputtering process, in which a sputtering target is sputtered. This is because a thin film formed through the sputtering process is more excellent in terms of in-plane uniformity (e.g. composition uniformity in a film plane direction (i.e. within a film plane) and even film thickness) than a thin film formed through ion-plating process, vacuum deposition process or electron beam deposition process, allowing the formation of the thin film with the same composition as that of the sputtering target.

Patent Literature 1 discloses a sintered oxide containing Bixbyite crystalline phase of $In_2O_3$, and $A_3B_5O_{12}$ crystalline phase (A being at least one element selected from the group consisting of Sc, Y, La, Ce, Pr, Nd, Pm, Sm, Eu, Gd, Tb, Dy, Ho, Er, Tm, Yb, and Lu, B being at least one element selected from the group consisting of Al and Ga). Patent Literature 1 also discloses an oxide semiconductor thin-film, and a thin-film transistor.

Meanwhile, there exists a strong demand for higher-quality TFT, and for a material exhibiting high carrier mobility and small change in properties during CVD process and the like.

Zinc oxide (or zinc-oxide-containing material) has been known as a material of the oxide semiconductor. A thin-film transistor formed of an amorphous oxide (oxide semiconductor) whose electron carrier concentration is less than $10^{18}$ per cubic centimeter is disclosed (Patent Literatures 2 to 4).

A solid-state imaging device and an image sensor, in which an oxide semiconductor is combined with a photo-electric converter, are also disclosed (Patent Literature 5).

CITATION LIST

Patent Literature(S)

Patent Literature 1 WO 2015/098060
Patent Literature 2 JP 2006-165527 A
Patent Literature 3 JP 2006-165528 A
Patent Literature 4 JP 2006-165529 A
Patent Literature 5 JP 2017-135410 A

SUMMARY OF THE INVENTION

Problem(s) to be Solved by the Invention

An object of the invention is to provide a sintered oxide and a sputtering target made of a new oxide system, and an oxide semiconductor thin-film capable of exhibiting excellent thin-film transistor (sometimes referred to as TFT hereinafter) performance when being used for TFT.

It should be noted that the above disclosure of a problem to be solved by the invention does not exclude the presence of other problem(s). It is not necessary for an exemplary embodiment of the invention to solve all of the problem(s). It should be noted that the problem(s) to be solved by the invention would become self-evident from, and can be extracted from the specification, drawing(s) and claim(s).

Means for Solving the Problem(s)

According to some aspects of the invention, a sintered oxide, a sputtering target, an oxide semiconductor thin-film, a thin film transistor, an electronic device, a garnet compound, and an image sensor as described below are provided.

A sintered oxide contains In element, Y element, and Ga element at respective atomic ratios as defined in formulae (1-1) to (1-3) below, $$0.80 \leq In/(In+Y+Ga) \leq 0.96 \quad (1\text{-}1),$$

$$0.02 \leq Y/(In+Y+Ga) \leq 0.10 \quad (1\text{-}2), \text{ and}$$

$$0.02 \leq Ga/(In+Y+Ga) \leq 0.15 \quad (1\text{-}3); \text{ and}$$

Al element at an atomic ratio as defined in a formula (1-4) below, $$0.005 \leq Al/(In+Y+Ga+Al) \leq 0.07 \quad (1\text{-}4),$$

where In, Y, Ga, and Al in the formulae represent the number of atoms of the In element, Y element, Ga element, and Al element in the sintered oxide, respectively.

The sintered oxide according to the above aspect of the invention, further containing Ga element at an atomic ratio as defined in a formula (1-5) below, $$0.02 \leq Ga/(In+Y+Ga) \leq 0.10 \quad (1\text{-}5).$$

The sintered oxide according to the above aspect of the invention, further containing an oxide of a positive tetravalent or more polyvalent metal element X at an atomic ratio defined by a formula (1-6) below, $$0.00005 \leq X/(In+Y+Ga+Al+X) \leq 0.005 \quad (1\text{-}6),$$

where X represents the number of atoms of the X element in the sintered oxide.

The sintered oxide according to the above aspect of the invention, where the sintered oxide contains a Bixbyite crystalline phase represented by $In_2O_3$ and at least one of a $Y_3Ga_5O_{12}$ crystalline phase and a $Y_3Ga_4AlO_{12}$ crystalline phase.

A sintered oxide containing main constitutional elements containing In element, Y element, Ga element, Al element, and O element, where the sintered oxide contains a Bixbyite crystalline phase represented by $In_2O_3$ and at least one of a $Y_3Ga_5O_{12}$ crystalline phase or a $Y_3Ga_4AlO_{12}$ crystalline phase.

A sintered oxide containing main constitutional elements containing In element, Y element, Ga element, Al element, positive tetravalent metal element, and O element, where the sintered oxide contains a Bixbyite crystalline phase represented by $In_2O_3$ and a $Y_3Ga_4AlO_{12}$ crystalline phase.

The sintered oxide according to the above aspect of the invention, where a relative density of the sintered oxide is 95% or more.

The sintered oxide according to the above aspect of the invention, where a bulk resistivity of the sintered oxide is 30 mΩ·cm or less.

A sputtering target containing: the sintered oxide according to the above aspect of the invention; and a backing plate.

An oxide semiconductor thin-film containing:
In element, Y element, and Ga element at respective atomic ratios as defined in formulae (1-7) to (1-9) below, $$0.80 \leq In/(In+Y+Ga) \leq 0.96 \quad (1\text{-}7),$$

$$0.02 \leq Y/(In+Y+Ga) \leq 0.10 \quad (1\text{-}8), \text{ and}$$

$$0.02 \leq Ga/(In+Y+Ga) \leq 0.15 \quad (1\text{-}9); \text{ and}$$

Al element at an atomic ratio as defined in a formula (1-10) below, $$0.005 \leq Al/(In+Y+Ga+Al) \leq 0.07 \quad (1\text{-}10),$$

where In, Y, Ga, and Al in the formulae represent the number of atoms of the In element, Y element, Ga element, and Al element in the oxide semiconductor thin-film, respectively.

The oxide semiconductor thin-film according to the above aspect of the invention, further containing Ga element at an atomic ratio as defined in a formula (1-11) below, $$0.02 \leq Ga/(In+Y+Ga) \leq 0.10 \quad (1\text{-}11).$$

The oxide semiconductor thin-film according to the above aspect of the invention, further containing an oxide of a positive tetravalent or more polyvalent metal element X at an atomic ratio defined by a formula (1-12) below, $$0.00005 \leq X/(In+Y+Ga+Al+X) \leq 0.005 \quad (1\text{-}12),$$

where X represents the number of atoms of the X element in the oxide semiconductor thin-film.

The oxide semiconductor thin-film according to the above aspect of the invention, where the oxide semiconductor thin-film contains a Bixbyite crystalline phase represented by $In_2O_3$.

The oxide semiconductor thin-film according to the above aspect of the invention, where a lattice constant of the Bixbyite crystalline phase represented by $In_2O_3$ is $10.083 \times 10^{-10}$ m or less.

A thin-film transistor containing the oxide semiconductor thin-film according to the above aspect of the invention.

An electronic device containing the thin-film transistor according to the above aspect of the invention.

A garnet compound represented by a formula $$Ln_3(Ga_{5-x}Al_x)O_{12} \quad (I),$$

where Ln represents at least one metal element selected from Gd, Tb, Dy, Ho, Er, Tm, Yb, and Lu, and 0<X<5.

A garnet compound represented by a formula $$Ln_3(Ga_{5-x}Al_x)O_{12} \quad (I),$$

where Ln represents at least one metal element selected from Gd, Tb, Dy, Ho, Er, Tm, Yb, and Lu, and 0<X<5,
where a lattice constant of the garnet compound is $11.93 \times 10^{-10}$ m or more and $12.20 \times 10^{-10}$ m or less.

The garnet compound according to the above aspect of the invention, where Ln is Yb element.

A sintered oxide containing:
a garnet crystalline phase represented by a formula $$Ln_3(Ga_{5-x}Al_x)O_{12} \quad (I),$$

where Ln represents at least one metal element selected from Gd, Tb, Dy, Ho, Er, Tm, Yb, and Lu, and 0<X<5.

A sintered oxide containing In element, Ga element, Al element and Ln element, where
the sintered oxide contains a garnet crystalline phase whose lattice constant is $11.93 \times 10^{-10}$ m or more and $12.20 \times 10^{-10}$ m or less,
where Ln represents at least one metal element selected from Gd, Tb, Dy, Ho, Er, Tm, Yb, and Lu.

The sintered oxide according to the above aspect of the invention, where Ln is Yb element.

A sintered oxide containing:
a garnet crystalline phase represented by a formula $$Ln_3(Ga_{5-x}Al_x)O_{12} \quad (I),$$

where Ln represents at least one metal element selected from Gd, Tb, Dy, Ho, Er, Tm, Yb, and Lu, and 0<X<5; and
a Bixbyite crystalline phase represented by $In_2O_3$.

A sintered oxide containing In element, Ga element, Al element and Ln element, where
the sintered oxide contains:
a garnet crystalline phase whose lattice constant is $11.93 \times 10^{-10}$ m or more and $12.20 \times 10^{-10}$ m or less; and
a Bixbyite crystalline phase represented by $In_2O_3$,
where Ln represents at least one metal element selected from Gd, Tb, Dy, Ho, Er, Tm, Yb, and Lu.

The sintered oxide according to the above aspect of the invention, where Ln is Yb element.

A sputtering target containing the sintered oxide according to the above aspect of the invention.

A sintered oxide containing In element, Ga element, and Ln element at respective atomic ratios as defined in formulae (2-1) to (2-3) below, $$0.75 \leq In/(In+Ga+Ln) \leq 0.96 \quad (2\text{-}1),$$

$$0.03 \leq Ga/(In+Ga+Ln) \leq 0.10 \quad (2\text{-}2), \text{ and}$$

$$0.01 \leq Ln/(In+Ga+Ln) \leq 0.15 \quad (2\text{-}3),$$

where In, Ga, and Ln represent the number of atoms of In element, Ga element, and Ln element in the sintered oxide, respectively, and Ln represents at least one metal element selected from Gd, Tb, Dy, Ho, Er, Tm, Yb, and Lu.

The sintered oxide according to the above aspect of the invention, where the sintered oxide contains a garnet crystalline phase represented by $Yb_3Ga_5O_{12}$ and a Bixbyite crystalline phase represented by $In_2O_3$.

A sintered oxide containing In element, Ga element, Ln element, and Al element at respective atomic ratios as defined in formulae (2-4) to (2-7) below, $$0.70 \leq In/(In+Ga+Ln+Al) \leq 0.95 \quad (2\text{-}4),$$

$$0.03 \leq Ga/(In+Ga+Ln+Al) \leq 0.10 \quad (2\text{-}5),$$

$$0.01 \leq Ln/(In+Ga+Ln+Al) \leq 0.10 \quad (2\text{-}6), \text{ and}$$

$$0.01 \leq Al/(In+Ga+Ln+Al) \leq 0.10 \quad (2\text{-}7),$$

where In, Ga, Ln, and Al represent the number of atoms of In element, Ga element, Ln element, and Al element in the sintered oxide, respectively, and Ln represents at least one metal element selected from Gd, Tb, Dy, Ho, Er, Tm, Yb, and Lu.

The sintered oxide according to the above aspect of the invention, further containing Sn element at a content in a range from 100 to 10000 ppm.

The sintered oxide according to the above aspect of the invention, where the sintered oxide contains a garnet crystalline phase represented by a formula (I) and a Bixbyite crystalline phase represented by $In_2O_3$, $$Ln_3(Ga_{5-x}Al_x)O_{12} \quad \text{Formula (I),}$$

where $0<X<5$.

A sintered oxide containing In element, Sn element, and Ln element at respective atomic ratios as defined in formulae (2-8) to (2-10) below, $$0.55 \leq In/(In+Sn+Ln) \leq 0.90 \quad (2\text{-}8),$$

$$0.05 \leq Sn/(In+Sn+Ln) \leq 0.25 \quad (2\text{-}9), \text{ and}$$

$$0.05 \leq Ln/(In+Sn+Ln) \leq 0.20 \quad (2\text{-}10),$$

where In, Sn, and Ln represent the number of atoms of In element, Sn element, and Ln element in the sintered oxide, respectively, and Ln represents at least one metal element selected from Gd, Tb, Dy, Ho, Er, Tm, Yb, and Lu.

The sintered oxide according to the above aspect of the invention, where the sintered oxide contains a rutile crystalline phase represented by $SnO_2$ and a Bixbyite crystalline phase represented by $In_2O_3$.

An oxide semiconductor thin-film containing In element, Ga element, and Ln element at respective atomic ratios as defined in formulae (2-1) to (2-3) below, $$0.75 \leq In/(In+Ga+Ln) \leq 0.96 \quad (2\text{-}1),$$

$$0.03 \leq Ga/(In+Ga+Ln) \leq 0.10 \quad (2\text{-}2), \text{ and}$$

$$0.01 \leq Ln/(In+Ga+Ln) \leq 0.15 \quad (2\text{-}3),$$

where In, Ga, and Ln represent the number of atoms of In element, Ga element, and Ln element in the oxide semiconductor thin-film, respectively, and Ln represents at least one metal element selected from Gd, Tb, Dy, Ho, Er, Tm, Yb, and Lu.

An oxide semiconductor thin-film containing In element, Ga element, Ln element, and Al element at respective atomic ratios as defined in formulae (2-4) to (2-7) below, $$0.70 \leq In/(In+Ga+Ln+Al) \leq 0.95 \quad (2\text{-}4),$$

$$0.03 \leq Ga/(In+Ga+Ln+Al) \leq 0.10 \quad (2\text{-}5),$$

$$0.01 \leq Ln/(In+Ga+Ln+Al) \leq 0.10 \quad (2\text{-}6), \text{ and}$$

$$0.01 \leq Al/(In+Ga+Ln+Al) \leq 0.10 \quad (2\text{-}7),$$

where In, Ga, Ln, and Al represent the number of atoms of In element, Ga element, Ln element, and Al element in the oxide semiconductor thin-film, respectively, and Ln represents at least one metal element selected from Gd, Tb, Dy, Ho, Er, Tm, Yb, and Lu.

The oxide semiconductor thin-film according to the above aspect of the invention, further containing Sn element at a content in a range from 100 to 10000 ppm.

An oxide semiconductor thin-film containing In element, Sn element, and Ln element at respective atomic ratios as defined in formulae (2-8) to (2-10) below, $$0.55 \leq In/(In+Sn+Ln) \leq 0.90 \quad (2\text{-}8),$$

$$0.05 \leq Sn/(In+Sn+Ln) \leq 0.25 \quad (2\text{-}9), \text{ and}$$

$$0.05 \leq Ln/(In+Sn+Ln) \leq 0.20 \quad (2\text{-}10),$$

where In, Sn, and Ln represent the number of atoms of In element, Sn element, and Ln element in the oxide semiconductor thin-film, respectively, and Ln represents at least one metal element selected from Gd, Tb, Dy, Ho, Er, Tm, Yb, and Lu.

A thin-film transistor containing the oxide semiconductor thin-film according to the above aspect of the invention.

An electronic device containing the thin-film transistor according to the above aspect of the invention.

An image sensor including:
a photoelectric converter;
an n-type transfer transistor, one of a source and a drain of the n-type transfer transistor being electrically connected to the photoelectric converter;
a signal charge accumulator electrically connected to the other of the source and the drain of the transfer transistor;
a p-type amplification transistor containing a gate electrically connected to the other of the source and the drain of the transfer transistor and the signal charge accumulator; and
an n-type reset transistor containing a source or drain electrically connected to the signal charge accumulator, where
the transfer transistor and the reset transistor include a channel-formation region containing an oxide semiconductor thin-film, and
the oxide semiconductor thin-film contains at least one of In element, Sn element, or Ga element, and at least one of Al element, Y element, or lanthanoid element Ln.

The image sensor according to the above aspect of the invention, where the oxide semiconductor thin-film does not contain Zn element.

The image sensor according to the above aspect, where the oxide semiconductor thin-film is amorphous.

The image sensor according to the above aspect, where the oxide semiconductor thin-film is crystalline.

The image sensor according to the above aspect of the invention, where an atomic composition ratio of the oxide semiconductor thin-film satisfies formulae (3-1) and (3-2) below, $$0.60 \leq (In+Sn+Ga)/(In+Sn+Ga+Al+Y+Ln) \leq 0.98 \quad (3\text{-}1), \text{ and}$$

$$0.02 \leq (Al+Y+Ln)/(In+Sn+Ga+Al+Y+Ln) \leq 0.40 \quad (3\text{-}2),$$

where In, Sn, Ga, Al, Y, and Ln in the formulae represent the number of atoms of the In element, Sn element, Ga element, Al element, Y element and lanthanoid element Ln in the oxide semiconductor thin-film, respectively.

The image sensor according to the above aspect of the invention, where the oxide semiconductor thin-film contains In element, Sn element, Ga element and Al element, and the atomic composition ratio satisfies formulae (3-3) to (3-6) below, $$0.01 \leq Ga/(In+Ga+Sn) \leq 0.30 \quad (3\text{-}3),$$

$$0.01 \leq Sn/(In+Ga+Sn) \leq 0.40 \quad (3\text{-}4),$$

$$0.55 \leq In/(In+Ga+Sn) \leq 0.98 \quad (3\text{-}5), \text{ and}$$

$$0.05 \leq Al/(In+Ga+Sn+Al) \leq 0.30 \quad (3\text{-}6),$$

where In, Sn, Ga, and Al in the formulae represent the number of atoms of the In element, Sn element, Ga element, and Al element in the oxide semiconductor thin-film, respectively.

The image sensor according to the above aspect of the invention, where the oxide semiconductor thin-film contains In element, Sn element, Ga element and Al element, and the atomic composition ratio satisfies formulae (3-7) to (3-10) below, $$0.01 \leq Ga/(In+Ga+Sn) \leq 0.50 \qquad (3\text{-}7)$$

$$0.01 \leq Sn/(In+Ga+Sn) \leq 0.50 \qquad (3\text{-}8)$$

$$0.20 \leq In/(In+Ga+Sn) \leq 0.55 \qquad (3\text{-}9), \text{ and}$$

$$0.05 \leq Al/(In+Ga+Sn+Al) \leq 0.30 \qquad (3\text{-}10),$$

where In, Sn, Ga, and Al in the formulae represent the number of atoms of the In element, Sn element, Ga element, and Al element in the oxide semiconductor thin-film, respectively.

The image sensor according to the above aspect of the invention, where the oxide semiconductor thin-film contains In element, Sn element, Ga element and Ln element, and the atomic composition ratio satisfies formulae (3-11) to (3-14) below, $$0.01 \leq Ga/(In+Ga+Sn) \leq 0.30 \qquad (3\text{-}11),$$

$$0.01 \leq Sn/(In+Ga+Sn) \leq 0.40 \qquad (3\text{-}12),$$

$$0.55 \leq In/(In+Ga+Sn) \leq 0.98 \qquad (3\text{-}13), \text{ and}$$

$$0.03 \leq Ln/(In+Ga+Sn+Ln) \leq 0.25 \qquad (3\text{-}14),$$

where In, Sn, Ga, and Ln in the formulae represent the number of atoms of the In element, Sn element, Ga element, and lanthanoid element Ln in the oxide semiconductor thin-film, respectively.

The image sensor according to the above aspect of the invention, where the oxide semiconductor thin-film contains In element, Sn element, Ga element, Al element, and Y element, and the atomic composition ratio satisfies formulae (3-15) and (3-16) below, $$0.03 \leq (Al+Ga+Y)/(In+Y+Al+Ga) \leq 0.50 \qquad (3\text{-}15), \text{ and}$$

$$0.05 \leq [(Al+Ga)/(In+Al+Ga+Y)]/[(Y+Al+Ga)/(In+Al+Ga+Y)] \leq 0.75 \qquad (3\text{-}16)$$

where In, Sn, Ga, Al, and Y in the formulae represent the number of atoms of the In element, Sn element, Ga element, Al element, and Y element in the oxide semiconductor thin-film, respectively.

The image sensor according to the above aspect of the invention, where the atomic composition ratio of the oxide semiconductor thin-film satisfies a formula (3-17) below, $$0.0001 \leq (Al+Y)/(In+Al+Y) \leq 0.1 \qquad (3\text{-}17),$$

where In, Al, and Y represent the number of atoms of In element, Al element, and Y element in the oxide semiconductor thin-film, respectively.

The image sensor according to the above aspect of the invention, where the atomic composition ratio of the oxide semiconductor thin-film satisfies a formula (3-18) below, $$0.01 \leq (Y+Ln+Al+Ga)/(In+Y+Ln+Al+Ga) \leq 0.5 \qquad (3\text{-}18),$$

where In, Ga, Al, Y, and Ln in the formula represent the number of atoms of the In element, Ga element, Al element, Y element and lanthanoid element Ln in the oxide semiconductor thin-film, respectively.

The image sensor according to the above aspect of the invention, where the oxide semiconductor thin-film contains surface crystal grains whose main component is indium oxide, the surface crystal grains having a single crystal orientation.

The image sensor according to the above aspect of the invention, where the oxide semiconductor thin-film contains gallium element in a form of a solid solution in indium oxide, a ratio of indium element and gallium element to all of the metal atoms in the oxide semiconductor thin-film is 80 atom % or more, the oxide semiconductor thin-film contains a Bixbyite structure represented by $In_2O_3$, and the atomic composition ratio of the oxide semiconductor thin-film satisfies a formula (3-19) below, $$0.001 \leq Ga/(Ga+In) \leq 0.10 \qquad (3\text{-}19),$$

where In and Ga represent in the formula the number of atoms of In element and Ga element in the oxide semiconductor thin-film, respectively.

The above aspects of the invention provide a sintered oxide and a sputtering target made of a new oxide system, and an oxide semiconductor thin-film capable of exhibiting, when being used for a thin-film transistor (sometimes referred to as TFT hereinafter), excellent TFT performance.

It should be noted that the above description of the effect(s) does not exclude the presence of other effect(s). It is not necessary for an exemplary embodiment of the invention to exhibit all of the effect(s). It should be noted that the effect(s) other than the above would become self-evident, and can be extracted from the specification, drawing(s) and claim(s).

BRIEF DESCRIPTION OF DRAWING(S)

FIG. 20 is an enlarged illustration of a part of the transfer transistor shown in

FIG. 19.

Figure 21:
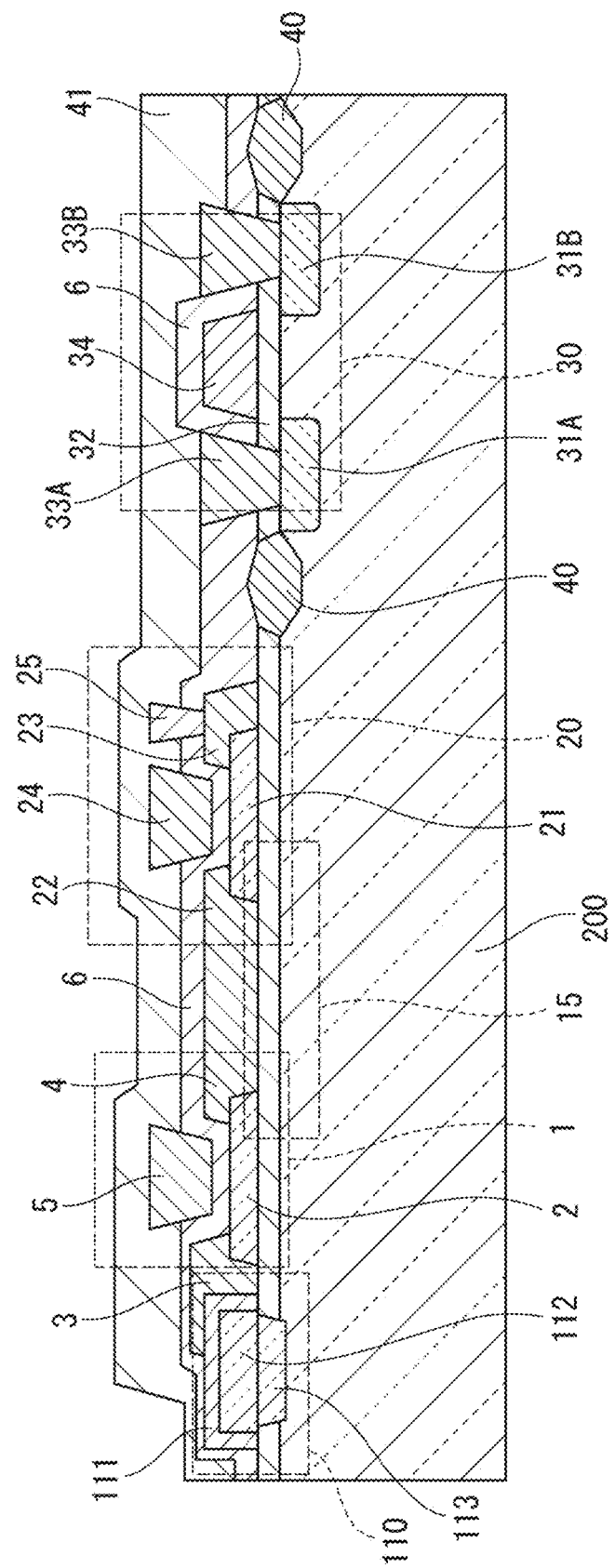

FIG. 21 is another vertical cross section of the unit cell of the image sensor according to the fourth exemplary embodiment, in which an organic diode is used as a photodiode.

Figure 22:
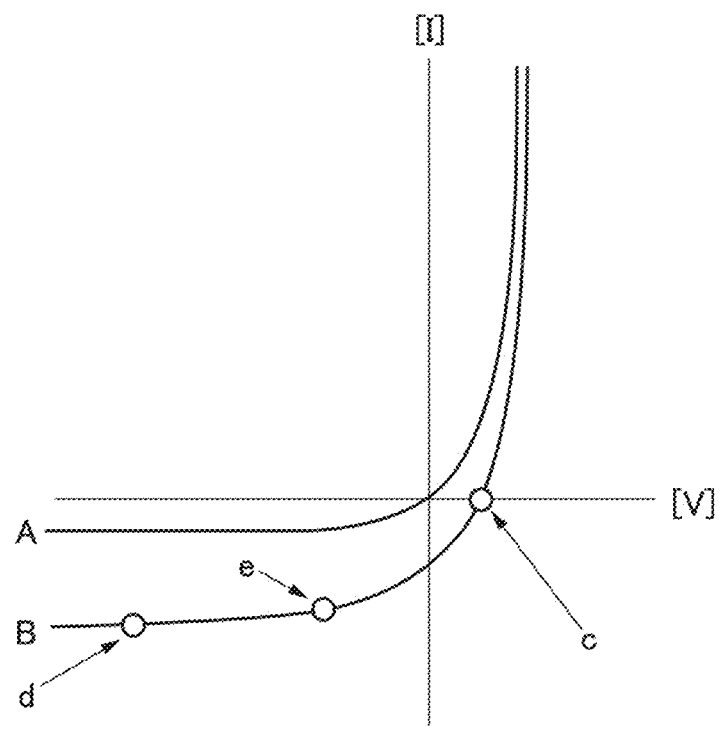

FIG. 22 illustrates an operation of a photodiode, showing a relationship between a current and voltage at an output.

Figure 23:
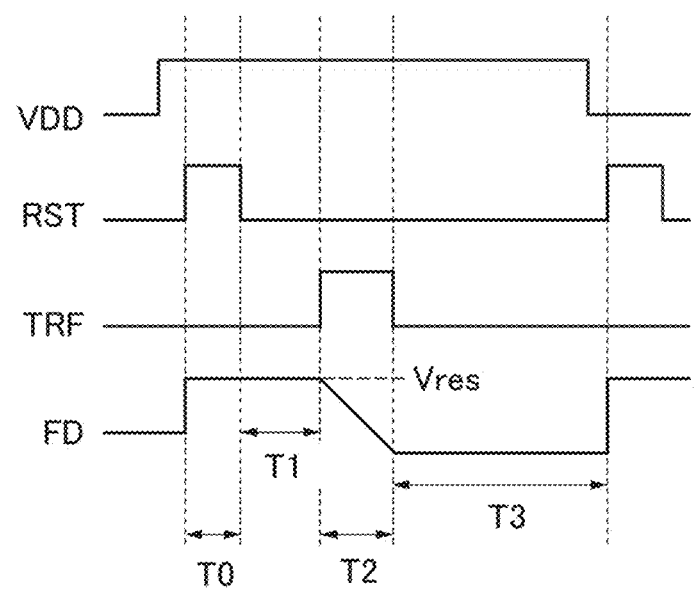

FIG. 23 is a timing chart showing an operation of the unit cell.

Figure 24:
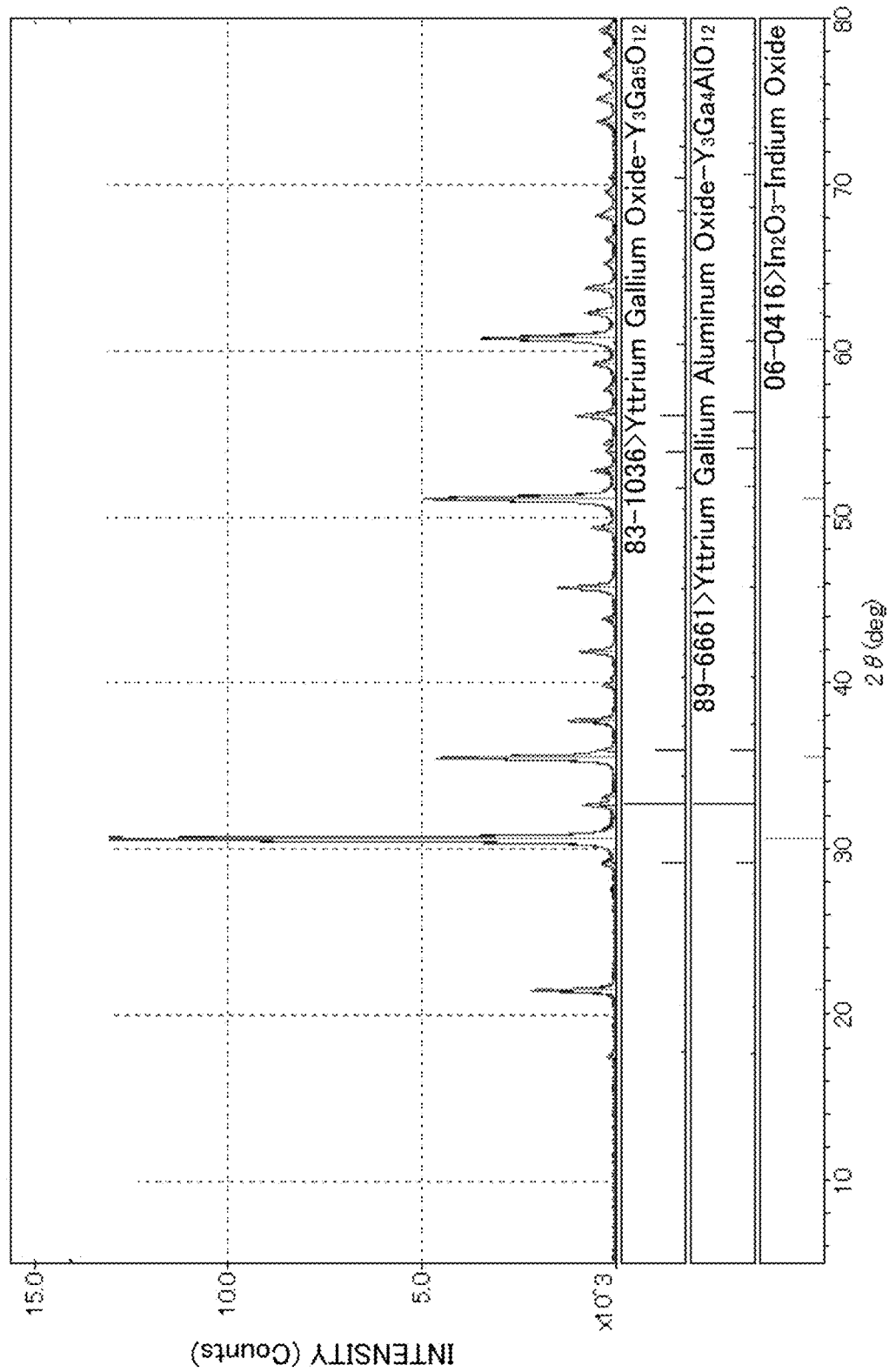

FIG. 24 is an XRD chart of a sintered oxide prepared in Example 1-1.

Figure 25:
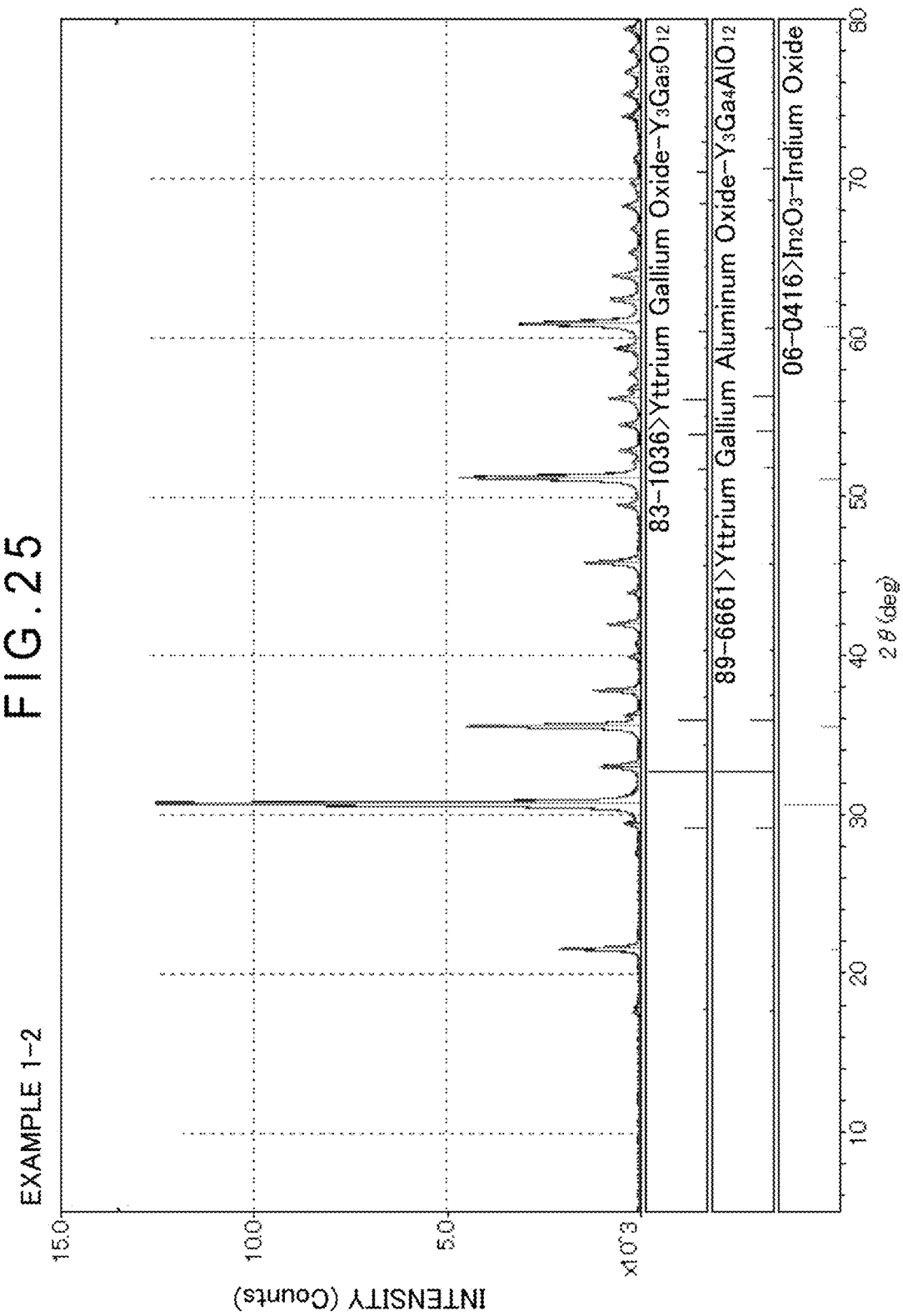

FIG. 25 is an XRD chart of a sintered oxide prepared in Example 1-2.

Figure 26:
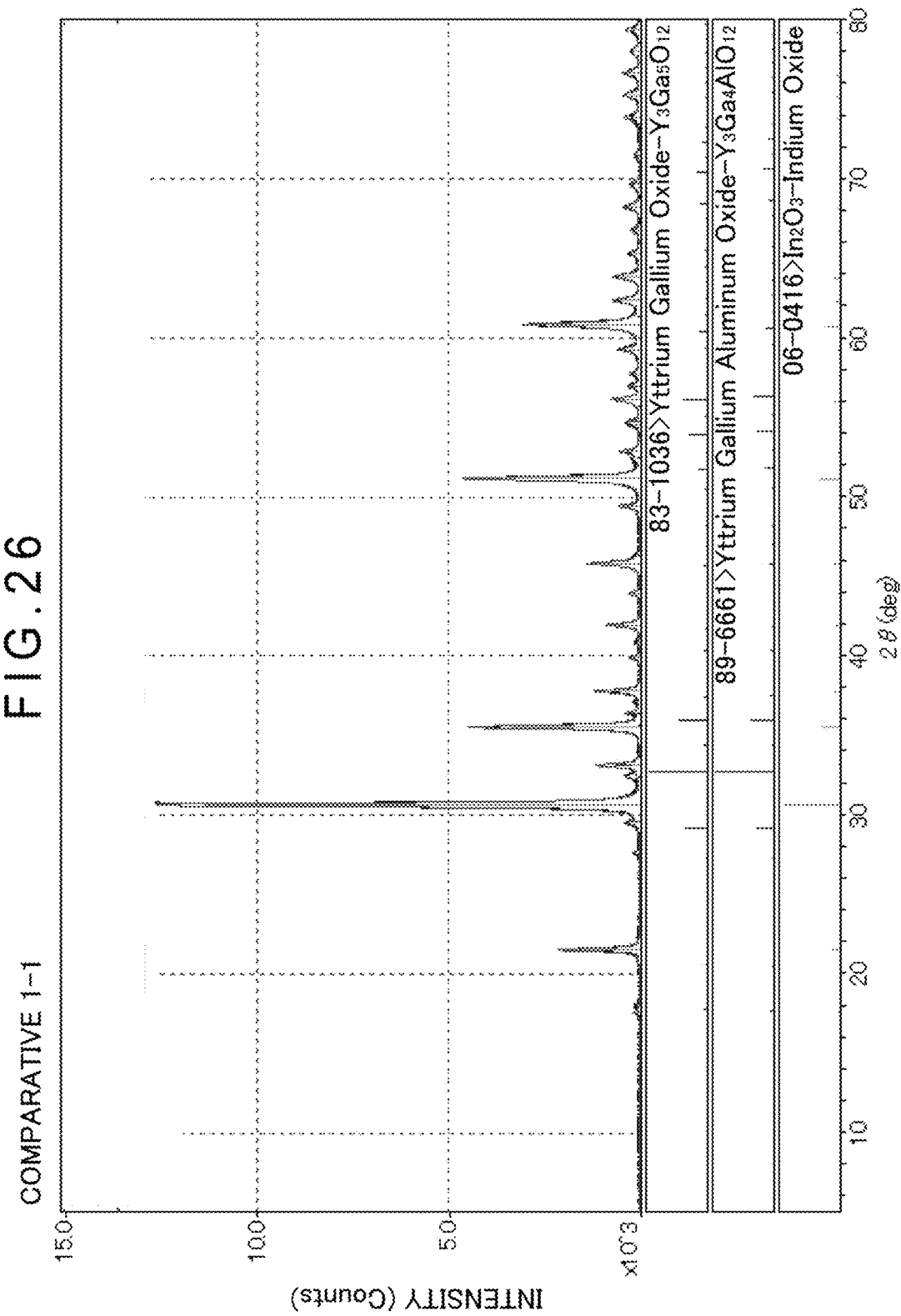

FIG. 26 is an XRD chart of a sintered oxide prepared in Comparative 1-1.

Figure 27:
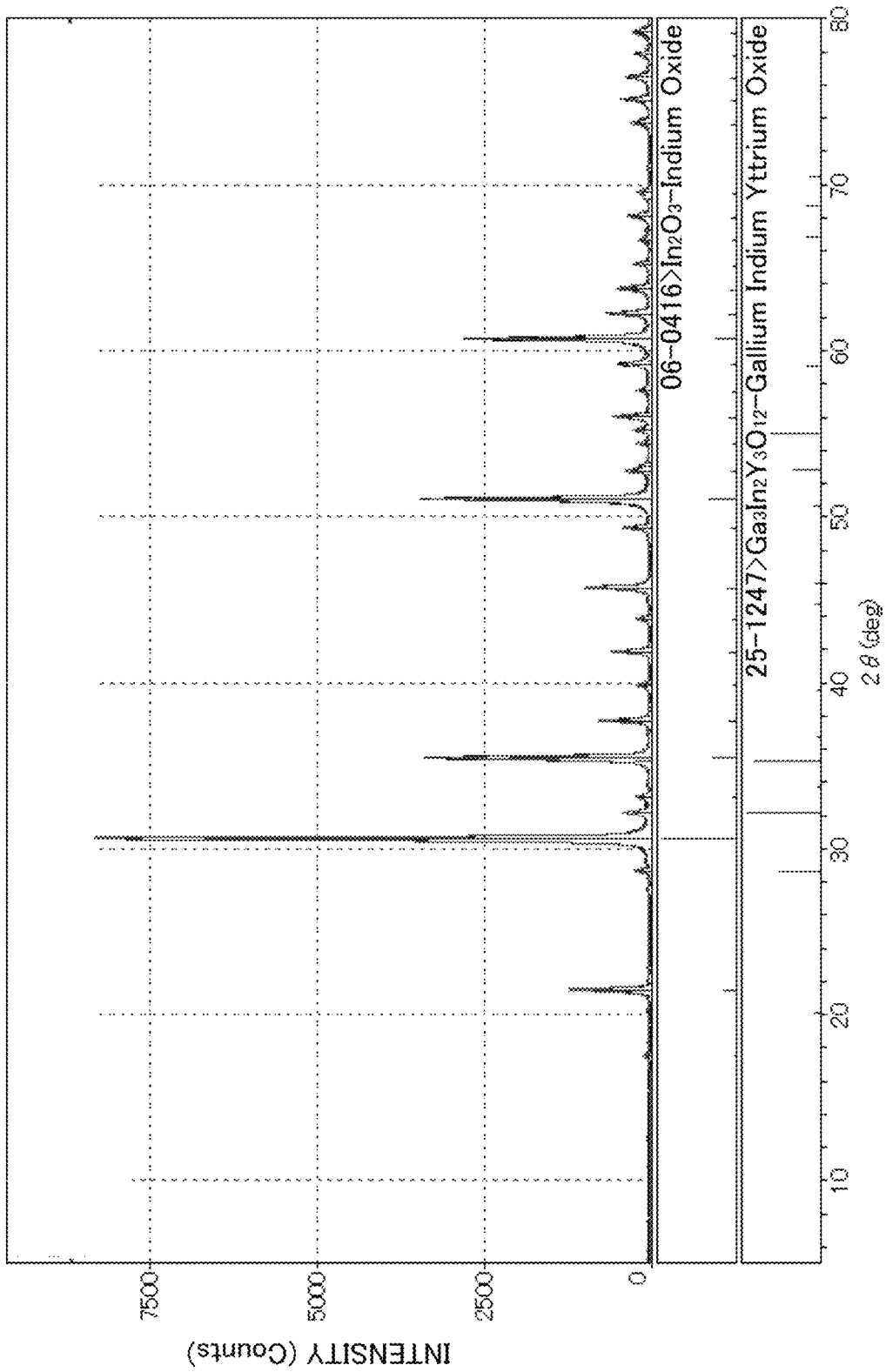

FIG. 27 is an XRD chart of a sintered oxide prepared in Comparative 1-2.

Figure 28:
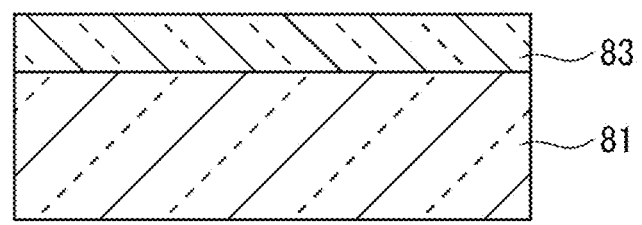

FIG. 28 is a vertical cross section showing an oxide semiconductor thin-film formed on a glass substrate.

Figure 29:
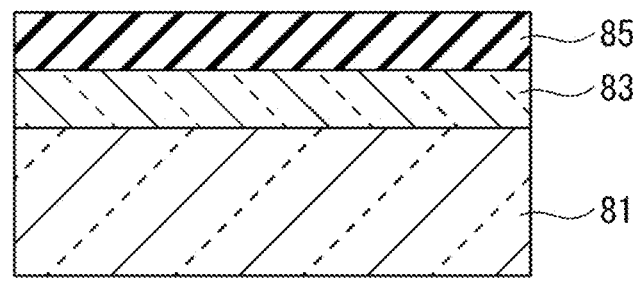

FIG. 29 illustrates an $SiO_2$ film formed on the oxide semiconductor thin-film shown in FIG. 28.

Figure 30:
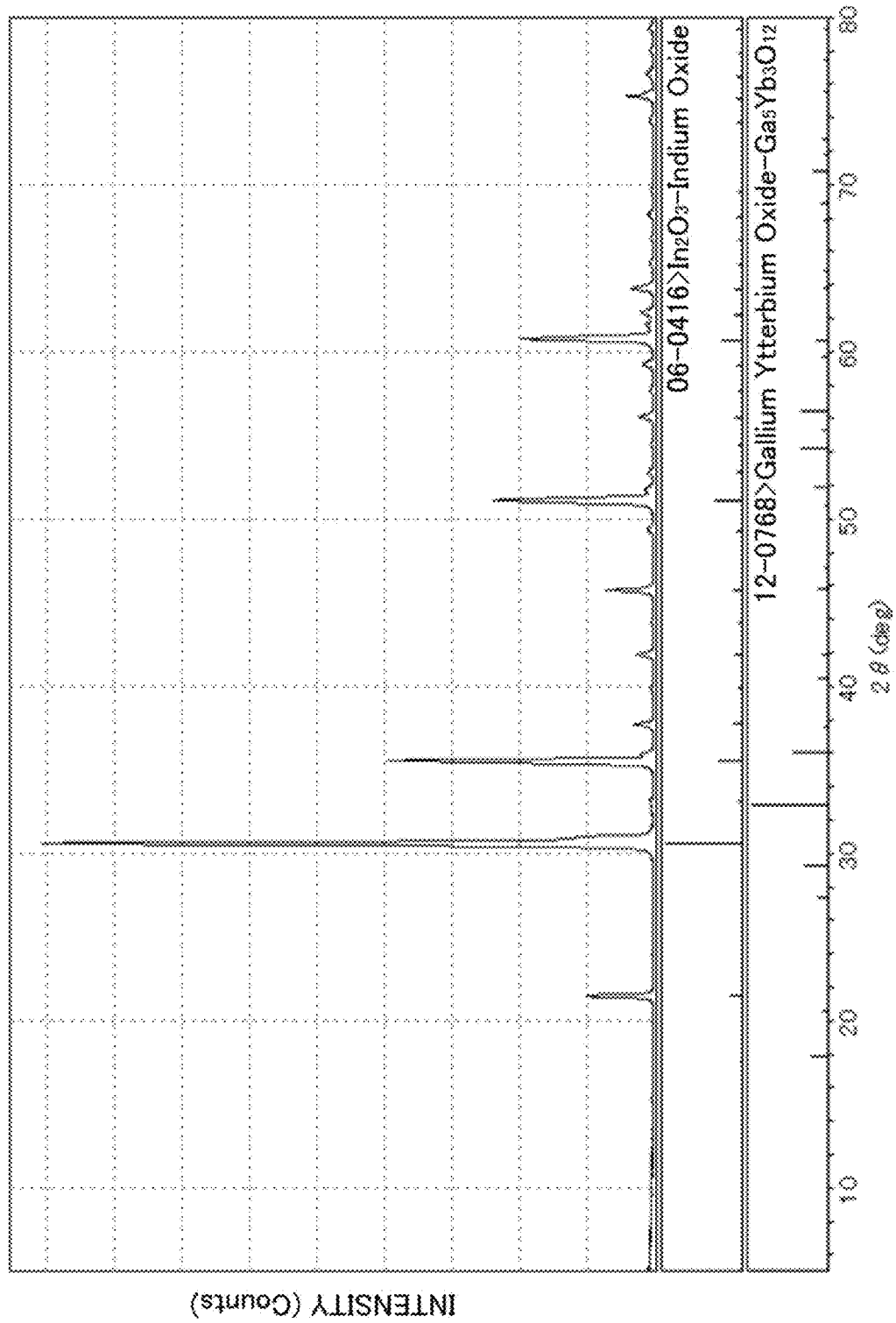

FIG. 30 is an XRD chart of a sintered oxide prepared in Example 2-1.

Figure 31:
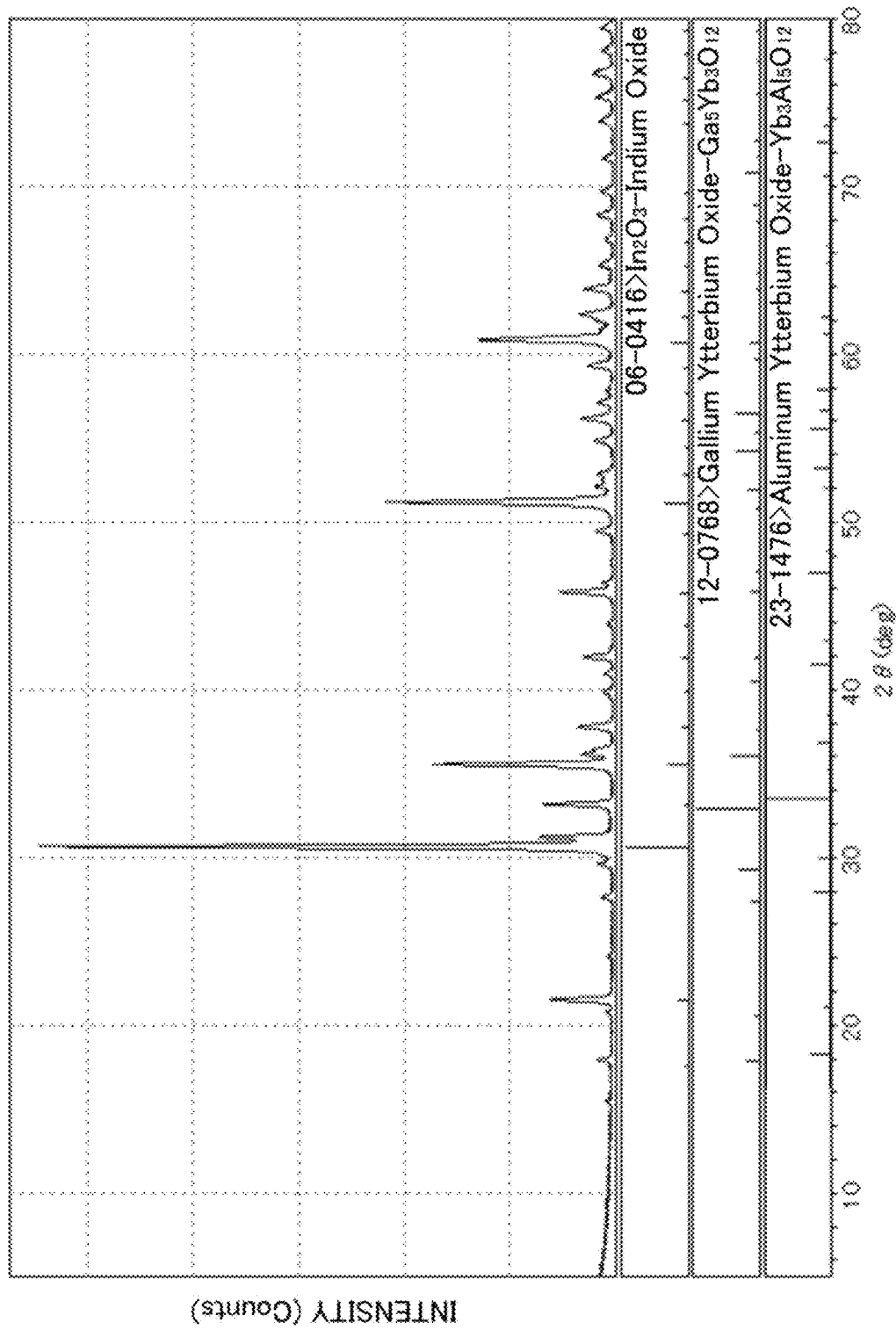

FIG. 31 is an XRD chart of a sintered oxide prepared in Example 2-2.

Figure 32:
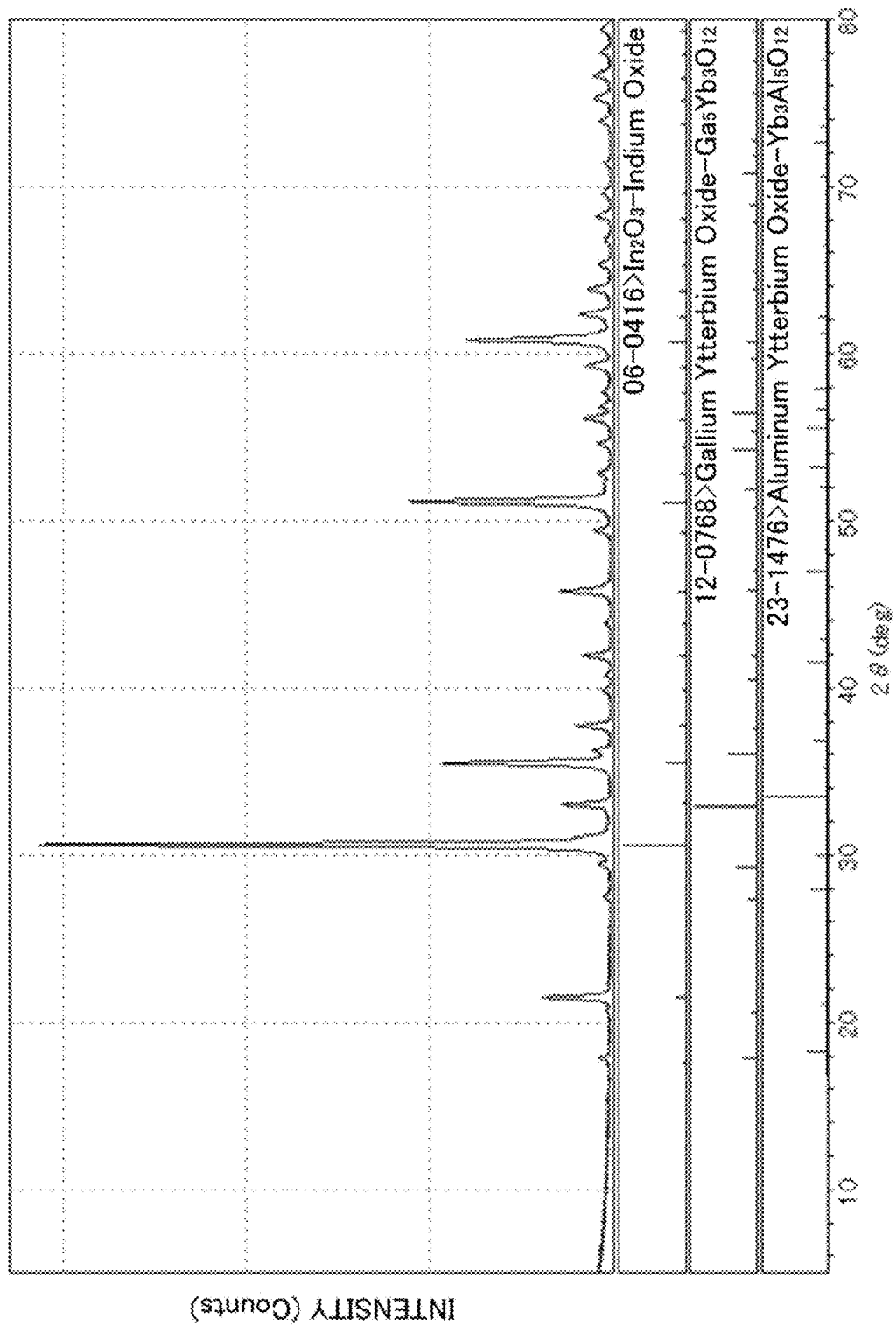

FIG. 32 is an XRD chart of a sintered oxide prepared in Example 2-3.

Figure 33:
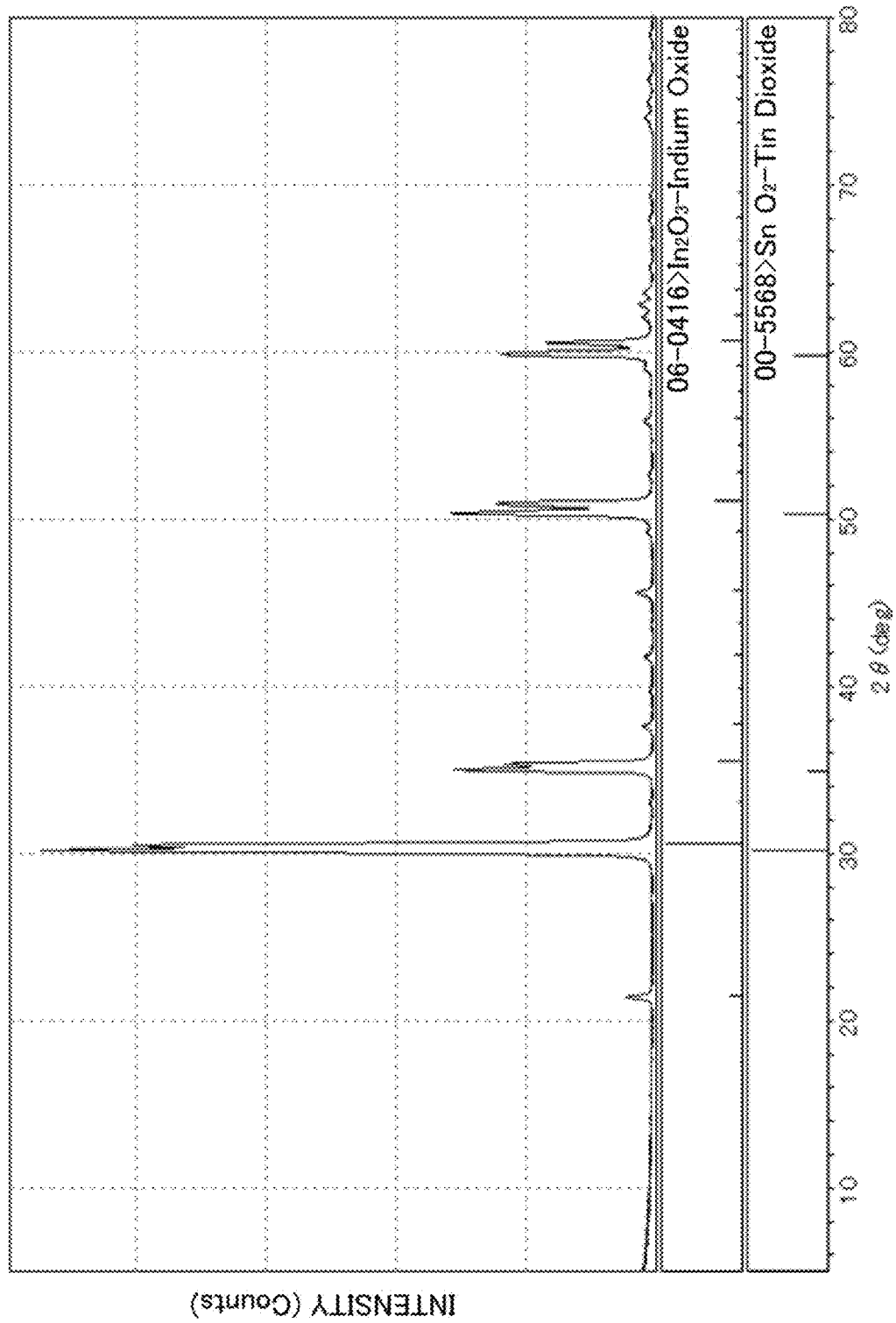

FIG. 33 is an XRD chart of a sintered oxide prepared in Example 2-4.

Figure 34:
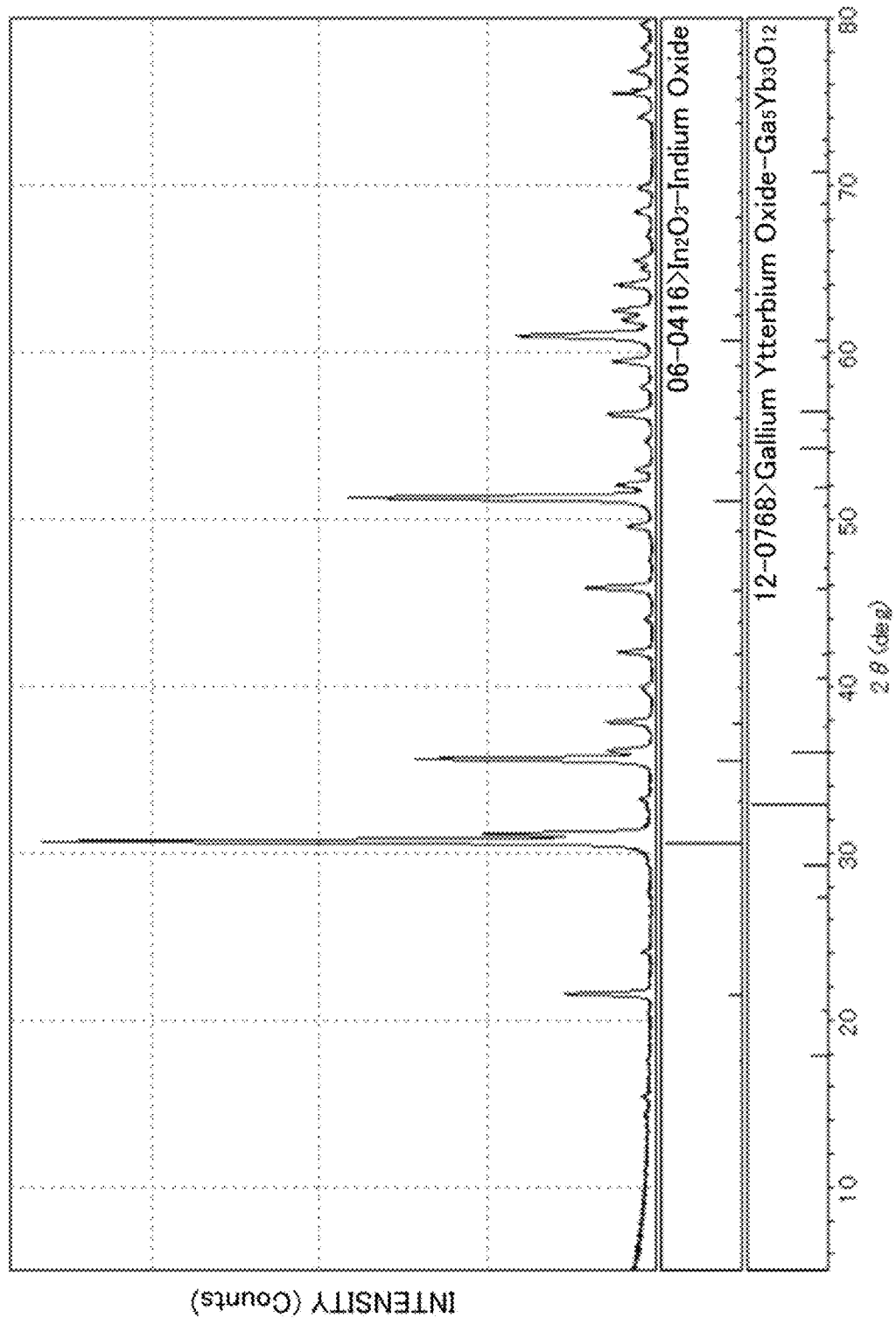

FIG. 34 is an XRD chart of a sintered oxide prepared in Example 2-5.

Figure 35:
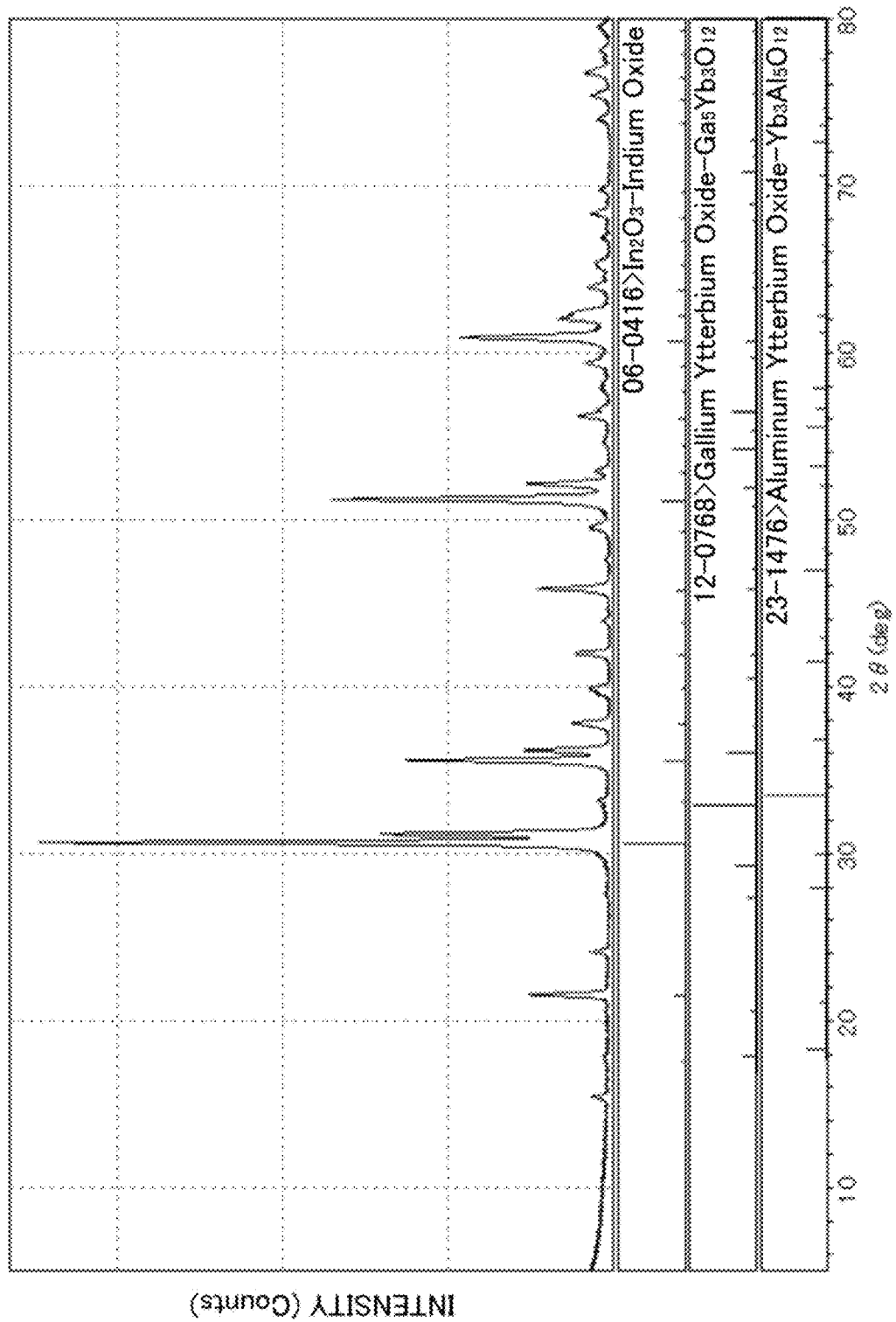

FIG. 35 is an XRD chart of a sintered oxide prepared in Example 2-6.

Figure 36:
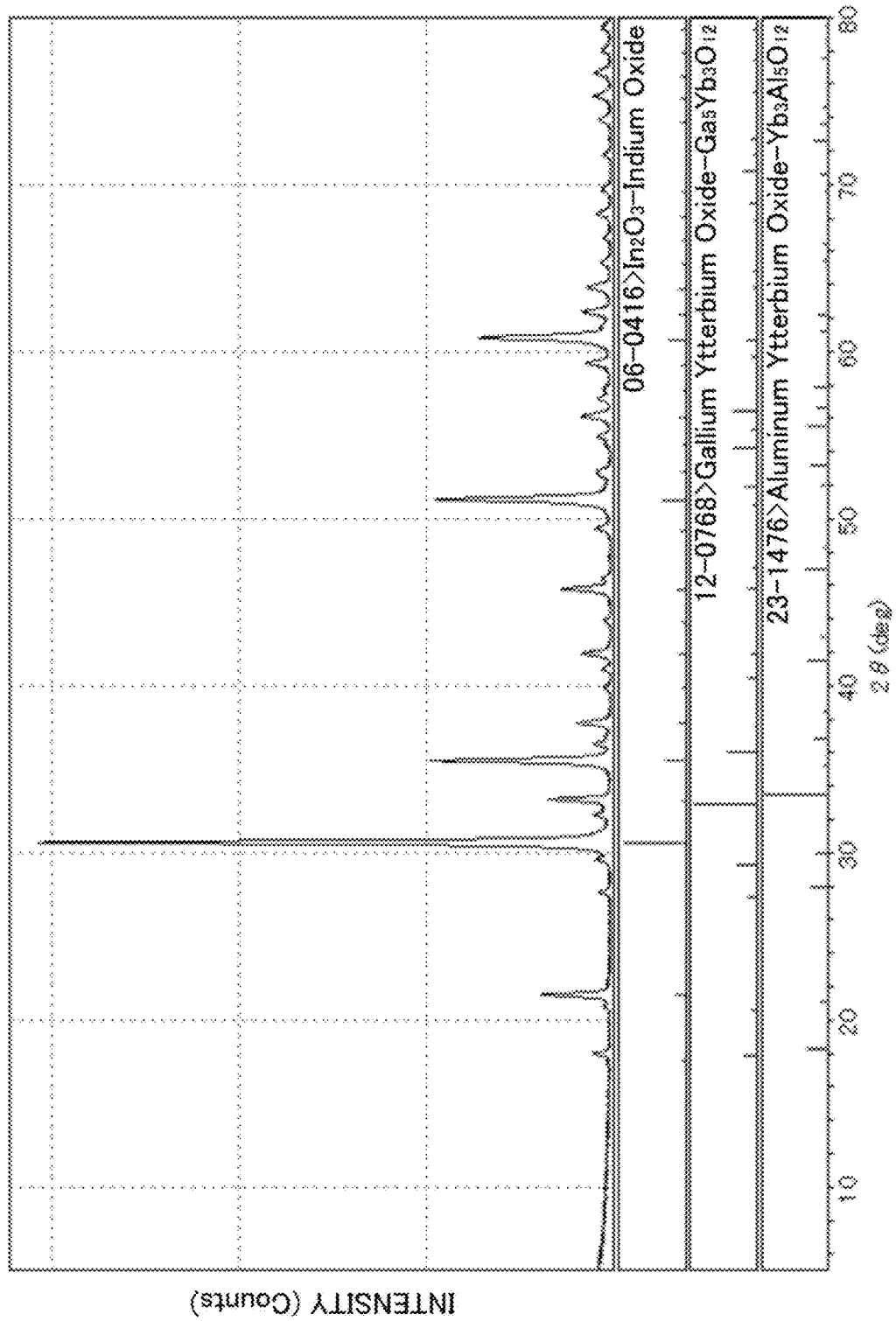

FIG. 36 is an XRD chart of a sintered oxide prepared in Example 2-7.

Figure 37:
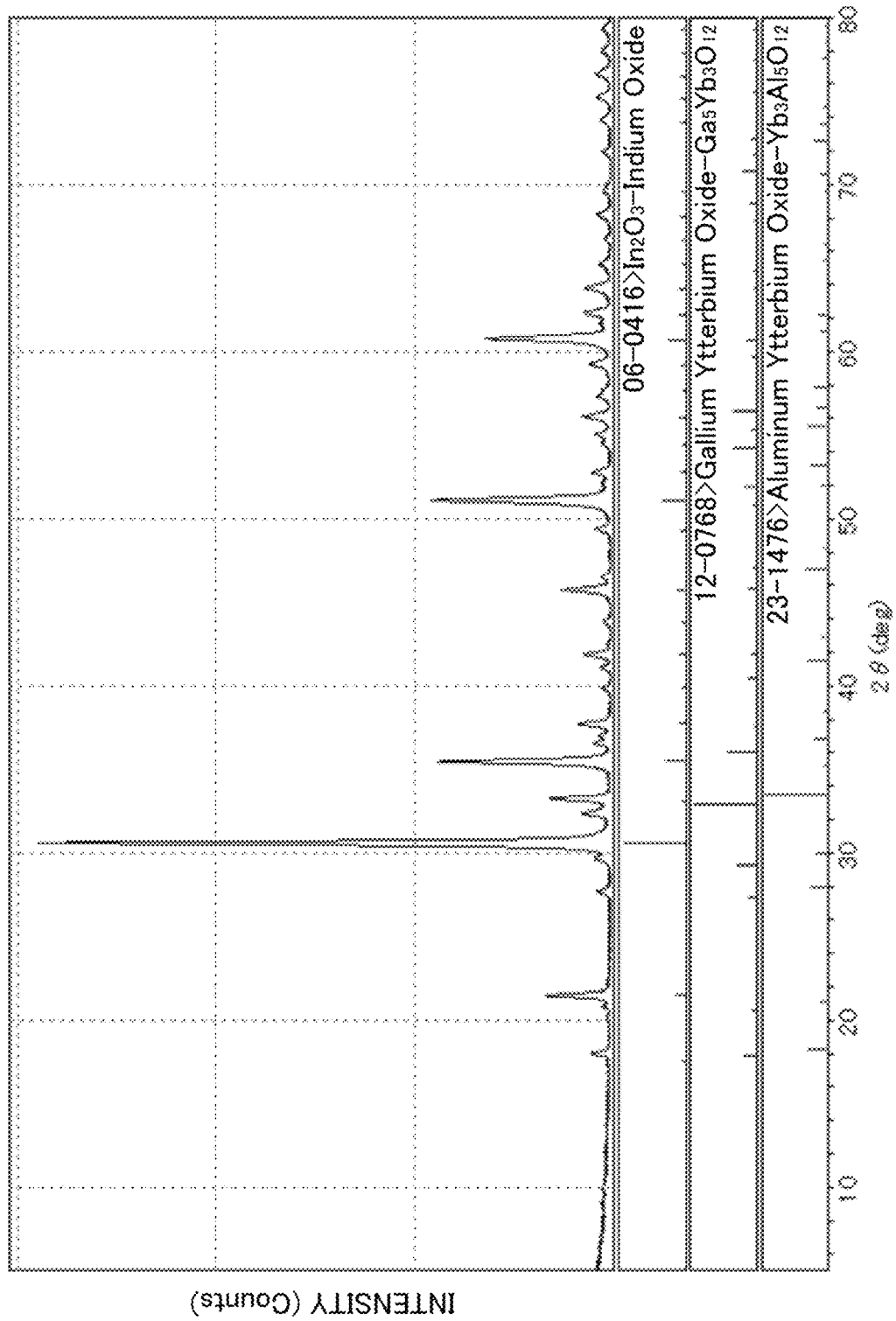

FIG. 37 is an XRD chart of a sintered oxide prepared in Example 2-8.

Figure 38:
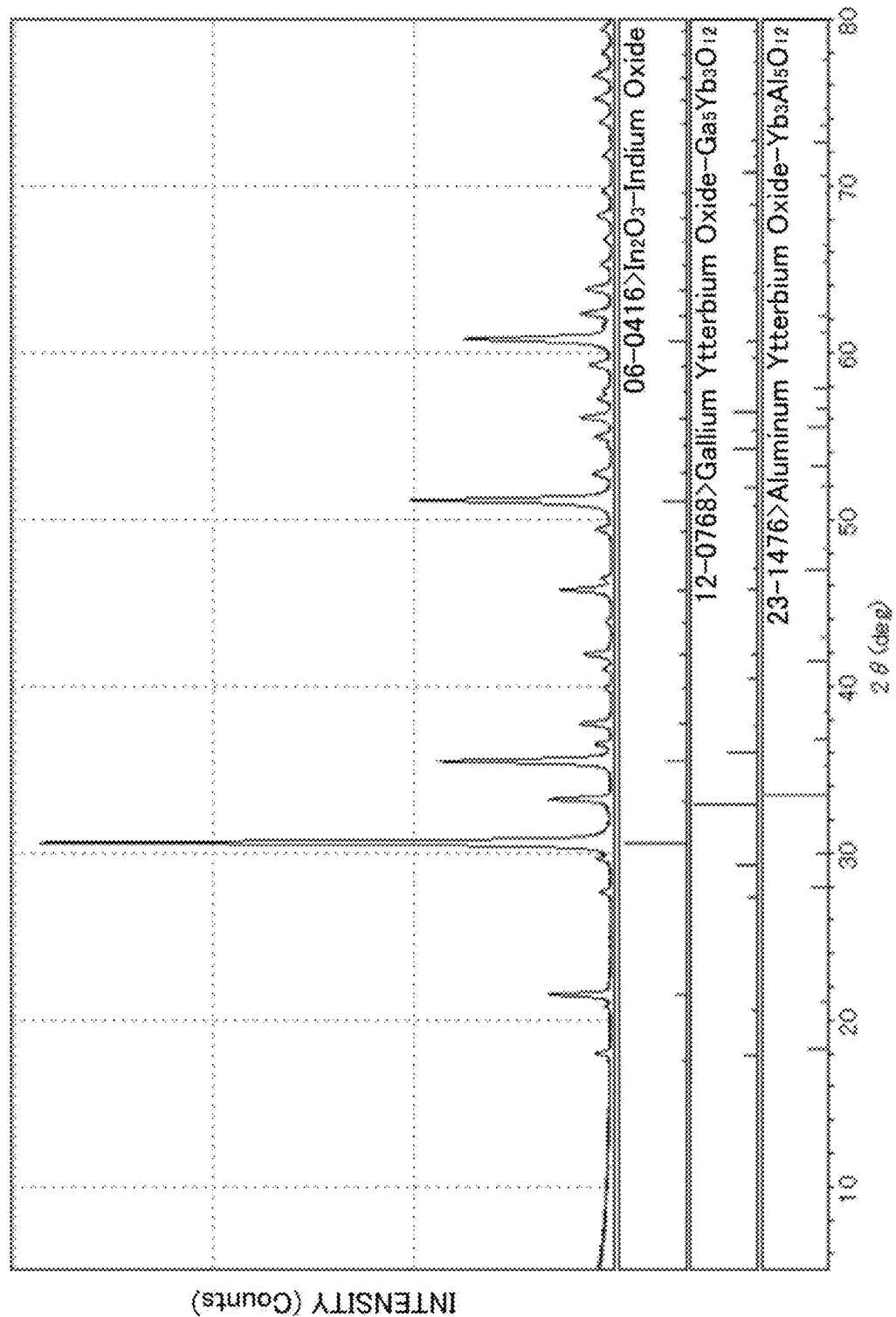

FIG. 38 is an XRD chart of a sintered oxide prepared in Example 2-9.

Figure 39:
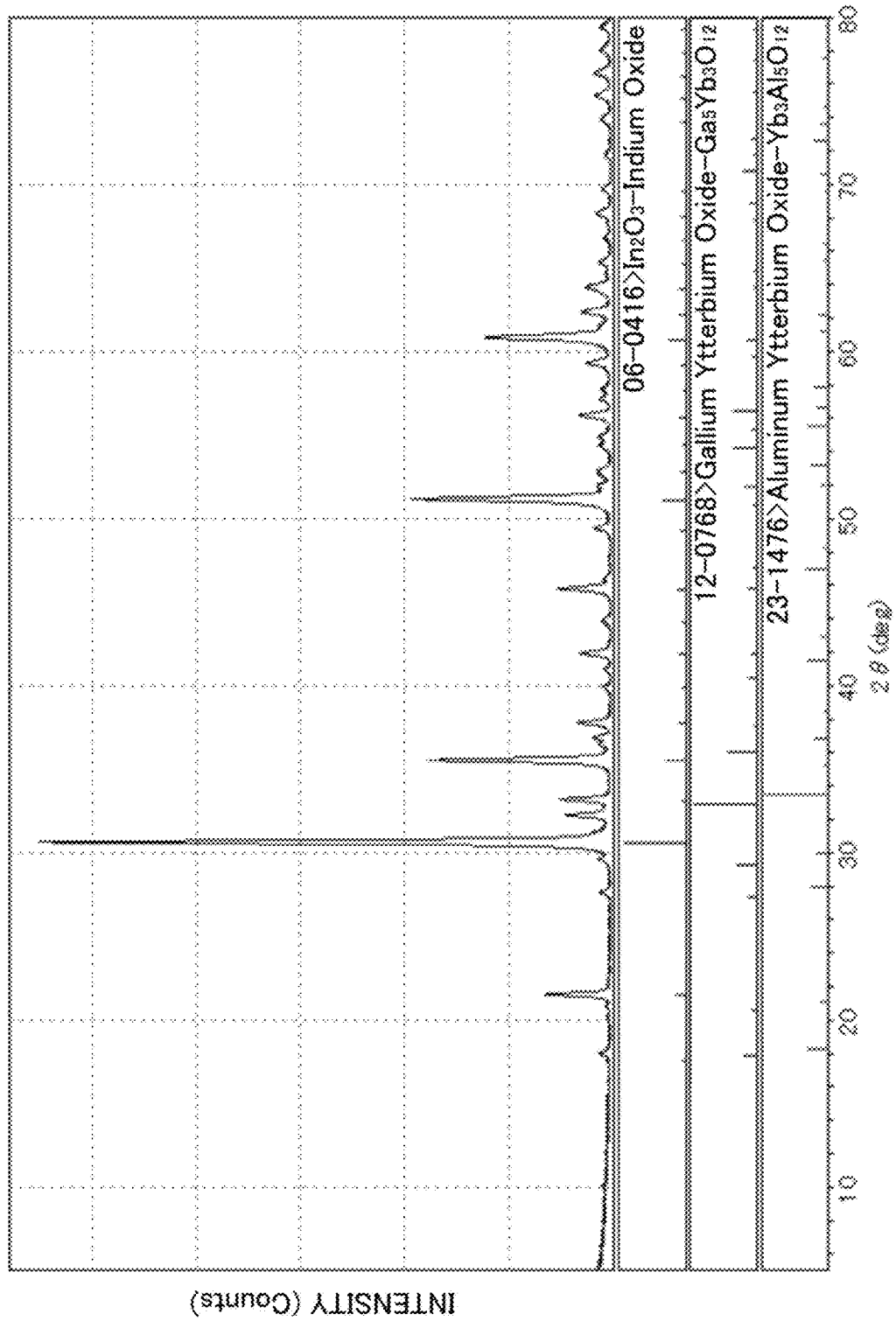

FIG. 39 is an XRD chart of a sintered oxide prepared in Example 2-10.

FIG. 40 is an XRD chart of a sintered oxide prepared in Example 2-11.

FIG. 41 is an XRD chart of a sintered oxide prepared in Example 2-12.

DESCRIPTION OF EMBODIMENT(S)

Exemplary embodiment(s) of the invention will be described below with reference to attached drawing(s). It should however be noted that it is easily understood by those skilled in the art that the exemplary embodiment(s) may be modified in various manners, as long as such modification and details are compatible with an object and scope of the invention. Accordingly, the scope of the invention should by no means be interpreted to be restricted to the disclosure in the exemplary embodiment(s) below.

Further, in the drawing(s), a size, a layer thickness, or a region is sometimes exaggerated for clarification. Thus, the scale of the drawing(s) is not necessarily limiting. It should be noted that the drawing(s) schematically shows an ideal example, and illustrated shape(s) and/or value(s) are not limited to those shown in the drawing(s).

Further, ordinals such as "first," "second," and "third," used in the specification are attached for avoiding confusion between components, and are not numerically limiting.

In the specification and the like, the term "electrically connected" encompasses a connection through "an object of some electric action." The "object of some electric action" is not limited to specific object as long as such an object allows communication of electric signals between connected components. Examples of the "object of some electric action" include an electrode, a line, a switching element such as a transistor, a resistor, an inductor, a capacitor, and devices having other function(s).

In the specification and the like, the term "film" or "thin-film" is sometimes interchangeable with the term "layer".

In the specification and the like, a source and a drain of a transistor are sometimes interchanged when, for instance, a transistor of different polarity is used or a direction of a current is changed during an operation of a circuit. Accordingly, the terms "source" and "drain" in the specification and the like are interchangeable.

Further, in a sintered oxide and an oxide semiconductor thin-film in the specification and the like, the term "compound" and the term "crystalline phase" are sometimes interchangeable.

A first exemplary embodiment will be described below.

BACKGROUND OF FIRST EXEMPLARY EMBODIMENT

Initially, a background of a first exemplary embodiment will be briefly described below.

A carrier mobility of a typical thin-film transistor using an oxide semiconductor thin-film formed through sputtering with the use of a sputtering target made of a sintered oxide produced by sintering indium oxide ($In_2O_3$), gallium oxide ($Ga_2O_3$), and yttrium oxide ($Y_2O_3$) is, though dependent on film-formation conditions of the semiconductor thin-film, approximately 25 cm$^2$/V·s when an oxygen concentration at the time of film-formation is approximately 1%, and 10 cm$^2$/V·s or less when an oxygen concentration at the time of film-formation is approximately 20%. Thus, TFT with higher carrier mobility has been desired.

In order to solve the above problem, the inventors have prepared a sintered oxide made of a material containing indium oxide ($In_2O_3$), yttrium oxide ($Y_2O_3$), and gallium oxide ($Ga_2O_3$), and added with aluminum oxide ($Al_2O_3$). The sintered oxide is ground to prepare a target material, which is bonded to a backing plate to produce a sputtering target. A thin-film formed with the use of the sputtering target is subjected to a CVD process and a heat treatment, where it is found that a thin-film transistor with high carrier mobility can be obtained. Further, it is also found that the aluminum oxide, which is insulative and is believed to raise bulk resistivity of the sintered oxide, lowers the bulk resistivity when being added at a predetermined compositional ratio, contrary to expectations.

The above is the background of the first exemplary embodiment.

Structure of Sintered Oxide

Next, a structure of a sintered oxide according to the first exemplary embodiment will be described below.

The sintered oxide according to an example of the first exemplary embodiment (referred to as a first sintered oxide in the first exemplary embodiment) contains:

In element, Y element, and Ga element at respective atomic ratios as defined in formulae (1-1) to (1-3) below, $$0.80 \leq \text{In}/(\text{In}+\text{Y}+\text{Ga}) \leq 0.96 \quad (1\text{-}1),$$

$$0.02 \leq \text{Y}/(\text{In}+\text{Y}+\text{Ga}) \leq 0.10 \quad (1\text{-}2), \text{and}$$

$$0.02 \leq \text{Ga}/(\text{In}+\text{Y}+\text{Ga}) \leq 0.15 \quad (1\text{-}3), \text{and}$$

Al element at an atomic ratio as defined in a formula (1-4) below, $$0.005 \leq \text{Al}/(\text{In}+\text{Y}+\text{Ga}+\text{Al}) \leq 0.07 \quad (1\text{-}4),$$

where In, Y, Ga, and Al in the formulae represent the number of atoms of the In element, Y element, Ga element, and Al element in the sintered oxide, respectively.

The sintered oxide containing In, Y, Ga, and Al elements at ratios satisfying the formulae (1-1) to (1-4) provides a target for producing an oxide semiconductor thin-film with a high carrier mobility and small change in properties during CVD process and the like. The reasons for adding each of the elements will be described below with reference to the oxide semiconductor thin-film.

It should be noted that the Al element contained at a ratio of the formula (1-4) lowers the bulk resistivity of the sintered oxide.

The first sintered oxide in the first exemplary embodiment preferably contains Ga element at an atomic ratio defined by a formula (1-5) below.

$$0.02 \leq \text{Ga}/(\text{In}+\text{Y}+\text{Ga}) \leq 0.10 \quad (1\text{-}5)$$

The first sintered oxide in the first exemplary embodiment more preferably contains:

In element, Y element, and Ga element at respective atomic ratios as defined in formulae (1-1A) to (1-3A) below, $$0.82 \leq \text{In}/(\text{In}+\text{Y}+\text{Ga}) \leq 0.94 \quad (1\text{-}1\text{A}),$$

$$0.03 \leq \text{Y}/(\text{In}+\text{Y}+\text{Ga}) \leq 0.09 \quad (1\text{-}2\text{A}), \text{and}$$

$$0.03 \leq \text{Ga}/(\text{In}+\text{Y}+\text{Ga}) \leq 0.09 \quad (1\text{-}3\text{A}), \text{and}$$

Al element at an atomic ratio as defined in a formula (1-4A) below, $$0.01 \leq \text{Al}/(\text{In}+\text{Y}+\text{Ga}+\text{Al}) \leq 0.06 \quad (1\text{-}4\text{A}).$$

The first sintered oxide in the first exemplary embodiment further preferably contains:

In element, Y element, and Ga element at respective atomic ratios as defined in formulae (1-1B) to (1-3B) below, $$0.84 \leq \text{In}/(\text{In}+\text{Y}+\text{Ga}) \leq 0.92 \quad (1\text{-}1\text{B}),$$

$$0.04 \leq \text{Y}/(\text{In}+\text{Y}+\text{Ga}) \leq 0.08 \quad (1\text{-}2\text{B}), \text{and}$$

$$0.04 \leq \text{Ga}/(\text{In}+\text{Y}+\text{Ga}) \leq 0.08 \quad (1\text{-}3\text{B}), \text{and}$$

Al element at an atomic ratio as defined in a formula (1-4B) below, $$0.01 \leq \text{Al}/(\text{In}+\text{Y}+\text{Ga}+\text{Al}) \leq 0.06 \quad (1\text{-}4\text{B}).$$

The first sintered oxide in the first exemplary embodiment may essentially consist of indium (In) element, yttrium (Y) element, gallium (Ga) element, aluminum (Al) element and oxygen (O) element. In this case, inevitable impurities may be contained. For instance, 70 mass % or more, 80 mass % or more, or 90 mass % or more of the sintered oxide in the exemplary embodiment(s) of the invention may consist of indium (In) element, yttrium (Y) element, gallium (Ga) element, aluminum (Al) element and oxygen (O) element. The sintered oxide in the exemplary embodiment(s) of the invention may consist solely of indium (In) element, yttrium (Y) element, gallium (Ga) element, aluminum (Al) element and oxygen (O) element. It should be noted that the inevitable impurities herein mean an element(s) that is not intentionally added but are mixed in a material or during a production process. The same applies to the description below.

Examples of the inevitable impurities include alkali metal, alkaline earth metal (e.g. Li, Na, K, Rb, Mg, Ca, Sr, Ba), hydrogen (H) element, boron (B) element, carbon (C) element, nitrogen (N) element, fluorine (F) element, silicon (Si) element, and chlorine (Cl) element.

The first sintered oxide in the first exemplary embodiment preferably contains an oxide of a positive tetravalent or more polyvalent metal element X at an atomic ratio defined by a formula (1-6) below.

$$0.00005 \leq \text{X}/(\text{In}+\text{Y}+\text{Ga}+\text{Al}+\text{X}) \leq 0.005 \quad (1\text{-}6),$$

where X represents the number of atoms of the X element in the sintered oxide.

The oxide of the positive tetravalent or more polyvalent metal element X contained in the sintered oxide reduces the bulk resistivity of the sintered oxide and prevents cracks in the target when the target is heated by plasma during a sputtering process. The positive tetravalent or more polyvalent metal X for the oxide is selectable from among X=Si, Ge, Sn, Ti, Zr, Hf, Ce, W and the like.

The oxide of the positive tetravalent or more polyvalent metal element X is preferably at least one metal oxide selected from $SnO_2$ and $CeO_2$.

The first sintered oxide in the first exemplary embodiment preferably contains the oxide of the positive tetravalent or more polyvalent metal element X at an atomic ratio defined by a formula (1-6A) below.

$$0.00008 \leq \text{X}/(\text{In}+\text{Y}+\text{Ga}+\text{Al}+\text{X}) \leq 0.003 \quad (1\text{-}6\text{A})$$

An atomic ratio as defined by a formula (1-6B) below is further preferable.

$$0.0001 \leq \text{X}/(\text{In}+\text{Y}+\text{Ga}+\text{Al}+\text{X}) \leq 0.001 \quad (1\text{-}6\text{B})$$

The first sintered oxide in the first exemplary embodiment preferably contains a Bixbyite crystalline phase represented by $In_2O_3$ and at least one of $Y_3Ga_5O_{12}$ crystalline phase and $Y_3Ga_4AlO_{12}$ crystalline phase.

A sintered oxide according to another example of the first exemplary embodiment (referred to as a second sintered oxide in the first exemplary embodiment hereinafter) is a sintered oxide, whose main constituent elements are In, Y, Ga, Al, and O, including a Bixbyite crystalline phase represented by $In_2O_3$ and at least one of $Y_3Ga_5O_{12}$ crystalline phase and $Y_3Ga_4AlO_{12}$ crystalline phase.

The atomic ratio composition of the second sintered oxide in the first exemplary embodiment is not limited to those in the first sintered oxide. A sintered oxide whose atomic ratio composition falls outside the definition of the first oxide is still the second sintered oxide as long as the sintered oxide contains the Bixbyite crystalline phase represented by $In_2O_3$ and the at least one of $Y_3Ga_5O_{12}$ crystalline phase and $Y_3Ga_4AlO_{12}$ crystalline phase.

The phrase "whose main constituent elements are In, Y, Ga, Al, and O" for the second sintered oxide in the exemplary embodiment means that the second sintered oxide may essentially consist of indium (In) element, yttrium (Y) element, gallium (Ga) element, aluminum (Al) element, and oxygen (O) element, for instance, 70 mass % or more, 80 mass % or more, or 90 mass % or more of the second sintered oxide may consist of indium (In) element, yttrium (Y) element, gallium (Ga) element, aluminum (Al) element and oxygen (O) element, or the second sintered oxide consists of indium (In) element, yttrium (Y) element, gallium (Ga) element, aluminum (Al) element, oxygen (O) element, and a balance in a form of the inevitable impurities.

Examples of the inevitable impurities are as described above.

The first sintered oxide in the first exemplary embodiment is produced by: mixing indium oxide ($In_2O_3$), yttrium oxide ($Y_2O_3$), and gallium oxide ($Ga_2O_3$) so that the ratios of In element, Y element, and Ga element satisfy the atomic ratios defined by formulae (1-1) to (1-3) below, $$0.80 \leq In/(In+Y+Ga) \leq 0.96 \quad (1\text{-}1),$$

$$0.02 \leq Y/(In+Y+Ga) \leq 0.10 \quad (1\text{-}2), \text{ and}$$

$$0.02 \leq Ga/(In+Y+Ga) \leq 0.15 \quad (1\text{-}3);$$

further mixing aluminum oxide ($Al_2O_3$) so that the atomic ratio of the Al element satisfies the definition of a formula (1-4) below, $$0.005 \leq Al/(In+Y+Ga+Al) \leq 0.07 \quad (1\text{-}4); \text{ and}$$

sintering the mixed material.

The first and second sintered oxides in the first exemplary embodiment can be produced by sintering a material prepared by mixing indium oxide ($In_2O_3$), yttrium oxide ($Y_2O_3$), gallium oxide ($Ga_2O_3$), and aluminum oxide ($Al_2O_3$). A sintered oxide containing the Bixbyite crystalline phase represented by $In_2O_3$ and the at least one of $Y_3Ga_5O_{12}$ crystalline phase and $Y_3Ga_4AlO_{12}$ crystalline phase is the second sintered oxide of the invention.

The first sintered oxide in the first exemplary embodiment preferably contains a Bixbyite crystalline phase represented by $In_2O_3$ and at least one of $Y_3Ga_5O_{12}$ crystalline phase and $Y_3Ga_4AlO_{12}$ crystalline phase. The $Y_3Ga_5O_{12}$ crystalline phase and/or the $Y_3Ga_4AlO_{12}$ crystalline phase in the first sintered oxide densifies the structure of the sintered oxide.

A sintered oxide according to still another example of the first exemplary embodiment (referred to as a third sintered oxide in the first exemplary embodiment hereinafter) is a sintered oxide, whose main constituent elements are In, Y, Ga, Al, a positive tetravalent metal element, and O, including a Bixbyite crystalline phase represented by $In_2O_3$ and $Y_3Ga_4O_{12}$ crystalline phase.

The composition of the third sintered oxide is not limited to those in the first and second sintered oxide.

The phrase "whose main constituent elements are In, Y, Ga, Al, positive tetravalent metal, and O" for the third sintered oxide in the first exemplary embodiment means that: the third sintered oxide may essentially consist of indium (In) element, yttrium (Y) element, gallium (Ga) element, aluminum (Al) element, positive tetravalent metal element, and oxygen (O) element; for instance, 70 mass % or more, 80 mass % or more, or 90 mass % or more of the third sintered oxide may consist of indium (In) element, yttrium (Y) element, gallium (Ga) element, aluminum (Al) element, positive tetravalent metal element, and oxygen (O) element; or the third sintered oxide consists of indium (In) element, yttrium (Y) element, gallium (Ga) element, aluminum (Al) element, the positive tetravalent metal element, oxygen (O) element, and a balance in a form of inevitable impurities.

Examples of the inevitable impurities are as described above.

The third sintered oxide in the first exemplary embodiment is produced by: mixing indium oxide ($In_2O_3$), yttrium oxide ($Y_2O_3$), and gallium oxide ($Ga_2O_3$) so that the ratios of In element, Y element, and Ga element satisfy the atomic ratios defined by formulae (1) to (3) below, $$0.80 \leq In/(In+Y+Ga) \leq 0.96 \quad (1\text{-}1),$$

$$0.02 \leq Y/(In+Y+Ga) \leq 0.10 \quad (1\text{-}2), \text{ and}$$

$$0.02 \leq Ga/(In+Y+Ga) \leq 0.15 \quad (1\text{-}3);$$

mixing aluminum oxide ($Al_2O_3$) so that the atomic ratio of the Al element satisfies the definition of a formula (1-4) below, $$0.005 \leq Al/(In+Y+Ga+Al) \leq 0.07 \quad (1\text{-}4);$$

mixing the oxide of positive tetravalent or more polyvalent metal element X at an atomic ratio as defined in a formula (1-6) below, $$0.00005 \leq X/(In+Y+Ga+Al+X) \leq 0.005 \quad (1\text{-}6); \text{ and}$$

sintering the mixed material.

The third sintered oxide in the first exemplary embodiment can be produced by, for instance, sintering a material prepared by mixing indium oxide ($In_2O_3$), yttrium oxide ($Y_2O_3$), gallium oxide ($Ga_2O_3$), aluminum oxide ($Al_2O_3$), and tin oxide ($SnO_2$). A sintered oxide containing both of the Bixbyite crystalline phase represented by $In_2O_3$ and the $Y_3Ga_4AlO_{12}$ crystalline phase is the third sintered oxide in the first exemplary embodiment.

A relative density of each of the first to third sintered oxides in the first exemplary embodiment is preferably 95% or more. At a relative density of 95% or more, the sintered oxide and the target can be stably produced without being broken or cracked during the production process. The relative density is preferably 96% or more, more preferably 97% or more, further preferably 98% or more. The relative density of the sintered oxide can be determined through a method described in Examples.

The sintered oxide of the invention including the Bixbyite crystalline phase represented by $In_2O_3$ and at least one of $Y_3Ga_5O_{12}$ crystalline phase and $Y_3Ga_4AlO_{12}$ crystalline phase is especially preferable in that the relative density is likely to be 95% or more.

A bulk resistivity of each of the first to third sintered oxides in the first exemplary embodiment is preferably 30 mΩ·cm or less. At the bulk resistivity of more than 30 mΩ·cm, abnormal electrical discharge may be induced. Further, with the low electrical conductivity, which results in low thermal conductivity, may cause hairline cracks or breakage of the target due to thermal stress when the surface of the target is heated during the sputtering process.

The first to third sintered oxides in the first exemplary embodiment are as described above.

Next, a production method of the first to third sintered oxides in the first exemplary embodiment will be described below.

The production method, which is not particularly limited as long as the sintered oxide according to the first exemplary embodiment of the invention is producible, may exemplarily include the following steps (a) to (c).

(a) Preparing a mixture by mixing material compound powders (b) Preparing a molding body by molding the mixture (c) Sintering the molding body (1) Step (a): Mixing Step In a mixing step, the material of the sintered oxide is mixed.

In compound powder, Y compound powder, Ga compound powder, and Al compound powder are used as the material. Positive tetravalent metal oxide powder, when the positive tetravalent metal oxide is added, is also used. Examples of the Al compound include aluminum oxide, and aluminum hydroxide. Examples of the Y and Ga compounds include Y and Ga oxides. In terms of adaptability to sintering and unlikelihood of a residual by-product, all of these compound powders are preferably oxides.

The purity of the material is usually 2N (99 mass %) or more, preferably 3N (99.9 mass %) or more, especially preferably 4N (99.99 mass %) or more. At the purity of 2N or more, the durability of the sintered oxide can be ensured. Further, the impurities are less likely to be segregated in the oxide semiconductor film when the sintered oxide is used for a liquid crystal display, and less likely to enter a gate insulating film and/or an interlayer insulating film to cause operation failure and/or burn-in in the oxide semiconductor.

An average particle size of the material powder is preferably 0.1 μm or more and 2 μm or less, more preferably 0.5 μm or more and 1.5 μm or less. The average particle size of the material powder is measurable using a laser diffraction particle size analyzer or the like.

The method for mixing and molding the material is not particularly limited (i.e. the material may be mixed and molded in any known manner). A binder may be added to the material mixture when the material is mixed.

The material may be mixed using a known apparatus such as a ball mill, bead mill, jet mill, and ultrasonic devices. Conditions for the mixing (e.g. pulverization time) may be determined as required. The pulverization time is preferably in a range from 6 hours to 100 hours.

(2) Step (b): Molding Step

In the molding step, the material mixture (pre-sintered product when the pre-sintering step is conducted) is molded under pressure to form a molding body. Through this step, the material is formed into a shape suitable as a target. When the pre-sintering step is conducted, the resultant particles of the pre-sintered product are pelletized and are subsequently pressed into a desired shape.

An average thickness of the molding body is preferably 5.5 mm or more, more preferably 6 mm or more, further preferably 8 mm or more, and especially preferably 12 mm or more. At the thickness of 5.5 mm or more, a temperature gradient in the thickness direction of the molding body is reduced, so that it is expectable that a change in the combination of crystal types at the surface and a depth part of the molding body is unlikely to occur.

Examples of the molding process usable in the molding step include press molding (uniaxial press), die molding, casting, and injection molding. It is preferable to mold the material using CIP (Cold Isostatic Pressing) in order to obtain a sintered oxide (target) with a high sintering density.

Two or more molding steps may be conducted, where, for instance, the material is subjected to CIP (Cold Isostatic Pressing), HIP (Hot Isostatic Pressing) or the like after press molding (uniaxial press).

When a CIP or HIP machine is used, a surface pressure is preferably kept at 78.5 MPa (in terms of SI unit equivalent to 800 kgf/cm$^2$) or more and 392.4 MPa (in terms of SI unit equivalent to 4000 kgf/cm$^2$) for 0.5 minutes or more and 60 minutes or less. The surface pressure is preferably 196.2 MPa or more and 294.3 MPa or less and is preferably kept for 2 minutes or more and 30 minutes or less. Within the above range, it is expectable that unevenness in composition or the like inside the molding body is reduced (i.e. the composition is uniformed). At the surface pressure of 78.5 MPa or more, the density after sintering and, consequently, the resistance of the sintered oxide are reduced. At the surface pressure of 392.4 MPa or less, the material can be molded without increasing the size of the molding machine. At a holding time of 0.5 minutes or more, the density and resistance can be kept from being raised after sintering. The holding time of 60 minutes or less is not too time-consuming to be economical.

In the molding process, a molding aid such as polyvinyl alcohol, methyl cellulose, polywax, and oleic acid may be used.

(3) Step (c): Sintering Step

The sintering step is an indispensable step for sintering the molding body obtained in the molding step.

The sintering temperature is preferably in a range from 1200 degrees C. to 1650 degrees C., more preferably from 1350 degrees C. to 1600 degrees C., further preferably from 1400 degrees C. to 1600 degrees C., furthermore preferably from 1450 degrees C. to 1600 degrees C.

The sintering time is preferably in a range from 10 hours to 50 hours, more preferably from 12 hours to 40 hours, further preferably from 13 hours to 30 hours.

At the sintering temperature of 1200 degrees C. or more and the sintering time of 10 hours or more, the target is so sufficiently sintered that the electric resistance of the target is sufficiently lowered and the abnormal electrical discharge is unlikely to occur. At the sintering temperature of 1650 degrees C. or less and the sintering time of 50 hours or less, an increase in the average particle size and occurrence of coarse vacancy due to eminent growth in crystal grains can be prevented, so that the strength of the sintered oxide is not likely to be decreased and the abnormal electrical discharge is not likely to occur.

In a normal pressure sintering, the molding body is sintered in an atmospheric air or oxygen-gas atmosphere. In the oxygen-gas atmosphere, it is preferable that the oxygen concentration is, for instance, 20 volume % or more and 80 volume % or less. The density of the sintered oxide can be increased by performing a temperature-increase step in the oxygen-gas atmosphere.

A temperature increase rate in the sintering process is preferably 0.1 degrees C./min to 2 degrees C./min in a temperature range from 800 degrees C. to the sintering temperature.

The sintering process in the sintered oxide according to the first exemplary embodiment most effectively progresses in the temperature range at or above 800 degrees C. At the temperature increase rate of 0.1 degrees C./min or more in this temperature range, excessive growth of the crystal grains can be restrained, achieving a high-density sintered oxide. At the temperature increase rate of 2 degrees C./min or less, warpage or cracks on the sintered oxide, which is caused due to uneven temperature distribution in the molding body, can be restrained.

The temperature increase rate in the temperature range from 800 degrees C. to the sintering temperature is preferably in a range from 0.5 degrees C./min to 2.0 degrees C./min, more preferably 1.0 degree C./min to 1.8 degrees C./min.

Sputtering Target

Next, a structure of a sputtering target according to the first exemplary embodiment will be described below with reference to FIGS. 1 to 4.

The sintered oxide is ground and bonded to a backing plate to be formed into the sputtering target. An oxide semiconductor film can be formed through sputtering using the sputtering target.

The sputtering target according to the first exemplary embodiment of the invention (sometimes referred to as the present target hereinafter) includes the above first to third sintered oxides of the invention (sometimes collectively referred to as the present sintered oxide hereinafter), and the backing plate. The sputtering target according to the first exemplary embodiment of the invention preferably includes the present sintered oxide and, as necessary, a cooler/holder (e.g. the backing plate) provided on the sintered oxide.

The sintered oxide (target material) of the target according to the first exemplary embodiment of the invention is provided by grinding a surface the above-described present sintered oxide. Accordingly, the substance of the target material is the same as the sintered oxide in the first exemplary embodiment. The explanation on the sintered oxide according to the first exemplary embodiment thus directly applies to the target material.

Figure 1:
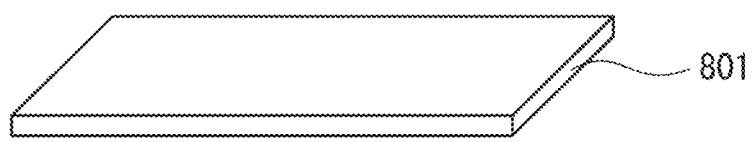
FIG. 1 is a perspective view showing a shape of a target according to a first exemplary embodiment.
Figure 2:
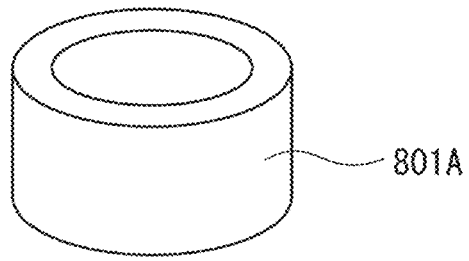
FIG. 2 is a perspective view showing a shape of another target according to the first exemplary embodiment.
Figure 3:
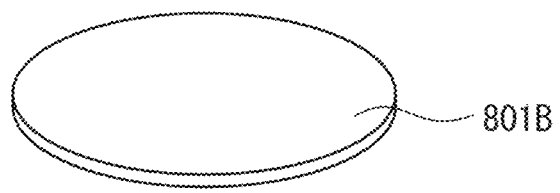
FIG. 3 is a perspective view showing a shape of still another target according to the first exemplary embodiment.
Figure 4:
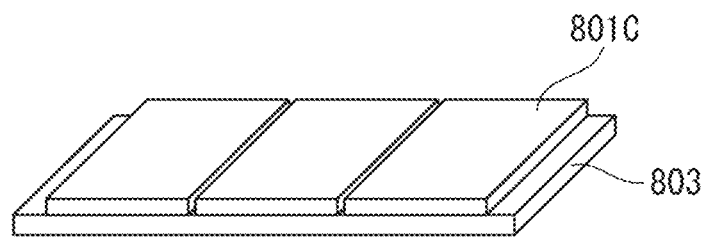
FIG. 4 is a perspective view showing a shape of a further target according to the first exemplary embodiment.

The shape of the sintered oxide is not particularly limited. For instance, the sintered oxide may be a plate as shown in FIG. 1 (item 801) or a hollow cylinder as shown in FIG. 2 (item 801A). When the sintered oxide is plate-shaped, the sintered oxide may be rectangular in a plan view as shown in FIG. 1(A) (item 1) or circular in a plan view as shown in FIG. 3 (item 801B). The sintered oxide may be a single-piece molding body or may be a multiple-division component including a plurality of divided sintered oxides (item 801C) fixed on a backing plate 803 as shown in FIG. 4.

The backing plate 803 is a holder/cooler for the sintered oxide. The backing plate 803 is preferably made of a material with excellent thermal conductivity (e.g. copper).

The sputtering target is produced through, for instance, the following steps.

(d) Grinding a surface of the sintered oxide (grinding step)

(e) Bonding the sintered oxide on the backing plate (bonding step)

The above steps will be specifically described below.
(4) Step (d): Grinding Step In the grinding step, the sintered oxide is ground into a shape adapted to be attached to a sputtering apparatus.

The surface of the sintered oxide is often partially highly oxidized or roughened. Further, the sintered oxide has to be cut into piece(s) of a predetermined size.

The surface of the sintered oxide is preferably ground for 0.3 mm or more. The grinding depth is more preferably 0.5 mm or more, especially preferably 2 mm or more. A part of the sintered oxide at or near the surface thereof, at which crystal structure is modified, can be removed by grinding 0.3 mm or more.

It is preferable to grind the sintered oxide using, for instance, a surface grinder to form a material whose average surface roughness Ra is 5 µm or less. A sputtering surface of the sputtering target may further be mirror-finished so that the average surface roughness Ra is $1000 \times 10^{-10}$ m or less. The mirror-finishing (polishing) may be performed using any known polishing technique including mechanical polishing, chemical polishing, and mechanochemical polishing (combination of the mechanical polishing and chemical polishing). For instance, the surface may be polished using a fixed-abrasive-grain polisher (polishing liquid: water) to #2000 or finer grain size, or may be lapped using diamond-paste polishing material after being lapped using a loose-abrasive-grain lapping material (polishing material: SiC paste etc.). The polishing method is not limited to the above. Examples of the polishing material include a polishing material with #200 grit size, #400 grit size, and #800 grit size.

The sintered oxide after the polishing step is preferably cleaned with an air blower or washed with running water and the like. When a foreign substance is to be removed using an air blower, air is preferably sucked with a dust catcher provided at a side opposite a nozzle for effective removal. It should be noted that ultrasonic cleaning may further be performed in view of the limited cleaning power of the air blower and running water. The ultrasonic cleaning is effectively performed with oscillation at multiple frequencies ranging from 25 kHz to 300 kHz. For instance, twelve waves of different frequencies ranging from 25 kHz to 300 kHz in 25 kHz increments are preferably applied for the ultrasonic cleaning.

(5) Step (e): Bonding Step

In the step (e), the sintered oxide after being ground is bonded to the backing plate using a low-melting-point metal such as indium.

The sputtering target has been described as the above.
Oxide Semiconductor Thin-Film Next, an oxide semiconductor thin-film according to the first exemplary embodiment will be described below.

The oxide semiconductor thin-film according to an example of the first exemplary embodiment (referred to as the present oxide semiconductor thin-film hereinafter) contains:

In element, Y element, and Ga element at respective atomic ratios as defined in formulae (1-7) to (1-9) below, $$0.80 \leq \text{In}/(\text{In}+\text{Y}+\text{Ga}) \leq 0.96 \qquad (1\text{-}7),$$

$$0.02 \leq \text{Y}/(\text{In}+\text{Y}+\text{Ga}) \leq 0.10 \qquad (1\text{-}8), \text{ and}$$

$$0.02 \leq \text{Ga}/(\text{In}+\text{Y}+\text{Ga}) \leq 0.15 \qquad (1\text{-}9); \text{ and}$$

Al element at an atomic ratio as defined in a formula (1-10) below, $$0.005 \leq \text{Al}/(\text{In}+\text{Y}+\text{Ga}+\text{Al}) \leq 0.07 \qquad (1\text{-}10),$$

where In, Y, Ga, and Al in the formulae represent the number of atoms of the In element, Y element, Ga element, and Al element in the oxide semiconductor thin-film, respectively.

An atomic ratio of Ga is preferably as defined by a formula (1-11) below.

$$0.02 \leq \text{Ga}/(\text{In}+\text{Y}+\text{Ga}) \leq 0.10 \qquad (1\text{-}11)$$

The oxide semiconductor thin-film according to the first exemplary embodiment is producible using the present target through a sputtering process. The atomic ratio composition of the oxide semiconductor thin-film obtained through the sputtering process reflects the atomic ratio composition of the target material.

When an oxide semiconductor thin-film whose atomic ratio composition is outside the above range is subjected to a process in a CVD film-formation apparatus used for forming a thin-film transistor, the carrier concentration in the semiconductor portion (the present oxide semiconductor thin-film) of the thin-film transistor is sometimes increased, which is not decreased even after the subsequent annealing, thus failing to function as TFT. Accordingly, the film-formation temperature of the CVD apparatus has been reduced to restrain the increase in the carrier concentration in order to exhibit the TFT performance. However, due to the reduction in the film-formation temperature in the CVD apparatus, the resultant semiconductor thin film may be poor in durability, and also in the TFT performance.

The oxide semiconductor thin-film of the first exemplary embodiment is preferably amorphous when being formed through sputtering, and is preferably turned to be crystalline after a heat treatment (annealing process).

The oxide semiconductor thin-film according to the first exemplary embodiment preferably includes the Bixbyite crystalline phase represented by $In_2O_3$. This is because the oxide semiconductor thin-film is densified due to crystallization. Further, the indium oxide ($In_2O_3$) crystals developed in the oxide semiconductor thin-film, which create neatly aligned rows of indium atoms, increase s orbital overlap between In—In ions and reduce carrier diffusion, thereby enhancing the carrier mobility of TFT when the present oxide semiconductor thin-film is used in TFT.

Further, crystals, which are stable as compared with amorphous, provides resistance against degradation caused by CVD process, long-time driving of TFT, exposure to light and the like, allowing stable TFT drive.

Further, it is preferable that at least one of yttrium (Y) element and gallium (Ga) element is substitutionally dissolved in the Bixbyite crystalline phase represented by $In_2O_3$ to form a solid solution.

The presence of Y element substitutionally dissolved in the Bixbyite structure represented by $In_2O_3$ to form a solid solution can be determined by checking whether the lattice constant of the Bixbyite structure of the indium oxide in the sintered oxide is larger than the lattice constant of the indium oxide per se.

The presence of Ga element substitutionally dissolved in the Bixbyite structure represented by $In_2O_3$ to form a solid solution can be determined by checking whether the lattice constant of the Bixbyite structure of the indium oxide in the sintered oxide is smaller than the lattice constant of the indium oxide per se.

A feature of a thin-film transistor according to the first exemplary embodiment (sometimes referred to as the present thin-film transistor hereinafter) is the use of the present oxide semiconductor thin-film.

Though not particularly limited, the thin-film transistor according to the first exemplary embodiment is preferably configured as a back-channel etching transistor, etching stopper transistor, a top-gate transistor or the like.

In the oxide semiconductor thin-film of the first exemplary embodiment, yttrium (Y) element is effective in reducing occurrence of oxygen vacancies and increasing the band gap in the oxide semiconductor thin-film. A Y ratio [Y/(In+Y+Ga) (atomic ratio)] is preferably $0.02 \leq Ga/(In+Y+Ga) \leq 0.10$. At the Y ratio of less than 0.02, the effect for reducing the oxygen vacancies is sometimes too small to form a semiconductor, or the lattice constant of the crystal sometimes becomes excessively smaller than the lattice constant of the typical Bixbyite crystalline phase represented by $In_2O_3$. Meanwhile, at the Y ratio of more than 0.10, oxygen vacancies are sometimes eliminated to form an insulation film, the lattice constant of the crystal sometimes becomes excessively larger than the lattice constant of the Bixbyite crystalline phase represented by $In_2O_3$, and the carrier mobility in TFT is sometimes reduced. More preferably, $0.03 \leq Y/(In+Y+Ga) \leq 0.09$, further preferably, $0.04 \leq Y/(In+Y+Ga) \leq 0.08$.

In the oxide semiconductor thin-film of the first exemplary embodiment, gallium (Ga) element is effective in reducing occurrence of oxygen vacancies, increasing the band gap in the oxide semiconductor thin-film and reducing the lattice constant of the semiconductor thin-film ($In_2O_3$). A Ga ratio [Ga/(In+Y+Ga) (atomic ratio)] is preferably $0.02 \leq Ga/(In+Y+Ga) \leq 0.15$. At the Ga ratio of less than 0.02, the effect for reducing the oxygen vacancies is sometimes too small to form a semiconductor, or the lattice constant of the crystal sometimes does not become smaller than the lattice constant of the Bixbyite crystalline phase represented by $In_2O_3$. At the Ga ratio of more than 0.15, oxygen vacancies are sometimes eliminated to turn the resultant film to an insulation film, the thin-film is sometimes not crystallized, and the carrier mobility in TFT sometimes becomes small. More preferably, $0.02 \leq Ga/(In+Y+Ga) \leq 0.10$, further preferably, $0.03 \leq Ga/(In+Y+Ga) \leq 0.09$, furthermore preferably $0.04 \leq Ga/(In+Y+Ga) \leq 0.08$.

Y element and Ga element, both of which have the effect of reducing the occurrence of oxygen vacancies and the effect of increasing the band gap in the oxide semiconductor thin-film, are essential for the following reasons.

The ion radius of Ga element is significantly smaller than the ion radius of In element. Accordingly, when $In_2O_3$ is crystallized with Ga being solely added, Ga is dissolved to form a solid solution at a small rate of approximately 12 atom % according to Hume-Rothery rules. Further, Ga is effective in reducing the lattice constant of $In_2O_3$.

The ion radius of Y element is greater than the ion radius of In element. However, the difference between ion radii of Y and In is smaller than the difference between ion radii of Ga and In. Further, Y oxide per se has a Bixbyite structure. Accordingly, $In_2O_3$ and solid solution are generated over the entire compositional range by adding Y element. The lattice constant of $In_2O_3$ with Y being dissolved to form a solid solution increases as an added amount of Y element increases.

The addition of both of Ga element and Y element to be dissolved to form a solid solution, the effect of Ga for reducing the lattice constant of the $In_2O_3$ crystal is cancelled by the effect of Y for increasing the lattice constant of the $In_2O_3$. Accordingly, stable crystallization is possible without significantly changing the lattice constant. The lattice constant of $In_2O_3$ can be made smaller than the lattice constant of pure $In_2O_3$ by adjusting the added amount of Ga element. Smaller lattice constant results in reduction in the distance between In—In ions and increase in s orbital overlap, thus increasing the carrier mobility in TFT.

In the semiconductor thin-film of the first exemplary embodiment, indium (In) element is an element for ensuring the carrier mobility in the semiconductor thin-film. The In ratio [In/(In+Y+Ga) (atomic ratio)] is preferably $0.80 \leq In/(In+Y+Ga) \leq 0.96$. When the In ratio is less than 0.80, indium oxide is sometimes not crystallized to lower the carrier mobility in the semiconductor thin-film. The In ratio of more than 0.96 may cause too much oxygen vacancies to form a semiconductor film (i.e. the film may become a conductor). More preferably, $0.82 \leq In/(In+Y+Ga) \leq 0.94$, further preferably, $0.84 \leq In/(In+Y+Ga) \leq 0.92$.

The addition of gallium (Ga) element reduces the lattice constant of the semiconductor thin-film ($In_2O_3$), which is smaller than the lattice constant of indium oxide when the material consists solely of base material oxides. It is speculated that the reduction in the lattice constant of the crystalline indium oxide results in reduction in interatomic distance of indium ions and, especially, increase in s orbital overlap of In element, thereby enhancing the carrier mobility.

The lattice constant of the Bixbyite crystalline phase represented by $In_2O_3$ in the oxide semiconductor thin-film according to the first exemplary embodiment is preferably $10.083 \times 10^{-10}$ m or less. The lattice constant is measurable according to the method described in Examples. The lower limit of the lattice constant is usually $10.020\times10^{-10}$ m or more, preferably $10.025\times10^{-10}$ m or more, more preferably $10.030\times10^{-10}$ m or more.

In the oxide semiconductor thin-film of the first exemplary embodiment, aluminum (Al) element is effective in reducing occurrence of oxygen vacancies and increasing the band gap in the oxide semiconductor thin-film. The addition of aluminum is effective in restraining an increase in carriers in a CVD process for forming an insulation film to facilitate adjustment of semiconductor properties in the subsequent heat treatment. Specifically, the addition of aluminum is effective in reducing the carrier concentration in a heat treatment at a temperature lower than a typical heat treatment. Further, it is believed that with the addition of aluminum oxide, which per se is low in oxygen diffusion coefficient, the oxygen diffusion rate in indium oxide can be decreased than in indium oxide consisting solely of base material oxide. Oxygen vacancies in the oxide semiconductor thin-film increase in the CVD process to increase the carrier concentration. The addition of aluminum reduces the oxygen vacancies by the heat treatment after the CVD process to reduce the carriers in the surface of the oxide semiconductor. It is speculated that the carrier concentration at a channel portion inside the oxide semiconductor thin-film near the gate insulating film is thus kept at a high level, achieving high carrier mobility.

Accordingly, in an oxide semiconductor thin-film with a large ratio of indium oxide, without a relatively large amount of the aluminum element, the oxygen vacancies near the gate insulating film in the oxide semiconductor thin-film might be entirely eliminated, failing to achieve high carrier mobility. In contrast, in an oxide semiconductor thin-film with a small ratio of indium oxide, unless the amount of aluminum element is relatively reduced, a large number of oxygen vacancies may remain not only near the gate insulating film but also inside the oxide semiconductor thin-film, so that the thin-film sometimes does not turn into a semiconductor but becomes conductive, and the threshold voltage (Vth) may shift to a negative side (i.e. normally-on state).

For instance, at the In ratio [In/(In+Y+Ga) (atomic ratio)] of 0.90 or more, the Al ratio [Al/(In+Y+Ga+Al) (atomic ratio)] is 0.020 or more, preferably 0.025 or more. The upper limit is preferably 0.07 or less. At the Al ratio of more than 0.07, indium oxide sometimes is not crystallized, failing to provide an oxide semiconductor thin-film with high carrier mobility. Preferably, the upper limit is 0.06 or less.

For instance, at the In ratio [In/(In+Y+Ga+Al) (atomic ratio)] of 0.90 or less, the Al ratio [Al/(In+Y+Ga+Al) (atomic ratio)] is 0.030 or less, preferably 0.025 or less. The lower limit is preferably 0.005 or more. More preferably, the lower limit is 0.01 or more.

An oxide semiconductor thin-film according to an example of the first exemplary embodiment preferably contains:

In element, Y element, and Ga element at respective atomic ratios as defined in formula (1-7A) to (1-10A) below, $$0.82 \leq \text{In}/(\text{In}+\text{Y}+\text{Ga}) \leq 0.94 \tag{1-7A},$$

$$0.03 \leq \text{Y}/(\text{In}+\text{Y}+\text{Ga}) \leq 0.09 \tag{1-8A, and}$$

$$0.03 \leq \text{Ga}/(\text{In}+\text{Y}+\text{Ga}) \leq 0.09 \tag{1-9A, and}$$

Al element at an atomic ratio as defined in a formula (1-10A) below, $$0.01 \leq \text{Al}/(\text{In}+\text{Y}+\text{Ga}+\text{Al}) \leq 0.06 \tag{1-10A}.$$

An oxide semiconductor thin-film according to an example of the first exemplary embodiment more preferably contains:

In element, Y element, and Ga element at respective atomic ratios as defined in formulae (1-7B) to (1-10B) below, $$0.84 \leq \text{In}/(\text{In}+\text{Y}+\text{Ga}) \leq 0.92 \tag{1-7B},$$

$$0.04 \leq \text{Y}/(\text{In}+\text{Y}+\text{Ga}) \leq 0.08 \tag{1-8B, and}$$

$$0.04 \leq \text{Ga}/(\text{In}+\text{Y}+\text{Ga}) \leq 0.08 \tag{1-9B, and}$$

Al element at an atomic ratio as defined in a formula (1-10B) below, $$0.01 \leq \text{Al}/(\text{In}+\text{Y}+\text{Ga}+\text{Al}) \leq 0.06 \tag{1-10B}.$$

The oxide semiconductor thin-film in the first exemplary embodiment preferably contains an oxide of a positive tetravalent or more polyvalent metal element X at an atomic ratio defined by a formula (1-12) below.

$$0.00005 \leq \text{X}/(\text{In}+\text{Y}+\text{Ga}+\text{Al}+\text{X}) \leq 0.005 \tag{1-12},$$

where X represents the number of atoms of the X element in the oxide semiconductor thin-film.

At X/(In+Y+Ga+Al+X) of 0.00005 or more, the carrier concentration in a crystallized oxide semiconductor thin-film, which, when reduced to $10^{-12}$ per cubic centimeter or less, lowers carrier mobility and turns the thin-film into an insulative body (i.e. not a semiconductor), can be kept from being excessively reduced. At X/(In+Y+Ga+Al+X) of 0.005 or less, excessively large number of carriers can be kept from being generated to prevent the thin-film from turning into a conductor and causing failure in TFT.

The oxide semiconductor thin-film in the first exemplary embodiment preferably contains the oxide of the positive tetravalent or more polyvalent metal X at an atomic ratio defined by a formula (1-12A) below.

$$0.00008 \leq \text{X}/(\text{In}+\text{Y}+\text{Ga}+\text{Al}+\text{X}) \leq 0.003 \tag{1-12A}$$

The oxide semiconductor thin-film in the first exemplary embodiment further preferably contains the oxide of the positive tetravalent or more polyvalent metal element X at an atomic ratio defined by a formula (1-12B) below.

$$0.0001 \leq \text{X}/(\text{In}+\text{Y}+\text{Ga}+\text{Al}+\text{X}) \leq 0.001 \tag{1-12B}$$

The content (atomic ratio) of each of the metal elements in the oxide semiconductor film can be determined by measuring the amount of the elements through ICP (Inductive Coupled Plasma) measurement or XRF (X-Ray Fluorescence) measurement. An inductively coupled plasma emission spectrometer can be used for the ICP measurement. A thin-film X-ray fluorescence spectrometer (AZX400, manufactured by Rigaku Corporation) can be used for the XRF measurement.

A sector-dynamic SIMS (Secondary Ion Mass Spectrometer) analysis may alternatively be used for analysis of the contents (atomic ratio) of the metal elements in the oxide semiconductor thin-film at the same accuracy as the inductively coupled plasma emission spectrometry. A reference material is prepared by forming source/drain electrodes (made of the same material as in TFT device) of a channel length on an upper surface of a reference oxide thin-film whose atomic ratio of the metal elements are known by measurement using the inductively coupled plasma emission spectrometer or the thin-film X-ray fluorescence spectrometer. Then, the oxide semiconductor layer is analyzed using a sector-dynamic SIMS (Secondary Ion Mass Spectrometer) (IMS 7f-Auto, manufactured by AMETEK, Inc.) to measure a mass spectrum intensity of each of the elements, and plot analytical curves for concentrations of the known elements and the mass spectrum intensity. Next, the atomic ratio in the oxide semiconductor thin-film of an actual TFT device is calculated with reference to the above-described analytical curve based on the spectrum intensity obtained by the sector-dynamic SIMS (Secondary Ion Mass Spectrometry) analysis. As a result of the calculation, it is found that the calculated atomic ratio is within 2 atom % of the atomic ratio of the oxide semiconductor thin-film separately measured by the thin-film X-ray fluorescent spectrometer or the inductively coupled plasma emission spectrometer.

The oxide semiconductor thin-film of the invention, which is configured as described above, has high carrier mobility and exhibits small change in properties during CVD process and the like.

With the use of the oxide semiconductor thin-film according to the first exemplary embodiment, a high-performance thin-film transistor can be provided.

Thin-Film Transistor

Next, a structure of a thin-film transistor according to the first exemplary embodiment will be described below.

The structure of the thin-film transistor according to the first exemplary embodiment is not particularly limited as long as the thin-film transistor includes the oxide semiconductor thin-film according to the first exemplary embodiment and serves as a transistor.

Examples of the specific configurations of the thin-film transistor include a back-channel etching transistor, etching stopper transistor, and a top-gate transistor.

Figure 5:
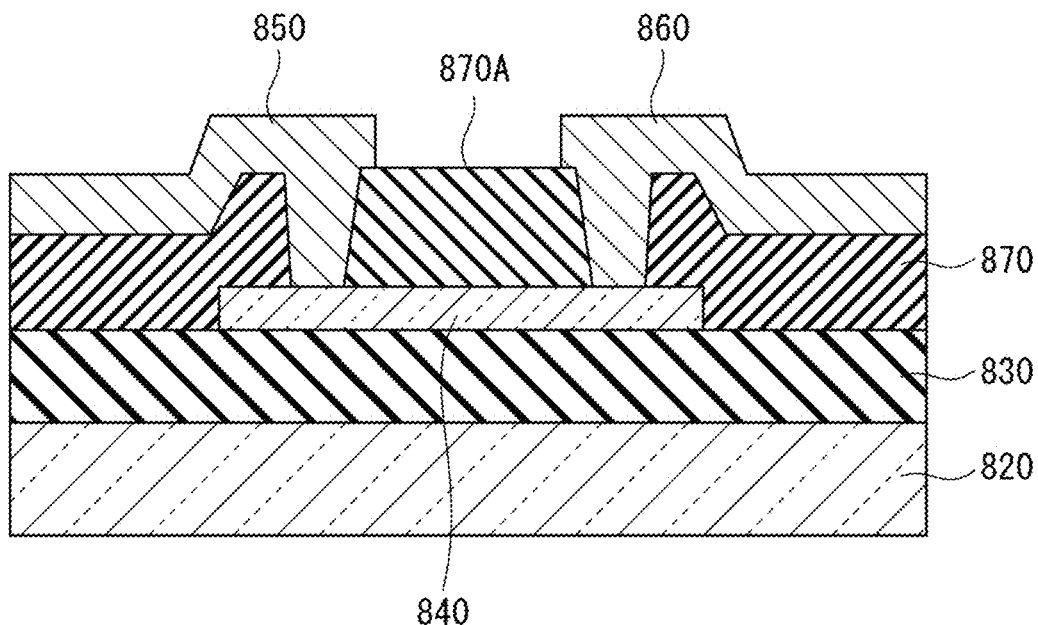
FIG. 5 is a schematic cross section showing a thin-film transistor according to the first exemplary embodiment.
Figure 6:
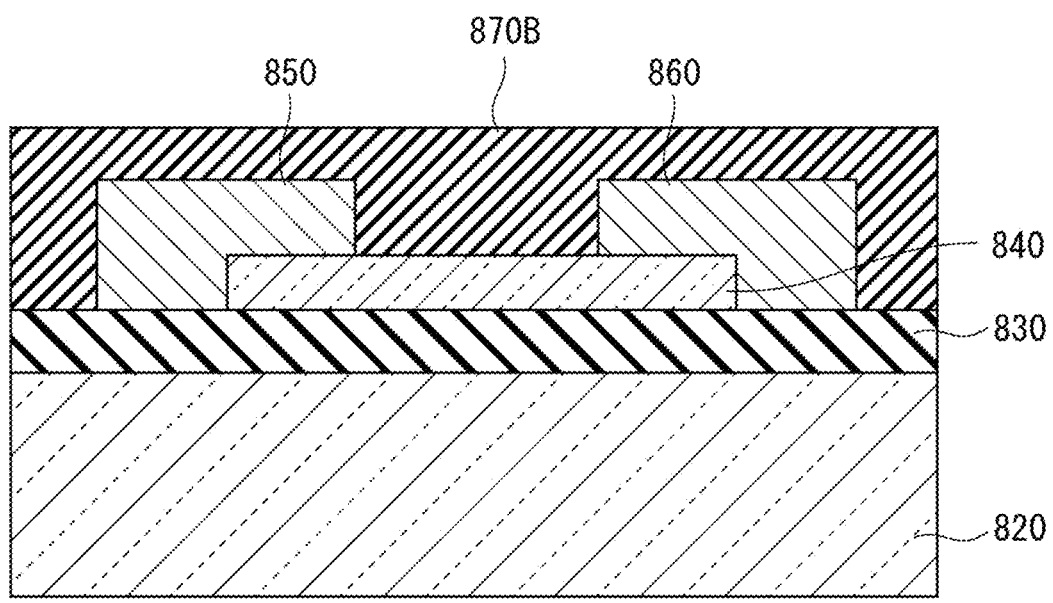
FIG. 6 is a schematic cross section showing another thin-film transistor according to the first exemplary embodiment.

Specific examples of the thin-film transistor are shown in FIGS. 5 and 6.

As shown in FIG. 5, a thin-film transistor 810 includes a silicon wafer 820, a gate insulating film 830, an oxide semiconductor thin-film 840, a source electrode 850, a drain electrode 860, and interlayer insulating films 870, 870A.

The silicon wafer 820 defines a gate electrode. The gate insulating film 830, which is an insulation film for insulation between the gate electrode and the oxide semiconductor thin-film 840, is provided on the silicon wafer 820.

The oxide semiconductor thin-film 840 (channel layer) is provided on the gate insulating film 830. The oxide semiconductor thin-film 840 is the oxide semiconductor thin-film according to the first exemplary embodiment.

The source electrode 850 and the drain electrode 860, which are conductive terminals for passing source current and drain current through the oxide semiconductor thin-film 840, are in contact with parts near respective ends of the oxide semiconductor thin-film 840.

The interlayer insulating film 870 is an insulation film for insulating parts other than the contact portions between the source electrode 850 and the drain electrode 860, and the oxide semiconductor thin-film 840.

The interlayer insulating film 870A is another insulation film for insulating parts other than the contact portions between the source electrode 850 and drain electrode 860, and the oxide semiconductor thin-film 840. The interlayer insulating film 870A is also an insulation film for insulation between the source electrode 50 and the drain electrode 860, and also serves as a protection layer for the channel layer.

As shown in FIG. 6, the structure of a thin-film transistor 810A is substantially the same as the thin-film transistor 810, except that the source electrode 850 and the drain electrode 860 are in contact with both of the gate insulating film 830 and the oxide semiconductor thin-film 840, and that an interlayer insulating film 70B is integrally provided to cover the gate insulating film 830, the oxide semiconductor thin-film 840, the source electrode 850, and the drain electrode 860.

The material for the drain electrode 860, the source electrode 850 and the gate electrode are not particularly limited but may be selected from generally known materials. In the examples shown in FIGS. 5 and 6, the silicon wafer is used for the substrate. Though the silicon wafer also serves as an electrode, the material of the electrode is not necessarily silicon.

For instance, the electrode may be a transparent electrode made of, for instance, ITO (Indium Tin Oxide), IZO (Indium Zinc Oxide), ZnO, and SnO2, a metal electrode made of Al, Ag, Cu, Cr, Ni, Mo, Au, Ti, Ta, or the like, a metal electrode made of an alloy containing the above metal elements, or a laminated electrode of layers made of the alloy.

The gate electrode shown in FIGS. 5 and 6 may be formed on a substrate made of glass or the like.

The material for the interlayer insulating films 870, 870A and 870B is not particularly limited but may be selected as desired from generally known materials. Specifically, the interlayer insulating films 870, 870A, 870B may be made of a compound such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, and AlN.

When the thin-film transistor according to the first exemplary embodiment is a back-channel-etching (bottom-gate) thin-film transistor, it is preferable to provide a protection film on the drain electrode, the source electrode and the channel layer. The protection film enhances the durability against a long-term driving of the TFT. In a top-gate TFT, the gate insulating film is formed on, for instance, the channel layer.

The protection film or the insulation film can be formed, for instance, through a CVD process, which sometimes entails high-temperature treatment. The protection film or the insulation film often contains impurity gas immediately after being formed, and thus is preferably subjected to a heat treatment (annealing). The heat treatment removes the impurity gas to provide a stable protection film or insulation film, and, consequently, highly durable TFT device.

With the use of the oxide semiconductor thin-film according to the first exemplary embodiment, the TFT device is less likely to be affected by the temperature in the CVD process and the subsequent heat treatment. Accordingly, the stability of the TFT performance can be enhanced even when the protection film or the insulation film is formed.

The thin-film transistor preferably has the following properties.

The carrier mobility in the thin-film transistor is preferably 1.0 $cm^2/V \cdot s$ or more. At the carrier mobility of 1.0 $cm^2/V \cdot s$ or more, a liquid crystal display can be driven.

The saturation mobility is determined based on a transfer function when a 20 V drain voltage is applied. Specifically, the saturation mobility can be calculated by: plotting a graph of a transfer function Id-Vg; calculating transconductance (Gm) for each Vg; and calculating the saturation mobility using a formula in a saturated region. It should be noted Id represents a current between the source and drain electrodes, and Vg represents a gate voltage when the voltage Vd is applied between the source and drain electrodes.

A threshold voltage (Vth) is preferably in a range from −3.0 V to 3.0 V, more preferably from −2.0 V to 2.0 V, further preferably from −1.0 V to 1.0 V. At the threshold voltage (Vth) of −3.0 V or more, a thin-film transistor with a high carrier mobility can be provided. At the threshold voltage (Vth) of 3.0 V or less, a thin-film transistor with small Off current and a large On/Off ratio can be provided.

The threshold voltage (Vth) is defined as Vg at Id=$10^{-9}$ A based on the graph of the transfer function.

The On/Off ratio is preferably in a range from $10^6$ to $10^{12}$, more preferably from $10^7$ to $10^{11}$, further preferably from $10^8$ to $10^{10}$. At the On/Off ratio of $10^6$ or more, a liquid crystal display can be driven. At the On/Off ratio of $10^{12}$ or less, an organic EL device with a large contrast can be driven. Further, the Off current can be set at $10^{-12}$ A or less, allowing an increase in image-holding time and improvement in sensitivity when the present transistor is used for a transfer transistor or a reset transistor of a CMOS image sensor.

The On/Off ratio can be determined as a ratio [On current value/Off current value] of On current value (a value of Id when Vg=20 V) to Off current value (a value of Id when Vg=–10 V).

The Off current value is preferably $10^{-10}$ A or less, more preferably $10^{-11}$ A or less, further preferably $10^{-12}$ A or less. At the Off current value of $10^{-10}$ A or less, an organic EL device with a large contrast can be driven. Further, the image-holding time can be increased and sensitivity can be enhanced when the thin-film transistor is used for a transfer transistor or a reset transistor of a CMOS image sensor.

The defect density of the oxide semiconductor thin-film according to the first exemplary embodiment, which is used in a semiconductor layer of the thin-film transistor, is preferably $5.0\times10^{16}$ cm$^{-3}$ or less, more preferably $1.0\times10^{16}$ cm$^{-3}$ or less. With the decrease in the defect density, the carrier mobility in the thin-film transistor is further improved, thereby enhancing the stability to irradiated light and heat and allowing stable operation of the TFT.

Quantum-Tunneling Field-Effect Transistor

The oxide semiconductor thin-film according to the first exemplary embodiment is usable for a quantum-tunneling Field-Effect Transistor (FET).

Figure 7:
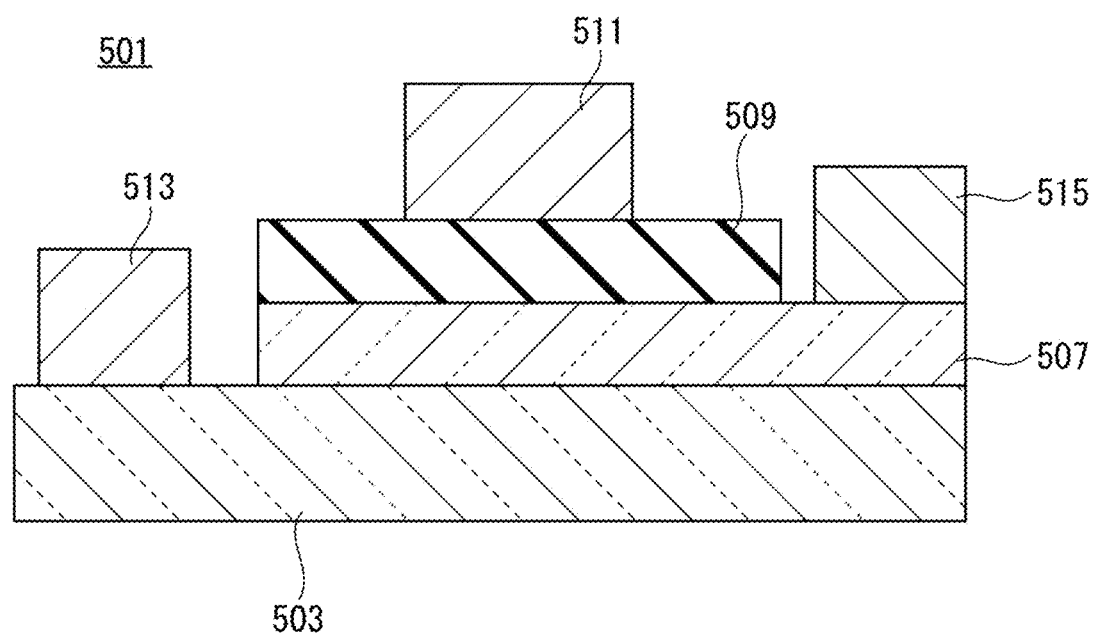
FIG. 7 is a schematic illustration (vertical cross section) of a quantum-tunneling FET (Field-Effect Transistor).

FIG. 7 is a schematic illustration (vertical cross section) of a quantum-tunneling FET (Field-Effect Transistor) according to the first exemplary embodiment.

A quantum-tunneling field-effect transistor 501 includes a p-type semiconductor layer 503, an n-type semiconductor layer 507, a gate insulating film 509, a gate electrode 511, a source electrode 513, and a drain electrode 515.

The p-type semiconductor layer 503, the n-type semiconductor layer 507, the gate insulating film 509, and the gate electrode 511 are layered in this order.

The source electrode 513 is provided on the p-type semiconductor layer 503. The drain electrode 515 is provided on the n-type semiconductor layer 507.

The p-type semiconductor layer 503 is a layer of a p-type IV group semiconductor layer, which is a p-type silicon layer in the exemplary embodiment.

The n-type semiconductor layer 507 is a n-type oxide semiconductor thin-film according to the first exemplary embodiment. The source electrode 513 and the drain electrode 515 are conductive films.

Though not shown in FIG. 7, an insulation layer may be provided on the p-type semiconductor layer 503. In this case, the p-type semiconductor layer 503 and the n-type semiconductor layer 507 are connected through a contact hole(s) defined by partially removing the insulation layer. Though not shown in FIG. 7, the quantum-tunneling field-effect transistor 501 may be provided with an interlayer insulating film covering an upper side of the quantum-tunneling field-effect transistor 501.

The quantum-tunneling field-effect transistor 501 is a current-switching quantum-tunneling FET (Field-Effect Transistor) for controlling the electric current tunneled through an energy barrier formed by the p-type semiconductor layer 503 and the n-type semiconductor layer 507 using a voltage applied to the gate electrode 511. With this structure, the band gap of the oxide semiconductor of the n-type semiconductor layer 507 can be increased, thereby decreasing the Off current.

Figure 8:
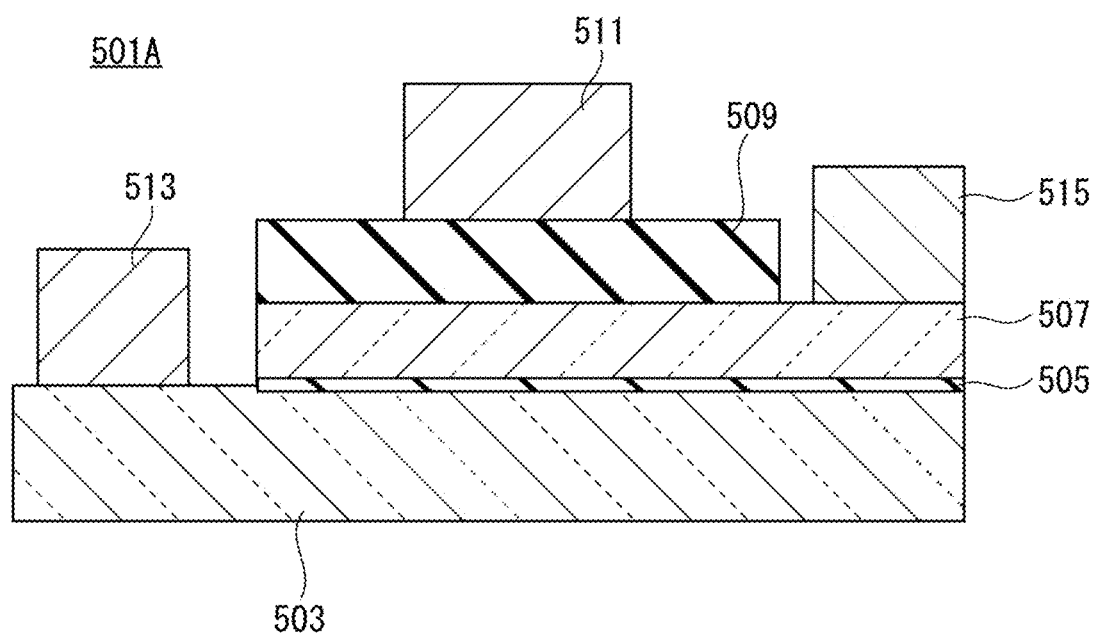
FIG. 8 is a vertical cross section showing another quantum-tunneling field-effect transistor.

FIG. 8 is a schematic illustration (vertical cross section) of a quantum-tunneling field-effect transistor 501A according to another example in the first exemplary embodiment.

The structure of the quantum-tunneling field-effect transistor 501A is the same as the structure of the quantum-tunneling field-effect transistor 501 except that a silicon oxide layer 505 is interposed between the p-type semiconductor layer 503 and the n-type semiconductor layer 507. The Off current can be reduced by the presence of the silicon oxide layer.

The thickness of the silicon oxide layer 505 is preferably 10 nm or less. At the thickness of 10 nm or less, the tunnel current securely passes through the energy barrier and the energy barrier can be securely formed with a constant barrier height, preventing the decrease or change in the tunneling current. The thickness is preferably 8 nm or less, more preferably 5 nm or less, further preferably 3 nm or less, and especially preferably 1 nm or less.

Figure 9:
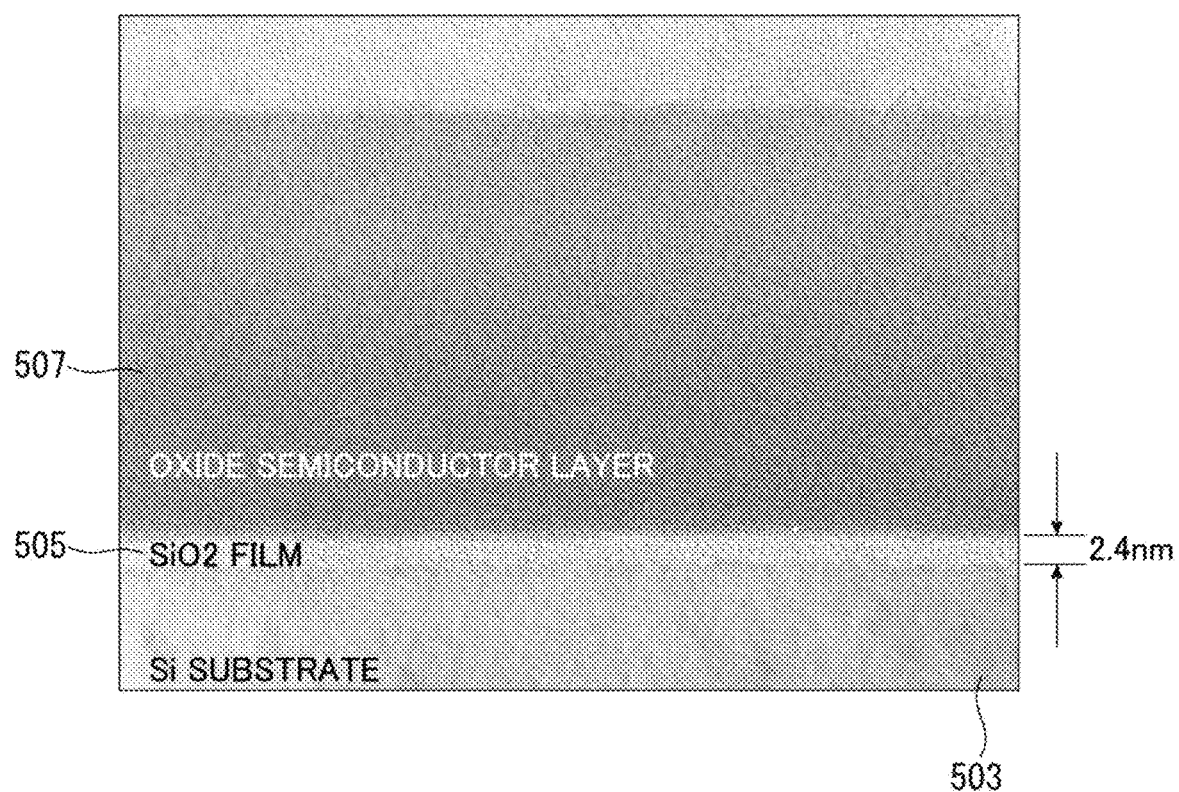
FIG. 9 is a photograph taken by a TEM (Transmission Electron Microscope) showing a silicon oxide layer between a p-type semiconductor layer and an n-type semiconductor layer shown in FIG. 8.

FIG. 9 is a TEM photograph showing the silicon oxide layer 505 between the p-type semiconductor layer 503 and the n-type semiconductor layer 507.

The n-type semiconductor layer 507 in both of the quantum-tunneling field-effect transistors 501 and 501A is an n-type oxide semiconductor.

The oxide semiconductor of the n-type semiconductor layer 507 may be amorphous. The amorphous oxide semiconductor can be etched using an organic acid (e.g. oxalic acid) at a large difference in etching rate from the other layer(s), so that the etching process can be favorably performed without any influence on the metal layer (e.g. wiring).

The oxide semiconductor of the n-type semiconductor layer 507 may alternatively be crystalline. The crystalline oxide semiconductor exhibits a larger band gap than the amorphous oxide semiconductor, so that the Off current can be reduced. Further, since the work function can be increased, the control over the current tunneled through the energy barrier formed by the p-type IV group semiconductor material and the n-type semiconductor layer 507 can be facilitated.

A non-limiting example of the production method of the quantum-tunneling field-effect transistor 501 will be described below.

Figure 10:
FIG. 10 is a vertical cross section showing a step in a production process of the quantum-tunneling field-effect transistor.

Initially, as shown in FIG. 10, an insulation film 505A is formed on the p-type semiconductor layer 503. Then a part of the insulation film 505A is removed by etching or the like to form a contact hole 505B.

Figure 11:
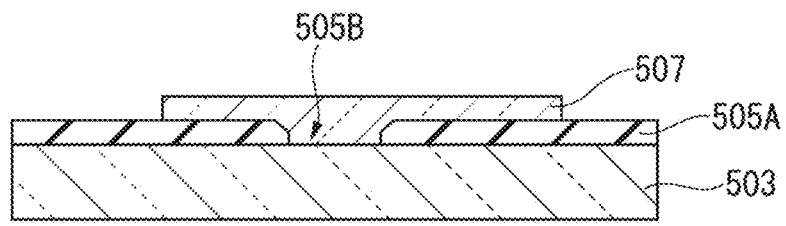
FIG. 11 is a vertical cross section showing another step in the production process of the quantum-tunneling field-effect transistor.

Subsequently, as shown in FIG. 11, the n-type semiconductor layer 507 is formed on the p-type semiconductor layer 503 and the insulation film 505A. At this time, the p-type semiconductor layer 503 and the n-type semiconductor layer 507 are connected through the contact hole 505B.

Figure 12:
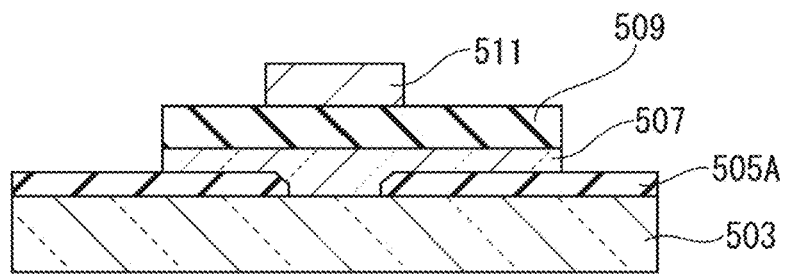
FIG. 12 is a vertical cross section showing still another step in the production process of the quantum-tunneling field-effect transistor.

Subsequently, as shown in FIG. 12, the gate insulating film 509 and the gate electrode 511 are formed in this order on the n-type semiconductor layer 507.

Figure 13:
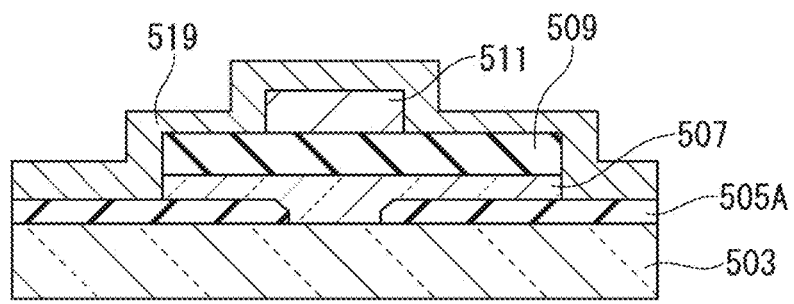
FIG. 13 is a vertical cross section showing a further step in the production process of the quantum-tunneling field-effect transistor.

Then, as shown in FIG. 13, an interlayer insulating film 519 is formed to cover the insulation film 505A, the n-type semiconductor layer 507, the gate insulating film 509 and the gate electrode 511.

Figure 14:
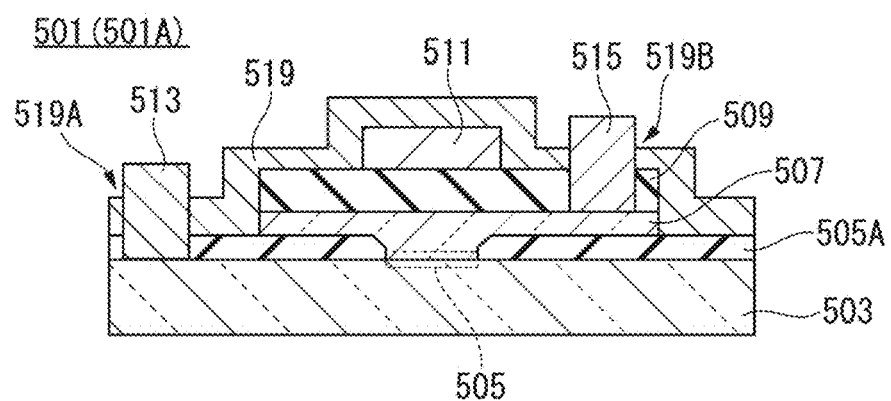
FIG. 14 is a vertical cross section showing a still further step in the production process of the quantum-tunneling field-effect transistor.

Next, as shown in FIG. 14, the insulation film 505A on the p-type semiconductor layer 503 and the interlayer insulating film 519 are partially removed to form a contact hole 519A, in which the source electrode 513 is provided.

Further, as shown in FIG. 14, the gate insulating film 509 on the n-type semiconductor layer 507 and the interlayer insulating film 519 are partially removed to form a contact hole 519B, in which the drain electrode 515 is formed.

The quantum-tunneling field-effect transistor 501 is produced through the above process.

It should be noted that the silicon oxide layer 505 between the p-type semiconductor layer 503 and the n-type semiconductor layer 507 can be formed by applying a heat treatment at a temperature ranging from 150 degrees C. to 600 degrees C. after the n-type semiconductor layer 507 is formed on the p-type semiconductor layer 503. The quantum-tunneling field-effect transistor 501A can be produced through the process including the above additional step.

Usage of Thin-Film Transistor

The thin-film transistor according to the first exemplary embodiment is also capable of being embodied as various integrated circuits such as a field-effect transistor, logic circuit, memory circuit, and differential amplifier, which are applicable to electronic devices. Further, the thin-film transistor according to the first exemplary embodiment is also applicable to an electrostatic inductive transistor, Schottky barrier transistor, Schottky diode, and resistor, in addition to the field-effect transistor.

The thin-film transistor according to the first exemplary embodiment is suitably usable for a display, solid-state image sensor, and the like.

A display and a solid-state image sensor incorporating the thin-film transistor according to the first exemplary embodiment will be described below.

Initially, a display (electronic device) incorporating the thin-film transistor according to the first exemplary embodiment will be described with reference to FIGS. 15 to 17.

Figure 15:
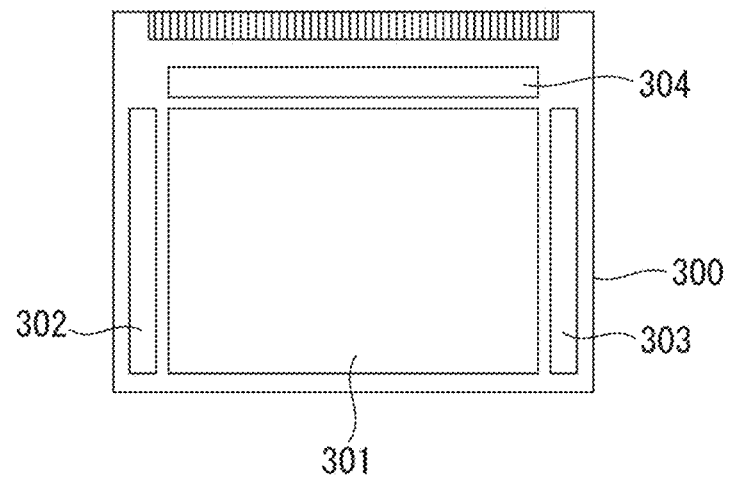
FIG. 15 is a top plan showing a display using the thin-film transistor according to the first exemplary embodiment.

FIG. 15 is a top plan view of a display according to an exemplary embodiment of the invention. FIG. 16 is a circuit diagram showing a circuit of a pixel unit in a form of a liquid crystal device of the display according to the first exemplary embodiment. FIG. 17 is a circuit diagram showing a circuit of a pixel unit in a form of an organic EL device of the display according to the first exemplary embodiment.

The transistor in the pixel unit may be the thin-film transistor according to the first exemplary embodiment. The thin-film transistor according to the first exemplary embodiment is easily made into an n-channel type. Accordingly, a part of the drive circuit capable of being provided by an n-channel transistor is formed on the same substrate as the transistor of the pixel unit. A highly reliable display can be provided using the thin-film transistor of the first exemplary embodiment for the pixel unit and/or the drive circuit.

FIG. 15 is a top plan view showing an example of an active matrix display. The display includes a substrate 300, and a pixel unit 301, a first scan line drive circuit 302, a second scan line drive circuit 303, and a signal line drive circuit 304 formed on the substrate 300. Multiple signal lines extend from the signal line drive circuit 304 to the pixel unit 301. Multiple scan lines extend from the first scan line drive circuit 302 and the second scan line drive circuit 303 to the pixel unit 301. Pixels each including a display element are provided in a matrix at intersections of the scan lines and the signal lines. The substrate 300 of the display is connected to a timing controller (controller, also referred to as a control IC) through a connector such as an FPC (Flexible Printed Circuit).

As shown in FIG. 15, the first scan line drive circuit 302, the second scan line drive circuit 303, and the signal line drive circuit 304 are provided on the same substrate 300 as the pixel unit 301. Such an arrangement results in reduction in the number of external component (e.g. drive circuit) and, consequently, reduction in production cost. In addition, when the drive circuit is provided outside the substrate 300, the lines have to be extended and the connection between the lines increases. With the drive circuit being provided on the same substrate 300, the number of connections between the lines can be reduced, thereby improving the reliability and yield rate.

Figure 16:
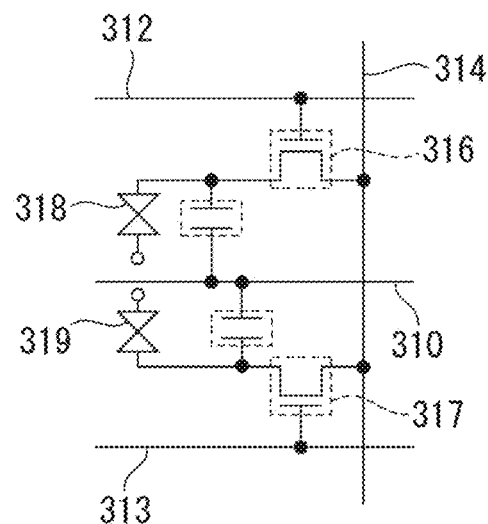
FIG. 16 illustrates a circuit of a pixel unit applicable to a pixel of a VA liquid crystal display.

An example of a pixel circuit is shown in FIG. 16. FIG. 9B shows a circuit of a pixel unit applicable to a pixel unit of a VA liquid crystal display.

The circuit of the pixel unit is applicable to a device having a plurality of pixel electrodes in one pixel. The pixel electrodes are each connected to different transistors, whereby each of the transistors is drivable in accordance with a different gate signal. Thus, the signals to be applied to the respective pixel electrodes of a multi-domain structure can be independently controlled.

A gate line 312 of a transistor 316 and a gate line 313 of a transistor 317 are separated so that different gate signals are inputted thereto. In contrast, a source electrode or drain electrode 314 serving as a data line is common to the transistors 316 and 317. The transistors 316 and 317 may be the transistors according to the first exemplary embodiment. A highly reliable liquid crystal display can be thereby provided.

First and second pixel electrodes are electrically connected to the transistors 316 and 317, respectively. The first pixel electrode is separated from the second pixel electrode. Shapes of the first and second pixel electrodes are not particularly limited. For instance, the first pixel electrode may be V-shaped.

Gate electrodes of the transistors 316 and 317 are connected with the gate lines 312 and 313, respectively. Different gate signals can be inputted to the gate lines 312 and 313 so that the transistors 316 and 317 are operated at different timings, thereby controlling orientation of the liquid crystal.

A capacity line 310, a gate insulating film serving as a dielectric, and a capacity electrode electrically connected with the first pixel electrode or the second pixel electrode may be provided to define a holding capacity.

In a multi-domain structure, first and second liquid crystal devices 318 and 319 are provided in one pixel. The first liquid crystal device 318 includes the first pixel electrode, an opposing electrode, and a liquid crystal layer interposed between the first pixel electrode and the opposing electrode. The second liquid crystal device 319 includes the second pixel electrode, an opposing electrode, and a liquid crystal layer interposed between the second pixel electrode and the opposing electrode.

The pixel unit is not necessarily arranged as shown in FIG. 16. The pixel unit shown in FIG. 16 may additionally include a switch, a resistor, a capacitor, a transistor, a sensor, and/or a logic circuit.

Figure 17:
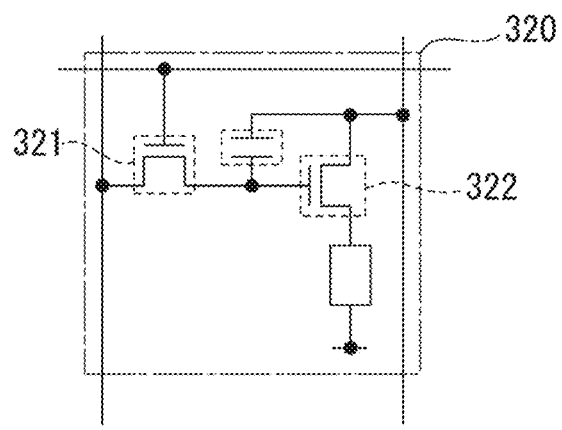
FIG. 17 illustrates a circuit of a pixel unit of a solid-state image sensor using the thin-film transistor according to the first exemplary embodiment.

Another example of a pixel circuit is shown in FIG. 17. Illustrated is a structure of a pixel unit in a display using an organic EL device.

FIG. 17 illustrates an applicable example of a circuit of a pixel unit 320. In this example, two n-channel transistors are used in one pixel. The oxide semiconductor thin-film according to the first exemplary embodiment is usable for channel-formation regions of the n-channel transistors. The circuit of the pixel unit can be driven in accordance with digital pulse width modulation control.

The switching transistor 321 and the drive transistor 322 may be the thin-film transistors according to the first exemplary embodiment. A highly reliable organic EL display can be thereby provided.

The circuit of the pixel unit is not necessarily arranged as shown in FIG. 17. The circuit of the pixel unit shown in FIG. 17 may additionally include a switch, a resistor, a capacitor, a sensor, a transistor, and/or a logic circuit.

The thin-film transistor according to the first exemplary embodiment used in a display has been described above.

Next, a solid-state image sensor incorporating the thin-film transistor according to the first exemplary embodiment will be described with reference to FIG. 18.

CMOS (Complementary Metal Oxide Semiconductor) image sensor is a solid-state image sensor including a signal charge accumulator for retaining an electric potential, and an amplification transistor for transferring (outputting) the electric potential to a vertical output line. When the signal charge accumulator is charged or discharged by a possible leak current from the reset transistor and/or the transfer transistor of the CMOS image sensor, the electric potential of the signal charge accumulator changes. The change in the electric potential of the signal charge accumulator results in the change in the electric potential of the amplification transistor (i.e. shift from a desired value), deteriorating the quality of the captured image.

An effect of the thin-film transistor according to the first exemplary embodiment incorporated in the reset transistor and transfer transistor of the CMOS image sensor will be described below. The amplification transistor may be any one of the thin-film transistor or a bulk transistor.

Figure 18:
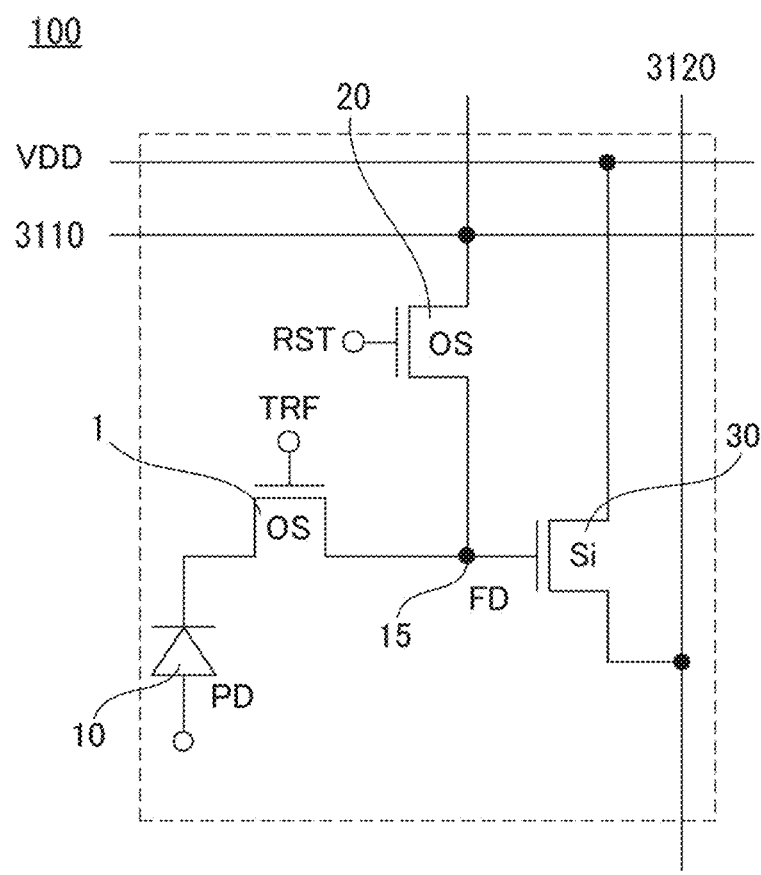
FIG. 18 illustrates an arrangement of an equivalent circuit of a unit cell of a CMOS image sensor.

FIG. 18 illustrates an exemplary arrangement of the CMOS image sensor. The pixel includes a photodiode 10 (photoelectric converter), a transfer transistor 1, a reset transistor 20, an amplification transistor 30, and various lines. A plurality of the pixels are arranged in a matrix to form the sensor. A selector transistor may be electrically connected to the amplification transistor 30. The characters in the transistor signs each represent a preferable material to be used for the transistors, where "OS" represents Oxide Semiconductor and "Si" represents silicon. The same applies to the other drawing(s).

The photodiode 10 is connected to a source of the transfer transistor 1. A signal charge accumulator 15 (also referred to as FD (Floating Diffusion)) is provided to a drain of the transfer transistor 1. The source of the reset transistor 15 and the gate of the amplification transistor 30 are connected to the signal charge accumulator 15. A reset power line 3110 may be omitted in other embodiments. For instance, the drain of the reset transistor 20 may be connected with a power line VDD or a vertical output line 3120 instead of the reset power line 3110.

The oxide semiconductor thin-film according to the exemplary embodiment of the invention, which may be made of the same material as the oxide semiconductor thin-film used for the transfer transistor 1 and the reset transistor 20, may be used in the photodiode 10.

The thin-film transistor according to the first exemplary embodiment used in a display has been described above.

A second exemplary embodiment will be described below.

Initially, the second exemplary embodiment will be briefly summarized below.

As disclosed in Patent Literature 1, it is known that a sintered oxide, which contains an element A selected from the group consisting of Sc, Y, La, Ce, Pr, Nd, Pm, Sm, Eu, Gd, Tb, Dy, Ho, Er, Tm, Yb, and Lu, a B element selected from the group consisting of Al and Ga, and In, sometimes includes a Bixbyite crystalline phase of $In_2O_3$, and $A_3B_5O_{12}$ crystalline phase.

In this regard, the inventors have examined the crystal structure of In—Ga—Al—Yb system and In—Sn—Ga—Al—Yb system sintered oxides to find that a new garnet compound, which is neither the Bixbyite crystalline phase represented by $In_2O_3$ nor $Yb_3Ga_5O_{12}$ and $Yb_3A_5O_{12}$ ($A_3B_5O_{12}$ crystalline phase), is sometimes generated. Exact structural formula of the garnet compound is unknown. However, it has been confirmed by the inventors that the lattice constant of the garnet compound is between the lattice constant of $Yb_3Ga_5O_{12}$ and the lattice constant of $Yb_3A_5O_{12}$. Accordingly, the structural formula can be represented by $Yb_3(Ga_{5-x}Al_x)O_{12}$ (0<X<5).

It is also found by the inventors that cracks are not likely to be caused in a sputtering process using a sintered oxide containing the garnet compound as a sputtering target.

The above is a summary of the second exemplary embodiment.

The second exemplary embodiment will be detailed below.

Garnet Compound

Initially, a garnet compound of the second exemplary embodiment will be described below.

A garnet compound according to a first example of the second exemplary embodiment is represented by a formula (I) below,

$$Ln_3(Ga_{5-x}Al_x)O_{12} \qquad (I),$$

where Ln represents at least one metal element selected from Gd, Tb, Dy, Ho, Er, Tm, Yb, and Lu, and 0<X<5.

A garnet compound according to a second example of the second exemplary embodiment is represented by the formula (I) below,

$$Ln_3(Ga_{5-x}Al_x)O_{12} \qquad (I),$$

where Ln represents at least one metal element selected from Gd, Tb, Dy, Ho, Er, Tm, Yb, and Lu, and 0<X<5, and a lattice constant of the garnet compound is $11.93 \times 10^{-10}$ m or more and $12.20 \times 10^{-10}$ m or less.

The garnet compound satisfying the conditions mentioned in the first and second examples is not likely to cause cracks when being used as a sputtering target.

In the first and second examples, Ln is preferably Yb element. This is because Yb is rich in reserve among Ln (i.e. abundant as natural resources).

The garnet compound is obtained by sintering oxides of Ln, Ga, and Al.

The garnet compound of the second exemplary embodiment has been described above.

Sintered Oxide

Next, a sintered oxide according to the second exemplary embodiment will be described below.

A sintered oxide according to the first example of the second exemplary embodiment includes a garnet crystalline phase represented by a formula (I) below,

$$Ln_3(Ga_{5-x}Al_x)O_{12} \qquad (I),$$

where Ln represents at least one metal element selected from Gd, Tb, Dy, Ho, Er, Tm, Yb, and Lu, and 0<X<5.

A sintered oxide according to the second example of the second exemplary embodiment includes a garnet crystalline phase containing In element, Ga element, Al element and Ln element, the lattice constant of the garnet crystalline phase being $11.93 \times 10^{-10}$ m or more and $12.20 \times 10^{-10}$ m or less, where Ln represents at least one metal element selected from Gd, Tb, Dy, Ho, Er, Tm, Yb, and Lu.

The sintered oxide satisfying the conditions mentioned in the first and second examples is not likely to cause cracks during sputtering process when being used as a sputtering target.

Ln in the first and second examples of the second exemplary embodiment is preferably Yb element. The reason is the same as those in the first and second examples of the garnet compound.

A sintered oxide according to a third example of the second exemplary embodiment includes:

a garnet crystalline phase represented by the formula (I), $$Ln_3(Ga_{5-x}Al_x)O_{12} \tag{I}$$

where Ln represents at least one metal element selected from Gd, Tb, Dy, Ho, Er, Tm, Yb, and Lu, and 0<X<5; and a Bixbyite crystalline phase represented by $In_2O_3$.

A sintered oxide according to a fourth example of the second exemplary embodiment includes;

a garnet crystalline phase containing In element, Ga element, Al element and Ln element, the lattice constant of the garnet crystalline phase being $11.93 \times 10^{-10}$ m or more and $12.20 \times 10^{-10}$ m or less; and a Bixbyite crystalline phase represented by $In_2O_3$, where Ln represents at least one metal element selected from Gd, Tb, Dy, Ho, Er, Tm, Yb, and Lu.

The sintered oxide including the garnet crystalline phase is not likely to cause cracks during sputtering process when being used as a sputtering target.

The sintered oxide including the Bixbyite crystalline phase improves a film density of an oxide semiconductor thin-film formed through sputtering when the sintered oxide is used as the sputtering target.

Ln in the third and fourth examples of the second exemplary embodiment is preferably Yb element. The reason is the same as those in the first and second examples of the garnet compound.

The sintered oxide including the garnet compound is obtained by sintering oxides of Ln, Ga, and Al.

The crystalline phase of the resultant garnet compound changes depending on the composition of the sintered material.

For instance, when the material of the sintered oxide is indium oxide, aluminum oxide, gallium oxide, and ytterbium oxide as lanthanoid oxide, the sintered oxide contains the Bixbyite crystalline phase represented by $In_2O_3$ and the garnet crystalline phase different from $Yb_3Ga_5O_{12}$ crystalline phase and/or $Yb_3A_5O_{12}$ crystalline phase emerge, the garnet crystalline phase containing a garnet compound being represented by the following formula $$Yb_3(Ga_{5-x}Al_x)O_{12} \tag{I'}$$

where 0<X<5.

A sintered oxide according to a fifth example of the second exemplary embodiment contains In element, Ga element, and Ln element at respective atomic ratios as defined in formulae (2-1) to (2-3) below, $$0.75 \leq In/(In+Ga+Ln) \leq 0.96 \tag{2-1},$$

$$0.03 \leq Ga/(In+Ga+Ln) \leq 0.10 \tag{2-2}, \text{ and}$$

$$0.01 \leq Ln/(In+Ga+Ln) \leq 0.15 \tag{2-3},$$

where In, Ga, and Ln represent the number of atoms of In element, Ga element, and Ln element in the sintered oxide, respectively, and Ln represents at least one metal element selected from Gd, Tb, Dy, Ho, Er, Tm, Yb, and Lu.

The sintered oxide containing In, Ga, and Ln at ratios satisfying the formulae (2-1) to (2-3) provides a target for producing an oxide semiconductor thin-film with high carrier mobility and small change in properties during CVD process and the like.

Preferably, the atomic ratio of each of the elements satisfies formulae (2-1A) to (2-3A) below.

$$0.80 \leq In/(In+Ga+Ln) \leq 0.96 \tag{2-1A}$$

$$0.05 \leq Ga/(In+Ga+Ln) \leq 0.08 \tag{2-2A}$$

$$0.03 \leq Ln/(In+Ga+Ln) \leq 0.15 \tag{2-3A}$$

A sintered oxide according to a fifth example preferably includes a garnet crystalline phase represented by $Yb_3Ga_5O_{12}$ and the Bixbyite crystalline phase represented by $In_2O_3$.

The sintered oxide including the garnet crystalline phase is not likely to cause cracks during sputtering process when being used as a sputtering target.

The sintered oxide including the Bixbyite crystalline phase improves a film density of an oxide semiconductor thin-film formed through sputtering when the sintered oxide is used as the sputtering target.

A sintered oxide according to a sixth example of the second exemplary embodiment contains In element, Ga element, Ln element, and Al element at respective atomic ratios as defined in formulae (2-4) to (2-7) below, $$0.70 \leq In/(In+Ga+Ln+Al) \leq 0.95 \tag{2-4}$$

$$0.03 \leq Ga/(In+Ga+Ln+Al) \leq 0.10 \tag{2-5}$$

$$0.01 \leq Ln/(In+Ga+Ln+Al) \leq 0.10 \tag{2-6}$$

$$0.01 \leq Al/(In+Ga+Ln+Al) \leq 0.10 \tag{2-7}$$

where In, Ga, Ln, and Al represent the number of atoms of In element, Ga element, Ln element, and Al element in the sintered oxide, respectively, and Ln represents at least one metal element selected from Gd, Tb, Dy, Ho, Er, Tm, Yb, and Lu.

The sintered oxide containing the elements at ratios satisfying the formulae (2-4) to (2-6) provides a target for producing an oxide semiconductor thin-film with high carrier mobility and small change in properties during CVD process and the like.

The sintered oxide satisfying the formula (2-7) can lower the bulk resistivity of the sintered oxide.

Preferably, the atomic ratio of each of the elements in the sintered oxide of the sixth example satisfies formulae (2-4A) to (2-7A) below.

$$0.76 \leq In/(In+Ga+Ln+Al) \leq 0.90 \tag{2-4A}$$

$$0.05 \leq Ga/(In+Ga+Ln+Al) \leq 0.08 \tag{2-5A}$$

$$0.03 \leq Ln/(In+Ga+Ln+Al) \leq 0.08 \tag{2-6A}$$

$$0.02 \leq Al/(In+Ga+Ln+Al) \leq 0.08 \tag{2-7A}$$

The sintered oxide according to the sixth example of the second exemplary embodiment optionally contains Sn element at a content in a range from 100 to 10000 ppm.

The Sn element contained in the sintered oxide can reduce the bulk resistivity of the sintered oxide and prevent cracks in the target when the target is heated by plasma during a sputtering process.

The sintered oxide according to the sixth example preferably includes the garnet crystalline phase represented by the formula (I) and the Bixbyite crystalline phase represented by In$_2$O$_3$, $$Ln_3(Ga_{5-x}Al_x)O_{12} \quad \text{Formula (I)}$$

where 0<X<5.

The reason is the same as those in the sintered oxide of the third and fourth examples.

It should be noted that the measurement method of the composition of the sintered oxide of the second exemplary embodiment, which is the same as that in the first exemplary embodiment, will be omitted.

The sintered oxide of the second exemplary embodiment has been described above.

Next, a production method of the sintered oxide of the second exemplary embodiment will be described below.

The production method, which is not particularly limited as long as the sintered oxide according to the second exemplary embodiment is producible, may exemplarily include the following steps (a) to (c) as in the first exemplary embodiment.

(a) Preparing a mixture by mixing material compound powders
(b) Preparing a molding body by molding the mixture
(c) Sintering the molding body (1) Step (a): Mixing Step In a mixing step, the material of the sintered oxide is mixed.

The material include In compound powder, Ga compound powder, Ln compound powder, and, as necessary, Al compound powder. Examples of the compounds include oxides, and hydroxides. In terms of adaptability to sintering and unlikelihood of a residual by-product, all of these compound powders are preferably oxides.

When the material includes indium oxide, gallium oxide, and ytterbium oxide, the sintered oxide includes the Bixbyite crystalline phase represented by In$_2$O$_3$. In this case, it is believed that gallium oxide and ytterbium oxide are dissolved in the Bixbyite crystalline phase represented by In$_2$O$_3$ to form solid solutions. When the added amount of gallium oxide and ytterbium oxide is increased in indium oxide, gallium oxide, and ytterbium oxide, a sintered oxide having the garnet crystalline phase represented by Yb$_3$Ga$_5$O$_{12}$ is obtained.

The purity of the material is usually 2N (99 mass %) or more, preferably 3N (99.9 mass %) or more, especially preferably 4N (99.99 mass %) or more. At the purity of 2N or more, the durability of the sintered oxide can be ensured. Further, the impurities are less likely to be segregated in the oxide semiconductor film when the sintered oxide is used for a liquid crystal display, and less likely to enter a gate insulating film and/or an interlayer insulating film to cause operation failure and/or burn-in in the oxide semiconductor.

An average particle size of the material powder is preferably 0.1 μm or more and 2 μm or less, more preferably 0.5 μm or more and 1.5 μm or less. The average particle size of the material powder is measurable using a laser diffraction particle size analyzer or the like.

The method for mixing and molding the material is not particularly limited (i.e. the material may be mixed and molded in any known manner). A binder may be added to the material mixture when the material is mixed.

The material may be mixed using a known apparatus such as a ball mill, bead mill, jet mill, and ultrasonic devices. Conditions for the mixing (e.g. pulverization time) may be determined as required. The pulverization time is preferably in a range from 6 hours to 100 hours.

(2) Step (b): Molding Step

In the molding step, the material mixture (pre-sintered product when the pre-sintering step is conducted) is molded under pressure to form a molding body. Through this step, the material is formed into a shape suitable as a target. When the pre-sintering step is conducted, the resultant particles of the pre-sintered product are pelletized and are subsequently pressed into a desired shape.

An average thickness of the molding body is preferably 5.5 mm or more, more preferably 6 mm or more, further preferably 8 mm or more, and especially preferably 12 mm or more. At the thickness of 5.5 mm or more, a temperature gradient in the thickness direction of the molding body is reduced, so that it is expectable that a change in the combination of crystal types at the surface and a depth part of the molding body is unlikely to occur.

Examples of the molding process usable in the molding step include press molding (uniaxial press), die molding, casting, and injection molding. It is preferable to mold the material using CIP (Cold Isostatic Pressing) in order to obtain a sintered oxide (target) with a high sintering density.

Two or more molding steps may be conducted, where, for instance, the material is subjected to CIP (Cold Isostatic Pressing), HIP (Hot Isostatic Pressing) or the like after press molding (uniaxial press).

When a CIP or HIP machine is used, a surface pressure is preferably kept at 78.5 MPa (in terms of SI unit equivalent to 800 kgf/cm$^2$) or more and 392.4 MPa (in terms of SI unit equivalent to 4000 kgf/cm$^2$) for 0.5 minutes or more and 60 minutes or less. The surface pressure is preferably 196.2 MPa or more and 294.3 MPa or less and is preferably kept for 2 minutes or more and 30 minutes or less. Within the above range, it is expectable that unevenness in composition or the like inside the molding body is reduced (i.e. the composition is uniformed). At the surface pressure of 78.5 MPa or more, the density after sintering and, consequently, the resistance of the sintered oxide are reduced. At the surface pressure of 392.4 MPa or less, the material can be molded without increasing the size of the molding machine. At a holding time of 0.5 minutes or more, the density and resistance can be kept from being raised after sintering. The holding time of 60 minutes or less is not too time-consuming to be economical.

In the molding process, a molding aid such as polyvinyl alcohol, methyl cellulose, polywax, and oleic acid may be used.

(3) Step (c): Sintering Step

The sintering step is an indispensable step for sintering the molding body obtained in the molding step.

The sintering temperature is preferably in a range from 1200 degrees C. to 1650 degrees C., more preferably from 1350 degrees C. to 1600 degrees C., further preferably from 1400 degrees C. to 1600 degrees C., furthermore preferably from 1450 degrees C. to 1600 degrees C.

The sintering time is preferably in a range from 10 hours to 50 hours, more preferably from 12 hours to 40 hours, further preferably from 13 hours to 30 hours.

At the sintering temperature of 1200 degrees C. or more and the sintering time of 10 hours or more, the target is so sufficiently sintered that the electric resistance of the target is sufficiently lowered and the abnormal electrical discharge is unlikely to occur. At the sintering temperature of 1650 degrees C. or less and the sintering time of 50 hours or less, an increase in the average particle size and occurrence of coarse vacancy due to eminent growth in crystal grains can be prevented, so that the strength of the sintered oxide is not likely to be decreased and the abnormal electrical discharge is not likely to occur.

In a normal pressure sintering, the molding body is sintered in an atmospheric air or oxygen-gas atmosphere. In the oxygen-gas atmosphere, it is preferable that the oxygen concentration is, for instance, 20 volume % or more and 80 volume % or less. The density of the sintered oxide can be increased by performing a temperature-increase step in the oxygen-gas atmosphere.

A temperature increase rate in the sintering process is preferably 0.1 degrees C./min to 2 degrees C./min in a temperature range from 800 degrees C. to the sintering temperature.

The sintering process in the sintered oxide according to the second exemplary embodiment most effectively progresses in the temperature range at or above 800 degrees C. At the temperature increase rate of 0.1 degrees C./min or more in this temperature range, excessive growth of the crystal grains can be restrained, achieving a high-density sintered oxide. At the temperature increase rate of 2 degrees C./min or less, warpage or cracks on the sintered oxide, which is caused due to uneven temperature distribution in the molding body, can be restrained.

The temperature increase rate in the temperature range from 800 degrees C. to the sintering temperature is preferably in a range from 0.5 degrees C./min to 2.0 degrees C./min, more preferably 1.0 degree C./min to 1.8 degrees C./min.

Sputtering Target

Next, a sputtering target according to the second exemplary embodiment will be described below.

The garnet compound and the sintered oxide containing the garnet compound according to the second exemplary embodiment are ground and bonded to a backing plate for use as a sputtering target. An oxide semiconductor film can be formed through sputtering using the sputtering target.

The shape and structure of the target, which is not particularly limited, is exemplified by the same shape and structure as in the first exemplary embodiment. The sintered oxide may be a plate as shown in FIG. 1 (item 801) or a hollow cylinder as shown in FIG. 2 (item 801A). When the sintered oxide is plate-shaped, the sintered oxide may be rectangular in a plan view as shown in FIG. 1(A) (item 1) or circular in a plan view as shown in FIG. 3 (item 801B). The sintered oxide may be a single-piece molding body or may be a multiple-division component including a plurality of divided sintered oxides (item 801C) fixed on a backing plate 803 as shown in FIG. 4.

The backing plate 803 is a holder/cooler for the sintered oxide. The backing plate 803 is preferably made of a material with excellent thermal conductivity (e.g. copper).

As in the first exemplary embodiment, the sputtering target is produced through, for instance, the following steps.

(d) Grinding a surface of the sintered oxide (grinding step)

(e) Bonding the sintered oxide on the backing plate (bonding step)

The above steps will be specifically described below.

(4) Step (d): Grinding Step

In the grinding step, the sintered oxide is ground into a shape adapted to be attached to a sputtering apparatus.

The surface of the sintered oxide is often partially highly oxidized or roughened. Further, the sintered oxide has to be cut into piece(s) of a predetermined size.

The surface of the sintered oxide is preferably ground for 0.3 mm or more. The grinding depth is more preferably 0.5 mm or more, especially preferably 2 mm or more. A part of the sintered oxide at or near the surface thereof, at which crystal structure is modified, can be removed by grinding 0.3 mm or more.

It is preferable to grind the sintered oxide using, for instance, a surface grinder to form a material whose average surface roughness Ra is 5 μm or less. A sputtering surface of the sputtering target may further be mirror-finished so that the average surface roughness Ra is $1000 \times 10^{-10}$ m or less. The mirror-finishing (polishing) may be performed using any known polishing technique including mechanical polishing, chemical polishing, and mechanochemical polishing (combination of the mechanical polishing and chemical polishing). For instance, the surface may be polished using a fixed-abrasive-grain polisher (polishing liquid: water) to #2000 or finer grain size, or may be lapped using diamond-paste polishing material after lapping using a loose-abrasive-grain lapping material (polishing material: SiC paste etc.). The polishing method is not limited to the above. Examples of the polishing material include a polishing material with #200 grit size, #400 grit size, and #800 grit size.

The sintered oxide after the polishing step is preferably cleaned with an air blower or washed with running water and the like. When a foreign substance is to be removed using an air blower, air is preferably sucked with a dust catcher provided at a side opposite a nozzle for effective removal. It should be noted that ultrasonic cleaning may further be performed in view of the limited cleaning power of the air blower and running water. The ultrasonic cleaning is effectively performed with oscillation at multiple frequencies ranging from 25 kHz to 300 kHz. For instance, twelve waves of different frequencies ranging from 25 kHz to 300 kHz in 25 kHz increments are preferably applied for the ultrasonic cleaning.

(5) Step (e): Bonding Step

In the step (e), the sintered oxide after being ground is bonded to the backing plate using a low-melting-point metal such as indium.

The sputtering target has been described as the above.

Oxide Semiconductor Thin-Film

Next, an oxide semiconductor thin-film according to the second exemplary embodiment will be described below.

The oxide semiconductor thin-film of the first example of the second exemplary embodiment contains In element, Ga element, and Ln element at respective atomic ratios as defined in formulae (2-1) to (2-3) below, $$0.75 \leq \text{In}/(\text{In}+\text{Ga}+\text{Ln}) \leq 0.96 \quad (2\text{-}1),$$

$$0.03 \leq \text{Ga}/(\text{In}+\text{Ga}+\text{Ln}) \leq 0.10 \quad (2\text{-}2), \text{ and}$$

$$0.01 \leq \text{Ln}/(\text{In}+\text{Ga}+\text{Ln}) \leq 0.15 \quad (2\text{-}3),$$

where In, Ga, and Ln represent the number of atoms of In element, Ga element, and Ln element in the oxide semiconductor thin-film, respectively, and Ln represents at least one metal element selected from Gd, Tb, Dy, Ho, Er, Tm, Yb, and Lu.

Indium (In) element ensures the carrier mobility in the oxide semiconductor thin-film. When the In ratio is less than the lower limit defined in the formula (2-1), for instance, indium oxide is sometimes not crystallized to lower the carrier mobility in the semiconductor thin-film. The In ratio exceeding the upper limit may cause too much oxygen vacancies to form a semiconductor film (i.e. the film may become a conductor).

Gallium (Ga) element is effective in reducing occurrence of oxygen vacancies and increasing a band gap in a resultant oxide semiconductor thin-film. At the Ga ratio of less than the lower limit in the formula (2-1), the effect for reducing the oxygen vacancies is sometimes too small to form a semiconductor, and/or the lattice constant of the crystal sometimes may not become smaller than the lattice constant of the Bixbyite crystalline phase represented by $In_2O_3$. At the Ga ratio of exceeding the upper limit, oxygen vacancies are sometimes eliminated to turn the resultant film to an insulation film, the thin-film is sometimes not crystallized, and the carrier mobility in TFT sometimes becomes small.

Ln element is effective in reducing occurrence of oxygen vacancies and is believed to be effective in improving CVD resistance of the oxide semiconductor thin-film. The above effects may not be sufficiently exhibited at a content less than the lower limit in the formula (2-3). At a content exceeding the upper limit, the above effects are excessively exhibited to turn the oxide semiconductor thin-film to form an insulation film.

Preferably, atomic ratio of each of the elements satisfies formulae (2-1A) to (2-3A) below.

$$0.80 \leq In/(In+Ga+Ln) \leq 0.96 \quad (2\text{-}1A)$$

$$0.05 \leq Ga/(In+Ga+Ln) \leq 0.08 \quad (2\text{-}2A)$$

$$0.03 \leq Ln/(In+Ga+Ln) \leq 0.15 \quad (2\text{-}3A)$$

The oxide semiconductor thin-film of the second example of the second exemplary embodiment contains In element, Ga element, Ln element, and Al element at respective atomic ratios as defined in formulae (2-4) to (2-7) below.

$$0.70 \leq In/(In+Ga+Ln+Al) \leq 0.95 \quad (2\text{-}4)$$

$$0.03 \leq Ga/(In+Ga+Ln+Al) \leq 0.10 \quad (2\text{-}5)$$

$$0.01 \leq Ln/(In+Ga+Ln+Al) \leq 0.10 \quad (2\text{-}6)$$

$$0.01 \leq Al/(In+Ga+Ln+Al) \leq 0.10 \quad (2\text{-}7),$$

where In, Ga, Ln, and Al represent the number of atoms of In element, Ga element, Ln element, and Al element in the oxide semiconductor thin-film, respectively, and Ln represents at least one metal element selected from Gd, Tb, Dy, Ho, Er, Tm, Yb, and Lu.

The reasons of adding In, Ga, and Ln are the same as in the first example.

Aluminum (Al) element is effective in reducing occurrence of oxygen vacancies and increasing a band gap in a resultant oxide semiconductor thin-film. The addition of aluminum is especially effective in restraining an increase in carriers in a CVD process for forming an insulation film to facilitate adjustment of semiconductor properties in the subsequent heat treatment. Specifically, the addition of aluminum is effective in reducing the carrier concentration in a heat treatment at a temperature lower than a typical heat treatment. Further, it is believed that with the addition of aluminum oxide, which per se is low in oxygen diffusion coefficient, the oxygen diffusion rate in indium oxide can be reduced relative to the oxygen diffusion rate in indium oxide consisting solely of base material oxide. Oxygen vacancies in the oxide semiconductor thin-film increase in the CVD process to increase the carrier concentration. The addition of aluminum reduces the oxygen vacancies by the heat treatment after the CVD process to reduce the carriers in the surface of the oxide semiconductor. It is speculated that the carrier concentration at a channel portion inside the oxide semiconductor thin-film near the gate insulating film is kept at a high level, achieving high carrier mobility. In order to exhibit the above effect, the Al content has to satisfy the lower limit in the formula (2-7). The Al content exceeding the upper limit in the formula (2-7) may eliminate the oxygen vacancies to turn the thin film to an insulation film.

The oxide semiconductor thin-film according to the second example optionally contains Sn element at a content in a range from 100 to 10000 ppm. The bulk resistivity of the target for forming the oxide semiconductor thin-film can be lowered, so that the carrier concentration of the resultant oxide semiconductor thin-film can be easily controlled at a constant level. Thus, an oxide semiconductor thin-film with stable properties (i.e. the TFT properties are less likely to be affected by the CVD process and subsequent annealing step) can be obtained.

The content (atomic ratio) of each of the metal elements in the oxide semiconductor thin-film can be determined by measuring the amount of the elements in the same manner as in the first exemplary embodiment. An inductively coupled plasma emission spectrometer can be used for the ICP measurement.

Though the production method is not particularly limited, the oxide semiconductor thin-film according to the second exemplary embodiment is preferably produced through sputtering using the target made of the sintered oxide according to the second exemplary embodiment, as in the first exemplary embodiment.

Thin-Film Transistor

Next, a structure of a thin-film transistor according to the second exemplary embodiment will be described below.

The structure of the thin-film transistor according to the second exemplary embodiment is not particularly limited as long as the thin-film transistor includes the oxide semiconductor thin-film according to the second exemplary embodiment and serves as a transistor. With the use of the oxide semiconductor thin-film according to the second exemplary embodiment, a high-performance thin-film transistor can be provided.

Details of the thin-film transistor, which are substantially the same as described in the first exemplary embodiment, are omitted herein.

Usage of Thin-Film Transistor

The thin-film transistor according to the second exemplary embodiment is also capable of being embodied as various integrated circuits such as a field-effect transistor, logic circuit, memory circuit, and differential amplifier, which are applicable to electronic devices. Further, the thin-film transistor according to the second exemplary embodiment is also applicable to an electrostatic inductive transistor, Schottky barrier transistor, Schottky diode, and resistor, in addition to the field-effect transistor.

The thin-film transistor according to the second exemplary embodiment is suitably usable for a display, solid-state image sensor, and the like.

Specific structure of the thin-film transistor, which is substantially the same as described in the first exemplary embodiment, will be omitted herein.

Quantum-Tunneling Field-Effect Transistor

The oxide semiconductor thin-film according to the second exemplary embodiment is usable for a quantum-tunneling Field-Effect Transistor (FET).

Specific structure of the FET, which is substantially the same as described in the first exemplary embodiment, will be omitted herein.

The above is the description of the second exemplary embodiment.

A third exemplary embodiment will be described below.

Initially, the second exemplary embodiment will be briefly summarized below.

As disclosed in Patent Literature 3, a sintered oxide containing In element and Sn element, and an oxide semiconductor thin-film (ITO thin-film) formed by using the sintered oxide as a target, are known.

The Applicant made a sample of a sintered oxide containing ITO and further added with Ln element. As a result, it was found that no Ln compound was formed in the sintered oxide in spite of the addition of Ln. Further, In element and Sn element only formed oxides thereof (i.e. $In_2O_3$ and $SnO_2$, respectively), and no compound containing both of In element and Sn element was formed.

The sintered oxide was then used as a target for forming an oxide semiconductor thin-film. As a result, it was found that no crack was caused, thereby reaching the invention.

The above is a summary of the third exemplary embodiment.

Next, a sintered oxide according to the third exemplary embodiment will be specifically described below.

The sintered oxide of the third exemplary embodiment contains In element, Sn element, and Ln element at respective atomic ratios as defined in formulae (2-8) to (2-10) below, $$0.55 \leq In/(In+Sn+Ln) \leq 0.90 \quad (2\text{-}8),$$

$$0.05 \leq Sn/(In+Sn+Ln) \leq 0.25 \quad (2\text{-}9), \text{ and}$$

$$0.05 \leq Ln/(In+Sn+Ln) \leq 0.20 \quad (2\text{-}10),$$

where In, Sn, and Ln represent the number of atoms of In element, Sn element, and Ln element in the sintered oxide, respectively, and Ln represents at least one metal element selected from Gd, Tb, Dy, Ho, Er, Tm, Yb, and Lu.

The sintered oxide satisfying the formulae (2-8) to (2-10) is unlikely to cause cracks and the like during film-formation.

Further, an oxide semiconductor thin-film made of the sintered oxide as a target exhibits high carrier mobility and small change in properties during CVD process and the like.

Preferably, atomic ratio of each of the elements in the sintered oxide of the third exemplary embodiment satisfies formulae (2-8A) to (2-10A) below.

$$0.62 \leq In/(In+Sn+Ln) \leq 0.84 \quad (2\text{-}8A)$$

$$0.08 \leq Sn/(In+Sn+Ln) \leq 0.23 \quad (2\text{-}9A)$$

$$0.08 \leq Ln/(In+Sn+Ln) \leq 0.15 \quad (2\text{-}10A)$$

A sintered oxide according to the third exemplary embodiment preferably includes a rutile crystalline phase represented by $SnO_2$ and the Bixbyite crystalline phase represented by $In_2O_3$.

The rutile crystalline phase included in the sintered oxide can reduce the bulk resistivity of the sintered oxide and prevent cracks in the target when the target is heated by plasma during a sputtering process.

The sintered oxide including the Bixbyite crystalline phase improves a film density of an oxide semiconductor thin-film formed through sputtering when the sintered oxide is used as the sputtering target.

The sintered oxide according to the third exemplary embodiment of the invention can be produced by sintering the oxides of In, Sn and Ln.

For instance, when a material containing indium oxide, tin oxide, and ytterbium oxide are sintered, the sintered oxide includes the Bixbyite crystalline phase represented by $In_2O_3$ and the rutile crystalline phase represented by $SnO_2$.

Next, a production method of the sintered oxide of the third exemplary embodiment will be described below.

The production method, which is not particularly limited as long as the sintered oxide according to the third exemplary embodiment is producible, may exemplarily include the following steps (a) to (c) as in the first exemplary embodiment.

(a) Preparing a mixture by mixing material compound powders (b) Preparing a molding body by molding the mixture (c) Sintering the molding body (1) Step (a): Mixing Step In a mixing step, the material of the sintered oxide is mixed.

In compound powder, compound powder, Sn compound powder, and Ln compound powder are used as the material. Examples of the compounds include oxides, and hydroxides. In terms of adaptability to sintering and unlikelihood of a residual by-product, all of these compound powders are preferably oxides.

The purity of the material is usually 2N (99 mass %) or more, preferably 3N (99.9 mass %) or more, especially preferably 4N (99.99 mass %) or more. At the purity of 2N or more, the durability of the sintered oxide can be ensured. Further, the impurities are less likely to be segregated in the oxide semiconductor film when the sintered oxide is used for a liquid crystal display, and less likely to enter a gate insulating film and/or an interlayer insulating film to cause operation failure and/or burn-in in the oxide semiconductor.

An average particle size of the material powder is preferably 0.1 µm or more and 2 µm or less, more preferably 0.5 µm or more and 1.5 µm or less. The average particle size of the material powder is measurable using a laser diffraction particle size analyzer or the like.

The method for mixing and molding the material is not particularly limited (i.e. the material may be mixed and molded in any known manner). A binder may be added to the material mixture when the material is mixed.

The material may be mixed using a known apparatus such as a ball mill, bead mill, jet mill, and ultrasonic devices. Conditions for the mixing (e.g. pulverization time) may be determined as required. The pulverization time is preferably in a range from 6 hours to 100 hours.

(2) Step (b): Molding Step

In the molding step, the material mixture (pre-sintered product when the pre-sintering step is conducted) is molded under pressure to form a molding body. Through this step, the material is formed into a shape suitable as a target. When the pre-sintering step is conducted, the resultant particles of the pre-sintered product are pelletized and are subsequently pressed into a desired shape.

An average thickness of the molding body is preferably 5.5 mm or more, more preferably 6 mm or more, further preferably 8 mm or more, and especially preferably 12 mm or more. At the thickness of 5.5 mm or more, a temperature gradient in the thickness direction of the molding body is reduced, so that it is expectable that a change in the combination of crystal types at the surface and a depth part of the molding body is unlikely to occur.

Examples of the molding process usable in the molding step include press molding (uniaxial press), die molding, casting, and injection molding. It is preferable to mold the material using CIP (Cold Isostatic Pressing) in order to obtain a sintered oxide (target) with a high sintering density.

Two or more molding steps may be conducted, where, for instance, the material is subjected to CIP (Cold Isostatic Pressing), HIP (Hot Isostatic Pressing) or the like after press molding (uniaxial press).

When a CIP or HIP machine is used, a surface pressure is preferably kept at 78.5 MPa (in terms of SI unit equivalent to 800 kgf/cm$^2$) or more and 392.4 MPa (in terms of SI unit equivalent to 4000 kgf/cm$^2$) for 0.5 minutes or more and 60 minutes or less. The surface pressure is preferably 196.2 MPa or more and 294.3 MPa or less and is preferably kept for 2 minutes or more and 30 minutes or less. Within the above range, it is expectable that unevenness in composition or the like inside the molding body is reduced (i.e. the composition is uniformed). At the surface pressure of 78.5 MPa or more, the density after sintering and, consequently, the resistance of the sintered oxide are reduced. At the surface pressure of 392.4 MPa or less, the material can be molded without increasing the size of the molding machine. At a holding time of 0.5 minutes or more, the density and resistance can be kept from being raised after sintering. The holding time of 60 minutes or less is not too time-consuming to be economical.

In the molding process, a molding aid such as polyvinyl alcohol, methyl cellulose, polywax, and oleic acid may be used.

(3) Step (c): Sintering Step

The sintering step is an indispensable step for sintering the molding body obtained in the molding step.

The sintering temperature is preferably in a range from 1200 degrees C. to 1650 degrees C., more preferably from 1350 degrees C. to 1600 degrees C., further preferably from 1400 degrees C. to 1600 degrees C., furthermore preferably from 1450 degrees C. to 1600 degrees C.

The sintering time is preferably in a range from 10 hours to 50 hours, more preferably from 12 hours to 40 hours, further preferably from 13 hours to 30 hours.

At the sintering temperature of 1200 degrees C. or more and the sintering time of 10 hours or more, the target is so sufficiently sintered that the electric resistance of the target is sufficiently lowered and the abnormal electrical discharge is unlikely to occur. At the sintering temperature of 1650 degrees C. or less and the sintering time of 50 hours or less, an increase in the average particle size and occurrence of coarse vacancy due to eminent growth in crystal grains can be prevented, so that the strength of the sintered oxide is not likely to be decreased and the abnormal electrical discharge is not likely to occur.

In a normal pressure sintering, the molding body is sintered in an atmospheric air or oxygen-gas atmosphere. In the oxygen-gas atmosphere, it is preferable that the oxygen concentration is, for instance, 20 volume % or more and 80 volume % or less. The density of the sintered oxide can be increased by performing a temperature-increase step in the oxygen-gas atmosphere.

A temperature increase rate in the sintering process is preferably 0.1 degrees C./min to 2 degrees C./min in a temperature range from 800 degrees C. to the sintering temperature.

The sintering process in the sintered oxide according to the third exemplary embodiment most effectively progresses in the temperature range at or above 800 degrees C. At the temperature increase rate of 0.1 degrees C./min or more in this temperature range, excessive growth of the crystal grains can be restrained, achieving a high-density sintered oxide. At the temperature increase rate of 2 degrees C./min or less, warpage or cracks on the sintered oxide, which is caused due to uneven temperature distribution in the molding body, can be restrained.

The temperature increase rate in the temperature range from 800 degrees C. to the sintering temperature is preferably in a range from 0.5 degrees C./min to 2.0 degrees C./min, more preferably 1.0 degree C./min to 1.8 degrees C./min.

It should be noted that the measurement method of the composition of the sintered oxide of the third exemplary embodiment, which is the same as that in the first exemplary embodiment, will be omitted.

Sputtering Target

Next, a sputtering target according to the third exemplary embodiment will be described below.

The garnet compound and the sintered oxide containing the garnet compound according to the third exemplary embodiment are ground and bonded to a backing plate for use as a sputtering target. An oxide semiconductor film can be formed through sputtering using the sputtering target.

The shape and structure of the target, which is not particularly limited, is exemplified by the same shape and structure as in the first exemplary embodiment. The sintered oxide may be a plate as shown in FIG. 1 (item 801) or a hollow cylinder as shown in FIG. 2 (item 801A). When the sintered oxide is plate-shaped, the sintered oxide may be rectangular in a plan view as shown in FIG. 1(A) (item 1) or circular in a plan view as shown in FIG. 3 (item 801B). The sintered oxide may be a single-piece molding body or may be a multiple-division component including a plurality of divided sintered oxides (item 801C) fixed on a backing plate 803 as shown in FIG. 4.

The backing plate 803 is a holder/cooler for the sintered oxide. The backing plate 803 is preferably made of a material with excellent thermal conductivity (e.g. copper).

As in the first exemplary embodiment, the sputtering target is produced through, for instance, the following steps.

(d) Grinding a surface of the sintered oxide (grinding step)

(e) Bonding the sintered oxide on the backing plate (bonding step) The above steps will be specifically described below.

(4) Step (d): Grinding Step

In the grinding step, the sintered oxide is ground into a shape adapted to be attached to a sputtering apparatus.

The surface of the sintered oxide is often partially highly oxidized or roughened. Further, the sintered oxide has to be cut into piece(s) of a predetermined size.

The surface of the sintered oxide is preferably ground for 0.3 mm or more. The grinding depth is more preferably 0.5 mm or more, especially preferably 2 mm or more. A part of the sintered oxide at or near the surface thereof, at which crystal structure is modified, can be removed by grinding 0.3 mm or more.

It is preferable to grind the sintered oxide using, for instance, a surface grinder to form a material whose average surface roughness Ra is 5 µm or less. A sputtering surface of the sputtering target may further be mirror-finished so that the average surface roughness Ra is $1000 \times 10^{-10}$ m or less. The mirror-finishing (polishing) may be performed using any known polishing technique including mechanical polishing, chemical polishing, and mechanochemical polishing (combination of the mechanical polishing and chemical polishing). For instance, the surface may be polished using a fixed-abrasive-grain polisher (polishing liquid: water) to #2000 or finer grain size, or may be lapped using diamond-paste polishing material after lapping using a loose-abrasivegrain lapping material (polishing material: SiC paste etc.). The polishing method is not limited to the above. Examples of the polishing material include a polishing material with #200 grit size, #400 grit size, and #800 grit size.

The sintered oxide after the polishing step is preferably cleaned with an air blower or washed with running water and the like. When a foreign substance is to be removed using an air blower, air is preferably sucked with a dust catcher provided at a side opposite a nozzle for effective removal. It should be noted that ultrasonic cleaning may further be performed in view of the limited cleaning power of the air blower and running water. The ultrasonic cleaning is effectively performed with oscillation at multiple frequencies ranging from 25 kHz to 300 kHz. For instance, twelve waves of different frequencies ranging from 25 kHz to 300 kHz in 25 kHz increments are preferably applied for the ultrasonic cleaning.

(5) Step (e): Bonding Step

In the step (e), the sintered oxide after being ground is bonded to the backing plate using a low-melting-point metal such as indium.

The sputtering target has been described as the above.

The sintered oxide of the third exemplary embodiment has been described above.

Next, an oxide semiconductor thin-film according to the third exemplary embodiment will be described below.

The oxide semiconductor thin-film of the third exemplary embodiment contains In element, Sn element, and Ln element at respective atomic ratios as defined in formulae (2-8) to (2-10) below, $$0.55 \leq In/(In+Sn+Ln) \leq 0.90 \quad (2\text{-}8),$$

$$0.05 \leq Sn/(In+Sn+Ln) \leq 0.25 \quad (2\text{-}9),$$

$$0.05 \leq Ln/(In+Sn+Ln) \leq 0.20 \quad (2\text{-}10),$$

where In, Sn, and Ln represent the number of atoms of In element, Sn element, and Ln element in the oxide semiconductor thin-film, respectively, and Ln represents at least one metal element selected from Gd, Tb, Dy, Ho, Er, Tm, Yb, and Lu.

The reasons of adding In and Ln are the same as in the first example.

Sn is effective in enhancing chemical resistance of the oxide semiconductor thin-film. In order to exhibit the above effect, the Sn content has to satisfy the lower limit in the formula (2-10). With the Sn content satisfying the upper limit, island(s) can be formed on the semiconductor thin-film through etching.

The content (atomic ratio) of each of the metal elements in the oxide semiconductor thin-film can be determined by measuring the amount of the elements in the same manner as in the first exemplary embodiment. An inductively coupled plasma emission spectrometer can be used for the ICP measurement.

Though the production method is not particularly limited, the oxide semiconductor thin-film according to the third exemplary embodiment is preferably produced through sputtering using the target made of the sintered oxide according to the third exemplary embodiment, as in the first exemplary embodiment.

Thin-Film Transistor

Next, a structure of a thin-film transistor according to the third exemplary embodiment will be described below.

The structure of the thin-film transistor according to the third exemplary embodiment is not particularly limited as long as the thin-film transistor includes the oxide semiconductor thin-film according to the third exemplary embodiment and serves as a transistor. With the use of the oxide semiconductor thin-film according to the third exemplary embodiment, a high-performance thin-film transistor can be provided.

Details of the thin-film transistor, which are substantially the same as described in the first exemplary embodiment, are omitted herein.

Usage of Thin-Film Transistor

The thin-film transistor according to the third exemplary embodiment is also capable of being embodied as various integrated circuits such as a field-effect transistor, logic circuit, memory circuit, and differential amplifier, which are applicable to electronic devices. Further, the thin-film transistor according to the third exemplary embodiment is also applicable to an electrostatic inductive transistor, Schottky barrier transistor, Schottky diode, and resistor, in addition to the field-effect transistor.

The thin-film transistor according to the third exemplary embodiment is suitably usable for a display, solid-state image sensor, and the like.

Specific structure of the thin-film transistor, which is substantially the same as described in the first exemplary embodiment, will be omitted herein.

Quantum-Tunneling Field-Effect Transistor

The oxide semiconductor thin-film according to the third exemplary embodiment is usable for a quantum-tunneling Field-Effect Transistor (FET).

Specific structure of the FET, which is substantially the same as described in the first exemplary embodiment, will be omitted herein.

The oxide semiconductor thin-film of the third exemplary embodiment has been described above.

A fourth exemplary embodiment will be described below.

The fourth exemplary embodiment is directed to an image sensor using a zinc-free oxide semiconductor.

Initially, a background of the fourth exemplary embodiment will be described below.

An image sensor includes solid-state image sensors each provided with a plurality of thin-film transistors. Accordingly, in order to enhance sensitivity and to save power of the image sensor, the leak current of the thin-film transistor is preferably as small as possible.

Addition of zinc is effective in order to reduce the leak current in the oxide semiconductor, as disclosed in Patent Literatures 2 to 5.

However, zinc is easily dispersed in silicon. Accordingly, when an image sensor includes thin-film transistors made of a zinc-containing oxide semiconductor, other thin-film transistors may be contaminated due to dispersion of zinc, failing to achieve desired properties.

The fourth exemplary embodiment is to address the above disadvantage. An object of the fourth exemplary embodiment is to provide an image sensor with small leak current while using zinc-free oxide semiconductor.

Initially, with reference to FIGS. 18 to 23, an equivalent circuit of a unit cell of an image sensor according to the fourth exemplary embodiment will be briefly described below. It should be noted that, in the drawing(s), size, layer thickness, and the like of a component and a region are sometimes exaggerated for clarification. Thus, the scale of the drawing(s) is not necessarily limiting.

The image sensor in the fourth exemplary embodiment is a CMOS image sensor. The CMOS image sensor will be sometimes simply referred to as an "image sensor" hereinafter.

Image Sensor

Figure 19:
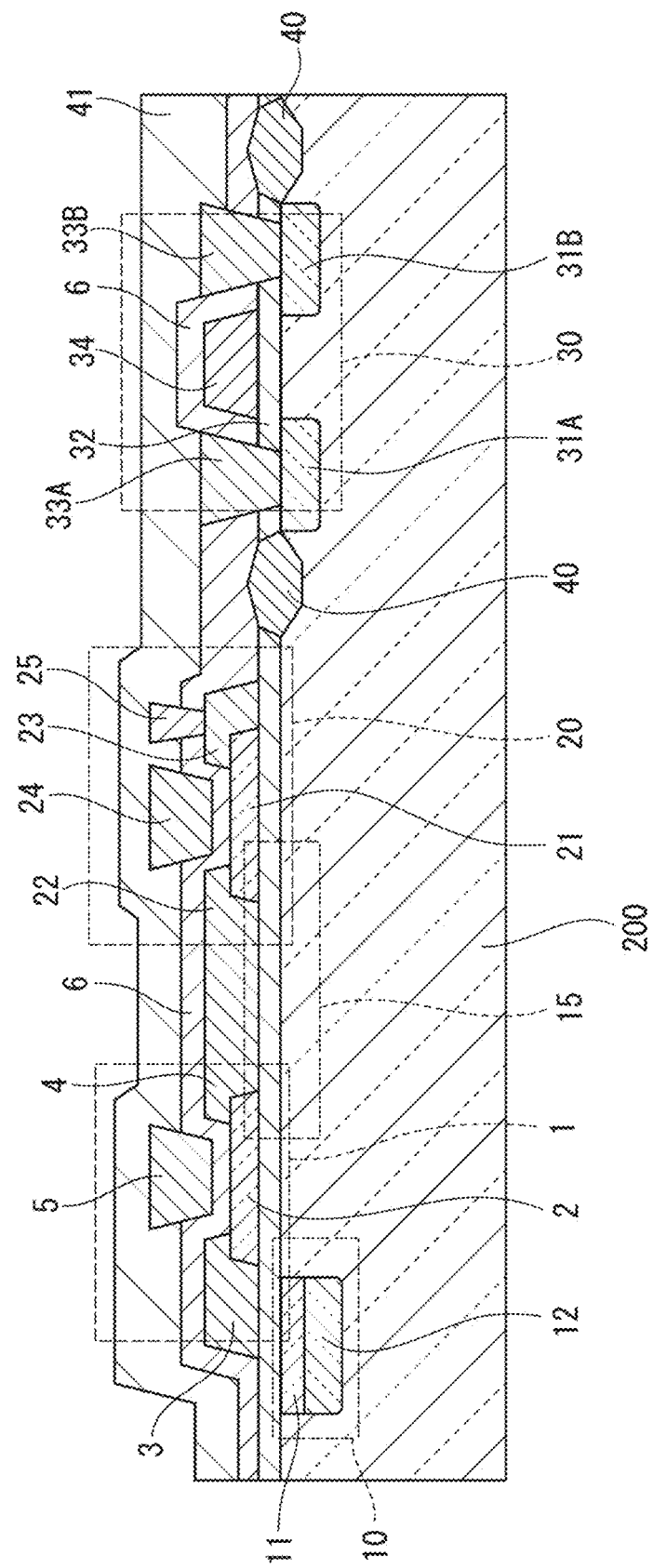
FIG. 19 is a vertical cross section showing a unit cell of an image sensor according to a fourth exemplary embodiment.

As shown in FIGS. 18 and 19, the image sensor includes unit cells 100 each including a photodiode 10, and a transfer transistor 1 whose source electrode 3 is electrically connected to the photodiode 10. The image sensor also includes a signal charge accumulator 15 electrically connected to a drain electrode 4 of the transfer transistor 1, and an amplification transistor 30 whose gate electrode 34 is electrically connected to the transfer transistor 1 and the signal charge accumulator 15. The image sensor further includes a reset transistor 20 including a drain electrode 23, and a source electrode 22 electrically connected to the signal charge accumulator 15.

The transfer transistor 1 and the reset transistor 20 are n-type transistors, while the amplification transistor 30 is a p-type transistor.

Figure 20:
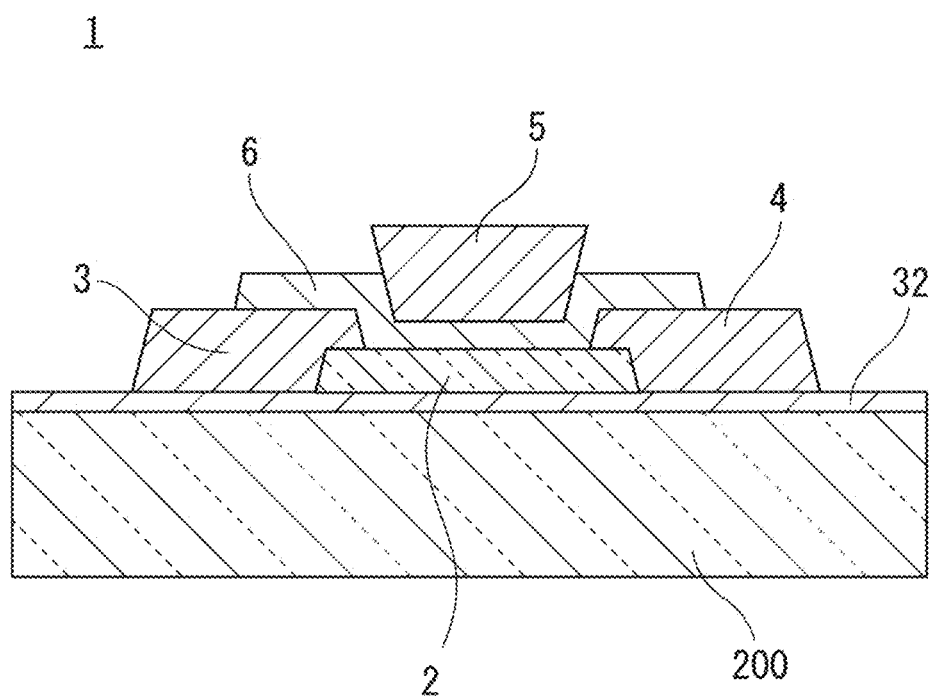

The transfer transistor 1 and the reset transistor 20, whose structures are shown in FIGS. 19 and 20, have channel-formation regions including oxide semiconductor thin-films 2, 21, respectively, containing predetermined elements. The details of the oxide semiconductor thin-films 2, 21 will be described below.

In order to further enhance amplification rate, the amplification transistor 30 in the fourth exemplary embodiment is preferably a bulk transistor whose channel-formation region is made of monocrystalline silicon semiconductor.

It should be noted that the transfer transistor 1 and the reset transistor 20 are sometimes collectively referred to as "thin-film transistors" when it is not necessary to distinguish between the transfer transistor 1 and the reset transistor 20. It should also be noted that the amplification transistor 30 is sometimes referred to as a "bulk transistor."

Though a single one of the unit cells 100 is shown in FIG. 18, the image sensor includes a plurality of unit cells 100 arranged in a matrix.

The image sensor is a solid-state image sensor, in which an electric potential is held in the signal charge accumulator 15, the electric potential being outputted to a vertical output line 3120 through the amplification transistor 30.

The photodiode 10 is a photoelectric converter. The photodiode 10 shown in FIG. 19, which is an inorganic diode, is a so-called pinned photodiode. The photodiode 10 is provided by doping a surface of a monocrystalline silicon substrate 200 with impurities to form sequentially an n-type region 12 and a p-type region 11. The photodiode 10, whose surface provided with the p-type region 11 generates an electrical charge, is capable of easily reducing dark current (i.e. noise). The oxide semiconductor thin-film may be made of the same material as the oxide semiconductor thin-films 2, 21 used for the photodiode, or may be made of the same material as the oxide semiconductor thin-film for the transfer transistor 1 and the reset transistor 20.

When the photodiode is an organic diode, whose details will be described below in a modification, a photodiode 110 is provided by sequentially forming, for instance, a contact metal layer 113, an n-type organic semiconductor region 112, and a p-type organic semiconductor region 111 on the monocrystalline silicon substrate 200 as shown in FIG. 21.

Without being irradiated with light, the photodiode 10 exhibits the same voltage-current characteristics as an ordinary diode as shown in A in FIG. 22. Once irradiated with light, especially when applied with reverse-bias, the photodiode 10 passes larger current than that without being irradiated with light as shown in B in FIG. 22.

The transfer transistor 1 is an n-type transistor for switching on/off the current between the photodiode 10 and the signal charge accumulator 15. As shown in FIG. 20, the transfer transistor 1 includes the oxide semiconductor thin-film 2, the source electrode 3, the drain electrode 4, and the gate electrode 5.

The oxide semiconductor thin-film 2 (channel region) is provided on the monocrystalline silicon substrate 200 through a gate insulating film 32.

The source electrode 3 and the drain electrode 4 are electrodes electrically connected to respective ends of the oxide semiconductor thin-film 2 planarly across the oxide semiconductor thin-film 2. One of the source electrode 3 and the drain electrode 4 is electrically connected to the photodiode 10. In the illustrated example, the source electrode 3 is electrically connected to an output (p-type region) of the photodiode 10.

The gate electrode 5 is an electrode provided on an upper side of the oxide semiconductor thin-film 2 (i.e. a side opposite the monocrystalline silicon substrate 200) across the gate insulating film 6.

The signal charge accumulator 15, which is a capacitor component for temporarily accumulating the electrical charge of the photodiode 10, defines a capacitor with the gate insulating film 32 as a dielectric. The signal charge accumulator 15 is electrically connected to the other of the source electrode 3 and the drain electrode 4 (i.e. not connected to the photodiode 10). In the illustrated example, the signal charge accumulator 15 is electrically connected with the drain electrode 4 of the transfer transistor 1.

In FIG. 19, the drain electrode 4 of the transfer transistor 1 also serves as the source electrode 22 of the reset transistor 20. The signal charge accumulator 15 is provided on a lower side of the drain electrode 4.

The amplification transistor 30, which is a component for amplifying the electric current from the photodiode 10, is a bulk transistor including n-type regions 31A, 31B, a source electrode 33A, a drain electrode 33B, and a gate electrode 34.

The n-type regions 31A, 31B are provided by doping a surface of the monocrystalline silicon substrate 200 with impurities, the n-type regions 31A, 31B being spaced from each other in a planar direction of the monocrystalline silicon substrate 200. In the fourth exemplary embodiment, the monocrystalline silicon substrate 200 is a p-type monocrystalline silicon substrate. Accordingly, the region between the n-type regions 31A and 31B is a p-type region. Thus, the amplification transistor is a p-type transistor.

The source electrode 33A and the drain electrode 33B are connected to the n-type regions 31A and 31B, respectively, penetrating through the gate insulating film 32.

The gate electrode 34 is an electrode provided above a region between the n-type regions 31A and 31B (i.e. opposite the monocrystalline silicon substrate 200). In the illustrated example, the gate electrode 34 is provided on the gate insulating film 32. The gate electrode 34 is electrically connected to the signal charge accumulator 15 and the other of the source electrode 3 and the drain electrode 4 of the transfer transistor 1 (i.e. not connected to the photodiode 10, in the illustrated example, the drain electrode 4). The gate insulating film 6 is provided on the gate electrode 34. The amplification transistor 30 is surrounded by an insulation region 40 provided on the monocrystalline silicon substrate 200, the insulation region 40 electrically insulating the amplification transistor 30 from the other components.

The source electrode 33A of the amplification transistor 30 is connected to the vertical output line 3120 (see FIG. 1). The drain electrode 33B is connected to a power terminal VDD. The gate electrode 34 is connected to a transfer switching line (not shown), through which a read-out pulse is inputted to the gate electrode 34.

The reset transistor 20, which is an n-type transistor for resetting the electrical charge in the signal charge accumulator 15, includes the oxide semiconductor thin-film 21, the source electrode 22, the drain electrode 23, and the gate electrode 24.

The locations and functions of the oxide semiconductor thin-film 21, the source electrode 22, the drain electrode 23, and the gate electrode 24 are the same as those of the oxide semiconductor thin-film 2, the source electrode 3, the drain electrode 4, and the gate electrode 5, and thus the description thereof is omitted.

The source electrode 22 is connected to the signal charge accumulator 15. The source electrode 22 also serves as the drain electrode 4 of the transfer transistor 1.

The drain electrode 23 is connected to the reset power line 3110 through a line 25 (see FIG. 18). The gate electrode 24 is connected to a reset line (not shown), through which a reset pulse is inputted to the gate electrode 24.

The transfer transistor 1, the reset transistor 20, and the amplification transistor 30 are covered with an insulation film 41.

The equivalent circuit of the unit cell 100 of the image sensor according to the fourth exemplary embodiment has been described above.

Next, an operation of the unit cell 100 will be described below with reference to FIGS. 18, 22, and 23.

First, an operation for outputting a signal from the unit cell to a vertical signal line will be described below with reference to FIGS. 18, 22, and 23.

Initially, power voltage is supplied to the power terminal VDD. Subsequently, a reset pulse is inputted to the gate electrode 24 of the reset transistor 20 (RST in FIGS. 18 and 23), to turn on the reset transistor 20. The signal charge accumulator 15 (FD in FIGS. 18 and 23) are charged to an electric potential of a reset power source.

Then, the reset transistor 20 is turned off, to hold the electric potential of the signal charge accumulator 15 at the electric potential of the reset power source (period T1 in FIG. 23). In the period T1, as long as there is no or little leak current in the reset transistor 20 and the transfer transistor 1 (TRF in FIGS. 18 and 23), the electric potential is held until the next operation of the transfer transistor 1.

Then, when the transfer transistor 1 is turned on, the electric current flows from the signal charge accumulator 15 to the photodiode, lowering the electric potential of the signal charge accumulator 15 (period T2). When the transfer transistor 1 is turned off, the electric potential at the time of being turned off is held in the signal charge accumulator 15 (period T3). In the period T3, as long as there is no or little leak current in the reset transistor 20 and the transfer transistor 1, the electric potential is held until the next operation of the reset transistor 20. In the period T3, the electric potential is lowered to turn on the amplification transistor 30, outputting the electric potential to the vertical output line 3120. Subsequently, the supply of the power voltage to the power terminal VDD is blocked.

The electric potential of the signal outputted to the vertical output line 3120 varies depending on the intensity and time for radiating the light on the photodiode 10. Thus, the unit cell 100 is configured to output the intensity of the light received by the photodiode 10 as an electric signal.

Next, an operation of the unit cell 100 when the photodiode is irradiated with light will be described below with reference to FIGS. 22 and 23.

Initially, when the photodiode 10 is irradiated with light while the transfer transistor 1 is turned off, since the photodiode 10 has no electric current path, the electric potential at the output of the photodiode 10 is a value at a point c in FIG. 5.

After the reset transistor 20 is turned on in a period T0 in FIG. 23 and the electric potential of the signal charge accumulator 15 is held at a reset power potential Vres as shown in period T1, the transfer transistor 1 is turned on in the period T2, whereby the electric potential at the output of the photodiode 10 shifts to the reset power potential and the electric potential at the output of a cathode of the photodiode shifts to a point d in FIG. 22.

When a discharge current flows from the signal charge accumulator 15 to the photodiode 10 through the transfer transistor 1, the electric potential in the signal charge accumulator 15 is lowered. The discharge stops when the transfer transistor 1 is turned off in the period T3. Assuming that the electric potential at the output of the photodiode 10 in the period T3 is at a point e, the electric potential difference between the points d and e is the electric potential difference caused by the light irradiation on the photodiode 10, which corresponds to the intensity of the light.

As described above, there exists a period whose electric potential is held at a constant level (e.g. the periods T1 and T3) in the operation of the unit cell 100.

Accordingly, with the use of the oxide semiconductor thin-films 21, 2 of low Off current in the channel region of the reset transistor 20 and the transfer transistor 1, the leak current from the signal charge accumulator 15 through the channel region can be reduced, thereby achieving extremely high electric-potential-holding effect in the periods T1 and T3 (i.e. electric-potential holding periods). Thus, the sensitivity of the unit cell 100 can be enhanced and power consumption of the unit cell 100 can be reduced.

Oxide Semiconductor Thin-Film

Next, the details of the oxide semiconductor thin-films 2, 21, which are used for the image sensor according to the fourth exemplary embodiment and contain predetermined elements, will be described below.

The oxide semiconductor thin-films 2, 21 are used for the channel-formation regions (semiconductor layers) of the transfer transistor 1 and the reset transistor 20.

Initially, preferable properties of the oxide semiconductor thin-films 2, 21 will be described below.

The carrier density of the oxide semiconductor thin-films 2, 21 is preferably $1.0 \times 10^{16}$ cm$^{-3}$ or less, more preferably $1.0 \times 10^{15}$ cm$^{-3}$ or less. The lower limit of the carrier density is preferably $1.0 \times 10^{14}$ cm$^{-3}$ or more.

At the carrier density within the above range, the carrier mobility of the thin-film transistor is enhanced. Thus, the stability against irradiated light and heat is enhanced, allowing stable operation of the TFT.

The carrier density is measurable through a Hall-effect measurement method.

The saturation mobility in the thin-film transistor is preferably 1.0 cm$^2$/V·s or more and 50.0 cm$^2$/V·s or less.

At the saturation mobility of 1.0 cm$^2$/V·s or more, the thin-film transistor can be stably driven, enhancing the sensitivity of the image sensor and data import rate.

At the saturation mobility of 50.0 cm$^2$/V·s or less, the Off current can be easily set at $10^{-12}$ A or less, and the On/Off ratio can be set at $10^8$ or more. Thus, the thin-film transistor can be stably driven to enhance the sensitivity and data import rate of the image sensor. Further, since the data-holding time can be lengthened, the performance of the image sensor can be enhanced.

The saturation mobility is determined based on a transfer function when the drain voltage is set at 20 V. Specifically, the saturation mobility is calculated by: plotting a graph of a transfer function Id-Vg; calculating transconductance (Gm) for each Vg; and calculating the saturation mobility using a formula in a saturated region. It should be noted that Id represents a current between the source and drain electrodes, and Vg represents a gate voltage when the voltage Vd is applied between the source and drain electrodes.

A threshold voltage (Vth) is preferably in a range from −3.0 V to +3.0 V, more preferably from −2.5 V to +2.5V. At the threshold voltage (Vth) in a range from −3.0 V to +3.0 V, a thin-film transistor with small Off current and a large On/Off ratio can be provided.

The threshold voltage (Vth) is defined as Vg at Id=$10^{-9}$ A based on the graph of the transfer function.

The On/Off ratio is preferably in a range from $10^6$ to $10^{12}$, more preferably from $10^7$ to $10^{11}$, further preferably from $10^8$ to $10^{10}$.

At the On/Off ratio of $10^6$ or more, a liquid crystal display can be driven.

At the On/Off ratio of $10^{12}$ or less, an organic EL device with a large contrast can be driven. Further, the image-holding time can be increased and sensitivity of the image sensor can be enhanced at the On/Off ratio of $10^{12}$ or less.

The On/Off ratio can be determined as a ratio [On/Off] of On current value (a value of Id when Vg=20 V) to Off current value (a value of Id when Vg=−10 V).

The Off current value is preferably $10^{-11}$ A or less, more preferably from $10^{-12}$ A or less.

The image-holding time can be increased and sensitivity of the image sensor can be enhanced with the Off current value of $10^{-11}$ A or less.

The band gap of the oxide semiconductor thin-films 2, 21 is preferably 3.0 eV or more, more preferably 3.2 eV or more, further preferably 3.4 eV or more.

The band gap is measurable using a spectrophotometer UV-3100PC (manufactured by Shimadzu Corporation) as follows.

An oxide semiconductor thin-film is formed on a glass substrate to prepare a band gap measurement sample. The sample is subjected to a heat treatment to measure transmission spectrum thereof, whose results are plotted in a graph (abscissa axis: wavelength, ordinate axis; transmittance). Then, the transmittance in ordinate axis is converted into:

Formula: transmittance=$(\alpha h v)^2$, where α, h, and v are as follows.
α: absorption coefficient
h: Planck's constant
v: oscillation frequency In the converted graph, a straight line is fitted to a rising portion of the absorption and a value (eV) at an intersection of the straight line with a base line is calculated as the band gap.

The leak current of the thin-film transistor is preferably 1×$10^{-11}$ A or less, more preferably 1×$10^{-12}$ A or less, further preferably 9×$10^{-13}$ A or less.

The leak current herein refers to a leak current in a device with L/W being 200/1000 (L: channel length [μm], W: channel width [μm]).

Next, a composition of the oxide semiconductor thin-films 2, 21 will be described below.

The oxide semiconductor thin-films 2, 21 of the fourth exemplary embodiment contain at least one conductive oxide selected from oxides of In (indium) element, Sn (tin) element, and Ga (gallium) element, and at least one oxide selected from oxides of Al (aluminum) element, Y (yttrium) element, and lanthanoid element Ln.

Herein, the lanthanoid element Ln refers to at least one element selected from lanthanoid elements (atom number 51 to 71, i.e. fifteen elements from lanthanum to lutetium).

Indium element ensures the carrier mobility in the oxide semiconductor thin-film.

Tin has chemical resistance. Further, as can be understood from the use in a conductive film, tin hardly affects the carrier mobility in the oxide semiconductor thin-film, and is effective in reducing the added amount of expensive indium.

Gallium is effective in restraining crystallization of indium oxide, reducing occurrence of oxygen vacancies and increasing a band gap in a resultant oxide semiconductor thin-film.

Aluminum element, yttrium element, and lanthanoid element(s), which have large oxygen binding ability, are effective in reducing carrier generation due to oxygen vacancies, and in restraining increase in the carrier density due to oxygen vacancies caused by various heat loads in a TFT production process, reduction load during CVD film-formation, and the like.

Further, aluminum element and lanthanoid element(s) are also effective in amorphization of the oxide semiconductor thin-film.

Accordingly, an intrinsic or substantially intrinsic semiconductor can be provided by the selection of elements (In, Sn, Ga, Al, Y, and Ln) from the above, whereby the semiconductor properties (at least one of carrier density, saturation mobility, threshold voltage, On/Off ratio, band gap, and leak current, the same applying hereinafter) can be easily adjusted within the above-described preferable range. Thus, the use of the oxide semiconductor thin-films 2, 21 in the channel-formation region of the transfer transistor 1 and the reset transistor 20 achieves an image sensor using an oxide semiconductor with low leak current.

The oxide semiconductor thin-films 2, 21 are obtainable through sputtering using a sputtering target whose atomic composition ratio is substantially the same as those of the oxide semiconductor thin-films 2, 21. An atomic composition ratio of a thin-film provided by a sputtering process using a sputtering target made of a sintered oxide becomes similar to the atomic composition ratio of the used sputtering target.

The sintered oxide for forming the oxide semiconductor thin-films 2, 21 is produced by sintering a base material including indium oxide, gallium oxide, and tin oxide added with aluminum oxide, yttrium oxide and lanthanoids.

The oxide semiconductor thin-film may contain an element(s) other than the above. In this case, an oxide containing an element(s) other than the above is added to a base material, which is subjected to the same process as described above to obtain the oxide semiconductor thin-film. The element(s) other than the above include inevitable impurities. The inevitable impurities herein mean an element(s) that is not intentionally added but are mixed in a material or during a production process.

Examples of the inevitable impurities are as described above.

The content (atomic ratio) of each of the metal elements in the oxide semiconductor thin-film can be determined by measuring the amount of the elements through ICP (Inductive Coupled Plasma) measurement or XRF (X-Ray Fluorescence) measurement. An inductively coupled plasma emission spectrometer can be used for the ICP measurement.

A thin-film X-ray fluorescence spectrometer (AZX400, manufactured by Rigaku Corporation) can be used for the XRF measurement.

A sector-dynamic SIMS (Secondary Ion Mass Spectrometer) analysis may alternatively be used for analysis of the contents (atomic ratio) of the metal elements in the oxide semiconductor thin-film at the same accuracy as the inductively coupled plasma emission spectrometry. A reference material is prepared by forming source/drain electrodes (made of the same material as in TFT device) of a channel length on an upper surface of a reference oxide thin-film whose atomic ratio of the metal elements are known by measurement using the inductively coupled plasma emission spectrometer or the thin-film X-ray fluorescence spectrometer. Then, the oxide semiconductor layer is analyzed using a sector-dynamic SIMS (Secondary Ion Mass Spectrometer) (IMS 7f-Auto, manufactured by AMETEK, Inc.) to measure a mass spectrum intensity of each of the elements, and plot analytical curves for concentrations of the known elements and the mass spectrum intensity. Next, the atomic ratio in the oxide semiconductor thin-film of an actual TFT device is calculated with reference to the above-described analytical curves based on the spectrum intensity obtained by the sector-dynamic SIMS (Secondary Ion Mass Spectrometry) analysis. As a result of the calculation, it is found that the calculated atomic ratio is within 2 atom % of the atomic ratio of the oxide semiconductor thin-film separately measured by the thin-film X-ray fluorescent spectrometer or the inductively coupled plasma emission spectrometer.

The atomic composition ratio of each of the elements contained in the oxide semiconductor thin-film can be controlled by adjusting the contents of the elements in the sputtering target used for forming the oxide semiconductor thin-film.

The oxide semiconductor thin-films 2, 21 preferably do not contain Zn element.

This is because Zn element, whose ion radius is small, is sometimes dispersed into other thin-film transistors to change the properties thereof when the oxide semiconductor thin-film is subjected to heat treatment at a high temperature or a film is formed through sputtering process. The absence of Zn element prevents the dispersion of the Zn element and change in the properties of the other thin-film transistors.

The oxide semiconductor thin-film 2, 21 may be amorphous or crystalline.

The term "amorphous" means that a substance exhibits halo pattern in an X-ray diffraction and does not show any specific diffraction lines. The term "crystalline" means that a substance exhibits recognizable crystal peak(s) in an X-ray diffraction. Specifically, "crystalline" substance shows a peak(s) at an angle 2θ ranging from 30 degrees to 40 degrees in XRD.

The amorphous oxide semiconductor thin-films 2, 21 provide an oxide semiconductor thin-film with excellent surface smoothness. Especially, an amorphous film, which can be patterned with a weak-acid etching liquid (e.g. oxalic acid), is useful in that wire metal is not dissolved or degraded.

Further, the oxide semiconductor thin-films 2, 21 in a form of amorphous film, which can exhibit the TFT properties at a low-temperature annealing at 200 degrees C. or less, is useful in a layered transistor structure using a poorly heat-resistant organic flattening film.

Further, the oxide semiconductor thin-film 2, 21 in a form of crystalline film can easily provide a thin-film transistor that is excellent in reliability and durability. After forming a thin film which is amorphous immediately after film-formation, the thin-film may be patterned with a weak-acid etching liquid (e.g. oxalic acid) and subsequently crystallized through annealing. Thus, a crystalline oxide semiconductor thin-film with excellent surface smoothness can be obtained.

The oxide semiconductor thin-films 2, 21 according to the fourth exemplary embodiment preferably satisfy the requirements below. Examples of the preferable oxide semiconductor thin-films 2, 21 include oxide semiconductor thin-film according to first to ninth examples below.

First Example

An atomic composition ratio in an oxide semiconductor thin-film according to a first example (sometimes referred to as an oxide semiconductor thin-film A hereinafter) preferably satisfies formulae (3-1) and (3-2) below.

The use of the oxide semiconductor thin-film A in the channel-formation regions of the transfer transistor 1 and the reset transistor 20 reduces the leak current.

$$0.60 \leq (In+Sn+Ga)/(In+Sn+Ga+Al+Y+Ln) \leq 0.98 \quad (3\text{-}1)$$

$$0.02 \leq (Al+Y+Ln)/(In+Sn+Ga+Al+Y+Ln) \leq 0.40 \quad (3\text{-}2)$$

At $(In+Sn+Ga)/(In+Sn+Ga+Al+Y+Ln)$ of 0.60 or more as in the formula (3-1), the carrier mobility of the oxide semiconductor thin-film can be kept from being excessively small, thereby keeping excellent image quality and sensitivity of the image sensor. At 0.98 or less, the oxide semiconductor thin-film is kept from becoming a conductor (i.e. losing semiconductor properties), and the Off current of the oxide semiconductor thin-film can be reduced, so that the image quality and sensitivity of the image sensor are improvable.

In the formula (3-1), $(In+Sn+Ga)/(In+Sn+Ga+Al+Y+Ln)$ is more preferably 0.65 or more and 0.95 or less, further preferably 0.70 or more and 0.95 or less.

At a content of $(Al+Y+Ln)/(In+Sn+Ga+Al+Y+Ln)$ of 0.02 or more as in the formula (3-2), the oxide semiconductor thin-film is kept from becoming a conductor (i.e. losing semiconductor properties), and the Off current of the oxide semiconductor thin-film can be reduced, so that the image quality and sensitivity of the image sensor are improvable. At a content of 0.40 or less, the oxide semiconductor thin-film can be kept from becoming insulative, thereby keeping excellent image quality and sensitivity of the image sensor.

In the formula (3-2), $(Al+Y+Ln)/(In+Sn+Ga+Al+Y+Ln)$ is more preferably 0.05 or more and 0.35 or less, further preferably 0.05 or more and 0.30 or less.

Especially, when the oxide semiconductor thin-film A is crystalline, the formulae (3-1) and (3-2) preferably satisfy formulae (3-1') and (3-2') below.

$$0.75 \leq (In+Sn+Ga)/(In+Sn+Ga+Al+Y+Ln) \leq 0.98 \quad (3\text{-}1')$$

$$0.02 \leq (Al+Y+Ln)/(In+Sn+Ga+Al+Y+Ln) \leq 0.25 \quad (3\text{-}2')$$

At $(In+Sn+Ga)/(In+Sn+Ga+Al+Y+Ln)$ of 0.75 or more as in the formula (3-1'), the carrier mobility of the oxide semiconductor thin-film can be kept from being excessively small, thereby keeping excellent image quality and sensitivity of the image sensor. The upper limit in the formula (3-1') is defined for the same reason as in the formula (3-1).

At $(Al+Y+Ln)/(In+Sn+Ga+Al+Y+Ln)$ of 0.25 or less as in the formula (3-2'), the oxide semiconductor thin-film can be kept from becoming insulative, thereby keeping excellent image quality and sensitivity of the image sensor. The lower limit in the formula (3-2') is defined for the same reason as in the formula (2).

In the formula (3-1'), (In+Sn+Ga)/(In+Sn+Ga+Al+Y+Ln) is more preferably 0.80 or more and 0.98 or less.

In the formula (3-2'), (Al+Y+Ln)/(In+Sn+Ga+Al+Y+Ln) is more preferably 0.02 or more and 0.20 or less.

When the oxide semiconductor thin-film A is amorphous, the oxide semiconductor thin-film A preferably satisfies formulae (3-X) to (3-Z) in order to further improve the semiconductor properties.

$$0.35 \leq In/(In+Sn+Ga) \leq 1.00 \quad (3\text{-}X)$$

$$0.00 \leq Sn/(In+Sn+Ga) \leq 0.65 \quad (3\text{-}Y)$$

$$0.00 \leq Ga/(In+Sn+Ga) \leq 0.65 \quad (3\text{-}Z)$$

At an indium content of 0.35 or more as in the formula (3-X), reduction in carrier mobility is preventable.

In the formula (3-X), In/(In+Sn+Ga) is more preferably 0.50 or more and 1.00 or less, further preferably 0.40 or more and 1.00 or less.

At a tin content of 0.65 or less as in the formula (3-Y), islands can be formed on the oxide semiconductor thin-film through etching.

In the formula (3-Y), Sn/(In+Sn+Ga) is more preferably 0.00 or more and 0.50 or less, further preferably 0.00 or more and 0.45 or less.

At a gallium content of 0.65 or less as in the formula (3-Z), the oxide semiconductor thin-film is kept from becoming insulative due to excessive decrease in oxygen vacancies.

In the formula (3-Z), Ga/(In+Sn+Ga) is more preferably 0.00 or more and 0.50 or less, further preferably 0.00 or more and 0.30 or less.

In other words, when the oxide semiconductor thin-film A is amorphous, the atomic composition ratio in the oxide semiconductor thin-film A more preferably satisfies formulae (3-1A) to (3-2A) and formulae (3-X1) to (3-Z1), further preferably formulae (3-1B) to (3-2B) and formulae (3-X2) to (3-Z2).

$$0.65 \leq (In+Sn+Ga)/(In+Sn+Ga+Al+Y+Ln) \leq 0.95 \quad (3\text{-}1A)$$

$$0.05 \leq (Al+Y+Ln)/(In+Sn+Ga+Al+Y+Ln) \leq 0.35 \quad (3\text{-}2A)$$

$$0.50 \leq In/(In+Sn+Ga) \leq 1.00 \quad (3\text{-}X1)$$

$$0.00 \leq Sn/(In+Sn+Ga) \leq 0.50 \quad (3\text{-}Y1)$$

$$0.00 \leq Ga/(In+Sn+Ga) \leq 0.50 \quad (3\text{-}Z1)$$

$$0.70 \leq (In+Sn+Ga)/(In+Sn+Ga+Al+Y+Ln) \leq 0.95 \quad (3\text{-}1B)$$

$$0.05 \leq (Al+Y+Ln)/(In+Sn+Ga+Al+Y+Ln) \leq 0.30 \quad (3\text{-}2B)$$

$$0.40 \leq In/(In+Sn+Ga) \leq 1.00 \quad (3\text{-}X2)$$

$$0.00 \leq Sn/(In+Sn+Ga) \leq 0.45 \quad (3\text{-}Y2)$$

$$0.00 \leq Ga/(In+Sn+Ga) \leq 0.30 \quad (3\text{-}Z2)$$

When the oxide semiconductor thin-film A is crystalline, the oxide semiconductor thin-film A preferably satisfies formulae (3-X3) to (3-Z3) in order to further improve the semiconductor properties.

$$0.60 \leq In/(In+Sn+Ga) \leq 1.00 \quad (3\text{-}X3)$$

$$0.00 \leq Sn/(In+Sn+Ga) \leq 0.40 \quad (3\text{-}Y3)$$

$$0.00 \leq Ga/(In+Sn+Ga) \leq 0.40 \quad (3\text{-}Z3)$$

At an indium content of 0.60 or more as in the formula (3-X3), reduction in carrier mobility is preventable.

In the formula (3-X3), In/(In+Sn+Ga) is more preferably 0.70 or more and 1.00 or less, further preferably 0.80 or more and 1.00 or less.

At a tin content of 0.40 or less as in the formula (3-Y3), islands can be formed on the oxide semiconductor thin-film through etching.

In the formula (3-Y3), Sn/(In+Sn+Ga) is more preferably 0.00 or more and 0.30 or less, further preferably 0.00 or more and 0.20 or less.

At a gallium content of 0.40 or less as in the formula (3-Z3), the oxide semiconductor thin-film is kept from becoming insulative due to excessive decrease in oxygen vacancies.

In the formula (3-Z3), Ga/(In+Sn+Ga) is more preferably 0.00 or more and 0.30 or less, further preferably 0.00 or more and 0.20 or less.

In other words, when the oxide semiconductor thin-film A is crystalline, the atomic composition ratio in the oxide semiconductor thin-film A more preferably satisfies formulae (3-1C) to (3-2C) and formulae (3-X3) to (3-Z3), further preferably formulae (3-1D) to (3-2D) and formulae (3-X4) to (3-Z4), furthermore preferably formulae (3-1E) to (3-2E) and formulae (3-X5) to (3-Z5).

$$0.75 \leq (In+Sn+Ga)/(In+Sn+Ga+Al+Y+Ln) \leq 0.98 \quad (3\text{-}1C)$$

$$0.02 \leq (Al+Y+Ln)/(In+Sn+Ga+Al+Y+Ln) \leq 0.25 \quad (3\text{-}2C)$$

$$0.60 \leq In/(In+Sn+Ga) \leq 1.00 \quad (3\text{-}X3)$$

$$0.00 \leq Sn/(In+Sn+Ga) \leq 0.40 \quad (3\text{-}Y3)$$

$$0.00 \leq Ga/(In+Sn+Ga) \leq 0.40 \quad (3\text{-}Z3)$$

$$0.80 \leq (In+Sn+Ga)/(In+Sn+Ga+Al+Y+Ln) \leq 0.98 \quad (3\text{-}1D)$$

$$0.02 \leq (Al+Y+Ln)/(In+Sn+Ga+Al+Y+Ln) \leq 0.20 \quad (3\text{-}2D)$$

$$0.70 \leq In/(In+Sn+Ga) \leq 1.00 \quad (3\text{-}X4)$$

$$0.00 \leq Sn/(In+Sn+Ga) \leq 0.30 \quad (3\text{-}Y4)$$

$$0.00 \leq Ga/(In+Sn+Ga) \leq 0.30 \quad (3\text{-}Z4)$$

$$0.80 \leq (In+Sn+Ga)/(In+Sn+Ga+Al+Y+Ln) \leq 0.98 \quad (3\text{-}1E)$$

$$0.02 \leq (Al+Y+Ln)/(In+Sn+Ga+Al+Y+Ln) \leq 0.20 \quad (3\text{-}2E)$$

$$0.80 \leq In/(In+Sn+Ga) \leq 1.00 \quad (3\text{-}X5)$$

$$0.00 \leq Sn/(In+Sn+Ga) \leq 0.20 \quad (3\text{-}Y5)$$

$$0.00 \leq Ga/(In+Sn+Ga) \leq 0.20 \quad (3\text{-}Z5)$$

Second Example

An oxide semiconductor thin-film according to a second example (sometimes referred to as an oxide semiconductor thin-film B hereinafter) contains In element, Sn element, Ga element and Al element and an atomic composition ratio of the oxide semiconductor thin-film B preferably satisfies formulae (3-3) to (3-6) below.

The use of the oxide semiconductor thin-film B in the channel-formation regions of the transfer transistor 1 and the reset transistor 20 reduces the leak current.

$$0.01 \leq Ga/(In+Ga+Sn) \leq 0.30 \quad (3\text{-}3)$$

$$0.01 \leq Sn/(In+Ga+Sn) \leq 0.40 \quad (3\text{-}4)$$

$$0.55 \leq In/(In+Ga+Sn) \leq 0.98 \quad (3\text{-}5)$$

$$0.05 \leq Al/(In+Ga+Sn+Al) \leq 0.30 \quad (3\text{-}6)$$

At a gallium element content of 0.01 or more as in the formula (3-3), an effect of reducing oxygen vacancies is exhibited, thereby providing a semiconductor thin-film. At a gallium content of 0.30 or less, the oxide semiconductor thin-film is kept from becoming insulative due to excessive decrease in oxygen vacancies.

In the formula (3-3), Ga/(In+Ga+Sn) is more preferably 0.02 or more and 0.27 or less, further preferably 0.03 or more and 0.23 or less.

At a tin element content of 0.01 or more as in the formula (3-4), chemical resistance is exhibited. At a tin content of 0.40 or less, islands can be formed on the oxide semiconductor thin-film through etching.

In the formula (3-4), Sn/(In+Ga+Sn) is more preferably 0.02 or more and 0.35 or less, further preferably 0.03 or more and 0.30 or less.

At an indium element content of 0.55 or more as in the formula (3-5), reduction in carrier mobility is preventable. At an indium element content of 0.98 or less, the oxide semiconductor thin-film is kept from becoming conductive due to excessive increase in oxygen vacancies.

In the formula (3-5), In/(In+Ga+Sn) is more preferably 0.60 or more and 0.96 or less, further preferably 0.60 or more and 0.94 or less.

At an aluminum element content of 0.05 or more as in the formula (3-6), carrier mobility in a thin-film transistor using the oxide semiconductor thin-film can be set at a sufficient level. At the aluminum content of 0.30 or less, the carrier mobility is kept from becoming excessively small.

In the formula (3-6), Al(In+Ga+Sn+Al) is more preferably 0.08 or more and 0.22 or less.

The oxide semiconductor thin-film B is preferably amorphous. Specifically, the oxide semiconductor thin-film B is preferably amorphous when being formed through sputtering, and is preferably kept amorphous after a heat treatment. The reason is as follows.

Once an indium oxide crystal is formed in the oxide semiconductor thin-film B, the indium oxide crystal is sometimes doped with tin, so that the semiconductor thin-film becomes electrically conductive as in ITO. When the indium oxide crystal is in a form of fine crystals, there are amorphous crystals and the fine crystals simultaneously in the semiconductor film, where carriers may be scattered at interfaces of the amorphous and fine crystals to reduce the carrier mobility. Further, oxygen vacancies or the like, which possibly occur between the amorphous crystals and the fine crystals, may form a color center of absorbing light, impairing optical stability of TFT.

The atomic composition ratio in the oxide semiconductor thin-film B more preferably satisfies formulae (3-3A) to (3-5A) and formula (3-6), further preferably formulae (3-3B) to (3-5B) and formula (3-6B).

$$0.02 \leq Ga/(In+Ga+Sn) \leq 0.27 \tag{3-3A}$$

$$0.02 \leq Sn/(In+Ga+Sn) \leq 0.35 \tag{3-4A}$$

$$0.60 \leq In/(In+Ga+Sn) \leq 0.96 \tag{3-5A}$$

$$0.05 \leq Al/(In+Ga+Sn+Al) \leq 0.30 \tag{3-6}$$

$$0.03 \leq Ga/(In+Ga+Sn) \leq 0.23 \tag{3-3B}$$

$$0.03 \leq Sn/(In+Ga+Sn) \leq 0.30 \tag{3-4B}$$

$$0.60 \leq In/(In+Ga+Sn) \leq 0.94 \tag{3-5B}$$

$$0.08 \leq Al/(In+Ga+Sn+Al) \leq 0.22 \tag{3-6B}$$

Third Example

An oxide semiconductor thin-film according to a third example (sometimes referred to as an oxide semiconductor thin-film C hereinafter) contains In element, Sn element, Ga element and Al element and an atomic composition ratio of the oxide semiconductor thin-film C preferably satisfies formulae (3-7) to (3-10) below.

The use of the oxide semiconductor thin-film C in the channel-formation regions of the transfer transistor 1 and the reset transistor 20 reduces the leak current.

$$0.01 \leq Ga/(In+Ga+Sn) \leq 0.50 \tag{3-7}$$

$$0.01 \leq Sn/(In+Ga+Sn) \leq 0.50 \tag{3-8}$$

$$0.20 \leq In/(In+Ga+Sn) \leq 0.55 \tag{3-9}$$

$$0.05 \leq Al/(In+Ga+Sn+Al) \leq 0.30 \tag{3-10}$$

At a gallium element content of 0.01 or more as in the formula (3-7), an effect of reducing oxygen vacancies is exhibited, thereby providing a semiconductor thin-film after sputtering. At a gallium content of 0.50 or less, the oxide semiconductor thin-film is kept from becoming insulative due to excessive decrease in oxygen vacancies.

In the formula (3-7), Ga/(In+Ga+Sn) is more preferably 0.02 or more and 0.45 or less, further preferably 0.03 or more and 0.40 or less.

At a tin element content of 0.01 or more as in the formula (3-8), chemical resistance is exhibited. At a tin content of 0.50 or less, islands can be formed on the oxide semiconductor thin-film through etching.

In the formula (3-8), Sn/(In+Ga+Sn) is more preferably 0.02 or more and 0.45 or less, further preferably 0.03 or more and 0.40 or less.

At an indium element content of 0.20 or more as in the formula (3-9), reduction in carrier mobility is preventable. At an indium element content of less than 0.55, the oxide semiconductor thin-film is kept from becoming conductive due to crystallization of the film through sputtering and excessive increase in oxygen vacancies. In the formula (3-9), In/(In+Ga+Sn) is more preferably 0.25 or more and less than 0.55, further preferably 0.30 or more and less than 0.55.

At an aluminum element content of 0.05 or more as in the formula (3-10), carrier mobility in a thin-film transistor using the oxide semiconductor thin-film can be set at a sufficient level. Further, the resultant oxide semiconductor thin-film exhibits stable TFT performance after being subjected to annealing at a low temperature. At the aluminum content of 0.30 or less, the carrier mobility is kept from becoming excessively small.

In the formula (3-10), Al/(In+Ga+Sn+Al) is more preferably 0.05 or more and 0.25 or less, further preferably 0.08 or more and 0.22 or less.

Fourth Example

An oxide semiconductor thin-film according to a fourth example (sometimes referred to as an oxide semiconductor thin-film D hereinafter) contains In element, Sn element, Ga element and Ln element and an atomic composition ratio of the oxide semiconductor thin-film D preferably satisfies formulae (3-11) to (3-14) below.

The use of the oxide semiconductor thin-film D in the channel-formation regions of the transfer transistor 1 and the reset transistor 20 reduces the leak current.

$$0.01 \leq Ga/(In+Ga+Sn) \leq 0.30 \tag{3-11}$$

$$0.01 \leq Sn/(In+Ga+Sn) \leq 0.40 \tag{3-12}$$

$$0.55 \leq \text{In}/(\text{In}+\text{Ga}+\text{Sn}) \leq 0.98 \quad (3\text{-}13)$$

$$0.03 \leq \text{Ln}/(\text{In}+\text{Ga}+\text{Sn}+\text{Ln}) \leq 0.25 \quad (3\text{-}14)$$

At a gallium element content of 0.01 or more as in the formula (3-11), an effect of reducing oxygen vacancies is exhibited, thereby providing a semiconductor thin-film. At a gallium content of 0.30 or less, the oxide semiconductor thin-film is kept from becoming insulative due to excessive decrease in oxygen vacancies.

In the formula (3-11), Ga/(In+Ga+Sn) is more preferably 0.02 or more and 0.25 or less, further preferably 0.03 or more and 0.20 or less.

At a tin content of 0.01 or more as in the formula (3-12), chemical resistance is exhibited. At a tin content of 0.40 or less, islands can be formed on the oxide semiconductor thin-film through etching.

In the formula (3-12), Sn/(In+Ga+Sn) is more preferably 0.02 or more and 0.35 or less, further preferably 0.03 or more and 0.30 or less.

At an indium element content of 0.55 or more as in the formula (3-13), reduction in carrier mobility is preventable. At an indium element content of 0.98 or less, the oxide semiconductor thin-film is kept from becoming conductive due to excessive increase in oxygen vacancies.

In the formula (3-13), In/(In+Ga+Sn) is more preferably 0.60 or more and 0.96 or less, further preferably 0.60 or more and 0.94 or less.

At a lanthanoid element content of 0.03 or more as in the formula (3-14), an effect of amorphizing the oxide semiconductor thin-film is exhibited. At a lanthanoid element content of 0.25 or less, the oxide semiconductor thin-film is kept from becoming conductive due to excessive increase in oxygen vacancies.

The added lanthanoid increases the band gap of the oxide semiconductor film, so that an oxide semiconductor film and thin-film transistor with high light resistance can be easily provided.

In the formula (3-14), Ln(In+Ga+Sn+Ln) is more preferably 0.03 or more and 0.25 or less.

The oxide semiconductor thin-film D is preferably amorphous. Specifically, the oxide semiconductor thin-film D is preferably amorphous when being formed through sputtering, and is preferably kept amorphous after a heat treatment. The reason is the same as the above-described reason for the oxide semiconductor thin-film B to be preferably amorphous.

The atomic composition ratio in the oxide semiconductor thin-film D more preferably satisfies formulae (3-11A) to (3-14A), further preferably formulae (3-11B) to (3-13B) and formula (3-14A).

$$0.02 \leq \text{Ga}/(\text{In}+\text{Ga}+\text{Sn}) \leq 0.25 \quad (3\text{-}11\text{A})$$

$$0.02 \leq \text{Sn}/(\text{In}+\text{Ga}+\text{Sn}) \leq 0.35 \quad (3\text{-}12\text{A})$$

$$0.60 \leq \text{In}/(\text{In}+\text{Ga}+\text{Sn}) \leq 0.96 \quad (3\text{-}13\text{A})$$

$$0.03 \leq \text{Ln}/(\text{In}+\text{Ga}+\text{Sn}+\text{Ln}) \leq 0.25 \quad (3\text{-}14\text{A})$$

$$0.03 \leq \text{Ga}/(\text{In}+\text{Ga}+\text{Sn}) \leq 0.20 \quad (3\text{-}11\text{B})$$

$$0.03 \leq \text{Sn}/(\text{In}+\text{Ga}+\text{Sn}) \leq 0.30 \quad (3\text{-}12\text{B})$$

$$0.60 \leq \text{In}/(\text{In}+\text{Ga}+\text{Sn}) \leq 0.94 \quad (3\text{-}13\text{B})$$

$$0.03 \leq \text{Ln}/(\text{In}+\text{Ga}+\text{Sn}+\text{Ln}) \leq 0.25 \quad (3\text{-}14\text{A})$$

Fifth Example

An oxide semiconductor thin-film according to a fifth example (sometimes referred to as an oxide semiconductor thin-film E hereinafter) contains In element, Sn element, Ga element, Al element, and Y element, and an atomic composition ratio of the oxide semiconductor thin-film E preferably satisfies formulae (3-15) and (3-16) below.

The use of the oxide semiconductor thin-film E in the channel-formation regions of the transfer transistor 1 and the reset transistor 20 reduces the leak current.

$$0.03 \leq (\text{Al}+\text{Ga}+\text{Y})/(\text{In}+\text{Y}+\text{Al}+\text{Ga}) \leq 0.50 \quad (3\text{-}15)$$

$$0.05 \leq [(\text{Al}+\text{Ga})/(\text{In}+\text{Al}+\text{Ga}+\text{Y})]/[(\text{Y}+\text{Al}+\text{Ga})/(\text{In}+\text{Al}+\text{Ga}+\text{Y})] \leq 0.75 \quad (3\text{-}16)$$

The oxide semiconductor thin-film E is preferably formed by sputtering a sputtering target (sintered oxide), whose main component is the Bixbyite structure represented by $\text{In}_2\text{O}_3$, in which Y, and one or both of Al and Ga are dissolved in the Bixbyite structure to form a solid solution. The above sputtering target, which has low bulk resistivity of the sintered oxide, large strength of the sintered oxide, small coefficient of thermal expansion, and large thermal conductivity, is less likely to cause cracks or the like due to heat during sputtering and thus allow stable sputtering.

The term "main component" herein means that the component accounts for 50 mass % or more of components of an entire object (the sintered oxide in this example). The main component preferably accounts for 70 mass % or more, more preferably 80 mass % or more, further preferably 90 mass % or more of the object. The above definition of the "main component" applies throughout the fourth exemplary embodiment, unless explicitly defined otherwise.

At (Al+Ga+Y)/(In+Y+Al+Ga) of 0.03 or more as in the formula (3-15), an effect of the addition of Y and Al and/or Ga is exhibited. At a value of (Al+Ga+Y)/(In+Y+Al+Ga) of less than 0.50, carrier mobility in a thin-film transistor using the oxide semiconductor thin-film can be set at a sufficient level.

In the formula (3-15), (Al+Ga+Y)/(In+Y+Al+Ga) is more preferably 0.04 or more and 0.40 or less, further preferably 0.05 or more and 0.35 or less.

At [(Al+Ga)/(In+Al+Ga+Y)]/[(Y+Al+Ga)/(In+Al+Ga+Y)] of 0.05 or more as in the formula (3-16), an oxide semiconductor thin-film, whose main component is the Bixbyite structure represented by $\text{In}_2\text{O}_3$, in which Y, and one or both of Al and Ga are dissolved in the Bixbyite structure to form a solid solution, is more likely to be obtained. At [(Al+Ga)/(In+Al+Ga+Y)]/[(Y+Al+Ga)/(In+Al+Ga+Y)] of 0.75 or less, high carrier mobility and stable transistor performance are likely to be obtained.

In the formula (3-16), [(Al+Ga)/(In+Al+Ga+Y)]/[(Y+Al+Ga)/(In+Al+Ga+Y)] is more preferably 0.06 or more and less than 0.74, further preferably 0.10 or more and 0.74 or less, furthermore preferably 0.15 or more and 0.74 or less, and especially preferably 0.15 or more and 0.73 or less.

The oxide semiconductor thin-film E may optionally contain Sn element and optionally include perovskite structure represented by $\text{YAlO}_3$.

When the oxide semiconductor thin-film E contains Sn element, the Sn element content [(Sn)/(In+Y+Al+Ga+Sn)] in mass unit is preferably 500 ppm or more and 10000 ppm or less, more preferably 700 ppm or more and 8000 ppm or less, further preferably 1000 ppm or more and 7000 ppm or less.

The bulk resistivity of the sputtering target for forming the oxide semiconductor thin-film E can be lowered by the contained Sn element, so that the carrier concentration of the resultant oxide semiconductor thin-film E can be easily controlled at a constant level. Thus, a thin-film transistor with stable properties (i.e. the TFT properties are less likely to be affected by the CVD process and subsequent annealing step) can be obtained.

Sixth Example

An atomic composition ratio of an oxide semiconductor thin-film according to a sixth example (sometimes referred to as an oxide semiconductor thin-film F hereinafter) preferably satisfies a formula (3-17) below.

The use of the oxide semiconductor thin-film F in the channel-formation regions of the transfer transistor 1 and the reset transistor 20 reduces the leak current.

$$0.0001 \leq (Al+Y)/(In+Al+Y) \leq 0.1 \quad (3\text{-}17)$$

The oxide semiconductor thin-film F is preferably formed through sputtering using a sputtering target (sintered oxide), in which positive trivalent metal oxide is added to a main component of indium oxide. With the oxide semiconductor thin-film F, a thin-film transistor with excellent semiconductor properties can be easily provided.

Examples of the positive trivalent metal oxide are at least one oxide selected from the group consisting of boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, thulium oxide, ytterbium oxide, and lutetium oxide.

The oxide semiconductor thin-film F is preferably crystalline. With the crystalline oxide semiconductor thin-film F, durability of TFT can be enhanced.

At $(Al+Y)/(In+Al+Y)$ of 0.0001 or more as in the formula (3-17), the effect for reducing oxygen vacancies can be exhibited, so that a thin-film transistor with a carrier density of $2\times10^{16}$ cm$^{-3}$ or less can be easily obtained. Further, at $(Al+Y)/(In+Al+Y)$ of 0.1 or less, crystallinity of the film is enhanced to prevent excessive increase in oxygen vacancies, allowing stable operation of TFT.

In the formula (3-17), $(Al+Y)/(In+Al+Y)$ is more preferably 0.0005 or more and 0.05 or less, further preferably 0.001 or more and 0.05 or less.

Seventh Example

An atomic composition ratio of an oxide semiconductor thin-film according to a seventh example (sometimes referred to as an oxide semiconductor thin-film G hereinafter) preferably satisfies a formula (3-18) below. Ln represents lanthanoid elements.

The use of the oxide semiconductor thin-film G in the channel-formation regions of the transfer transistor 1 and the reset transistor 20 reduces the leak current.

$$0.01 \leq (Y+Ln+Al+Ga)/(In+Y+Ln+Al+Ga) \leq 0.5 \quad (3\text{-}18)$$

The oxide semiconductor thin-film G is preferably formed by sputtering a sputtering target (sintered oxide) including the Bixbyite structure of $In_2O_3$, and $A_3B_5O_{12}$ structure (A being at least one element selected from the group consisting of Y, La, Ce, Pr, Nd, Pm, Sm, Eu, Gd, Tb, Dy, Ho, Er, Tm, Yb and Lu, B being at least one element selected from the group consisting of Al and Ga). The above sputtering target, whose resistance can be restrained at a low level, is excellent in discharge stability.

The $A_3B_5O_{12}$ structure may be referred to as a garnet or garnet structure.

The presence of the $In_2O_3$ structure and the garnet structure in the oxide semiconductor thin-film G can be determined by an XRD (X-Ray Diffractiometer).

A dispersive arrangement (sea-island structure) of the garnet structure, which is electrically insulative, in the highly conductive Bixbyite structure can lower electric resistance of the sputtering target.

In order to provide larger On/Off characteristics in a thin-film transistor, A in the $A_3B_5O_{12}$ structure is preferably at least one element selected from the group consisting of Y, Ce, Nd, Sm, Eu, and Gd, more preferably at least one element selected from the group consisting of Y, Nd, Sm, and Gd. A and B each may be a single element or two or more elements.

At $(Y+Ln+Al+Ga)/(In+Y+Ln+Al+Ga)$ of 0.01 or more as in the formula (3-18), the carrier density does not become excessively high, allowing stable drive of a thin-film transistor. At $(Y+Ln+Al+Ga)/(In+Y+Ln+Al+Ga)$ of 0.5 or less, the resistance of the sputtering target for forming the oxide semiconductor thin-film G is not excessively high, so that electrical discharge in forming the oxide semiconductor thin-film G is stabilized and generation of particles is restrained.

In the formula (3-18), $(Y+Ln+Al+Ga)/(In+Y+Ln+Al+Ga)$ is more preferably 0.015 or more and 0.40 or less, further preferably 0.02 or more and 0.30 or less.

Eighth Example

An oxide semiconductor thin-film according to an eighth example (sometimes referred to as an oxide semiconductor thin-film H hereinafter) contains indium oxide as the main component and preferably includes surface crystal grains having a single crystal orientation.

The phrase "includes surface crystal grains having a single crystal orientation" means that the crystal orientation is controlled. Usually, a thin-film "includes surface crystal grains having a single crystal orientation" when crystal grains with facet crystal geometry are observed on a surface of the oxide semiconductor thin-film in an observation using EBSD (Electron BackScatter Diffraction). Whether the crystal geometry is facet or radial can be easily determined through the EBSD measurement.

The use of the oxide semiconductor thin-film H in the channel-formation regions of the transfer transistor 1 and the reset transistor 20 reduces the leak current.

The oxide semiconductor thin-film H is preferably crystalline.

The crystalline thin-film including surface crystal grains having a single crystal orientation, whose crystals are stable, can reduce change in the carrier density due to various thermal load, oxidation load, reduction load and the like during TFT production process. A thin-film transistor having a channel region of the crystalline thin-film (the oxide semiconductor thin-film in the fourth exemplary embodiment) can achieve high saturation mobility.

When the content of indium oxide in the oxide semiconductor thin-film is 50 mass % or more, saturation mobility in the resultant thin-film transistor (TFT) can be enhanced.

An average grain size of the facet crystal geometry in the oxide semiconductor thin-film H is usually 0.5 μm or more, preferably 1 μm or more, more preferably 2 μm or more, and an upper limit of the average particle size is usually 10 μm or less. Each of the crystal grains has a single crystal orientation. At the average grain size of 0.5 μm or more, the crystal grains are unlikely to be fine crystals. At the average grain size of 10 μm or less, internal crystal transition is unlikely to occur.

The particle size is calculated by determining a surface configuration through EBSD and measuring Feret diameter (defined as a short side of a rectangle externally tangent to the crystal).

The average grain size is calculated by measuring grain sizes of the facet crystals observed in a frame around a film center (intersection of diagonal lines) and averaging the grain sizes (arithmetic average). The size of the frame is usually 5 μm×5 μm, which is adjusted as needed depending on the size of the film and particle size. The number of the crystals with facet geometry in the frame is five or more. When the number is less than five, the frame is enlarged for further observation. When the number of the facet crystals is less than five even in observation of the entirety of the film, the average is calculated by measuring measurable crystals. Grains of radial crystal geometry usually have particle size ranging approximately from 1 μm to 20 μm. However, especially, crystals whose particle size exceeds 10 μm do not show a single crystal orientation within the particle size but the crystal orientation radially changes from the center or the end of crystals.

The crystal grain with facet crystal geometry on the surface thereof preferably accounts for 50% or more, more preferably 80% or more, further preferably 90% or more of the surface area. With the crystal grain with facet crystal geometry accounting for 50% or more surface area of the oxide semiconductor thin-film, stable carrier density can be achieved. Examples of the crystal geometry other than the facet geometry include radial crystal geometry, amorphous geometry, and minute crystal grains. Grains of the above geometry accounts for the surface area other than the area occupied by the grains of the facet crystal geometry.

It is preferable that the oxide semiconductor thin-film H contains a positive trivalent metal oxide. Examples of the positive trivalent metal oxides are the same as described above.

Ninth Example

An oxide semiconductor thin-film according to a ninth example (sometimes referred to as an oxide semiconductor thin-film I hereinafter) include a Bixbyite structure represented by $In_2O_3$, in which gallium is dissolved in indium oxide to form a solid solution, contents of indium and gallium to all of the metal atoms are 80 atom % or more, and the atomic composition ratio in the oxide semiconductor thin-film I preferably satisfies a formula (3-19) below.

The use of the oxide semiconductor thin-film I in the channel-formation regions of the transfer transistor 1 and the reset transistor 20 reduces the leak current.

$$0.001 \leq Ga/(Ga+In) \leq 0.10 \quad (3\text{-}19)$$

The oxide semiconductor thin-film is preferably crystalline.

At Ga/(Ga+In) of 0.001 or more as in the formula (3-19), a change in the lattice constant of the indium oxide crystal becomes relatively large, so that the effect of the addition of gallium is exhibited.

Further, at Ga/(Ga+In) of 0.10 or less, deposition of $InGaO_3$ and the like can be restrained. By restraining the deposition of $InGaO_3$ and the like, a crystalline oxide semiconductor thin-film I is likely to be obtained.

In the formula (3-19), Ga/(Ga+In) is more preferably 0.005 or more and 0.08 or less, further preferably 0.01 or more and 0.05 or less, furthermore preferably 0.02 or more and 0.04 or less.

The structure of the oxide semiconductor thin-films 2, 21 used in the image sensor according to the fourth exemplary embodiment has been described above.

A production method of the oxide semiconductor thin-films 2, 21 used in the image sensor according to the fourth exemplary embodiment will be described below.

It should be noted that, in the fourth exemplary embodiment, in which the pinned photodiode and n-channel bulk transistor are used, a p-type monocrystalline silicon substrate is used as a substrate. However, an n-type monocrystalline silicon substrate may be used by forming a p well.

Details of the method used for producing the photodiode 10 (photoelectric converter), which are the same as those generally employed, will be omitted.

Next, a method for producing a thin-film transistor whose channel region is made of the oxide semiconductor thin-films 2, 21 will be described with reference to FIG. 19.

In the fourth exemplary embodiment, the thin-film transistor is formed on the gate insulating film 32 of the bulk transistor (not shown) provided on the monocrystalline silicon substrate 200 in advance. Accordingly, the gate insulating film 32 of the bulk transistor can be used as a base layer of the thin-film transistor. It should however be noted that an insulation layer independent of the gate insulating film 32 may be formed as the base layer.

The insulation layer (the gate insulating film 32 in the fourth exemplary embodiment) in contact with the oxide semiconductor thin-film is preferably an oxide insulation layer such as a silicon oxide layer, silicon oxide-nitride layer, aluminum oxide layer, or aluminum oxide-nitride layer. The insulation layer is formed by plasma CVD, sputtering or the like. In order to keep a large amount of hydrogen from being contained in the insulation layer, the insulation layer is preferably formed through a simple process (i.e. sputtering).

A silicon oxide layer as the insulation layer is formed through sputtering in an example described below. The monocrystalline silicon substrate 200 is loaded into a process chamber, in which argon containing high-purity oxygen is introduced as the sputtering gas. Then, the silicon oxide layer as the insulation layer is formed on the monocrystalline silicon substrate 200 using a silicon oxide target through RF (Radio Frequency) sputtering. The monocrystalline silicon substrate may be at a room temperature or may be heated.

For instance, the silicon oxide layer is formed through RF (Radio Frequency) sputtering, in which a quartz (preferably synthetic quartz) is used as a target, with a substrate temperature being room temperature (25 degrees C.), a distance between the substrate and the target (T-S distance) being 70 mm, a pressure being 0.4 Pa, and RF (Radio Frequency) power being 1.5 kW, under oxygen and argon atmosphere (oxygen flow rate 4 sccm:argon flow rate 36 sccm, which corresponds to $O_2$ concentration of 10 volume %). The thickness of the silicon oxide layer is 100 nm. Subsequently, the silicon oxide layer is annealed in atmospheric air at 350 degrees C. for an hour. It should be noted that the target for forming the silicon oxide layer may be silicon instead of quartz. In this case, the sputtering gas is 100 volume % oxygen or a mixture gas of argon containing 50 volume % or more oxygen.

Examples of the sputtering process include RF sputtering whose sputtering power source is a high-frequency power source, DC sputtering whose power source is DC power source, and pulse DC sputtering in which a bias voltage is applied in pulses. The RF sputtering is mainly used when an insulation film is formed. DC sputtering is mainly used when a conductive film is formed.

A multi-sputtering machine capable of installing a plurality of targets of different materials may also be used. The multi-sputtering machine is configured to layer and form different material films in the same chamber or to apply electric discharge simultaneously on a plurality of materials to form a film.

In addition, a sputtering machine including a magnet mechanism for magnetron sputtering in a chamber, or a sputtering machine for ECR sputtering using plasma generated by microwaves instead of glow-discharge may also be used.

Further, examples of the film-formation method through sputtering include reactive sputtering, in which a target material and sputtering gas component are chemically reacted during film-formation to form a thin-film of the compound, and a bias sputtering, in which voltage is also applied on the substrate during film-formation.

The insulation layer may have a laminated structure layered on the substrate in an order of, for instance, a nitride insulation layer such as a silicon nitride layer, silicon nitride-oxide layer, aluminum nitride layer, and aluminum nitride-oxide layer, and the above oxide insulation layer.

For instance, sputtering gas containing high-purity nitrogen, from which hydrogen and moisture are removed, is introduced into between the silicon oxide layer and the substrate to form the silicon nitride layer using a silicon target. In this case, it is also preferable that the silicon nitride layer is formed while removing residual moisture in the process chamber, as in the silicon oxide layer.

When the silicon nitride layer is formed, the substrate may be heated during the film-formation.

When the silicon nitride layer and the silicon oxide layer are laminated as the insulation layers, the silicon nitride layer and the silicon oxide layer can be formed in the same process chamber using a silicon target in common. Initially, nitrogen-containing sputtering gas is introduced into the process chamber to form the silicon nitride layer using the silicon target placed in the process chamber. Then, the sputtering gas is changed to an oxygen-containing gas to form the silicon oxide layer using the same silicon target. Since the silicon nitride layer and the silicon oxide layer are successively formed without being exposed to the atmosphere, impurities such as hydrogen and moisture are kept from being adsorbed on the surface of the silicon nitride layer.

Subsequently, an oxide semiconductor thin-film whose thickness is preferably in a range from 15 nm to 150 nm is formed on the insulation layer (gate insulating film 32 in the fourth exemplary embodiment) through sputtering.

Before the oxide semiconductor thin-film is formed through sputtering, it is preferable to apply reverse sputtering for generating plasma with introduced argon gas, in order to remove dust adhered on the surface of the insulation layer. The reverse sputtering refers to a process, in which voltage is applied on a substrate with an RF power source under argon atmosphere to hit ionized argon against the substrate to modify the surface of the substrate. Nitrogen, helium or oxygen may alternatively be used instead of argon.

The oxide semiconductor thin-film is formed through sputtering using the sintered oxide as the sputtering target. The composition of the sintered oxide may be the same composition as the oxide semiconductor thin-film to be formed.

For instance, sintered oxide may be binary sintered oxide, ternary sintered oxide, quaternary sintered oxide, quinary sintered oxide and the like.

Examples of the binary sintered oxide include In—Al—O, In—Y—O, and In-Ln-O (Ln being at least one metal element selected from La, Nd, Sm, Eu, Gd, Tb, Dy, Ho, Er, Tm, Yb, and Lu).

Examples of the ternary sintered oxide include In—Ga—Al—O, In—Ga—Y—O, In—Ga-Ln-O (Ln being at least one metal element selected from La, Nd, Sm, Eu, Gd, Tb, Dy, Ho, Er, Tm, Yb, and Lu), In—Sn—Al—O, In—Sn—Y—O, In—Sn-Ln-O (Ln being at least one metal element selected from La, Nd, Sm, Eu, Gd, Tb, Dy, Ho, Er, Tm, Yb, and Lu), In—Al—Y—O, In—Al—Lu—O, and In—Y-Ln-O (Ln being at least one metal element selected from La, Nd, Sm, Eu, Gd, Tb, Dy, Ho, Er, Tm, Yb, and Lu).

Examples of the quaternary sintered oxide include In—Ga—Sn—Al—O, In—Ga—Sn—Y—O, In—Ga—Sn-Ln-O (Ln being at least one metal element selected from La, Nd, Sm, Eu, Gd, Tb, Dy, Ho, Er, Tm, Yb, and Lu), In—Ga—Al—Y—O, In—Ga—Al-Ln-O (Ln being at least one metal element selected from La, Nd, Sm, Eu, Gd, Tb, Dy, Ho, Er, Tm, Yb, and Lu), and In—Ga—Y-Ln-O (Ln being at least one metal element selected from La, Nd, Sm, Eu, Gd, Tb, Dy, Ho, Er, Tm, Yb, and Lu).

Examples of the quinary sintered oxide include In—Ga—Sn—Al—Y—O, In—Ga—Sn—Al-Ln-O (Ln being at least one metal element selected from La, Nd, Sm, Eu, Gd, Tb, Dy, Ho, Er, Tm, Yb, and Lu), and In—Ga—Sn—Y-Ln-O (Ln being at least one metal element selected from La, Nd, Sm, Eu, Gd, Tb, Dy, Ho, Er, Tm, Yb, and Lu).

The sputtering gas used in forming the oxide semiconductor thin-film may preferably be a high-purity gas from which impurities such as hydrogen, water, hydroxyl group and hydroxide are removed to a concentration of ppm or ppb level, or may be preferably a gas added with hydrogen and/or water to lower the carrier concentration to the maximum.

An example of film-formation conditions includes: a substrate temperature being a room temperature (25 degrees C.); a distance between the substrate and the target being 110 mm; diameter of the sputtering target being 4 inches; pressure being 0.4 Pa; power of DC (Direct Current) power source being 0.5 kW; and atmosphere being oxygen and argon (oxygen flow rate being controlled as needed in a range from 1 sccm to 15 sccm with the total gas flow rate of 40 sccm). It should be noted, a use of a pulse DC (Direct Current) power source with a pulse frequency in a range from 1 kHz to 300 kHz, preferably from 10 kHz to 180 kHz, and further preferably from 15 kHz to 150 kHz for film-formation at a duty cycle of 80% or less (preferably 60% or less, more preferably 40% or less) is preferable in that occurrence of abnormal discharge can be restrained, nodules (surface black foreign body) and powdery substance (particles or sometimes called dusts) formed during the film-formation can be reduced, and the thickness distribution becomes even. The film-formation through pulse DC sputtering is also advantageous in that the bulk resistivity of the sputtering target for film-formation through DC sputtering is not necessarily lowered (preferably 5 mΩcm or less), where a sputtering target with the bulk resistivity of 10 mΩcm or more and 100 mΩcm or less is suitably usable. The thickness of the oxide semiconductor thin-film is preferably in a range from 15 nm to 150 nm. It should be noted that the appropriate thickness differs depending on the used oxide semiconductor material and the thickness may be selected as needed depending on the material.

The film density of the oxide semiconductor is preferably 6.5 g/cm$^3$ or more. The film density is preferably 6.6 g/cm$^3$ or more, further preferably 6.8 g/cm$^3$ or more. With the above arrangement, a film with small shortage in each of the elements can be formed, which exhibits excellent reliability and stable performance when being used as a channel layer of a device. It should be noted that the oxide semiconductor layer may be designed in any manner within the scope of the claims, where the film density is not limited within the preferable range.

A relative density ratio (a ratio of the film density to a theoretical density) of the film is preferably 80% or more, more preferably 90%, further preferably 95% or more. The above feature provides a highly dense film, which is less likely to cause dispersion of oxygen and/or hydrogen when being used as a channel layer of a device, and is less likely to be affected by heat, chemical liquid, plasma and the like, exhibiting stable performance. It should be noted that the oxide semiconductor layer may be designed in any manner within the scope of the claims, where the relative density of the film is not limited within the preferable range.

Subsequently, the oxide semiconductor thin-film is processed into island-shaped oxide semiconductor thin-films 2, 21 through a first photolithography step and etching step (see FIG. 19).

A resist mask for forming the island-shaped oxide semiconductor thin-film may be formed through inkjet method. The inkjet method, which requires no photo mask, can lower the production cost. The oxide semiconductor thin-film may be etched through dry etching process, wet etching process, or both of dry and wet etching processes.

In the fourth exemplary embodiment, the island-shaped oxide semiconductor thin-film is formed with a mask pattern using a metal mask.

The etching gas for the dry etching process is preferably chlorine-containing gas (chlorine-based gas such as chlorine ($Cl_2$), boron chloride ($BCl_3$), silicon chloride ($SiCl_4$), and carbon tetrachloride ($CCl_4$)).

Alternatively, fluorine-containing gas (fluorine-based gas such as carbon tetrafluoride ($CF_4$), sulfur hexafluoride ($SF_6$), nitrogen trifluoride ($NF_3$), trifluoromethane ($CHF_3$)), hydrogen bromide (HBr), oxygen ($O_2$), and a gas provided by adding rare gas such as helium (He) and argon (Ar) to the above gases may be used.

Examples of the dry etching process include parallel-plate RIE (Reactive Ion Etching), and ICP (Inductively Coupled Plasma) etching. The etching conditions (e.g. electric power applied to a coil electrode, electric power applied to an electrode on the substrate, and temperature of the electrode on the substrate) are appropriately adjusted so that the oxide thin-film can be etched into a desired shape.

Examples of the etching liquid for the wet etching process include oxalic acid aqueous solution, a mixture solution of phosphoric acid, acetic acid and nitric acid, and ammonia-hydrogen peroxide mixture (31 mass % of hydrogen peroxide solution:28 mass % of ammonium water:water=5:2:2). Alternatively, ITO-07N (manufactured by KANTO CHEMICAL CO., INC.) may be used.

The etching liquid is cleaned to be removed together with etched material after the wet etching process. The waste liquid of the etching liquid containing the removed material may be purified for recycling the contained material. Collecting and recycling the material (e.g. indium) contained in the oxide semiconductor thin-film from the waste liquid after the etching process results in effective use of resources and reduction in cost.

The etching conditions (e.g. etching liquid, etching time, and temperature) are appropriately adjusted depending on the material so that the material is etched into a desired shape.

In the fourth exemplary embodiment, the oxide semiconductor thin-films 2, 21 are subjected to a first heat treatment under an atmospheric air, nitrogen atmosphere, or a rare-gas (e.g. helium, neon, and argon) atmosphere.

The temperature in the first heat treatment (anneal temperature), which is preferably as low as possible, is usually 50 degrees C. or more, preferably 100 degrees C. or more, more preferably 130 degrees C. or more, furthermore preferably 150 degrees C. or more for fear of failure in exhibiting the TFT performance when being left in a state immediately after the film is formed. In this case, the oxide semiconductor thin-film may be left amorphous, may include fine crystals of the Bixbyite crystalline phase represented by $In_2O_3$ in an amorphous phase, or may form fine crystals in the entirety thereof. Alternatively, the oxide semiconductor thin-film may include crystals with facet geometry that are crystallized within a controlled temperature range to have crystal orientation on the surface grown only in one direction.

The anneal temperature preferably does not affect the properties of the photoelectric converter and amplification transistor. Preferably, the anneal temperature is 500 degrees C. or less, more preferably 450 degrees C. or less, further preferably 400 degrees C. or less. When the oxide semiconductor thin-film is crystallized within the controlled temperature range, the temperature increase rate in the temperature range of 150 degrees C. or more and 250 degrees C. or less, in which crystal nuclei are supposed to develop, is preferably 10 degrees C./min or less. Alternatively, the oxide semiconductor thin-film may be held for a predetermined time at a predetermined temperature within the range of 150 degrees C. or more and 250 degrees C. or less to develop crystal nuclei, and then the temperature may be raised to grow the crystals. In other words, the temperature may be raised from 150 degrees C. to 250 degrees C. over a time period of 10 minutes or more, and/or the semiconductor oxide thin-film may be held at the predetermined temperature within the temperature range of 150 degrees C. or more and 250 degrees C. or less for 10 minutes or more.

In the fourth exemplary embodiment, the substrate is loaded into an electric furnace (i.e. one of heat treatment machines) to apply a heat treatment on the oxide semiconductor thin-film under atmospheric air at 350 degrees C. for 30 minutes. When the temperature is lowered from the temperature during the heat treatment, the atmosphere may be changed to oxygen. Through the first heat treatment, the oxide semiconductor thin-films 2, 21 are densified and, as necessary, crystallized.

The heat treatment machine is not necessarily an electric furnace, but may include a device for heating an object to be treated through thermal conduction or thermal radiation from a heating element (e.g. resistance heating element). For instance, the heat treatment machine may be an RTA (Rapid Thermal Annealing) device such as GRTA (Gas Rapid Thermal Annealing) device and LRTA (Lamp Rapid Thermal Annealing) device. The LRTA device is a device for heating an object to be treated with light (electromagnetic wave) emitted from a lamp such as a halogen lamp, metal halide lamp, xenon arc lamp, carbon arc lamp, high-pressure sodium lamp, and high-pressure mercury lamp. The GRTA device is configured to apply the heat treatment with a use of high-temperature gas. The gas is an inert gas such as rare gas (e.g. argon) and nitrogen that is non-reactive to the object to be treated during the heat treatment.

For instance, in the first heat treatment, the substrate may be placed in the inert gas heated to a high temperature (in a range from 150 to 500 degrees C.) using a GRTA device, and may be taken out of the inert gas after heating for several minutes. The use of the GRTA device allows a high-temperature heat treatment within a short time.

Depending on the conditions of the first heat treatment and/or the material of the oxide semiconductor thin-film, the oxide semiconductor thin-film is sometimes crystallized to become a layer of fine crystals or a polycrystalline layer. For instance, the oxide semiconductor thin-film sometimes becomes a thin-film of fine crystals whose crystallization ratio is 90% or more or 80% or more. Depending on the conditions of the first heat treatment and/or the material of the oxide semiconductor thin-film, the oxide semiconductor thin-film sometimes becomes an amorphous oxide semiconductor thin-film containing no crystal component. Alternatively, the oxide semiconductor thin-film may become an amorphous oxide semiconductor thin-film mixed therein with fine crystals (particle size ranging from 100 nm from 2 μm (exemplarily from 500 nm to 1 μm)). The "particle size" herein means a size of a crystal grain viewed in parallel to a surface of the thin-film and/or in a cross section of the thin-film observed through TEM (Transmission Electron Microscope).

The first heat treatment on the oxide semiconductor thin-films 2, 21 may be applied to the oxide semiconductor thin-film before the oxide semiconductor thin-film is formed into the island-shaped oxide semiconductor thin-film.

The heat treatment for densifying and crystallizing the oxide semiconductor thin-films 2, 21 may be applied after forming the oxide semiconductor thin-film, after forming the source electrode and drain electrode on the oxide semiconductor thin-film, or after forming the gate insulation layer and/or protection film on the source electrode and drain electrode.

Subsequently, after a conductive layer is formed, a resist mask is formed on the conductive layer through photolithography. Then, after the source electrode 3 and drain electrode 4 of the transfer transistor 1 and the source electrode 22 and drain electrode 23 of the reset transistor are formed through selective etching, the resist mask is removed.

In a top-gate thin-film transistor, ends of the formed source electrode and drain electrode are preferably tapered in order to improve coatability of the gate insulation layer layered thereon.

In the fourth exemplary embodiment, the source electrode 3 and the drain electrode 4 are titanium films of 50 nm thick patterned through sputtering using a metal mask.

It should be noted that the material and etching conditions of the oxide semiconductor thin-films 2, 21 are appropriately adjusted in order to avoid partial removal of the oxide semiconductor thin-films 2, 21 during the etching process of the conductive layer to expose the insulation layer below the oxide semiconductor thin-films 2, 21.

An oxalic acid aqueous solution may be used as an etchant in the fourth exemplary embodiment.

When a protection film is subsequently formed, for instance, high-density plasma CVD using microwaves (2.45 GHz), which is capable of providing a dense and high-quality protection film or insulation layer with high dielectric strength voltage, is preferable. The highly purified oxide semiconductor thin-film and the high-quality gate insulation layer (protection film), which are in close contact with each other, reduces the interface state to improve the interface properties. Other methods such as sputtering and plasma CVD for forming the film may be employed as long as an insulation layer suitable for the gate insulation layer can be formed. Alternatively, a heat treatment may be applied after the film is formed to change the quality of the gate insulation layer and interface state with the oxide semiconductor thin-film. In sum, it is only necessary for the gate insulation layer to have favorable film quality, and form favorable interface by reducing interface state density against the oxide semiconductor thin-film.

A protective insulation layer and/or a flattening insulation layer may be provided on the thin-film transistor and the bulk transistor. The protective insulation layer can be provided by, for instance, a single layer or a laminate of a silicon oxide layer, silicon nitride layer, silicon oxide-nitride layer, silicon nitride-oxide layer, and/or aluminum.

The flattening insulation layer may be made of a heat-resistant organic material such as polyimide, acryl, benzocyclobutene, polyamide, and epoxy. In addition to or in place of the above organic material, a low-dielectric material (low-k material), siloxane-based resin, PSG (Phospho-Silicate Glass), BPSG (Boron-Phospho-Silicate Glass) or the like may be used. A plurality of insulation films made of the above materials may be laminated to form the flattening insulation layer.

The siloxane-based resin refers to a resin including an Si—O—Si bond made of a siloxane-based material as a starting material. The siloxane-based resin is optionally substituted by an organic group (e.g. alkyl group and aryl group). The organic group optionally has a fluoro group.

The method for forming the flattening insulation layer is not particularly limited. Depending on the material of the flattening insulation layer, a process such as sputtering, SOG, spin coating, dipping, spraying, and liquid droplet discharging (e.g. inkjet, screen printing, offset printing) and a device such as a doctor blade, roll coater, curtain coater, and knife coater are usable.

The oxide semiconductor thin-films 2, 21 of the fourth exemplary embodiment contain at least one conductive oxide selected from oxides of In element, Sn element, and Ga element, and at least one oxide selected from oxides of Al element, Y element, and lanthanoid element Ln.

Accordingly, an oxide semiconductor containing no zinc and producing small leak current for an image sensor can be provided.

Further, the image sensor according to the fourth exemplary embodiment, which includes a combination of the thin-film transistor (transfer transistor 1 and reset transistor 20) with the oxide semiconductor thin-films 2, 21 containing specific elements, and the bulk transistor as the amplification transistor 30, further effectively exhibits the reduction effect of the leak current. Thus, an image sensor, which is excellent in the ability to hold electric potential by the signal charge accumulator 15 and has wide dynamic range, can be provided.

Modification(s) of Fourth Exemplary Embodiment

An image sensor according to a modification(s) will be described below. The same reference characters refer to the same parts described in the above-described exemplary embodiments and any repetitive description thereof are omitted.

The image sensor according to the modification is the same as the image sensor shown in FIG. 19 except that an organic photoelectric converter is used as the photodiode.

FIG. 21 is a vertical cross section showing a unit cell of an image sensor according to the modification.

The photodiode 110 as shown in FIG. 21 includes the contact metal layer 113, the n-type organic semiconductor region 112, and the p-type organic semiconductor region 111 sequentially laminated on the monocrystalline silicon substrate 200. The source electrode 3 of the transfer transistor 1 is connected to an output (p-type region) of the photodiode 110.

The contact metal layer 113 is provided in the gate insulating film 32 of the amplification transistor 30. The monocrystalline silicon substrate 200 and the p-type organic semiconductor region 111 are electrically connected through the contact metal layer 113.

In the image sensor according to the modification, the electrical charge generated by the photodiode 110 is accumulated in the signal charge accumulator 15 through the transfer transistor 1. The signal charge accumulator 15 is electrically connected with the gate electrode 34 of the amplification transistor 30 and is configured to efficiently amplify the signal from the photodiode 110.

As described above, the photodiode may be an organic diode, which exhibits effects similar to those of an organic diode.

Other Examples

The transfer transistor 1, reset transistor 20, and amplification transistor 30, which are top-gate transistors in the fourth exemplary embodiment, may alternatively be bottom-gate transistors (e.g. reverse staggered transistor).

Though the source electrode 3 of the transfer transistor 1 is exemplarily connected to the photodiode 10 in the fourth exemplary embodiment in order to illuminate the photodiode 10 (photoelectric converter) with light, for instance, the source electrode may be made of a translucent conductive material, whereby the source electrode may be connected with the photoelectric converter in a different manner.

Though the bulk transistor is exemplarily used as the amplification transistor 30 in the fourth exemplary embodiment, the channel-formation region of the amplification transistor is not particularly limited, where the oxide semiconductor thin-films 2, 21 according to the fourth exemplary embodiment or known semiconductor layer other than monocrystalline silicon semiconductor may alternatively be used. It should however be noted that the amplification transistor is preferably a bulk transistor made of silicon semiconductor, which has higher amplification factor.

For instance, a selector transistor electrically connected to the amplification transistor may be provided. The channel-formation region of the selector transistor may be made of the oxide semiconductor thin-films 2, 21 according to the fourth exemplary embodiment, or may be made of a silicon semiconductor or any other known semiconductor layer.

The substrate may be an SOI substrate. The "SOI substrate" is not limited to a semiconductor substrate such as a silicon wafer, but includes non-semiconductor substrate such as a glass substrate, quartz substrate, sapphire substrate, and metal substrate. In other words, "SOI substrate" in a broad sense refers to a substrate including a semiconductor material on an insulative substrate.

The structures of the transfer transistor 1, the reset transistor 20, and the amplification transistor 30 are not limited to those described in the fourth exemplary embodiment. For instance, the transfer transistor 1, the reset transistor 20, and the amplification transistor 30 may have an LDD (Lightly Doped Drain) structure including a sidewall at an end of the gate electrode, or may have a low-resistance silicide at a part of source and drain regions.

An insulation layer may be provided over the amplification transistor and a thin-film transistor may be provided on the insulation layer. For instance, at least one of the transfer transistor, the reset transistor, the amplification transistor, and, as necessary, the selector transistor may be provided above the amplification transistor. Thus, an area occupied by the transistor(s) required for one pixel can be decreased. Consequently, integration density and light-receiving area on the photodiode can be increased and noise can be decreased.

It should be noted that it is easily understood by those skilled in the art that the above-described examples may be modified in various manners, as long as such modification and details are compatible with an object and scope of the invention. Accordingly, the scope of the invention should by no means be interpreted to be restricted to the disclosure in the fourth exemplary embodiment.

Usage of Image Sensor

The image sensor according to the fourth exemplary embodiment is suitably usable for various electronic devices (including game machine). For instance, the image sensor is applicable in electronic devices including a unit for acquiring image information such as a digital camera, digital video camera, cellular phone, portable game machine, and portable information terminal.

The oxide semiconductor thin-film used in the image sensor according to the exemplary embodiment is usable for a quantum-tunneling Field-Effect Transistor (FET). Specific structure and production method of the FET, which are substantially the same as described in the first exemplary embodiment, will be omitted.

The above is the description of the fourth exemplary embodiment.

EXAMPLES

The invention will be specifically described below with reference to Examples. It should however be noted that the scope of the invention is by no means limited by the Examples.

Example 1

Preparation and Property Evaluation of Sintered Oxide
Preparation of Sintered Oxide Powders of yttrium oxide, gallium oxide, indium oxide, aluminum oxide, tin oxide, and cerium oxide were weighed in a ratio (atomic ratio) as shown in Table 1 or 2, which were put in a polyethylene pot and mixed/pulverized using a dry ball mill for 72 hours to prepare mixture powder.

The mixture powder was put in a die and pressed at a pressure of 49 MPa (in terms of the SI unit equivalent to 500 kg/cm$^2$) to prepare a press molding body. The molding body was compacted through CIP (Cold Isostatic Pressing) at a pressure of 196 MPa (in terms of the SI unit equivalent to 2000 kg/cm$^2$). Subsequently, after the molding body was put into an atmospheric-pressure sintering furnace and was held in the atmospheric air at 350 degrees C. for three hours, the temperature inside the furnace was raised at a temperature increase rate of 100 degrees C./hr., and the molding body was kept at 1460 degrees C. for 36 hours. Then, the molding body was left still to be cooled to obtain a sintered oxide.

Property Evaluation of Sintered Oxide

The following physical properties of the obtained sintered oxide were evaluated. The results are shown in Table 1.

(1) Crystalline Phase Observed by XRD

XRD (X-Ray Diffraction) of the obtained sintered oxide was measured using an X-ray diffractiometer Smartlab under the conditions below. The resultant XRD chart was analyzed using JADE6 to determine the crystalline phase in the sintered oxide. Further, the composition of the sintered oxide was calculated in mass % based on a peak intensity ratio.

Machine: Smartlab (manufactured by Rigaku Corporation)

X-ray: Cu—K α ray (wavelength $1.5418\times10^{-10}$ m)

2θ-θ Reflection method, Continuous Scan (2.0 degrees/min.)

Sampling interval: 0.02 degrees

Slit DS (Divergence Slit), SS (Scattering Slit), RS (Receiving Slit): 1 mm (2) Relative Density (%)

The "relative density" herein refers to a value represented by percentage obtained by dividing an actual density of the sintered oxide, which is measured by Archimedes method, by a theoretical density of the sintered oxide. In the invention, the theoretical density is calculated as follows.

Theoretical density=(total weight of material powder for the sintered oxide)/(total volume of the material powder of the sintered oxide)

For instance, when use amounts (charge amounts) of an oxide A, oxide B, oxide C, and oxide D, which are materials of the material powder of the sintered oxide, are represented by a (g), b (g), c (g), and d (g), respectively, the theoretical density can be calculated according to the formula below.

Theoretical density=$(a+b+c+d)/((a/$density of oxide $A)+(b/$density of oxide $B)+(c/$density of oxide $C)+(d/$density of oxide $D))$ It should be noted that the density of each of the oxides is substantially equal to the specific gravity of each of the oxides. Accordingly, the value of the specific gravity of oxides described in "Handbook of Chemistry: Pure Chemistry, Chemical Society of Japan, revised 2nd ed. (MARUZEN-YUSHODO Company, Limited) was used as the value of the density.

(3) Bulk Resistivity (mΩ·cm)

The bulk resistivity (mΩ·cm) of the obtained sintered body was measured according to a four-probe method (JIS R1637) using a resistivity meter Loresta (manufactured by Mitsubishi Chemical Corporation).

Five points (the center of the sintered oxide, and four middle points between four corners of the sintered oxide and the center of the sintered oxide) were measured and averaged to calculate the bulk resistivity.

Table 1 shows test results of indium-oxide-based, yttrium-oxide-based, gallium-oxide-based, and aluminum-oxide-based sintered bodies (Examples 1-1 to 1-4, Comparatives 1-1, 1-2). XRD charts of the sintered oxides prepared in Examples 1-1 and 1-2 and Comparatives 1-1 and 1-2 are shown in FIGS. 24 to 27, respectively. Table 2 shows test results of indium-oxide-based, yttrium-oxide-based, gallium-oxide-based, aluminum-oxide-based sintered bodies and a sintered oxide of a tetravalent positive metal oxide (Examples 1-5 and 1-6).

TABLE 1

| | Sample Name | Example 1-1 | Example 1-2 | Example 1-3 | Example 1-4 | Comparative 1-1 | Comparative 1-2 |
|---|---|---|---|---|---|---|---|
| mass % | $In_2O_3/(In_2O_3 + Y_2O_3 + Ga_2O_3 + Al_2O_3)$ | 90.0 | 89.0 | 90.0 | 89.0 | 88.0 | 91.0 |
| | $Y_2O_3/(In_2O_3 + Y_2O_3 + Ga_2O_3 + Al_2O_3)$ | 4.0 | 4.0 | 2.0 | 2.0 | 4.0 | 4.0 |
| | $Ga_2O_3/(In_2O_3 + Y_2O_3 + Ga_2O_3 + Al_2O_3)$ | 5.0 | 5.0 | 7.0 | 7.0 | 5.0 | 5.0 |
| | $Al_2O_3/(In_2O_3 + Y_2O_3 + Ga_2O_3 + Al_2O_3)$ | 1.0 | 2.0 | 1.0 | 2.0 | 3.0 | — |
| Atomic ratio | In/(In + Y + Ga) | 0.880 | 0.878 | 0.875 | 0.874 | 0.877 | 0.881 |
| | Y/(In + Y + Ga) | 0.048 | 0.049 | 0.024 | 0.024 | 0.049 | 0.047 |
| | Ga/(In + Y + Ga) | 0.072 | 0.073 | 0.101 | 0.102 | 0.074 | 0.072 |
| | Al/(In + Y + Ga + Al) | 0.0259 | 0.0510 | 0.0258 | 0.0508 | 0.0753 | — |
| Crystalline phase observed through XRD (mass %) | $In_2O_3$ | 92.6 | 91.3 | 91.3 | 91.3 | 90.5 | ≈100 |
| | $Y_3Ga_5O_{12}$ | 4.8 | 0.2 | 0.2 | 0.2 | 0.8 | — |
| | $Y_3Ga_4AlO_{12}$ | 2.6 | 8.5 | 8.5 | 8.5 | 8.7 | — |
| | $Y_3In_2Ga_3O_{12}$ | — | — | — | — | — | *trace |
| Lattice constant of $In_2O_3$ crystalline phase [$10^{-10}$ m] | | 10.10194 | 10.09744 | 10.09744 | 10.09744 | 10.0963 | 10.10801 |
| Relative density [%] | | 98.4 | 98.6 | 98.1 | 97.4 | 99.0 | 98.4 |
| Actual density [g/cm$^3$] | | 6.79 | 6.80 | 6.77 | 6.72 | 6.77 | 6.81 |
| Calculated density (Theoretical density) [g/cm$^3$] | | 6.9 | 6.9 | 6.9 | 6.9 | 6.84 | 6.92 |
| Bulk resistivity [mΩ · cm] | | 28.8 | 23.4 | 24.7 | 25.0 | 32.2 | 32.4 |

*"trace" means that, though XRD peak(s) was detected, the composition was less than lower limit of quantitative assay.

TABLE 2

| Added element | X | Example 1-5 Sn | Example 1-6 Ce |
|---|---|---|---|
| Mass ratio [mass %] | $In_2O_3/(In_2O_3 + Y_2O_3 + Ga_2O_3 + Al_2O_3)$ | 88.9 | 88.9 |
| | $Y_2O_3/(In_2O_3 + Y_2O_3 + Ga_2O_3 + Al_2O_3)$ | 4.0 | 4.0 |
| | $Ga_2O_3/(In_2O_3 + Y_2O_3 + Ga_2O_3 + Al_2O_3)$ | 5.0 | 5.0 |
| | $Al_2O_3/(In_2O_3 + Y_2O_3 + Ga_2O_3 + Al_2O_3)$ | 2.0 | 2.0 |
| | $XO_2/(In_2O_3 + Y_2O_3 + Ga_2O_3 + Al_2O_3 + XO_2)$ | 0.1 | 0.1 |
| Atomic ratio | In/(In + Y + Ga) | 0.878 | 0.878 |
| | Y/(In + Y + Ga) | 0.049 | 0.049 |
| | Ga/(In + Y + Ga) | 0.073 | 0.073 |

TABLE 2-continued

| Added element | X | Example 1-5<br>Sn | Example 1-6<br>Ce |
|---|---|---|---|
| Al/(In + Y + Ga + Al) | | 0.0510 | 0.0510 |
| X/(In + Y + Ga + Al + X) | | 0.00086 | 0.00042 |
| Crystalline phase observed | $In_2O_3$ | 91.3 | 91.4 |
| through XRD (mass %) | $Y_3Ga_5O_{12}$ | — | — |
| | $Y_3Ga_4AlO_{12}$ | 8.7 | 8.6 |
| | $Y_3In_2Ga_3O_{12}$ | — | — |
| Lattice constant of $In_2O_3$ crystalline phase [$10^{-10}$ m] | | 10.10135 | 10.10161 |
| Relative density [%] | | 98.0 | 97.7 |
| Actual density [g/cm³] | | 6.95 | 6.93 |
| Calculated density (Theoretical density) [g/cm³] | | 7.09 | 7.09 |
| Bulk resistivity [mΩ · cm] | | 4.7 | 5.6 |

As shown in Table 1, Examples 1-1 to 1-4 satisfied the atomic ratios of In, Y, Ga, and Al defined in the first exemplary embodiment, included the $In_2O_3$, $Y_3Ga_5O_{12}$, and $Y_3Ga_4AlO_{12}$ crystalline phases, and the bulk resistivity was 30 mΩcm or less. In contrast, Comparative 1 exceeded the upper limit of the Al atomic ratio and Comparative 2 fell below the lower limit of the Al atomic ratio, so that the bulk resistivity exceeded 30 mΩcm.

As shown in Table 2, Examples 1-5 and 1-6 satisfied the atomic ratios of In, Y, Ga, and Al defined in the first exemplary embodiment, included the $In_2O_3$ and $Y_3Ga_4AlO_{12}$ crystalline phases, and the bulk resistivity was 30 mΩcm or less.

Production of Thin-Film Transistor, Evaluation of Properties of Oxide Semiconductor Thin-Film, and Evaluation of Performance of Thin-Film Transistor Preparation of Oxide Semiconductor Thin-Film Initially, as shown in FIG. 28, samples each having only an oxide thin-film (item 83) formed on a glass substrate (item 81) were prepared and the properties of the samples were measured and evaluated, according to the following specific procedures.

Initially, with the use of sputtering targets made of the sintered oxides produced in Examples 1 to 5 and Comparatives 1 and 2, a 50-nm thin film (oxide semiconductor layer) was formed on a glass substrate through sputtering under the conditions shown in "production conditions" in Table 2. Sputtering gas in a form of mixture gas of high-purity argon and 1 volume % high-purity oxygen was used for the sputtering.

Then, after the obtained sample was subjected to a heat treatment in atmospheric air at 350 degrees C. for 30 minutes, the properties of the treated thin-film were evaluated. Specific evaluation items and method are as follows.
Measurement of Hall Effect:

A Hall-effect measurement sample was set to a Hall-effect/specific resistance measurement system (ResiTest 8300, manufactured by TOYO Corporation) to evaluate the Hall effect and determine the carrier density and carrier mobility at a room temperature.

Crystal Property of Oxide Semiconductor Thin-Film

Crystallinity of a non-heated film after sputtering (immediately after film deposition) and crystallinity of the film immediately after being heated were evaluated through XRD (X-Ray Diffraction) measurement. Whether the film was "amorphous" was determined based on presence/absence of a peak(s) at an angle 2θ ranging from 30 degrees to 40 degrees in XRD. The results are shown in Table 2.
Identification of Crystal Structure XRD charts of the films determined to be crystalline through XRD obtained under the conditions below were analyzed using JADE6 to identify the crystalline phases in the sintered oxide.

Machine: Smartlab (manufactured by Rigaku Corporation)
X-ray: Cu—K α ray (wavelength 1.5418×$10^{-10}$ m)
2θ-θ Reflection method, Continuous Scan (2.0 degrees/min.)
Sampling interval: 0.02 degrees
Slit DS (Divergence Slit), SS (Scattering Slit), RS (Receiving Slit): 1 mm
Lattice Constant ($10^{-10}$ m) of $In_2O_3$ Crystal The lattice constant was calculated through lattice-constant refinement starting from JCPDS card $In_2O_3$ (PDF #06-0416) using JADE6 based on the crystal peak obtained through XRD.
Band Gap of Oxide Semiconductor Thin-Film Transmission spectrum of a thin-film sample formed on a quartz substrate and subjected to the same heat treatment as in the oxide semiconductor thin-film was measured, whose results were plotted in a graph (abscissa axis: wavelength, ordinate axis: transmittance). Then, after the wavelength in abscissa axis was converted into energy (eV) and the transmittance in ordinate axis was converted into:

$$(\alpha h\nu)^2$$

where
α: absorption coefficient,
h: Planck's constant, and
ν: oscillation frequency,
a straight line was fitted to a rising portion of the absorption and an eV value at an intersection of the straight line with a base line was calculated as the band gap. The results are shown in Table 2.

The results are shown in "thin-film" "film-formation+heat treatment (before $SiO_2$ film formation)" in Table 2.

An $SiO_2$ film (protective insulation film; interlayer insulating film, item 85 in FIG. 29) was formed on an oxide semiconductor thin-film having been subjected to a heat treatment through CVD (Chemical Vapor Deposition) at a substrate temperature of 300 degrees C. to prepare a sample shown in FIG. 29. The carrier density and carrier mobility in the formed thin-film were evaluated under the same conditions as in "(1) Measurement of Hall Effect." The results are shown in "thin-film" "immediately after $SiO_2$ film formation" in Table 2.

The sample, on which the $SiO_2$ film was formed, was subjected to a heat treatment (subsequent annealing) at 350 degrees C. for an hour. The carrier density and carrier mobility of the sample after being subjected to the heat treatment were evaluated under the same conditions as in "immediately after $SiO_2$ film formation." The results are shown in "thin-film" "$SiO_2$ film formation+heat treatment" in Table 2.

It should be noted that the resultant oxide thin-films had the same composition in atomic ratio as the used target.

Production of Thin-Film Transistor

Next, a TFT (Thin-Film Transistor) having an oxide thin-film was prepared and performance of the produced TFT was measured and evaluated. Specific procedures are as follows.

(1) Film-Formation Step

A 50-nm thin film (oxide semiconductor layer) was formed on a silicon wafer (gate electrode) coated with a thermally oxidized film (gate insulating film) via a metal mask through a sputtering process using a sputtering target produced from the sintered oxide prepared in Examples 1 to 5 and Comparatives 1 and 2. Sputtering gas in a form of mixture gas of high-purity argon and 1 volume % high-purity oxygen was used for the sputtering.

(2) Formation of Source/Drain Electrodes

Source/drain electrodes made of titanium metal were formed on the oxide semiconductor layer through sputtering using a metal mask. Then, the resultant layered body was subjected to a heat treatment at 350 degrees C. for 30 minutes. TFT performance of the produced TFT (Thin-Film Transistor) was evaluated. Specific evaluation items and conditions are as follows.

Saturation Mobility ($cm^2/V \cdot sec$)

The saturation mobility was determined based on a transfer function when 5 V drain voltage was applied. Specifically, the saturation mobility was calculated by: plotting a graph of a transfer function Id–Vg; calculating transconductance (Gm) for each Vg; and calculating the saturation mobility using a formula in a linear region. Gm is represented by $\partial(Id)/\partial(Vg)$, and the saturation mobility is defined by a maximum carrier mobility in a Vg range from −15 to 25 V. The saturation mobility herein is evaluated according to the above unless otherwise specified. In the above, Id represents a current between source and drain electrodes, and Vg represents a gate voltage when the voltage Vd is applied between the source and drain electrodes.

Threshold Voltage (Vth)

The threshold voltage (Vth) is defined as Vg at $Id=10^{-9}$ A based on the graph of the transfer function. The results are shown in Table 2.

Off Current Value and on/Off Ratio

The On/Off ratio is determined as a ratio [On/Off] of On current value (a value of Id when Vg=20 V) to Off current value (a value of Id when Vg=−10 V). The results are shown in Table 2.

The results are shown in "TFT" "film-formation+heat treatment (before $SiO_2$ film formation)" in Table 3.

(3) Formation of Protective Insulation Film

An $SiO_2$ film (protective insulation film; interlayer insulating film) was formed on the oxide semiconductor thin-film having been subjected to the heat treatment in the above (2) through CVD (Chemical Vapor Deposition) at a substrate temperature of 300 degrees C., which was subsequently subjected to a further heat treatment (subsequent annealing) at 350 degrees C. for an hour.

The performance of the TFT having been subjected to the heat treatment after forming the $SiO_2$ film was evaluated under the same conditions as in the "film-formation+heat treatment (before $SiO_2$ film formation)." The results are shown in "TFT" "$SiO_2$ film formation+heat treatment" in Table 3.

TABLE 3

| | | | Example 1-A | Example 1-B | Example 1-C | Example 1-D |
|---|---|---|---|---|---|---|
| | | Sample Name | Example 1-1 | Example 1-2 | Example 1-3 | Example 1-4 |
| | | Used target material | | | | |
| Production conditions | Film-formation conditions | Atmosphere gas | Ar + $O_2$ | Ar + $O_2$ | Ar + $O_2$ | Ar + $O_2$ |
| | | Back pressure before film-formation (Pa) | $5.04 \times 10^{-4}$ | $5.04 \times 10^{-4}$ | $5.04 \times 10^{-4}$ | $5.04 \times 10^{-4}$ |
| | | Sputtering pressure at film-formation (Pa) | 0.5 | 0.5 | 0.5 | 0.5 |
| | | Substrate temperature at film-formation (° C.) | Room temp. | Room temp. | Room temp. | Room temp. |
| | | Oxygen partial pressure at film-formation (%) | 1 | 1 | 5 | 5 |
| | Heat-treatment conditions after film-formation | Heat treatment after film-formation: temp. (° C.) | 350 | 350 | 350 | 350 |
| | | :temperature increase rate (°C./min.) | 10 | 10 | 10 | 10 |
| | | :time (min.) | 30 | 30 | 30 | 30 |
| | | :atmosphere | Atmos. air | Atmos. air | Atmos. air | Atmos. air |
| Thin-film | Film-formation + heat treatment (before $SiO_2$ film formation) | Film thickness (nm) | 50 | 50 | 50 | 50 |
| | | Hall measurement carrier density ($cm^{-3}$) | $3.16 \times 10^{17}$ | $4.26 \times 10^{17}$ | $2.32 \times 10^{17}$ | $5.24 \times 10^{15}$ |
| | | Hall measuement carrier mobility ($cm^2/V \cdot sec$) | 7.37 | 6.1 | 5.1 | 5.1 |
| | | Crystallinity immediately after film deposition (XRD) | Amorphous | Amorphous | Amorphous | Amorphous |
| | | Crystallinity immediately after heating (XRD) | crystalline | crystalline | crystalline | crystalline |
| | | Lattice constant of $In_2O_3$ crystal ($10^{-10}$ m) | 10.03802 | 10.0391 | 10.03721 | 10.03789 |
| | | Band gap of semiconductor film (eV) | 3.55 | 3.70 | 3.65 | 3.71 |
| | immediately after $SiO_2$ film formation | Hall measurement carrier density ($cm^{-3}$) | $3.42 \times 10^{19}$ | $1.06 \times 10^{20}$ | $4.17 \times 10^{19}$ | $1.74 \times 10^{19}$ |
| | | Hall measuement carrier mobility ($cm^2/V \cdot sec$) | 54.7 | 64.5 | 62.7 | 57.2 |

TABLE 3-continued

|  |  |  |  |  |  |  |
|---|---|---|---|---|---|---|
|  | $SiO_2$ film formation + heat treatment | Heat treatment: temp. (° C.) :time (min.) :atmosphere Hall measurement carrier density ($cm^{-3}$) Hall measuement carrier mobility ($cm^2/V \cdot sec$) | 350 60 Atmos. air $9.97 \times 10^{18}$ 63.5 | 350 60 Atmos. air $4.74 \times 10^{18}$ 56.9 | 350 60 Atmos. air $7.45 \times 10^{18}$ 84.9 | 350 60 Atmos. air $4.10 \times 10^{15}$ 18.6 |
| TFT | Film-formation + heat treatment (before $SiO_2$ film formation) | Saturation mobility ($cm^2/V \cdot sec$) Vth(V) On/Off ratio (—) Off current (A) | 25.1 0.1 $>10^8$ $<10^{-11}$ | 21.4 −0.2 $>10^8$ $<10^{-11}$ | 42.2 −0.4 $>10^9$ $<10^{-12}$ | 37.6 −0.3 $>10^9$ $<10^{-12}$ |
|  | $SiO_2$ film formation + heat treatment | Saturation mobility ($cm^2/V \cdot sec$) Vth(V) On/Off ratio (—) Off current (A) | 62.1 −1.2 $>10^8$ $<10^{-12}$ | 58.1 −0.6 $>10^8$ $<10^{-12}$ | 56.1 −1.2 $>10^8$ $<10^{-11}$ | 34.4 −0.8 $>10^8$ $<10^{-11}$ |

|  |  |  |  | Example 1-E | Comparative 1-A | Comparative 1-B |
|---|---|---|---|---|---|---|
|  |  | Sample Name Used target material |  | Example 1-5 | Comparative 1-1 | Comparative 1-2 |
| Production conditions | Film-formation | Atmosphere gas Back pressure before film-formation (Pa) Sputtering pressure at film-formation (Pa) Substrate temperature at film-formation (° C.) Oxygen partial pressure at film-formation (%) |  | Ar + $O_2$ $5.04 \times 10^{-4}$ 0.5 Room temp. 5 | Ar + $O_2$ $5.04 \times 10^{-4}$ 0.5 Room temp. 1 | Ar + $O_2$ $5.04 \times 10^{-4}$ 0.5 Room temp. 20 |
|  | Heat-treatment conditions after film-formation | Heat treatment after film-formation: temp. (° C.) :temperature increase rate (°C./min.) :time (min.) :atmosphere |  | 350 10 30 Atmos. air | 350 10 30 Atmos. air | 350 10 30 Atmos. air |
| Thin-film | Film-formation + heat treatment (before $SiO_2$ film formation) | Film thickness (nm) Hall measurement carrier density ($cm^{-3}$) Hall measuement carrier mobility ($cm^2/V \cdot sec$) Crystallinity immediately after film deposition (XRD) Crystallinity immediately after heating (XRD) Lattice constant of $In_2O_3$ crystal ($10^{-10}$ m) Band gap of semiconductor film (eV) |  | 50 $3.77 \times 10^{17}$ 9.3 Amorphous crystalline 10.0390 3.63 | 50 $1.09 \times 10^{18}$ 18.3 Amorphous Amorphous — 3.20 | 50 $8.64 \times 10^{15}$ 3.3 Amorphous crystalline 10.08308 3.50 |
|  | immediately after $SiO_2$ film formation | Hall measurement carrier density ($cm^{-3}$) Hall measuement carrier mobility ($cm^2/V \cdot sec$) |  | $1.44 \times 10^{19}$ 32.4 | $4.86 \times 10^{19}$ 33.2 | $4.06 \times 10^{19}$ 44.3 |
|  | $SiO_2$ film formation + heat treatment | Heat treatment: temp. (° C.) :time (min.) :atmosphere Hall measurement carrier density ($cm^{-3}$) Hall measuement carrier mobility ($cm^2/V \cdot sec$) |  | 350 60 Atmos. air $5.33 \times 10^{18}$ 13.3 | 350 60 Atmos. air $1.27 \times 10^{19}$ 28.8 | 350 60 Atmos. air $7.12 \times 10^{18}$ 25.7 |
| TFT | Film-formation + heat treatment (before $SiO_2$ film formation) | Saturation mobility ($cm^2/V \cdot sec$) Vth(V) On/Off ratio (—) Off current (A) |  | 39.8 −0.7 $>10^8$ $<10^{-11}$ | 16.2 −0.4 $>10^7$ $<10^{-11}$ | 8.6 −2.4 $>10^7$ $<10^{-11}$ |
|  | $SiO_2$ film formation + heat treatment | Saturation mobility ($cm^2/V \cdot sec$) Vth(V) On/Off ratio (—) Off current (A) |  | 41.1 −2.1 $>10^8$ $<10^{-11}$ | conductive — — — | conductive — — — |

As shown in Table 3, the carrier mobility in TFT in Examples 1-A to 1-E exceeded 20 $cm^2/V \cdot sec$ even after the $SiO_2$ film was formed through CVD and the film was further heated.

In contrast, the thin film in TFT in Comparatives 1-A and 1-B became conductive after the $SiO_2$ film was formed through CVD and the film was further heated, failing to exhibit transistor performance.

Example 2

Preparation of Sintered Oxide

Oxide powders were weighed in an atomic ratio as shown in Tables 4 to 8, which were put in a polyethylene pot and mixed/pulverized using a dry ball mill for 72 hours to prepare a mixture powder.

The mixture powder was put in a die and pressed at a pressure of 78.4 MPa (in terms of the SI unit equivalent to 800 kg/cm$^2$) to prepare a press molding body. The molding body was compacted through CIP at a pressure of 98 MPa (in terms of the SI unit equivalent to 1,000 kg/cm$^2$). Subsequently, after the molding body was put into an atmospheric-pressure sintering furnace and was held at 350 degrees C. for three hours, the temperature inside the furnace was raised at a temperature increase rate of 50 degrees C./hr., and the molding body was kept at 1450 degrees C. or 1480 degrees C. for 36 hours. Then, the molding body was left still to be cooled to obtain a sintered oxide.

Measurement of Impurity Concentration (H, C, N, F, Si, Cl)

The impurity concentration (H, C, N, F, Si, Cl) in the resultant sintered oxide was determined through sector-dynamic SIMS (Secondary Ion Mass Spectrometer) (IMS 7f-Auto, manufactured by AMETEK CAMECA GmbH).

Specifically, primary ion Cs$^+$ was initially used to sputter the measurement target to a 20 μm depth from the surface of the sintered oxide at an acceleration voltage of 14.5 kV. Subsequently, while sputtering raster 100 μm$^2$ and measurement area 30 μm$^2$ for a 1 μm depth with primary ions, mass spectrum intensity of the impurities (H, C, N, F, Si, Cl) was integrated.

Further, in order to calculate an absolute value of the impurity concentration from the mass spectrum, each component of the impurities was ion-injected into the sintered oxide while controlling dose amount to prepare a standard sample with known impurity concentrations. With the use of the standard sample, mass spectrum intensities of the impurities (H, C, N, F, Si, Cl) through SIMS analysis were obtained to prepare analytical curves showing a relationship between the absolute values of the impurity concentrations and the mass spectrum intensities.

Finally, with the use of the mass spectrum intensity of the sintered oxide of the measurement target and the analytical curves, the impurity concentration of the measurement target was calculated, which was defined as the absolute value (atom·cm$^{-3}$) of the impurity concentration.

Measurement of Impurity Concentration (B, Na)

The impurity concentration (B, Na) in the resultant sintered oxide was also determined through SIMS analysis (IMS 7f-Auto, manufactured by AMETEK CAMECA GmbH). The absolute value (atom·cm$^{-3}$) of the impurity concentration in the measurement target was obtained in the same manner as in the measurement of H, C, N, F, Si, and Cl except that the primary ion was O$_2{}^+$, the acceleration voltage of the primary ion was set at 5.5 kV, and the mass spectrum of each of the impurities was measured.

Evaluation of Sintered Oxide

The crystalline phase, relative density, and bulk resistivity of the resultant oxides were determined through XRD under the same conditions as in Example 1.

Further, the resultant oxide was shaped into a target, which was subjected to a film-formation durability evaluation test under the conditions below.

Film-Formation Durability Evaluation Test

Initially, the sintered oxide was ground and polished into a sputtering target of 4-inch diameter×5-mm thick, which was bonded to a copper backing plate with indium brazing.

Subsequently, the backing plate was attached to a DC magnetron sputtering machine and subjected to DC sputtering at 400 W continuously for five hours. The conditions on the surface of the target after the DC sputtering (specifically, the presence/absence of cracks and black foreign body) was visually checked.

The results are shown in Tables 4 to 8. The XRD charts of Examples 2-1 to 2-12 are shown in FIGS. 30 to 41. Examples 2-1 to 2-3 and 2-5 to 2-12 show results of samples corresponding to the second exemplary embodiment. Examples 2-4, 2-4-1 to 2-4-3, and Comparative 2-4-4 show results of samples corresponding to the third exemplary embodiment.

TABLE 4

| | Sample No. | Example 2-1 | Example 2-2 | Example 2-3 |
|---|---|---|---|---|
| mass % | In/(In + Ga + Sn + Al + Y + Ln) | 88.0 | 84.0 | 87.0 |
| | Sn/(In + Ga + Sn + Al + Y + Ln) | 0.0 | 0.0 | 0.0 |
| | Ga/(In + Ga + Sn + Al + Y + Ln) | 5.0 | 6.0 | 5.0 |
| | Al/(In + Ga + Sn + Al + Y + Ln) | 0.0 | 2.0 | 1.0 |
| | Y/(In + Ga + Sn + Al + Y + Ln) | 0.0 | 0.0 | 0.0 |
| | Ln/(In + Ga + Sn + Al + Y + Ln) | 7.0 | 8.0 | 7.0 |
| | Ln element | Yb | Yb | Yb |
| Atomic ratio | In/(In + Ga + Sn + Al + Y + Ln) | 0.878 | 0.808 | 0.852 |
| | Sn/(In + Ga + Sn + Al + Y + Ln) | 0.000 | 0.000 | 0.000 |
| | Ga/(In + Ga + Sn + Al + Y + Ln) | 0.073 | 0.086 | 0.073 |
| | Al/(In + Ga + Sn + Al + Y + Ln) | 0.000 | 0.052 | 0.027 |
| | Y/(In + Ga + Sn + Al + Y + Ln) | 0.000 | 0.000 | 0.000 |
| | Ln/(In + Ga + Sn + Al + Y + Ln) | 0.049 | 0.054 | 0.048 |
| | (In + Sn + Ga)/((In + Sn + Ga) + (Al + Y + Ln)) | 0.951 | 0.894 | 0.925 |
| | (Al + Y + Ln)/((In + Sn + Ga) + (Al + Y + Ln)) | 0.049 | 0.106 | 0.075 |
| | (In)/(In + Sn + Ga) | 0.923 | 0.904 | 0.921 |
| | (Sn)/(In + Sn + Ga) | 0.000 | 0.000 | 0.000 |
| | (Ga)/(In + Sn + Ga) | 0.077 | 0.096 | 0.079 |
| Sintering temperature (° C.) | | 1480 | 1480 | 1480 |
| XRD chart (mass %) | | In$_2$O$_3$(≈100%) Yb$_3$Ga$_5$O$_{12}$ (trace) | In$_2$O$_3$ (72.7%) Yb$_3$(Ga$_{5-x}$Al$_x$)O$_{12}$ (27.3%) | In$_2$O$_3$(96.7%) Yb$_3$(Ga$_{5-x}$Al$_x$)O$_{12}$ (3.3%) |
| Lattice constant of In$_2$O$_3$ [10$^{-10}$ m] | | 10.10412 | 10.09562 | 10.09872 |
| Lattice constant of Yb$_3$(Ga$_{5-x}$ Al$_x$)O$_{12}$ (0 < x < 5) [10$^{-10}$ m] | | — | 12.06728 | 12.11255 |

TABLE 4-continued

| Sample No. | Example 2-1 | Example 2-2 | Example 2-3 |
|---|---|---|---|
| Relative density [%] | 96.9 | 98.1 | 97.7 |
| Bulk resistivity [mΩ · cm] | 5.6 | 21.5 | 4.2 |
| Impurity concentration  H [atom · cm$^{-3}$] | $2.5 \times 10^{17}$ | $1.7 \times 10^{17}$ | $3.2 \times 10^{17}$ |
| C [atom · cm$^{-3}$] | $2.4 \times 10^{17}$ | $3.3 \times 10^{17}$ | $1.2 \times 10^{17}$ |
| N [atom · cm$^{-3}$] | less than $1 \times 10^{16}$ | less than $1 \times 10^{16}$ | less than $1 \times 10^{16}$ |
| F [atom · cm$^{-3}$] | $2.8 \times 10^{16}$ | $1.1 \times 10^{16}$ | $4.0 \times 10^{16}$ |
| Si [atom · cm$^{-3}$] | $9.4 \times 10^{16}$ | $7.7 \times 10^{17}$ | $3.2 \times 10^{17}$ |
| Cl [atom · cm$^{-3}$] | $8.0 \times 10^{15}$ | $8.0 \times 10^{15}$ | $7.3 \times 10^{15}$ |
| B [atom · cm$^{-3}$] | $2.5 \times 10^{16}$ | $3.0 \times 10^{16}$ | $1.1 \times 10^{16}$ |
| Na [atom · cm$^{-3}$] | $5.3 \times 10^{18}$ | $2.9 \times 10^{18}$ | $9.0 \times 10^{18}$ |
| Condition of target after film formation at 400 W DC power for 5 hours | No significant change except for errosion | No significant change except for errosion | No significant change except for errosion |
| Remarks | Lattice constant of Yb$_3$Ga$_5$O$_{12}$: $12.2 \times 10^{-10}$ m [12-0768] Lattice constant of Yb$_3$Al$_5$O$_{12}$: $11.93 \times 10^{-10}$ m [23-1476] | | |

TABLE 5

| | Sample No. | Example 2-4 | Example 2-5 | Example 2-6 | Comparative 2-1 |
|---|---|---|---|---|---|
| mass % | In/(In + Ga + Sn + Al + Y + Ln) | 65.0 | 89.0 | 88.0 | 45.0 |
| | Sn/(In + Ga + Sn + Al + Y + Ln) | 20.0 | 0.0 | 0.0 | 36.0 |
| | Ga/(In + Ga + Sn + Al + Y + Ln) | 0.0 | 7.0 | 7.0 | 19.0 |
| | Al/(In + Ga + Sn + Al + Y + Ln) | 0.0 | 0.0 | 1.0 | 0.0 |
| | Y/(In + Ga + Sn + Al + Y + Ln) | 0.0 | 0.0 | 0.0 | 0.0 |
| | Ln/(In + Ga + Sn + Al + Y + Ln) | 15.0 | 4.0 | 4.0 | 0.0 |
| | Ln element | Yb | Yb | Yb | — |
| Atomic ratio | In/(In + Ga + Sn + Al + Y + Ln) | 0.692 | 0.870 | 0.847 | 0.423 |
| | Sn/(In + Ga + Sn + Al + Y + Ln) | 0.196 | 0.000 | 0.000 | 0.312 |
| | Ga/(In + Ga + Sn + Al + Y + Ln) | 0.000 | 0.102 | 0.100 | 0.265 |
| | Al/(In + Ga + Sn + Al + Y + Ln) | 0.000 | 0.000 | 0.026 | 0.000 |
| | Y/(In + Ga + Sn + Al + Y + Ln) | 0.000 | 0.000 | 0.000 | 0.000 |
| | Ln/(In + Ga + Sn + Al + Y + Ln) | 0.112 | 0.028 | 0.027 | 0.000 |
| | (In + Sn + Ga)/((In + Sn + Ga) + (Al + Y + Ln)) | 0.888 | 0.972 | 0.947 | 1.000 |
| | (Al + Y + Ln)/((In + Sn + Ga) + (Al + Y + Ln)) | 0.112 | 0.028 | 0.053 | 0.000 |
| | (In)/(In + Sn + Ga) | 0.779 | 0.895 | 0.894 | 0.423 |
| | (Sn)/(In + Sn + Ga) | 0.221 | 0.000 | 0.000 | 0.312 |
| | (Ga)/(In + Sn + Ga) | 0.000 | 0.105 | 0.106 | 0.265 |
| Sintering temperature (° C.) | | 1480 | 1480 | 1480 | 1480 |
| XRD chart (mass %) | | In$_2$O$_3$(54.3%) SnO$_2$(45.7%) | In$_2$O$_3$ (≈100%) Yb$_3$Ga$_5$O$_{12}$ (trace) | In$_2$O$_3$(≈100%) Yb$_3$(Ga$_{5-x}$Al$_x$)O$_{12}$ (trace) | Ga$_2$In$_6$Sn$_2$O$_{16}$ (≈100%) Ga$_3$InSn$_5$O$_{16}$ (trace) |
| Lattice constant of In$_2$O$_3$ [10$^{-10}$ m] | | 10.1533 | 10.0803 | 10.09439 | — |
| Lattice constant of Yb$_3$(Ga$_{5-x}$Al$_x$)O$_{12}$ (0 < x < 5) [10$^{-10}$ m] | | — | — | 12.04259 | — |
| Relative density [%] | | 89.8 | 96.0 | 97.1 | 98.3 |
| Bulk resistivity [mΩ · cm] | | 13.2 | 18.1 | 22.3 | 4.7 |
| Impurity concentration | H [atom · cm$^{-3}$] | $2.0 \times 10^{17}$ | $3.9 \times 10^{17}$ | $2.2 \times 10^{17}$ | $3.2 \times 10^{17}$ |
| | C [atom · cm$^{-3}$] | $1.1 \times 10^{17}$ | $4.2 \times 10^{17}$ | $1.8 \times 10^{17}$ | $3.8 \times 10^{17}$ |
| | N [atom · cm$^{-3}$] | less than $1 \times 10^{16}$ | less than $1 \times 10^{16}$ | less than $1 \times 10^{16}$ | $5.2 \times 10^{17}$ |
| | F [atom · cm$^{-3}$] | $3.9 \times 10^{16}$ | $9.6 \times 10^{15}$ | $1.1 \times 10^{16}$ | $4.0 \times 10^{16}$ |
| | Si [atom · cm$^{-3}$] | $7.2 \times 10^{17}$ | $3.8 \times 10^{17}$ | $4.8 \times 10^{17}$ | $3.2 \times 10^{17}$ |
| | Cl [atom · cm$^{-3}$] | $6.3 \times 10^{15}$ | $4.7 \times 10^{15}$ | $8.2 \times 10^{15}$ | $7.3 \times 10^{15}$ |
| | B [atom · cm$^{-3}$] | $2.2 \times 10^{16}$ | $2.8 \times 10^{16}$ | $3.2 \times 10^{16}$ | $2.2 \times 10^{16}$ |
| | Na [atom · cm$^{-3}$] | $6.2 \times 10^{18}$ | $3.3 \times 10^{18}$ | $4.9 \times 10^{18}$ | $4.0 \times 10^{18}$ |
| Condition of target after film formation at 400 W DC power for 5 hours | | No significant change except for errosion | No significant change except for errosion | No significant change except for errosion | cracked |
| Remarks | | Lattice constant of Yb$_3$Ga$_5$O$_{12}$: $12.2 \times 10^{-10}$ m [12-0768] Lattice constant of Yb$_3$Al$_5$O$_{12}$: $11.93 \times 10^{-10}$ m [23-1476] | | | |

TABLE 6

| | Sample No. | Example 2-7 | Example 2-8 | Example 2-9 |
|---|---|---|---|---|
| mass % | In/(In + Ga + Sn + Al + Y + Ln) | 86.0 | 85.0 | 86.0 |
| | Sn/(In + Ga + Sn + Al + Y + Ln) | 0.0 | 0.0 | 0.0 |

TABLE 6-continued

| | Sample No. | Example 2-7 | Example 2-8 | Example 2-9 |
|---|---|---|---|---|
| | Ga/(In + Ga + Sn + Al + Y + Ln) | 5.0 | 5.0 | 4.0 |
| | Al/(In + Ga + Sn + Al + Y + Ln) | 2.0 | 3.0 | 2.0 |
| | Y/(In + Ga + Sn + Al + Y + Ln) | 0.0 | 0.0 | 0.0 |
| | Ln/(In + Ga + Sn + Al + Y + Ln) | 7.0 | 7.0 | 8.0 |
| | Ln element | Yb | Yb | Yb |
| Atomic ratio | In/(In + Ga + Sn + Al + Y + Ln) | 0.829 | 0.806 | 0.835 |
| | Sn/(In + Ga + Sn + Al + Y + Ln) | 0.000 | 0.000 | 0.000 |
| | Ga/(In + Ga + Sn + Al + Y + Ln) | 0.071 | 0.070 | 0.057 |
| | Al/(In + Ga + Sn + Al + Y + Ln) | 0.052 | 0.077 | 0.053 |
| | Y/(In + Ga + Sn + Al + Y + Ln) | 0.000 | 0.000 | 0.000 |
| | Ln/(In + Ga + Sn + Al + Y + Ln) | 0.048 | 0.047 | 0.055 |
| | (In + Sn + Ga)/((In + Sn + Ga) + (Al + Y + Ln)) | 0.900 | 0.876 | 0.892 |
| | (Al + Y + Ln)/((In + Sn + Ga) + (Al + Y + Ln)) | 0.100 | 0.124 | 0.108 |
| | (In)/(In + Sn + Ga) | 0.921 | 0.920 | 0.936 |
| | (Sn)/(In + Sn + Ga) | 0.000 | 0.000 | 0.000 |
| | (Ga)/(In + Sn + Ga) | 0.079 | 0.080 | 0.064 |
| Sintering temperature (° C.) | | 1480 | 1480 | 1480 |
| XRD chart (mass %) | | $In_2O_3$(95.5%) $Yb_3(Ga_{5-x}Al_x)O_{12}$ (4.5%) | $In_2O_3$(89.8%) $Yb_3(Ga_{5-x}Al_x)O_{12}$ (10.2%) | $In_2O_3$(90.9%) $Yb_3(Ga_{5-x}Al_x)O_{12}$ (9.1%) |
| Lattice constant of $In_2O_3$ [$10^{-10}$ m] | | 10.09882 | 10.10371 | 10.10577 |
| Lattice constant of $Yb_3(Ga_{5-x}Al_x)O_{12}$ (0 < x < 5) [$10^{-10}$ m] | | 12.05113 | 12.0209 | 12.05802 |
| Relative density [%] | | 98.3 | 98.3 | 98.7 |
| Bulk resistivity [mΩ · cm] | | 3.4 | 3.5 | 17.4 |
| Impurity concentration | H [atom · cm$^{-3}$] | $3.3 \times 10^{17}$ | $2.8 \times 10^{17}$ | $2.6 \times 10^{17}$ |
| | C [atom · cm$^{-3}$] | $1.0 \times 10^{17}$ | $1.8 \times 10^{17}$ | $4.0 \times 10^{17}$ |
| | N [atom · cm$^{-3}$] | less than $1 \times 10^{16}$ | less than $1 \times 10^{16}$ | less than $1 \times 10^{16}$ |
| | F [atom · cm$^{-3}$] | $3.7 \times 10^{16}$ | $3.2 \times 10^{16}$ | $6.1 \times 10^{16}$ |
| | Si [atom · cm$^{-3}$] | $1.0 \times 10^{17}$ | $1.8 \times 10^{17}$ | $2.9 \times 10^{17}$ |
| | Cl [atom · cm$^{-3}$] | $9.2 \times 10^{15}$ | $6.2 \times 10^{15}$ | $7.4 \times 10^{15}$ |
| | B [atom · cm$^{-3}$] | $1.3 \times 10^{16}$ | $4.2 \times 10^{16}$ | $2.9 \times 10^{16}$ |
| | Na [atom · cm$^{-3}$] | $6.2 \times 10^{18}$ | $4.1 \times 10^{18}$ | $7.4 \times 10^{18}$ |
| Condition of target after film formation at 400 W DC power for 5 hours | | No significant change except for errosion | No significant change except for errosion | No significant change except for errosion |
| Remarks | | Lattice constant of $Yb_3Ga_5O_{12}$: $12.2 \times 10^{-10}$ m [12-0768] Lattice constant of $Yb_3Al_5O_{12}$: $11.93 \times 10^{-10}$ m [23-1476] | | |

TABLE 7

| | Sample No. | Example 2-10 | Example 2-11 | Example 2-12 |
|---|---|---|---|---|
| mass % | In/(In + Ga + Sn + Al + Y + Ln) | 86.0 | 88.0 | 85.9 |
| | Sn/(In + Ga + Sn + Al + Y + Ln) | 0.0 | 0.0 | 0.1 |
| | Ga/(In + Ga + Sn + Al + Y + Ln) | 6.0 | 4.0 | 5.0 |
| | Al/(In + Ga + Sn + Al + Y + Ln) | 2.0 | 2.0 | 2.0 |
| | Y/(In + Ga + Sn + Al + Y + Ln) | 0.0 | 0.0 | 0.0 |
| | Ln/(In + Ga + Sn + Al + Y + Ln) | 6.0 | 6.0 | 7.0 |
| | Ln element | Yb | Yb | Yb |
| Atomic ratio | In/(In + Ga + Sn + Al + Y + Ln) | 0.823 | 0.849 | 0.82774 |
| | Sn/(In + Ga + Sn + Al + Y + Ln) | 0.000 | 0.000 | 0.00089 |
| | Ga/(In + Ga + Sn + Al + Y + Ln) | 0.085 | 0.057 | 0.07137 |
| | Al/(In + Ga + Sn + Al + Y + Ln) | 0.052 | 0.053 | 0.05247 |
| | Y/(In + Ga + Sn + Al + Y + Ln) | 0.000 | 0.000 | 0.00000 |
| | Ln/(In + Ga + Sn + Al + Y + Ln) | 0.040 | 0.041 | 0.04753 |
| | (In + Sn + Ga)/((In + Sn + Ga) + (Al + Y + Ln)) | 0.908 | 0.906 | 0.900 |
| | (Al + Y + Ln)/((In + Sn + Ga) + (Al + Y + Ln)) | 0.092 | 0.094 | 0.100 |
| | (In)/(In + Sn + Ga) | 0.906 | 0.937 | 0.920 |
| | (Sn)/(In + Sn + Ga) | 0.000 | 0.000 | 0.001 |
| | (Ga)/(In + Sn + Ga) | 0.094 | 0.063 | 0.079 |
| Sintering temperature (° C.) | | 1480 | 1480 | 1480 |
| XRD chart (mass %) | | $In_2O_3$(85.3%) $Yb_3(Ga_{5-x}Al_x)O_{12}$ (14.7%) | $In_2O_3$(84.5%) $Yb_3(Ga_{5-x}Al_x)O_{12}$ (15.5%) | $In_2O_3$(80.7%) $Yb_3(Ga_{5-x}Al_x)O_{12}$ (19.3%) |
| Lattice constant of $In_2O_3$ [$10^{-10}$ m] | | 10.10018 | 10.10468 | 10.09798 |
| Lattice constant of $Yb_3(Ga_{5-x}Al_x)O_{12}$ (0 < x < 5) [$10^{-10}$ m] | | 12.06131 | 12.03006 | 12.05089 |
| Relative density [%] | | 98.1 | 98.7 | 97.8 |
| Bulk resistivity [mΩ · cm] | | 18.1 | 17.6 | 4.8 |
| Impurity concentration | H [atom · cm$^{-3}$] | $1.1 \times 10^{17}$ | $1.9 \times 10^{17}$ | $1.3 \times 10^{17}$ |
| | C [atom · cm$^{-3}$] | $3.2 \times 10^{17}$ | $1.9 \times 10^{17}$ | $3.1 \times 10^{17}$ |
| | N [atom · cm$^{-3}$] | less than $1 \times 10^{16}$ | less than $1 \times 10^{16}$ | less than $1 \times 10^{16}$ |
| | F [atom · cm$^{-3}$] | $1.7 \times 10^{16}$ | $3.2 \times 10^{16}$ | $3.0 \times 10^{16}$ |

TABLE 7-continued

| Sample No. | Example 2-10 | Example 2-11 | Example 2-12 |
|---|---|---|---|
| Si [atom · cm$^{-3}$] | $3.7 \times 10^{17}$ | $2.9 \times 10^{17}$ | $2.9 \times 10^{17}$ |
| Cl [atom · cm$^{-3}$] | $2.3 \times 10^{15}$ | $2.9 \times 10^{15}$ | $6.0 \times 10^{15}$ |
| B [atom · cm$^{-3}$] | $1.0 \times 10^{16}$ | $1.0 \times 10^{16}$ | $4.2 \times 10^{16}$ |
| Na [atom · cm$^{-3}$] | $6.9 \times 10^{18}$ | $8.2 \times 10^{18}$ | $8.8 \times 10^{18}$ |
| Condition of target after film formation at 400 W DC power for 5 hours | No significant change except for errosion | No significant change except for errosion | No significant change except for errosion |
| Remarks | | Lattice constant of Yb$_3$Ga$_5$O$_{12}$: $12.2 \times 10^{-10}$ m [12-0768] | |
| | | Lattice constant of Yb$_3$Al$_5$O$_{12}$: $11.93 \times 10^{-10}$ m [23-1476] | |

TABLE 8

| | Sample No. | Example 2-4 | Example 2-4-1 | Example 2-4-2 | Example 2-4-3 | Comparative 2-4-4 |
|---|---|---|---|---|---|---|
| mass % | In/(In + Ga + Sn + Al + Y + Ln) | 65.0 | 80.0 | 70.0 | 75.0 | 50.0 |
| | Sn/(In + Ga + Sn + Al + Y + Ln) | 20.0 | 10.0 | 20.0 | 10.0 | 30.0 |
| | Ga/(In + Ga + Sn + Al + Y + Ln) | 0.0 | 0.0 | 0.0 | 0.0 | 0.0 |
| | Al(In + Ga + Sn + Al + Y + Ln) | 0.0 | 0.0 | 0.0 | 0.0 | 0.0 |
| | Y/(In + Ga + Sn + Al + Y + Ln) | 0.0 | 0.0 | 0.0 | 0.0 | 0.0 |
| | Ln/(In + Ga + Sn + Al + Y + Ln) | 15.0 | 10.0 | 10.0 | 15.0 | 20.0 |
| | Ln element | Yb | Yb | Yb | Yb | Yb |
| Atomic ratio | In/(In + Ga + Sn + Al + Y + Ln) | 0.692 | 0.831 | 0.733 | 0.791 | 0.545 |
| | Sn/(In + Ga + Sn + Al + Y + Ln) | 0.196 | 0.096 | 0.193 | 0.097 | 0.301 |
| | Ga/(In + Ga + Sn + Al + Y + Ln) | 0.000 | 0.000 | 0.000 | 0.000 | 0.000 |
| | Al/(In + Ga + Sn + Al + Y + Ln) | 0.000 | 0.000 | 0.000 | 0.000 | 0.000 |
| | Y/(In + Ga + Sn + Al + Y + Ln) | 0.000 | 0.000 | 0.000 | 0.000 | 0.000 |
| | Ln/(In + Ga + Sn + Al + Y + Ln) | 0.112 | 0.073 | 0.074 | 0.112 | 0.154 |
| | (In + Sn + Ga)/((In + Sn + Ga) + (Al + Y + Ln)) | 0.888 | 0.927 | 0.926 | 0.888 | 0.846 |
| | (Al + Y + Ln)/((In + Sn + Ga) + (Al + Y + Ln)) | 0.112 | 0.073 | 0.074 | 0.112 | 0.154 |
| | (In)/(In + Sn + Ga) | 0.779 | 0.896 | 0.792 | 0.891 | 0.644 |
| | (Sn)/(In + Sn + Ga) | 0.221 | 0.104 | 0.208 | 0.109 | 0.356 |
| | (Ga)/(In + Sn + Ga) | 0.000 | 0.000 | 0.000 | 0.000 | 0.000 |
| Sintering temperature (° C.) | | 1480 | 1450 | 1450 | 1450 | 1450 |
| XRD chart (mass %) | | In$_2$O$_3$(54.3%) SnO$_2$(45.7%) | In$_2$O$_3$(87.1%) SnO$_2$(12.9%) | In$_2$O$_3$(62.3%) SnO$_2$(37.7%) | In$_2$O$_3$(87.3%) SnO$_2$(12.7%) | In$_2$O$_3$(25.7%) SnO$_2$(74.3%) |
| Lattice constant of In$_2$O$_3$ [10$^{-10}$ m] | | 10.1533 | 10.14629 | 10.13728 | 10.15293 | 10.14279 |
| Lattice constant of SnO$_2$ [10$^{-10}$ m] | | 5.12817 | 5.12359 | 5.11289 | 5.13897 | 5.11955 |
| Lattice constant of Yb$_3$(Ga$_{5-x}$Al$_x$)O$_{12}$ (0 < x < 5) [10$^{-10}$ m] | | — | — | — | — | — |
| Relative density [%] | | 89.8 | 94.2 | 88.3 | 93.6 | 86.8 |
| Bulk resistivity [mΩ · cm] | | 13.2 | 5.56 | 6.21 | 7.64 | 52.8 |
| Condition of target after film formation at 400 W DC power for 5 hours | | No significant change except for errosion | — | — | — | — |
| Remarks | | | Lattice constant of Yb$_3$Ga$_5$O$_{12}$: $12.2 \times 10^{-10}$ m [12-0768] | | | |
| | | | Lattice constant of Yb$_3$Al$_5$O$_{12}$: $11.93 \times 10^{-10}$ m [23-1476] | | | |

\* No film durability evaluation test conducted for Examples 2-4-1 to 2-4-3 and Comparative 2-4-4

Examples, which satisfied at least one of the requirements of the second exemplary embodiment, exhibited no abnormality in the target after sputtering.

Comparative, which satisfied none of the requirements of the second exemplary embodiment, caused cracks in the target after sputtering.

Garnet compound was generated in Examples other than Examples 2-4, 2-4-1 to 2-4-3, and Comparative 2-4-4. It is believed cracks were restrained because of the garnet compound.

Garnet compound was not generated in Examples 2-4, 2-4-1 to 2-4-3, and Comparative 2-4-4, where Bixbyite crystalline phase and tin oxide crystalline phase were only generated. Neither compound containing Ln element (ytterbium element in this Example) nor compound containing both of In element and Sn element was generated and no cracks caused. It is believed that this is because of the following reasons.

It is known that tin element is dissolved in indium oxide to form a solid solution. However, when ytterbium oxide is added, ytterbium element is dissolved into indium oxide to form a solid solution, and tin element cannot be dissolved. Thus, it is believed that neither compound containing Ln element nor compound containing both of In element and Sn element was generated.

The formation of the solid solution of ytterbium element in the indium oxide can be inferred from the lattice constant of the indium oxide, which is larger than the lattice constant of pure indium oxide. Meanwhile, since the content of tin oxide is larger than the starting composition, it is also inferred that indium element and/or ytterbium element are dissolved into cubic crystal phase to form a solid solution. The lattice constant of the tin oxide was $5.12817 \times 10^{-10}$ m.

Example 3

Strength Test of Sintered Oxide and Target

Initially, a sintered oxide satisfying the requirements of the fourth exemplary embodiment was prepared and processed into a target according to procedures below.

Initially, samples of compositions containing indium element, tin element, element, samarium element, yttrium element, ytterbium element, and aluminum element were prepared as Examples 3-1 to 3-27. Further, samples containing none of samarium element, yttrium element, ytterbium element, and aluminum were prepared as Comparatives 3-1, 3-2. It should be noted that Examples 3-16, 3-17, and 3-21 to 3-24, and Comparative 3-1 had the same compositions as Examples 2-1 to 2-6, and Comparative 2-1 in Example 2, respectively.

Oxide powders of 99.99 mass % purity with the following compositions were used for each of the elements.
Indium: $In_2O_3$
Tin: $SnO_2$
Gallium: $Ga_2O_3$
Samarium: $Sm_2O_3$
Yttrium: $Y_2O_3$
Ytterbium: $Yb_2O_3$
Aluminum $Al_2O_3$ Subsequently, material powders, which were weighed and were put in a polyethylene pot, were mixed/pulverized using a dry ball mill for 72 hours to prepare a mixture powder.

The mixture powder was put in a die and pressed at a pressure of 49 MPa (in terms of the SI unit equivalent to 500 kg/cm²) to prepare a press molding body. The molding body was compacted through CIP at a pressure of 196 MPa (in terms of the SI unit equivalent to 2000 kg/cm²). Subsequently, after the molding body was placed in an atmospheric-pressure sintering furnace and was held in the atmospheric air at 350 degrees C. for three hours, the temperature inside the furnace was raised at a temperature increase rate of 100 degrees C./hr., and the molding body was kept at 1480 degrees C. for 42 hours. Then, the molding body was left still to be cooled to obtain a sintered oxide.

Properties of an oxide semiconductor thin-film produced from the resultant sintered oxide under the conditions below were evaluated according to procedures detailed below.

(1) Film-Formation Step

The resultant sintered oxide was ground and polished to prepare a sputtering target of 4-inch diameter×5 mm-thick. A sample, on which a 50-nm-thick oxide semiconductor thin-film 83 was solely formed on a glass substrate 81 (ABC-G manufactured by Nippon Electric Glass Co., Ltd.) through pulse DC sputtering as shown in FIG. 28, was produced with the use of the prepared sputtering target.

The film-formation conditions are as shown in Tables 1 to 5.

(2) Heat Treatment Step

Subsequently, the resultant sample was subjected to a heat treatment under the conditions shown in Tables 1 to 5.

Then, the produced oxide semiconductor thin-film was evaluated with respect to the items below.

Measurement of Hall Effect:

Initially, a one centimeter square sample piece (in a plan view) was cut out from the sample made of the glass substrate 81 and the oxide semiconductor thin-film 83. Then, gold (Au) was coated on four corners of the cut sample piece at a size of approximately 2 mm×2 mm or less through a metal mask using an ion coater. Subsequently, indium solder was put on the Au metal spots for enhanced contact to prepare a Hall-effect measurement sample.

The Hall-effect measurement sample was set to a Hall-effect/specific resistance measurement system (ResiTest 8300, manufactured by TOYO Corporation) to evaluate the Hall effect and determine the carrier density and carrier mobility at a room temperature.

Further, the oxide semiconductor thin-film of the obtained sample was analyzed using an ICP-AES (Inductively Coupled Plasma-Atomic Emission Spectrometer, manufactured by Shimadzu Corporation). As a result, it was found that the atomic composition ratio of the obtained oxide semiconductor thin-film was the same as the atomic composition ratio of the sintered oxide used for preparing the oxide semiconductor thin-film.

Crystal Properties of Oxide Semiconductor Thin-Film

On the sample consisting of the glass substrate 81 and the oxide semiconductor thin-film 83, crystallinity of a non-heated film after sputtering (immediately after film-formation) and crystallinity of the film after being further heated after the film-formation were evaluated through XRD (X-Ray Diffraction) measurement.

Whether the film was "amorphous" was determined based on presence/absence of a peak(s) at an angle 2θ ranging from 30 degrees to 40 degrees in XRD.

Whether the crystal geometry on the surface of the film was facet was determined through EBSD.

Identification of Crystal Structure

XRD charts of the films determined to be crystalline through XRD obtained under the conditions below were analyzed using JADE6 to identify the crystalline phases in the sintered oxide and plane indices of the peaks.

Machine: Smartlab (manufactured by Rigaku Corporation)
X-ray: Cu—K α ray (wavelength $1.5418×10^{-10}$ m)
2θ-θ Reflection method, Continuous Scan (2.0 degrees/min.)
Sampling interval: 0.02 degrees
Slit DS (Divergence Slit), SS (Scattering Slit), RS (Receiving Slit): 1 mm Determination of Film Density Film density was measured in Examples 3-28 to 3-32 and Comparative 3-3 shown in Table 14 according to the following procedure.

Initially, after the sample consisting of the glass substrate 81 and the oxide thin-film 83 was annealed at 350 degrees C. for an hour in the atmospheric air, reflectivity of the sample was measured under the conditions below using XRR (X-ray Reflectometer).

Film density was calculated through fitting of the obtained spectrum with film thickness and density being used as parameters. The reflectivity was measured using a full-automatic horizontal multi-purpose X-ray diffractometer SmartLab manufactured by Rigaku Corporation with Cu-Kα1 ray (wavelength $1.5406×10^{-10}$ m, turned into monochrome by a graphite monochrometer) under measurement conditions of 2θ reflectivity measurement, in a measurement range of 2θ=0 to 8 degrees, at a sampling interval: 0.01 degrees.

Production of Thin-Film Transistor

Further, a thin-film transistor was produced using the oxide semiconductor thin-film according to the procedures below.

The thin-film transistor was configured in the same manner as the transfer transistor 1 shown in FIG. 20 except that the gate electrode was not formed.

(1) Film-Formation Step

The oxide semiconductor thin-film 2 was formed through a metal mask on the monocrystalline silicon substrate 200 (also serving as a gate electrode) with the gate insulating film 32 formed thereon. The other conditions were the same as the conditions when the oxide semiconductor thin-film 83 was formed on the glass substrate 81 ("(1) Film-Formation Conditions" of the semiconductor thin-film).

(2) Formation of Source/Drain Electrodes

Next, the source electrode 3 and drain electrode 4 each in a form of 50-nm-thick titanium film were formed through sputtering of titanium metal using a metal mask with a shape corresponding to contact holes. The obtained laminate was subjected to a heat treatment in an atmospheric air to prepare a thin-film transistor. The conditions for the heat treatment were the same as the conditions when the oxide semiconductor thin-film 83 was formed on the glass substrate 81.

Evaluation of Thin-Film Transistor

The saturation mobility and threshold voltage of the thin-film transistor after being subjected to the heat treatment were measured. The saturation mobility and threshold voltage were measured with a measurement probe being in contact with the titanium film.

Saturation Mobility

The saturation mobility was determined based on a transfer function when the drain voltage was set at 20 V. Specifically, the saturation mobility was calculated by: plotting a graph of a transfer function Id-Vg; calculating transconductance (Gm) for each Vg; and calculating the saturation mobility using a formula in a saturated region. It should be noted that Gm is represented by $\partial(Id)/\partial(Vg)$, and the saturation mobility is defined by a maximum carrier mobility in a Vg range from −15 to 25 V. The saturation mobility herein is evaluated according to the above unless otherwise specified. In the above, Id represents a current between source and drain electrodes, and Vg represents a gate voltage when the voltage Vd is applied between the source and drain electrodes.

Threshold Voltage (Vth)

The threshold voltage (Vth) is defined as Vg at $Id=10^{-9}$ A based on the graph of the transfer function.

On-Off Ratio, Off Current

The On/Off ratio is determined as a ratio [On/Off] of On current value (a value of Id when Vg=20 V) to Off current value (a value of Id when Vg=−10 V).

PBTS, NBTS

PBTS and NBTS (reliability) were calculated in Examples 3-28 to 3-32 and Comparative 3-3 shown in Table 14.

The PBTS and NBTS (reliability) were calculated based on the transfer function when the thin-film transistor was applied with Vg=20V, 20V, respectively, for 3600 seconds. Specifically, a difference between threshold voltages in the transfer function after 0 second and 3600 seconds was defined as ΔVth.

Identification of Crystal Structure in Oxide Semiconductor Area in Thin-Film Transistor Further, crystallinity of the oxide semiconductor area of the obtained TFT was evaluated using a transmission electron microscope ("HF-2000" manufactured by Hitachi High-Technologies Corporation). Specifically, a thin piece of the oxide semiconductor was prepared through ion milling. An electronic diffraction pattern on a 10 nm area of the thin piece was measured at an acceleration voltage of 200 kV using a transmission electron microscope to determine the space group of the crystals and plane indices of the diffraction pattern.

The results are shown in Tables 9 to 14.

TABLE 9

| | Sample name | Example 3-1 | Example 3-2 | Example 3-3 |
|---|---|---|---|---|
| Composition | Ln element | Sm | Sm | — |
| | In/(In + Ga + Sn + Al + Y + Ln) | 0.919 | 0.798 | 0.790 |
| | Sn/(In + Ga + Sn + Al + Y + Ln) | 0.000 | 0.000 | 0.005 |
| | Ga/(In + Ga + Sn + Al + Y + Ln) | 0.000 | 0.000 | 0.112 |
| | Al/(In + Ga + Sn + Al + Y + Ln) | 0.000 | 0.128 | 0.000 |
| | Y/(In + Ga + Sn + Al + Y + Ln) | 0.000 | 0.000 | 0.093 |
| | Ln(In + Ga + Sn + Al + Y + Ln) | 0.081 | 0.074 | 0.000 |
| | (In + Sn + Ga)/((In + Sn + Ga) + (Al + Y + Ln)) | 0.919 | 0.798 | 0.907 |
| | (Al + Y + Ln)/((In + Sn + Ga) + (Al + Y + Ln)) | 0.081 | 0.202 | 0.093 |
| | (In)/(In + Sn + Ga) | 1.000 | 1.000 | 0.871 |
| | (Sn)/(In + Sn + Ga) | 0.000 | 0.000 | 0.006 |
| | (Ga)/(In + Sn + Ga) | 0.000 | 0.000 | 0.123 |
| | (Al + Ga + Y)/(In + Y + Al + Ga) | 0.000 | 0.138 | 0.206 |
| | [(Al + Ga)/(In + Al + Ga + Y)]/[(Y + Al + Ga)/(In + Al + Ga + Y)] | — | 1.000 | 0.546 |
| | (Al + Y)/(In + Al + Y) | 0.000 | 0.138 | 0.105 |
| | (Y + Ln + Al + Ga)/(In + Y + Ln + Al + Ga) | 0.081 | 0.202 | 0.206 |
| | Ga/(Ga + In) | 0.000 | 0.000 | 0.124 |
| Film-formation conditions | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 300 | 400 | 400 |
| | Pulse frequency (kHz) | — | — | — |
| | Pulse duty ratio (%) | 100 | 100 | 100 |
| | Oxygen partial pressure at film-formation (%) | 20 | 20 | 40 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 300 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $3.0 \times 10^{14}$ | $3.8 \times 10^{14}$ | $3.8 \times 10^{14}$ |
| | Hall measuement carrier mobility ($cm^2/V \cdot sec$) | 9.7 | 5.7 | 5.7 |
| | Crystallinity (after heat treatment) | crystalline | Amorphous | Amorphous |

TABLE 9-continued

| | | | | |
|---|---|---|---|---|
| TFT | Saturation mobility (cm$^2$/V · sec) | 10.2 | 6.2 | 6.2 |
| | Vth(V) | 1.9 | 0.7 | 0.7 |
| | On/Off ratio | >10$^8$ | >10$^9$ | >10$^9$ |
| | Off current (A) | 8.0 × 10$^{-13}$ | 1.2 × 10$^{-13}$ | 3.2 × 10$^{-13}$ |

| | Sample name | Example 3-4 | Example 3-5 | Example 3-6 |
|---|---|---|---|---|
| Composition | Ln element | — | — | Sm |
| | In/(In + Ga + Sn + Al + Y + Ln) | 0.364 | 0.364 | 0.548 |
| | Sn/(In + Ga + Sn + Al + Y + Ln) | 0.319 | 0.319 | 0.187 |
| | Ga/(In + Ga + Sn + Al + Y + Ln) | 0.128 | 0.128 | 0.120 |
| | Al/(In + Ga + Sn + Al + Y + Ln) | 0.189 | 0.189 | 0.000 |
| | Y/(In + Ga + Sn + Al + Y + Ln) | 0.000 | 0.000 | 0.000 |
| | Ln(In + Ga + Sn + Al + Y + Ln) | 0.000 | 0.000 | 0.145 |
| | (In + Sn + Ga)/((In + Sn + Ga) + (Al + Y + Ln)) | 0.811 | 0.811 | 0.855 |
| | (Al + Y + Ln)/((In + Sn + Ga) + (Al + Y + Ln)) | 0.189 | 0.189 | 0.145 |
| | (In)/(In + Sn + Ga) | 0.449 | 0.449 | 0.641 |
| | (Sn)/(In + Sn + Ga) | 0.393 | 0.393 | 0.219 |
| | (Ga)/(In + Sn + Ga) | 0.158 | 0.158 | 0.140 |
| | (Al + Ga + Y)/(In + Y + Al + Ga) | 0.465 | 0.465 | 0.180 |
| | [(Al + Ga)/(In + Al + Ga + Y)]/[(Y + Al + Ga)/(In + Al + Ga + Y)] | 1.000 | 1.000 | 1.000 |
| | (Al + Y)/(In + Al + Y) | 0.342 | 0.342 | 0.000 |
| | (Y + Ln + Al + Ga)/(In + Y + Ln + Al + Ga) | 0.465 | 0.465 | 0.326 |
| | Ga/(Ga + In) | 0.260 | 0.260 | 0.180 |
| Film-formation conditions | Atmosphere gas | Ar + O$_2$ | Ar + O$_2$ | Ar + O$_2$ |
| | Back pressure before film-formation (Pa) | 5.0 × 10$^{-4}$ | 5.0 × 10$^{-4}$ | 5.0 × 10$^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 400 | 400 | 400 |
| | Pulse frequency (kHz) | — | — | — |
| | Pulse duty ratio (%) | 100 | 100 | 100 |
| | Oxygen partial pressure at film-formation (%) | 20 | 20 | 20 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 200 | 300 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density (cm$^{-3}$) | 6.3 × 10$^{12}$ | 9.9 × 10$^{13}$ | 4.9 × 10$^{12}$ |
| | Hall measurement carrier mobility (cm$^2$/V · sec) | 1.9 | 4.1 | 0.1 |
| | Crystallinity (after heat treatment) | Amorphous | Amorphous | Amorphous |
| TFT | Saturation mobility (cm$^2$/V · sec) | 0.6 | 1.8 | 3.4 |
| | Vth(V) | 3.8 | 2.6 | 0.3 |
| | On/Off ratio | >10$^5$ | >10$^6$ | >10$^7$ |
| | Off current (A) | 1.2 × 10$^{-13}$ | 2.1 × 10$^{-13}$ | 6.8 × 10$^{-13}$ |

TABLE 10

| | Sample name | Example 3-7 | Example 3-8 | Example 3-9 |
|---|---|---|---|---|
| Composition | Ln element | — | — | — |
| | In/(In + Ga + Sn + Al + Y + Ln) | 0.656 | 0.490 | 0.350 |
| | Sn/(In + Ga + Sn + Al + Y + Ln) | 0.080 | 0.163 | 0.246 |
| | Ga/(In + Ga + Sn + Al + Y + Ln) | 0.077 | 0.163 | 0.222 |
| | Al/(In + Ga + Sn + Al + Y + Ln) | 0.188 | 0.184 | 0.182 |
| | Y/(In + Ga + Sn + Al + Y + Ln) | 0.000 | 0.000 | 0.000 |
| | Ln(In + Ga + Sn + Al + Y + Ln) | 0.000 | 0.000 | 0.000 |
| | (In + Sn + Ga)/((In + Sn + Ga) + (Al + Y + Ln)) | 0.812 | 0.816 | 0.818 |
| | (Al + Y + Ln)/((In + Sn + Ga) + (Al + Y + Ln)) | 0.188 | 0.184 | 0.182 |
| | (In)/(In + Sn + Ga) | 0.807 | 0.600 | 0.428 |
| | (Sn)/(In + Sn + Ga) | 0.098 | 0.200 | 0.301 |
| | (Ga)/(In + Sn + Ga) | 0.095 | 0.200 | 0.271 |
| | (Al + Ga + Y)/(In + Y + Al + Ga) | 0.288 | 0.415 | 0.536 |
| | [(Al + Ga)/(In + Al + Ga + Y)]/[(Y + Al + Ga)/(In + Al + Ga + Y)] | 1.000 | 1.000 | 1.000 |
| | (Al + Y)/(In + Al + Y) | 0.223 | 0.273 | 0.342 |
| | (Y + Ln + Al + Ga)/(In + Y + Ln + Al + Ga) | 0.288 | 0.415 | 0.536 |
| | Ga/(Ga + In) | 0.105 | 0.250 | 0.388 |

TABLE 10-continued

| | | Example 3-7 | Example 3-8 | Example 3-9 |
|---|---|---|---|---|
| Film-formation conditions | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 400 | 400 | 400 |
| | Pulse frequency (kHz) | — | — | — |
| | Pulse duty ratio (%) | 100 | 100 | 100 |
| | Oxygen partial pressure at film-formation (%) | 30 | 1 | 20 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $1.9 \times 10^{13}$ | $1.5 \times 10^{14}$ | $8.9 \times 10^{13}$ |
| | Hall measuement carrier mobility ($cm^2/V \cdot sec$) | 0.4 | 6.9 | 0.496 |
| | Crystallinity (after heat treatment) | Amorphous | Amorphous | Amorphous |
| TFT | Saturation mobility ($cm^2/V \cdot sec$) | 6.7 | 3.8 | 0.8 |
| | Vth(V) | 2.2 | 0.8 | 0.94 |
| | On/Off ratio | >$10^9$ | >$10^7$ | >$10^6$ |
| | Off current (A) | $3.3 \times 10^{-13}$ | $8.4 \times 10^{-13}$ | $7.4 \times 10^{-13}$ |

| | Sample name | Example 3-10 | Example 3-11 | Example 3-12 |
|---|---|---|---|---|
| Composition | Ln element | — | — | — |
| | In/(In + Ga + Sn + Al + Y + Ln) | 0.806 | 0.691 | 0.805 |
| | Sn/(In + Ga + Sn + Al + Y + Ln) | 0.004 | 0.000 | 0.004 |
| | Ga/(In + Ga + Sn + Al + Y + Ln) | 0.000 | 0.125 | 0.000 |
| | Al/(In + Ga + Sn + Al + Y + Ln) | 0.051 | 0.184 | 0.147 |
| | Y/(In + Ga + Sn + Al + Y + Ln) | 0.139 | 0.000 | 0.044 |
| | Ln(In + Ga + Sn + Al + Y + Ln) | 0.000 | 0.000 | 0.000 |
| | (In + Sn + Ga)/((In + Sn + Ga) + (Al + Y + Ln)) | 0.810 | 0.816 | 0.809 |
| | (Al + Y + Ln)/((In + Sn + Ga) + (Al + Y + Ln)) | 0.190 | 0.184 | 0.191 |
| | (In)/(In + Sn + Ga) | 0.995 | 0.847 | 0.995 |
| | (Sn)/(In + Sn + Ga) | 0.005 | 0.000 | 0.005 |
| | (Ga)/(In + Sn + Ga) | 0.000 | 0.153 | 0.000 |
| | (Al + Ga + Y)/(In + Y + Al + Ga) | 0.191 | 0.309 | 0.192 |
| | [(Al + Ga)/(In + Al + Ga + Y)]/[(Y + Al + Ga)/(In + Al + Ga + Y)] | 0.268 | 1.000 | 0.770 |
| | (Al + Y)/(In + Al + Y) | 0.191 | 0.210 | 0.192 |
| | (Y + Ln + Al + Ga)/(In + Y + Ln + Al + Ga) | 0.191 | 0.309 | 0.192 |
| | Ga/(Ga + In) | 0.000 | 0.153 | 0.000 |
| Film-formation conditions | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 300 | 400 | 400 |
| | Pulse frequency (kHz) | 100 | 100 | 100 |
| | Pulse duty ratio (%) | 50 | 50 | 50 |
| | Oxygen partial pressure at film-formation (%) | 20 | 10 | 20 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $9.5 \times 10^{15}$ | $6.8 \times 10^{15}$ | $9.6 \times 10^{13}$ |
| | Hall measuement carrier mobility ($cm^2/V \cdot sec$) | 4.2 | 5.3 | 1.3 |
| | Crystallinity (after heat treatment) | crystalline | Amorphous | Amorphous |
| TFT | Saturation mobility ($cm^2/V \cdot sec$) | 3.9 | 7.6 | 9.4 |
| | Vth(V) | 2.1 | −0.3 | 0.2 |
| | On/Off ratio | >$10^7$ | >$10^9$ | >$10^8$ |
| | Off current (A) | $7.7 \times 10^{-13}$ | $8.3 \times 10^{-13}$ | $8.8 \times 10^{-13}$ |

TABLE 11

| | Sample name | Example 3-13 | Example 3-14 | Example 3-15 |
|---|---|---|---|---|
| Composition | Ln element | — | — | Sm |
| | In/(In + Ga + Sn + Al + Y + Ln) | 0.571 | 0.643 | 0.847 |
| | Sn/(In + Ga + Sn + Al + Y + Ln) | 0.175 | 0.105 | 0.000 |
| | Ga/(In + Ga + Sn + Al + Y + Ln) | 0.113 | 0.112 | 0.074 |

TABLE 11-continued

| | | | | |
|---|---|---|---|---|
| | Al/(In + Ga + Sn + Al + Y + Ln) | 0.000 | 0.000 | 0.000 |
| | Y/(In + Ga + Sn + Al + Y + Ln) | 0.141 | 0.140 | 0.000 |
| | Ln(In + Ga + Sn + Al + Y + Ln) | 0.000 | 0.000 | 0.079 |
| | (In + Sn + Ga)/((In + Sn + Ga) + (Al + Y + Ln)) | 0.859 | 0.860 | 0.921 |
| | (Al + Y + Ln)/((In + Sn + Ga) + (Al + Y + Ln)) | 0.141 | 0.140 | 0.079 |
| | (In/(In + Sn + Ga) | 0.665 | 0.748 | 0.920 |
| | (Sn)/(In + Sn + Ga) | 0.204 | 0.122 | 0.000 |
| | (Ga)/(In + Sn + Ga) | 0.132 | 0.130 | 0.080 |
| | (Al + Ga + Y)/(In + Y + Al + Ga) | 0.308 | 0.282 | 0.080 |
| | [(Al + Ga)/(In + Al + Ga + Y)]/[(Y + Al + Ga)/(In + Al + Ga + Y)] | 0.445 | 0.444 | 1.000 |
| | (Al + Y)/(In + Al + Y) | 0.198 | 0.179 | 0.000 |
| | (Y + Ln + Al + Ga)/(In + Y + Ln + Al + Ga) | 0.308 | 0.282 | 0.153 |
| | Ga/(Ga + In) | 0.165 | 0.148 | 0.080 |
| Film-formation conditions | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 400 | 400 | 400 |
| | Pulse frequency (kHz) | 100 | 100 | 100 |
| | Pulse duty ratio (%) | 50 | 50 | 50 |
| | Oxygen partial pressure at film-formation (%) | 20 | 20 | 30 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $2.5 \times 10^{14}$ | $1.2 \times 10^{14}$ | $3.6 \times 10^{14}$ |
| | Hall measurement carrier mobility ($cm^2/V \cdot sec$) | 0.9 | 1.1 | 1.7 |
| | Crystallinity (after heat treatment) | Amorphous | Amorphous | Amorphous |
| TFT | Saturation mobility ($cm^2/V \cdot sec$) | 6.2 | 7.1 | 3.4 |
| | Vth(V) | 0.1 | 1.1 | 0.3 |
| | On/Off ratio | $>10^8$ | $>10^8$ | $>10^9$ |
| | Off current (A) | $8.5 \times 10^{-13}$ | $7.1 \times 10^{-13}$ | $8.7 \times 10^{-13}$ |

| | Sample name | Example 3-16 (2-1) | Example 3-17 (2-2) | Example 3-18 |
|---|---|---|---|---|
| Composition | Ln element | Yb | Yb | — |
| | In/(In + Ga + Sn + Al + Y + Ln) | 0.878 | 0.808 | 0.833 |
| | Sn/(In + Ga + Sn + Al + Y + Ln) | 0.000 | 0.000 | 0.001 |
| | Ga/(In + Ga + Sn + Al + Y + Ln) | 0.073 | 0.086 | 0.069 |
| | Al/(In + Ga + Sn + Al + Y + Ln) | 0.000 | 0.052 | 0.051 |
| | Y/(In + Ga + Sn + Al + Y + Ln) | 0.000 | 0.000 | 0.046 |
| | Ln(In + Ga + Sn + Al + Y + Ln) | 0.049 | 0.054 | 0.000 |
| | (In + Sn + Ga)/((In + Sn + Ga) + (Al + Y + Ln)) | 0.951 | 0.894 | 0.903 |
| | (Al + Y + Ln)/((In + Sn + Ga) + (Al + Y + Ln)) | 0.049 | 0.106 | 0.097 |
| | (In/(In + Sn + Ga) | 0.923 | 0.904 | 0.922 |
| | (Sn)/(In + Sn + Ga) | 0.000 | 0.000 | 0.001 |
| | (Ga)/(In + Sn + Ga) | 0.077 | 0.096 | 0.076 |
| | (Al + Ga + Y)/(In + Y + Al + Ga) | 0.077 | 0.146 | 0.166 |
| | [(Al + Ga)/(In + Al + Ga + Y)]/[(Y + Al + Ga)/(In + Al + Ga + Y)] | 1.000 | 1.000 | 0.723 |
| | (Al + Y)/(In + Al + Y) | 0.000 | 0.060 | 0.104 |
| | (Y + Ln + Al + Ga)/(In + Y + Ln + Al + Ga) | 0.122 | 0.192 | 0.166 |
| | Ga/(Ga + In) | 0.077 | 0.096 | 0.076 |
| Film-formation conditions | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 300 | 400 | 300 |
| | Pulse frequency (kHz) | 100 | 100 | 100 |
| | Pulse duty ratio (%) | 50 | 50 | 50 |
| | Oxygen partial pressure at film-formation (%) | 30 | 20 | 20 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $1.9 \times 10^{14}$ | $8.4 \times 10^{14}$ | $8.1 \times 10^{14}$ |

TABLE 11-continued

|  |  |  |  |  |
|---|---|---|---|---|
| TFT | Hall measuement carrier mobility (cm$^2$/V · sec) | 1.2 | 1.3 | 0.3 |
|  | Crystallinity (after heat treatment) | crystalline | Amorphous | crystalline |
|  | Saturation mobility (cm$^2$/V · sec) | 8.8 | 6.3 | 8.8 |
|  | Vth(V) | 0.6 | −1.2 | −2.1 |
|  | On/Off ratio | >10$^9$ | >10$^8$ | >10$^9$ |
|  | Off current (A) | 6.5 × 10$^{-13}$ | 1.8 × 10$^{-13}$ | 9.1 × 10$^{-14}$ |

TABLE 12

|  | Sample name | Example 3-19 | Example 3-20 | Example 3-21 (2-3) |
|---|---|---|---|---|
| Composition | Ln element | — | Yb | Yb |
|  | In/(In + Ga + Sn + Al + Y + Ln) | 0.833 | 0.597 | 0.852 |
|  | Sn/(In + Ga + Sn + Al + Y + Ln) | 0.001 | 0.193 | 0.000 |
|  | Ga/(In + Ga + Sn + Al + Y + Ln) | 0.069 | 0.077 | 0.073 |
|  | Al/(In + Ga + Sn + Al + Y + Ln) | 0.051 | 0.000 | 0.027 |
|  | Y/(In + Ga + Sn + Al + Y + Ln) | 0.046 | 0.000 | 0.000 |
|  | Ln(In + Ga + Sn + Al + Y + Ln) | 0.000 | 0.133 | 0.048 |
|  | (In + Sn + Ga)/((In + Sn + Ga) + (Al + Y + Ln)) | 0.903 | 0.867 | 0.925 |
|  | (Al + Y + Ln)/((In + Sn + Ga) + (Al + Y + Ln)) | 0.097 | 0.133 | 0.075 |
|  | (In)/(In + Sn + Ga) | 0.922 | 0.689 | 0.921 |
|  | (Sn)/(In + Sn + Ga) | 0.001 | 0.223 | 0.000 |
|  | (Ga)/(In + Sn + Ga) | 0.076 | 0.089 | 0.079 |
|  | (Al + Ga + Y)/(In + Y + Al + Ga) | 0.166 | 0.114 | 0.105 |
|  | [(Al + Ga)/(In + Al + Ga + Y)]/[(Y + Al + Ga)/(In + Al + Ga + Y)] | 0.723 | 1.000 | 1.000 |
|  | (Al + Y)/(In + Al + Y) | 0.104 | 0.000 | 0.031 |
|  | (Y + Ln + Al + Ga)/(In + Y + Ln + Al + Ga) | 0.166 | 0.260 | 0.148 |
|  | Ga/(Ga + In) | 0.076 | 0.114 | 0.079 |
| Film-formation conditions | Atmosphere gas | Ar + O$_2$ | Ar + O$_2$ | Ar + O$_2$ |
|  | Back pressure before film-formation (Pa) | 5.0 × 10$^{-4}$ | 5.0 × 10$^{-4}$ | 5.0 × 10$^{-4}$ |
|  | Sputtering pressure at film-formation (Pa) | 0.5 | 0.5 | 0.5 |
|  | Substrate temperature at film-formation (° C.) | Room temp. | Room temp. | Room temp. |
|  | DC output (W) | 300 | 400 | 300 |
|  | Pulse frequency (kHz) | 100 | 100 | 100 |
|  | Pulse duty ratio (%) | 50 | 50 | 50 |
|  | Oxygen partial pressure at film-formation (%) | 30 | 20 | 20 |
|  | L/W of TFT (μm) | 200/1000 | 200/1000 | 200/1000 |
|  | Film thickness (nm) | 100 | 50 | 50 |
| Heat-treatment conditions after film-formation | Heat treatment after film-formation: temp. (° C.) | 350 | 350 | 350 |
|  | :temperature increase rate (° C./min.) | 10 | 10 | 10 |
|  | :time (min.) | 60 | 60 | 60 |
|  | :atmosphere | Atmos. air | Atmos. air | Atmos. air |
| Thin-film | Crystallinity (after film deposition) | Amorphous | Amorphous | Amorphous |
|  | Hall measurement carrier density (cm$^{-3}$) | 1.4 × 10$^{13}$ | 2.8 × 10$^{14}$ | 8.1 × 10$^{14}$ |
|  | Hall measurement carrier mobility (cm$^2$/V · sec) | 0.1 | 0.7 | 1.4 |
|  | Crystallinity (after heat treatment) | crystalline | Amorphous | crystalline |
| TFT | Saturation mobility (cm$^2$/V · sec) | 13.4 | 4.6 | 3.2 |
|  | Vth(V) | −0.6 | 0.3 | 0.2 |
|  | On/Off ratio | >10$^9$ | >10$^9$ | >10$^{10}$ |
|  | Off current (A) | 1.4 × 10$^{-13}$ | 9.6 × 10$^{-14}$ | 9.4 × 10$^{-14}$ |

|  | Sample name | Example 3-22 (2-4) | Example 3-23 (2-5) | Example 3-24 (2-6) |
|---|---|---|---|---|
| Composition | Ln element | Yb | Yb | Yb |
|  | In/(In + Ga + Sn + Al + Y + Ln) | 0.692 | 0.870 | 0.847 |
|  | Sn/(In + Ga + Sn + Al + Y + Ln) | 0.196 | 0.000 | 0.000 |
|  | Ga/(In + Ga + Sn + Al + Y + Ln) | 0.000 | 0.102 | 0.100 |
|  | Al/(In + Ga + Sn + Al + Y + Ln) | 0.000 | 0.000 | 0.026 |
|  | Y/(In + Ga + Sn + Al + Y + Ln) | 0.000 | 0.000 | 0.000 |
|  | Ln(In + Ga + Sn + Al + Y + Ln) | 0.112 | 0.028 | 0.027 |
|  | (In + Sn + Ga)/((In + Sn + Ga) + (Al + Y + Ln)) | 0.888 | 0.972 | 0.947 |
|  | (Al + Y + Ln)/((In + Sn + Ga) + (Al + Y + Ln)) | 0.112 | 0.028 | 0.053 |
|  | (In)/(In + Sn + Ga) | 0.779 | 0.895 | 0.894 |
|  | (Sn)/(In + Sn + Ga) | 0.221 | 0.000 | 0.000 |
|  | (Ga)/(In + Sn + Ga) | 0.000 | 0.105 | 0.106 |
|  | (Al + Ga + Y)/(In + Y + Al + Ga) | 0.000 | 0.105 | 0.129 |
|  | [(Al + Ga)/(In + Al + Ga + Y)]/[(Y + Al + Ga)/(In + Al + Ga + Y)] | — | 1.000 | 1.000 |

TABLE 12-continued

| | | | | |
|---|---|---|---|---|
| | (Al + Y)/(In + Al + Y) | 0.000 | 0.000 | 0.030 |
| | (Y + Ln + Al + Ga)/(In + Y + Ln + Al + Ga) | 0.139 | 0.130 | 0.153 |
| | Ga/(Ga + In) | 0.000 | 0.105 | 0.106 |
| Film-formation conditions | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 400 | 300 | 300 |
| | Pulse frequency (kHz) | 100 | 100 | 100 |
| | Pulse duty ratio (%) | 50 | 50 | 50 |
| | Oxygen partial pressure at film-formation (%) | 20 | 20 | 20 |
| | L/W of TFT (μm) | 200/1000 | 200/1000 | 200/1000 |
| | Film thickness (nm) | 50 | 50 | 50 |
| Heat-treatment conditions | Heat treatment after film-formation: temp. (° C.) | 350 | 350 | 350 |
| after film-formation | :temperature increase rate (° C./min.) | 10 | 10 | 10 |
| | :time (min.) | 60 | 90 | 90 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $9.4 \times 10^{14}$ | $4.5 \times 10^{14}$ | $8.4 \times 10^{14}$ |
| | Hall measuement carrier mobility ($cm^2/V \cdot sec$) | 1 | 1.2 | 10.5 |
| | Crystallinity (after heat treatment) | Amorphous | crystalline | crystalline |
| TFT | Saturation mobility ($cm^2/V \cdot sec$) | 7.3 | 12.2 | 9.6 |
| | Vth(V) | −1.1 | 0.1 | 0.9 |
| | On/Off ratio | $>10^8$ | $>10^9$ | $>10^9$ |
| | Off current (A) | $6.3 \times 10^{-13}$ | $1.2 \times 10^{-13}$ | $2.1 \times 10^{-13}$ |

TABLE 13

| | Sample name | Example 3-25 | Example 3-26 | Example 3-27 |
|---|---|---|---|---|
| Composition | Ln element | Sm | Sm | Sm |
| | In/(In + Ga + Sn + Al + Y + Ln) | 0.607 | 0.607 | 0.607 |
| | Sn/(In + Ga + Sn + Al + Y + Ln) | 0.112 | 0.112 | 0.112 |
| | Ga/(In + Ga + Sn + Al + Y + Ln) | 0.120 | 0.120 | 0.120 |
| | Al/(In + Ga + Sn + Al + Y + Ln) | 0.000 | 0.000 | 0.000 |
| | Y/(In + Ga + Sn + Al + Y + Ln) | 0.000 | 0.000 | 0.000 |
| | Ln(In + Ga + Sn + Al + Y + Ln) | 0.161 | 0.161 | 0.161 |
| | (In + Sn + Ga)/((In + Sn + Ga) + (Al + Y + Ln)) | 0.839 | 0.839 | 0.839 |
| | (Al + Y + Ln)/((In + Sn + Ga) + (Al + Y + Ln)) | 0.161 | 0.161 | 0.161 |
| | (In)/(In + Sn + Ga) | 0.723 | 0.723 | 0.723 |
| | (Sn)/(In + Sn + Ga) | 0.133 | 0.133 | 0.133 |
| | (Ga)/(In + Sn + Ga) | 0.143 | 0.143 | 0.143 |
| | (Al + Ga + Y)/(In + Y + Al + Ga) | 0.165 | 0.165 | 0.165 |
| | [(Al + Ga)/(In + Al + Ga + Y)]/[(Y + Al + Ga)/(In + Al + Ga + Y)] | 1.000 | 1.000 | 1.000 |
| | (Al + Y)/(In + Al + Y) | 0.000 | 0.000 | 0.000 |
| | (Y + Ln + Al + Ga)/(In + Y + Ln + Al + Ga) | 0.316 | 0.316 | 0.316 |
| Film-formation conditions | Ga/(Ga + In) | 0.165 | 0.165 | 0.165 |
| | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 300 | 300 | 300 |
| | Pulse frequency (kHz) | 100 | 100 | 100 |
| | Pulse duty ratio (%) | 50 | 50 | 50 |
| | Oxygen partial pressure at film-formation (%) | 1 | 1 | 1 |
| | L/W of TFT (μm) | 200/1000 | 200/1000 | 200/1000 |
| | Film thickness (nm) | 50 | 50 | 50 |
| Heat-treatment conditions | Heat treatment after film-formation: temp. (° C.) | 350 | 250 | 200 |
| after film-formation | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Hall measurement carrier density ($cm^{-3}$) | $3.3 \times 10^{12}$ | $4.1 \times 10^{15}$ | $3.2 \times 10^{15}$ |
| | Hall measuement carrier mobility ($cm^2/V \cdot sec$) | 0.35 | 0.63 | 0.48 |
| | Crystallinity (after heat treatment) | Amorphous | Amorphous | Amorphous |
| TFT | Saturation mobility ($cm^2/V \cdot sec$) | 2.7 | 2.5 | <0.1 |
| | Vth(V) | 0.8 | 0.2 | 1.8 |
| | On/Off ratio | $>10^9$ | $>10^8$ | $>10^6$ |
| | Off current (A) | $5.1 \times 10^{-13}$ | $9.2 \times 10^{-13}$ | $6.4 \times 10^{-13}$ |

TABLE 13-continued

| Sample name | | | Comparative 3-1 (2-1) | Comparative 3-2 |
|---|---|---|---|---|
| Composition | | Ln element | — | — |
| | | In/(In + Ga + Sn + Al + Y + Ln) | 0.423 | 0.423 |
| | | Sn/(In + Ga + Sn + Al + Y + Ln) | 0.312 | 0.312 |
| | | Ga/(In + Ga + Sn + Al + Y + Ln) | 0.265 | 0.265 |
| | | Al/(In + Ga + Sn + Al + Y + Ln) | 0.000 | 0.000 |
| | | Y/(In + Ga + Sn + Al + Y + Ln) | 0.000 | 0.000 |
| | | Ln(In + Ga + Sn + Al + Y + Ln) | 0.000 | 0.000 |
| | | (In + Sn + Ga)/((In + Sn + Ga) + (Al + Y + Ln)) | 1.000 | 1.000 |
| | | (Al + Y + Ln)/((In + Sn + Ga) + (Al + Y + Ln)) | 0.000 | 0.000 |
| | | (In)/(In + Sn + Ga) | 0.423 | 0.423 |
| | | (Sn)/(In + Sn + Ga) | 0.312 | 0.312 |
| | | (Ga)/(In + Sn + Ga) | 0.265 | 0.265 |
| | | (Al + Ga + Y)/(In + Y + Al + Ga) | 0.385 | 0.385 |
| | | [(Al + Ga)/(In + Al + Ga + Y)]/[(Y + Al + Ga)/(In + Al + Ga + Y)] | 1.000 | 1.000 |
| | | (Al + Y)/(In + Al + Y) | 0.000 | 0.000 |
| | | (Y + Ln + Al + Ga)/(In + Y + Ln + Al + Ga) | 0.385 | 0.385 |
| Film-formation conditions | | Ga/(Ga + In) | 0.385 | 0.385 |
| | | Atmosphere gas | Ar + $O_2$ | Ar + $O_2$ |
| | | Back pressure before film-formation (Pa) | $5.0 \times 10^{-4}$ | $5.0 \times 10^{-4}$ |
| | | Sputtering pressure at film-formation (Pa) | 0.5 | 0.5 |
| | | Substrate temperature at film-formation (° C.) | Room temp. | Room temp. |
| | | DC output (W) | 300 | 400 |
| | | Pulse frequency (kHz) | — | — |
| | | Pulse duty ratio (%) | 100 | 100 |
| | | Oxygen partial pressure at film-formation (%) | 1 | 1 |
| | | L/W of TFT (μm) | 200/1000 | 200/1000 |
| | | Film thickness (nm) | 50 | 50 |
| Heat-treatment conditions after film-formation | | Heat treatment after film-formation: temp. (° C.) | 300 | 200 |
| | | :temperature increase rate (° C./min.) | 10 | 10 |
| | | :time (min.) | 60 | 60 |
| | | :atmosphere | Atmos. air | Atmos. air |
| Thin-film | | Crystallinity (after film deposition) | Amorphous | Amorphous |
| | | Hall measurement carrier density ($cm^{-3}$) | $3.1 \times 10^{16}$ | $3.3 \times 10^{18}$ |
| | | Hall measuement carrier mobility ($cm^2/V \cdot sec$) | 8.4 | 14.4 |
| | | Crystallinity (after heat treatment) | Amorphous | Amorphous |
| TFT | | Saturation mobility ($cm^2/V \cdot sec$) | 18.4 | conductive |
| | | Vth(V) | −1.2 | — |
| | | On/Off ratio | >$10^8$ | — |
| | | Off current (A) | $8.7 \times 10^{-11}$ | — |

TABLE 14

| Sample name | | Example 3-28 | Example 3-29 | Example 3-30 |
|---|---|---|---|---|
| Composition | Ln element | — | Yb | Yb |
| | In/(In + Ga + Sn + Zn + Al + Y + Ln) | 0.822 | 0.800 | 0.835 |
| | Sn/(In + Ga + Sn + Zn + Al + Y + Ln) | 0.004 | 0.000 | 0.000 |
| | Zn/(In + Ga + Sn + Zn + Al + Y + Ln) | 0.000 | 0.000 | 0.000 |
| | Ga/(In + Ga + Sn + Zn + Al + Y + Ln) | 0.000 | 0.077 | 0.079 |
| | Al/(In + Ga + Sn + Zn + Al + Y + Ln) | 0.078 | 0.079 | 0.041 |
| | Y/(In + Ga + Sn + Zn + Al + Y + Ln) | 0.095 | 0.000 | 0.000 |
| | Ln/(In + Ga + Sn + Zn + Al + Y + Ln) | 0.000 | 0.043 | 0.045 |
| | Atmosphere gas | Ar + $O_2$ | Ar + $O_2$ | Ar + $O_2$ |
| | Back pressure before film-formation (Pa) | $5.0 \times 10^{-4}$ | $5.0 \times 10^{-4}$ | $5.0 \times 10^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 400 | 400 | 400 |
| | Pulse frequency (kHz) | — | — | — |
| | Pulse duty ratio (%) | 100 | 100 | 100 |
| | Oxygen partial pressure at film-formation (%) | 1 | 1 | 1 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Crystallinity (after heat treatment) | crystalline | crystalline | crystalline |
| | Film density (g/$cm^3$) | 6.93 | 6.99 | 7.12 |
| | Theoretical density (g/$cm^3$) | 6.83 | 7.13 | 7.19 |
| | Relative density ratio of film | 1.01 | 0.98 | 0.99 |

TABLE 14-continued

| TFT | | | | |
|---|---|---|---|---|
| | Saturation mobility (cm$^2$/V · sec) | 6.0 | 17.0 | 22.0 |
| | Vth(V) | −1 | −1.5 | −1 |
| | On/Off ratio | >10$^8$ | >10$^9$ | >10$^8$ |
| | Off current (A) | 8 × 10$^{-13}$ | 1 × 10$^{-12}$ | 3 × 10$^{-12}$ |
| | PBTS Δ Vth (V) | 1.4 | 1.5 | 1.5 |
| | NBTS Δ Vth (V) | −2.0 | −2.3 | −0.8 |

| | Sample name | Example 3-31 | Example 3-32 | Comparative 3-3 |
|---|---|---|---|---|
| Composition | Ln element | Sm | Yb | — |
| | In/(In + Ga + Sn + Zn + Al + Y + Ln) | 0.867 | 0.836 | 0.333 |
| | Sn/(In + Ga + Sn + Zn + Al + Y + Ln) | 0.000 | 0.000 | 0.000 |
| | Zn/(In + Ga + Sn + Zn + Al + Y + Ln) | 0.000 | 0.000 | 0.333 |
| | Ga/(In + Ga + Sn + Zn + Al + Y + Ln) | 0.111 | 0.078 | 0.333 |
| | Al/(In + Ga + Sn + Zn + Al + Y + Ln) | 0.000 | 0.000 | 0.000 |
| | Y/(In + Ga + Sn + Zn + Al + Y + Ln) | 0.000 | 0.000 | 0.000 |
| | Ln/(In + Ga + Sn + Zn + Al + Y + Ln) | 0.022 | 0.086 | 0.000 |
| | Atmosphere gas | Ar + O$_2$ | Ar + O$_2$ | Ar + O$_2$ |
| | Back pressure before film-formation (Pa) | 5.0 × 10$^{-4}$ | 5.0 × 10$^{-4}$ | 5.0 × 10$^{-4}$ |
| | Sputtering pressure at film-formation (Pa) | 0.5 | 0.5 | 0.5 |
| | Substrate temperature at film-formation (° C.) | Room temp. | Room temp. | Room temp. |
| | DC output (W) | 400 | 400 | 400 |
| | Pulse frequency (kHz) | — | — | — |
| | Pulse duty ratio (%) | 100 | 100 | 100 |
| | Oxygen partial pressure at film-formation (%) | 1 | 1 | 1 |
| | L/W of TFT (μm) | 200/1000 | 200/1000 | 200/1000 |
| | Film thickness (nm) | 50 | 50 | 50 |
| Heat-treatment conditions after film-formation | Heat treatment after film-formation: temp. (° C.) | 350 | 350 | 350 |
| | :temperature increase rate (° C./min.) | 10 | 10 | 10 |
| | :time (min.) | 60 | 60 | 60 |
| | :atmosphere | Atmos. air | Atmos. air | Atmos. air |
| Thin-film | Crystallinity (after film deposition) | Amorphous | Amorphous | Amorphous |
| | Crystallinity (after heat treatment) | crystalline | crystalline | Amorphous |
| | Film density (g/cm$^3$) | 7.00 | 7.26 | 6.22 |
| | Theoretical density (g/cm$^3$) | 7.13 | 7.25 | 6.50 |
| | Relative density ratio of film | 0.98 | 1.00 | 0.96 |
| TFT | Saturation mobility (cm$^2$/V · sec) | 28.0 | 24.0 | 13.0 |
| | Vth(V) | −1.4 | −0.4 | 1.2 |
| | On/Off ratio | >10$^8$ | >10$^8$ | >10$^9$ |
| | Off current (A) | 1 × 10$^{-12}$ | 8 × 10$^{-13}$ | 2 × 10$^{-12}$ |
| | PBTS Δ Vth (V) | 0.8 | 1.1 | 5.3 |
| | NBTS Δ Vth (V) | −2.5 | −1.9 | −7.2 |

As shown in Tables 9 to 14, both of the oxide semiconductor thin-film and thin-film transistor of Examples 3-1 to 3-27 satisfying at least one of the requirements of the fourth exemplary embodiment exhibited the semiconductor properties.

It was determined that the crystals on the surface of the oxide semiconductor thin-film after being subjected to the heat treatment had facet geometry in Examples 3-1, 3-10, 3-16, 3-18, 3-19, 3-21, 3-23, 3-24, and 3-28 to 32. As a result of thin-film crystal structure through XRD, it was found that the semiconductor thin-film had a Bixbyite structure with crystal peak in the range of 2θ of 30 degrees C. or more and 40 degrees C. or less corresponding to (222) and (400) planes. Further, crystal peaks corresponding to planes satisfying the formulae (3-20) to (3-23) were observed.

$$(hkl)\text{plane}: h+k+l=2n_1 (n_1 \text{ being a natural number}) \quad \text{formula (3-20)}$$

$$(0kl)\text{plane}: k=2n_2,\ l=2n_3 (n_2 \text{ and } n_3 \text{ being mutually different natural numbers}) \quad \text{formula (3-21)}$$

$$(hhl)\text{plane}: H=n_4,\ l=2n_5 (n_4 \text{ and } n_5 \text{ being mutually different natural numbers}) \quad \text{formula (3-22)}$$

$$(h00)\text{plane}: h=2n_6 (n_6 \text{ being a natural number}) \quad \text{formula (3-23)}$$

Further, the electronic diffraction pattern of the oxide semiconductor area after the thin-film transistor was formed was observed. As a result of analysis of the observed pattern and the plane indices, it was determined that the oxide semiconductor thin-film had a cubic crystal system crystal of space group Ia-3 (No. 206). Diffraction points from the planes satisfying the formulae 3-20 to 3-23 were determined in the electronic diffraction pattern.

Both of the thin-film and thin-film transistor of Comparatives 3-1 and 3-2, which did not satisfy any of the requirements of the fourth exemplary embodiment, exhibited insufficient semiconductor properties.

From the above, it was found that the oxide semiconductor thin-film formed with the use of the sintered oxide satisfying the composition range specified in the fourth exemplary embodiment, which contained oxide(s) of at least one of Al element, Y element, and lanthanoid element Ln, exhibited semiconductor properties even when indium, tin, and gallium were contained at a composition range typically turning the thin-film into a conductor.

Further, the thin-film transistors having the oxide semiconductor thin-film of Examples 3-1 to 3-27 showed reduced leak current as compared with the thin-film transistor having the oxide thin-film according to Comparative 1.

Comparative 3-3, which did not satisfy at least one of the requirements of the fourth exemplary embodiment, had lower film density than that of Examples 3-28 to 3-32. Comparative 3-3, which was inferior to Examples 3-28 to 3-34 in terms of reliability (PBTS, NBTS), showed insufficient results. From the above, it was found that a film with small shortage in each of the elements, which exhibited excellent reliability and stable performance when being used as a channel layer of a device, could be formed by increasing the film density.

Accordingly, with the use of the thin-film transistor of Examples 3-1 to 3-32, it is expectable that an image sensor that is excellent in electric potential holdability (e.g. electron-potential holding time) and stable for a long time can be provided.

The invention claimed is:

1. A sintered oxide comprising main constitutional elements comprising In element, Y element, Ga element, Al element, and O element, wherein the sintered oxide comprises a Bixbyite crystalline phase represented by $In_2O_3$ and a $Y_3Ga_5O_{12}$ crystalline phase and a $Y_3Ga_4AlO_{12}$ crystalline phase.

2. A sintered oxide comprising main constitutional elements comprising In element, Y element, Ga element, Al element, positive tetravalent metal element, and O element, wherein the sintered oxide comprises a Bixbyite crystalline phase represented by $In_2O_3$ and a $Y_3Ga_4AlO_{12}$ crystalline phase.

3. The sintered oxide according to claim 1, wherein a relative density of the sintered oxide is 95% or more.

4. The sintered oxide according to claim 1, wherein a bulk resistivity of the sintered oxide is 30 mΩ cm or less.

5. A sputtering target comprising: the sintered oxide according to claim 1; and a backing plate.

6. The sintered oxide according to claim 2, wherein a relative density of the sintered oxide is 95% or more.

7. The sintered oxide according to claim 2, wherein a bulk resistivity of the sintered oxide is 30 mΩ cm or less.

8. A sputtering target comprising: the sintered oxide according to claim 2; and a backing plate.

9. A manufacturing method of an oxide semiconductor thin-film, the method comprising forming the oxide semiconductor thin film via sputtering with a sputtering target comprising the sintered oxide according to claim 1 and a backing plate.

10. The manufacturing method according to claim 9, wherein the oxide semiconductor thin-film containing: In element, Y element, Ga element and Al element at respective atomic ratios as defined in formulae (1-7) to (1-9) and (1-10) below, $$0.80 \leq In/(In+Y+Ga) \leq 0.96 \quad (1-7),$$

$$0.02 \leq Y/(In+Y+Ga) \leq 0.10 \quad (1-8), \text{ and}$$

$$0.02 \leq Ga/(In+Y+Ga) \leq 0.15 \quad (1-9);$$

$$0.005 \leq Al/(In+Y+Ga+Al) \leq 0.07 \quad (1-10),$$

where In, Y, Ga, and Al in the formulae represent the number of atoms of the In element, the Y element, the Ga element, and the Al element in the oxide semiconductor thin-film, respectively.

11. A manufacturing method of an oxide semiconductor thin-film, the method comprising forming the oxide semiconductor thin-film via sputtering with a sputtering target comprising the sintered oxide according to claim 2 and a backing plate.

12. The manufacturing method according to claim 11, wherein the oxide semiconductor thin-film containing: In element, Y element, Ga element and Al element at respective atomic ratios as defined in formulae (1-7) to (1-9) and (1-10) below, $$0.80 \leq In/(In+Y+Ga) \leq 0.96 \quad (1-7),$$

$$0.02 \leq Y/(In+Y+Ga) \leq 0.10 \quad (1-8), \text{ and}$$

$$0.02 \leq Ga/(In+Y+Ga) \leq 0.15 \quad (1-9);$$

$$0.005 \leq Al/(In+Y+Ga+Al) \leq 0.07 \quad (1-10), \text{ and}$$

an oxide of a positive tetravalent or more polyvalent metal element X at an atomic ratio defined by a formula (1-12) below, $$0.00005 \leq X/(In+Y+Ga+Al+X) \leq 0.005 \quad (1-12),$$

where In, Y, Ga, and Al in the formulae represent the number of atoms of the In element, the Y element, the Ga element, and the Al element in the oxide semiconductor thin-film, respectively, X represents the number of atoms of the X element in the oxide semiconductor thin-film.

* * * * *